(12) United States Patent
Tamura et al.

(10) Patent No.: US 6,356,475 B1
(45) Date of Patent: Mar. 12, 2002

(54) FERROELECTRIC MEMORY AND METHOD OF READING OUT DATA FROM THE FERROELECTRIC MEMORY

(75) Inventors: Tetsuro Tamura; Kazuaki Takai; Shigenobu Taira, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 08/977,664

(22) Filed: Nov. 24, 1997

Related U.S. Application Data

(63) Continuation of application No. 08/708,707, filed on Sep. 5, 1996, now abandoned.

(30) Foreign Application Priority Data

| Sep. 8, 1995 | (JP) | 7-230868 |
| Sep. 8, 1995 | (JP) | 7-230869 |
| Oct. 24, 1995 | (JP) | 7-275546 |
| Nov. 29, 1995 | (JP) | 7-311088 |
| Nov. 29, 1995 | (JP) | 7-311089 |

(51) Int. Cl.$^7$ .......................... G11C 13/00; G11C 11/22
(52) U.S. Cl. .................. 365/145; 365/189.01
(58) Field of Search ................. 365/145, 149, 365/150, 189.01, 230.01

(56) References Cited

U.S. PATENT DOCUMENTS 5,638,318 A * 6/1997 Seyyedy ..................... 365/145

FOREIGN PATENT DOCUMENTS

| JP | 4-192173 | 7/1992 |
| JP | 7-13877 | 2/1995 |
| JP | 7-45794 | 2/1995 |
| JP | 7-106450 | 4/1995 |
| JP | 7-202035 | 8/1995 |

* cited by examiner

Primary Examiner—Terrell W. Fears
(74) Attorney, Agent, or Firm—Arent Fox Kintner Plotkin & Kahn, PLLC

(57) ABSTRACT

A method of reading data from a ferroelectric memory has a memory cell which uses a ferroelectric capacitor as a storage medium. The method includes the steps of (a) applying first and second electric fields having opposite directions to the ferroelectric capacitor, wherein polarization of the ferroelectric capacitor is changed according to a variation of the first and second electric fields; and (b) reading out the data stored in the memory cell by detecting a variation of the polarization of the ferroelectric capacitor.

60 Claims, 72 Drawing Sheets

(A CASE WHERE A LOGIC "1" IS WRITTEN)

$\delta Q_1 = \delta P_1 \cdot S$ $\delta Q_2 = \delta P_2 \cdot S$     S : capacitor area (A CASE WHERE A LOGIC "1" IS WRITTEN)

(A CASE WHERE A LOGIC "0" IS WRITTEN)

$V_{CC}/2$ = 1.65V
$\triangle VH$ = 1.65V
$\triangle VH$ = -0.8V
Pr = 7 $\mu C/cm^2$ ( : REMANENT POLARIZATION)
S = 0.031mm² ( : CAPACITOR AREA)
$C_{BL}$ = 4.26nF ( : BIT-LINE CAPACITANSE)

'1' READING

'0' READING

'1' READING

'0' READING $V_{CC}/2$ = 1.65V
$\triangle VH$ = 2.65V
$\triangle VH$ = -1.0V
Pr = 7 $\mu C/cm^2$ ( : REMANENT POLARIZATION)
S = 0.031mm² ( : CAPACITOR AREA)
$C_{BL}$ = 2.10nF (: BIT-LINE CAPACITANSE)

'1' READING

'0' READING (COMPARATOR)

(RING OSCILLATOR)

→ SELECTION
→ SEMI-SELECTION
← SEMI-SELECTION (REVERSE ELECTRIC FIELD)
←---→ UNSELECTION

← SELECTION
← SEMI-SELECTION
↔ UNSELECTION

→ REVERSE ELECTRIC FIELD

US 6,356,475 B1

FERROELECTRIC MEMORY AND METHOD OF READING OUT DATA FROM THE FERROELECTRIC MEMORY

This application is a continuation of application Ser. No. 08/708,707 filed Sep. 5, 1996, now abandoned.

BACKGROUND OF THE INVENTION

1. Field of the Invention

The present invention generally relates to a ferroelectric memory and a method of reading out data from the ferroelectric memory, and more particularly, to a ferroelectric memory having memory cells in which ferroelectric capacitors formed by ferroelectric substances such as $Pb(Zr, Ti)O_3$ are used as storage mediums.

The present invention is also directed to a ferroelectric memory and a method of reading out data from the ferroelectric memory so as to carry out a stable reading-out operation by increasing a signal margin for reading out the data.

2. Description of the Related Art

A semiconductor memory using ferroelectric capacitors formed by ferroelectric substances such as $Pb(Zr, Ti)O_3$ is a non-volatile memory and has a feature of having substantially the same writing-and-reading speed as that of a DRAM. Therefore, it is assumed that a demand for a large number of ferroelectric memories will increase in the future.

With respect to an operation method of the ferroelectric memory, several kinds of methods are known, and these operation methods are disclosed, for example, in U.S. Pat. No. 4,873,664 (Ramtron), and Japanese Patent Publication 7-13877 (Toshiba CO. LTD). In theses methods, by applying a voltage to the ferroelectric capacitor, the data is discriminated according to an inversion of a polarization of the ferroelectric capacitor.

When a memory cell is constructed with one transistor and one capacitor, in order to determine whether or not the polarization is inverted, a reference circuit (dummy cell) generating an intermediate load (or voltage) needs to be constructed with the ferroelectric capacitor.

However, characteristics of this reference circuit may be easily varied by process dispersion of a ferroelectric film and fatigue due to inversion (referred to as inversion fatigue, hereinafter) of the ferroelectric capacitor. Therefore, there is a problem in that the signal margin is reduced, and a stable reading-out operation may not be conducted.

In the following, a more detailed description will be given of the operation of the above-discussed prior-art ferroelectric memory.

FIG. 1 shows a schematic diagram for illustrating a part of one embodiment of a prior-art ferroelectric memory. The ferroelectric memory shown in FIG. 1 includes memory cells 1, 2, which have ferroelectric capacitors 3, 4, and transistors 5, 6 forming transmission gates. The transistors 5, 6 are so-called cell transistors.

In FIG. 1, symbols "WL0 and WL1" indicate word lines for selecting a memory cell, and the symbols "PL0 and PL1" indicate plate lines for driving a plate electrode of the ferroelectric capacitor of a selected memory cell.

The ferroelectric memory shown in FIG. 1 further includes dummy cells 7, 8 which have ferroelectric capacitors 9, 10 having an overlapped area of opposite electrodes half that of the ferroelectric capacitors 3, 4, and cell transistors 11, 12. In this embodiment, into the ferroelectric capacitors 9, 10, a logic "1" is written.

In FIG. 1, symbols "DWL0 and DWL1" indicate word lines for selecting the dummy cell, and the symbols "DPL0 and DPL1" indicate plate lines for driving a plate electrode of the ferroelectric capacitor of a selected dummy cell.

Further, symbols "BL and /BL" indicate bit lines forming data lines (data transmission lines), and the ferroelectric memory further includes a sense amplifier which amplifies a voltage difference between the bit lines BL and /BL when data is read out, and detects data read out from the selected memory cell.

FIG. 2 and FIG. 3 show illustrations for explaining a data-writing sequence in the memory cell of the ferroelectric memory. In these drawings, an example of the data-writing sequence in the memory cell 1 is shown. A horizontal axis indicates a voltage between the bit line BL and the plate line PL0, namely, a voltage $V_{BL}$ of the bit line BL to an earth ground minus a voltage $V_{PL0}$ of the plate line PL0 to the earth ground. A vertical axis indicates a polarization P of the ferroelectric capacitor 3.

For example, when a logic "1" is written into the memory cell 1, the voltage $V_{PL0}$ of the plate line PL0 is set to 0 V, and the cell transistor 5 is set to be conductive. Under this condition, the voltage $V_{BL}$ of the bit line BL is changed from 0 V to VCC, and is subsequently changed to 0 V.

In the above sequence, a state of the polarization P of the ferroelectric capacitor 3 changes, as shown in FIG. 2, from a point a to a point b, and then to a point c. At the point c, the polarization P of the ferroelectric capacitor 3 becomes a positive polarization Ps. As a result, a logic "1" is stored in the ferroelectric capacitor 3. A closed curved line of b to c to d to e to b indicates a hysteresis loop.

On the other hand, when a logic "0" is written into the memory cell 1, the voltage $V_{BL}$ of the bit line BL is set to 0 V, and the cell transistor 5 is set conductive. Under this condition, the voltage $V_{PL0}$ of the plate line PL0 is changed from 0 V to VCC, and is further changed to 0 V.

In the above sequence, a voltage of a storage electrode 3A to that of a plate electrode 3B of the ferroelectric capacitor 3 changes from 0 V to –VCC, and is further changed to 0 V. A state of the polarization P of the ferroelectric capacitor 3 changes, as shown in FIG. 3, from a point a to a point d, and then to a point e. At the point e, the polarization P of the ferroelectric capacitor 3 becomes a negative polarization –Ps. As a result, a logic "0" is stored in the ferroelectric capacitor 3.

FIG. 4 shows waveforms for explaining a data-reading sequence from the memory cell of the ferroelectric memory. In the drawing, an example of the data-reading sequence from the memory cell 1 is shown. A waveform A indicates a variation of the voltage of the word lines WL0, DWL0, a waveform B indicates a variation of the voltage of the plate lines PL0, DPL0, and a waveform C indicates a variation of the voltage of the bit line BL. FIG. 5 shows an illustration for explaining the data-reading sequence from the memory cell of the ferroelectric memory.

When data is read out from the memory cell 1, the bit lines BL, /BL are set to 0 V, and the word lines WL0, DWL0 are increased to VCC+VTH (a threshold voltage of the cell transistor) so as to set the cell transistors 5, 11 conductive. Further, the plate lines PL0, DPL0 are increased to VCC.

At this time, for example, when the logic "1" is previously written in the ferroelectric capacitor 3, the polarization P of the ferroelectric capacitor 3, as shown in FIG. 5, changes from a point c to a point K1. In this case, a charge δQ1, by which the voltage $V_{BL}$ of the bit line BL is the same as the voltage of the storage electrode 3A of the ferroelectric capacitor 3, is provided from the ferroelectric capacitor 3 to the bit line BL. As a result, the voltage $V_{BL}$ of the bit line BL increases from 0 V to V1 V as shown in FIG. 4.

On the other hand, for example, when the logic "0" is previously written in the ferroelectric capacitor 3, the polarization P of the ferroelectric capacitor 3, as shown in FIG. 5, changes from a point e to a point K2. In this case, a charge δQ2, by which the voltage $V_{BL}$ of the bit line BL is the same as the voltage of the storage electrode 3A of the ferroelectric capacitor 3, is provided from the ferroelectric capacitor 3 to the bit line BL. As a result, the voltage $V_{BL}$ of the bit line BL increases from 0 V to V2 V shown in FIG. 4.

Since the overlapped area of the opposite electrodes of the ferroelectric capacitor 9 in the dummy cell 7 is half that of the ferroelectric capacitor 3 in the memory cell 1, and the logic "1" is written in the ferroelectric capacitor 9 in an initial condition, the voltage $V_{/BL}$ of the bit line /BL becomes an intermediate level between V1 and V2. This intermediate voltage may be the reference voltage (operable as a function of the dummy cell).

Therefore, when the logic "1" is previously written in the ferroelectric capacitor 3, since the voltage $V_{BL}$ (=V1) of the bit line BL is larger than the voltage $V_{/BL}$ of the bit line /BL, the sense amplifier 13 increases the voltage $V_{BL}$ of the bit line BL to the voltage VCC, and decreases the voltage $V_{/BL}$ of the bit line /BL to 0 V.

On the contrary, when the logic "0" is previously written in the ferroelectric capacitor 3, since the voltage $V_{BL}$ (=V2) of the bit line BL is smaller than the voltage $V_{/BL}$ of the bit line /BL, the sense amplifier 13 decreases the voltage $V_{BL}$ of the bit line BL to 0 V, and increases the voltage $V_{/BL}$ of the bit line /BL to the voltage VCC.

In this way, the dummy cell 7 is used for the reference voltage of all of the memory cells connected to the bit line. Therefore, in the above-discussed ferroelectric memory, the dummy cell 7 is driven every time when any memory cell connected to the bit line BL, for example, the memory cell 1, is selected. The dummy cell 8 is driven every time when any memory cell connected to the bit line /BL, for example, the memory cell 2, is selected.

Therefore, fatigue due to inversion (referred to as inversion fatigue, hereinafter) of the ferroelectric capacitors 9, 10 of the dummy cells 7, 8 increases as compared to the ferroelectric capacitors of the normal memory cell such as ferroelectric capacitors 3, 4. In this way, characteristics of the memory cell changes, and, thus, a reading-out margin decreases.

It is difficult to design the dummy cells taking into account the characteristics change due to the inversion fatigue. Therefore, there is a problem in that the prior-art ferroelectric memory shown in FIG. 1 may not stably operate for a long term.

There is another ferroelectric memory, in which the overlapped area of the opposite electrodes of the ferroelectric capacitors 9, 10 is twice that of the memory cells 3, 4, and a logic "0" is written in the ferroelectric capacitors 9, 10. However, this ferroelectric memory also has the same problem as that of the ferroelectric memory shown in FIG. 1.

Next, a description will be given of an operating method of the ferroelectric memory disclosed in the above-mentioned Japanese Patent Publication No. 7-13877. This ferroelectric memory is also disclosed in "Proposal of an operation method of a non-volatile ferroelectric memory having a Vcc/2 common plate", proceedings of EIC Electronics Society, C-509, 1995, in Japanese.

The proposed ferroelectric memory has a cell structure similar to a DRAM using the ferroelectric film for a capacitor. The ferroelectric memory is operative in a DRAM mode at a normal operation state, stores information by remanent polarization of the ferroelectric capacitor at a power-off state, and reads the information when the power source is supplied. Therefore, the ferroelectric memory is operable as a non-volatile memory.

In the following, a detailed description will be given of the above-discussed ferroelectric memory.

When the ferroelectric memory is operating in the DRAM mode, data is not stored by the remanent polarization of the capacitor, but is stored by a charge stored in linear capacitance. At this time a plate voltage level is set to a Vcc/2 voltage, and a voltage level of a storage node is set to Vcc or 0 V according to the data. In this case, when the ferroelectric memory operates in the DRAM mode, a refresh operation is required.

Subsequently, when the power source is turned off, the data is held as the remanent polarization of the ferroelectric capacitor.

Further, when the power source is supplied, the remanent polarization is changed to a storage charge. Therefore, after a reading operation is carried out in all memory cells in an FRAM mode, the memory is set to be the DRAM mode.

In this case, the plate voltage level is set to a Vcc/2 voltage, and the bit line is precharged to be 0 V. Further, a word line is selected, and a voltage level of the selected word line is increased. When the bit line is connected to the capacitor, the voltage level of the bit line increases over 0 V. However, since a degree of the increase varies according to a direction of polarization inversion, the data may be discriminated by the variance. In this way, after the data in all memory cells is read out, the ferroelectric memory is set to be the DRAM mode.

However, there is also a problem in the ferroelectric memory disclosed in Japanese Patent Publication No. 7-13877. Different from the Ramtron method, when the data is read from the ferroelectric memory, the plate line is not driven, but the voltage level of the bit line is varied. In this case, in order to discriminate whether the polarization inversion occurs, the dummy cell for generating the reference voltage is required.

Therefore, characteristics of the dummy cell influences on a reliability of the reading operation. Particularly, since a voltage applied to the capacitor is relatively small, i.e., Vcc/2, for compatibility with the DRAM mode, a signal voltage decreases, and, thus, there is a problem in that a reading error may easily occur.

SUMMARY OF THE INVENTION

It is an object of the present invention to provide a ferroelectric memory and a method of reading data from the ferroelectric memory. The ferroelectric memory does not need a dummy cell which is used for detecting data read out from a memory cell in a prior-art ferroelectric memory. Also, a stable operation of the ferroelectric memory can be carried out for a long term.

It is another object of the present invention to provide a ferroelectric memory using a dummy cell and a method of reading data from the ferroelectric memory using the dummy cell. Even in the ferroelectric memory using the dummy cell, fatigue of the dummy cell may be reduced, and a stable operation for a long term cell can be achieved.

This permits the disadvantages described above to be eliminated.

The object described above is achieved by a method of reading data from a ferroelectric memory having a memory cell which uses a ferroelectric capacitor as a storage medium, the method comprising the steps of: (a) successively applying first and second electric fields having opposite directions to the ferroelectric capacitor, wherein polarization of the ferroelectric capacitor is changed according to a variation of the first and second electric fields; and (b) reading out the data stored in the memory cell by detecting a variation of the polarization of the ferroelectric capacitor.

The object described above is also achieved by a method of reading data from a ferroelectric memory having a memory cell, the memory cell including a transmission gate having a first charge input-and-output port connected to a data line and a second charge input-and-output port, and a ferroelectric capacitor having a first electrode connected to the second charge input-and-output port and a second electrode connected to a driving voltage line, the method comprising the steps of: (a) controlling the transmission gate to be non-conductive; (b) precharging the data line; (c) controlling the transmission gate to be conductive; (d) applying a driving voltage to the second electrode of the ferroelectric capacitor through the driving voltage line to successively apply first and second electric fields having opposite directions to the ferroelectric capacitor, wherein polarization of the ferroelectric capacitor is changed according to a variation of the first and second electric fields; and (e) reading out the data stored in the memory cell to the data line.

According to the above-mentioned method of reading the data in the ferroelectric memory, the data read out from the memory cell may be detected in the same way as that of, for example, a dynamic random access memory (DRAM) using a method of precharging the bit line to a voltage VCC (power-source voltage)/2. Therefore, the method according to the present invention does not need a dummy cell.

The object described above is also achieved by a ferroelectric memory comprising a memory cell which uses a ferroelectric capacitor as a storage medium, the memory cell having: an applying part for applying first and second electric fields having opposite directions to the ferroelectric capacitor, wherein polarization of the ferroelectric capacitor is changed according to a variation of the first and second electric fields; and a reading part for reading out data stored in the memory cell by detecting a variation of the polarization of the ferroelectric capacitor.

The object described above is also achieved by a ferroelectric memory comprising: a memory cell including: a transmission gate having a first charge input-and-output port connected to a data line and a second charge input-and-output port; and a ferroelectric capacitor having a first electrode connected to the second charge input-and-output port and a second electrode connected to a driving voltage line; a precharging part for precharging the data line; and a driving-voltage applying part for applying a driving voltage to the second electrode of the ferroelectric capacitor through the driving voltage line to successively apply first and second electric fields having opposite directions to the ferroelectric capacitor, wherein polarization of the ferroelectric capacitor is changed according to a variation of the first and second electric fields, and a driving-voltage applying operation of the driving-voltage applying part is carried out after processes in which the transmission gate is controlled to be non-conductive, the data line is precharged by the precharging part, and the transmission gate is controlled to be conductive; wherein data stored in the memory cell is read out to the data line by successively applying the first and second electric fields to the ferroelectric capacitor after the processes in which the transmission gate is controlled to be non-conductive, the data line is precharged, and the transmission gate is controlled to be conductive.

According to the above-mentioned ferroelectric memory, the data read out from the memory cell may be detected in the same way as that of, for example, the DRAM using the method of precharging the bit line to the voltage VCC/2. Therefore, the ferroelectric memory according to the present invention does not need the dummy cell.

The object described above is also achieved by the method discussed above and the ferroelectric memory discussed above, wherein the data line has parasitic capacitance $C_{BL}$, the parasitic capacitance $C_{BL}$ being set to be equal to or less than a value $C_{BL}$ in which a voltage difference generated in the data line when a logic "1" and a logic "0" are read out is substantially maximized.

The object described above is also achieved by the method discussed above and the ferroelectric memory discussed above, wherein one of the first and second electric fields is larger than an internal power-supply voltage, and when the data is read out, a voltage generated in the data line increases when compared with a case where the one of the first and second electric fields is substantially the same as the internal power-supply voltage.

According to the above-mentioned ferroelectric memory, the ratio of the capacitance in the bit-line and the capacitance of the ferroelectric capacitor is properly adjusted, and the driving voltage of the plate line is increased more than the power-supply voltage so as to generate a larger reading-out signal in the bit line. Therefore, a memory device operable in a stable condition for a long term may be provided.

The object described above is also achieved by a method of reading data from a ferroelectric memory having a memory cell which uses a ferroelectric capacitor as a storage medium and a dummy cell which uses a ferroelectric capacitor, wherein the data is written in the ferroelectric memory by means of a direction of the ferroelectric capacitor in the memory cell, the method comprising the steps of: (a) precharging data lines at ground level; (b) applying a first driving voltage to the ferroelectric capacitor in the memory cell; (c) generating one of first and second voltages to a data line according to the data stored in the memory cell; (d) applying a second driving voltage less than the first driving voltage to the ferroelectric capacitor in the dummy cell to generate a reference voltage; and (e) discriminating the first and second voltages generated in the step (c) based on the reference voltage to read out the data.

The object described above is also achieved by a ferroelectric memory having a memory cell which uses a ferroelectric capacitor as a storage medium and a dummy cell which uses a ferroelectric capacitor, wherein the data is written in the ferroelectric memory according to a direction of the ferroelectric capacitor in the memory cell, and when the data is read out, one of first and second voltages is provided to a data line by means of the data, the ferroelectric memory comprising: a first circuit for applying a first driving voltage to the ferroelectric capacitor in the memory cell; a second circuit for applying a second driving voltage less than the first driving voltage to the ferroelectric capacitor in the dummy cell to generate a reference voltage; and a third circuit for discriminating the first and second voltages provided when the data is read out, based on the reference voltage to read out the data.

According to the above-mentioned ferroelectric memory using the dummy cell according to the present invention, the driving voltage of the ferroelectric capacitor in the dummy cell is set to be lower than that of the ferroelectric capacitor in the memory cell. Therefore, inversion fatigue of the dummy cell is reduced, and, thus, a stable, long term data writing-in-and-reading-out operation may be expected.

The object described above is also achieved by a method of reading data from a non-volatile ferroelectric memory having a ferroelectric capacitor, the non-volatile ferroelectric memory is substantially operative in a DRAM mode at a normal operation time and holds data by remanent polarization of the ferroelectric capacitor at a power-off state, the method comprising the steps of: (a) setting voltage levels of a plate electrode and a bit line to be substantially half of a power source voltage (Vcc) when a power source is supplied; and (b) successively applying to the voltage level of the plate electrode Vcc/2→(Vcc/2Vα)→(Vcc−Vβ)→Vcc/2, where Vα and Vβ are respectively first and second given voltage; wherein when the power source is supplied, a storage state of the data in all memory cells is changed from the remanent polarization to a storage charge holding information in the DRAM mode.

The object described above is also achieved by a non-volatile ferroelectric memory having a ferroelectric capacitor, the non-volatile ferroelectric memory is substantially operative in a DRAM mode at a normal operation time and holds data by remanent polarization of the ferroelectric capacitor at a power-off state, the memory comprising: a first voltage setting part for setting voltage levels of a plate electrode and a bit line to be substantially half of a power source voltage (Vcc) when a power source is supplied; and a second voltage setting part for successively applying to the voltage level of the plate electrode Vcc/2→(Vcc/2+Vα)→ (Vcc−Vβ)→Vcc/2, where Vα and Vβ are respectively first and second given voltage; wherein when the power source is supplied, a storage state of the data in all memory cells is changed from the remanent polarization to a storage charge holding information in the DRAM mode.

According to the above-mentioned method of reading data from the non-volatile ferroelectric memory and the non-volatile ferroelectric memory according to the present invention, when the power source is supplied, the remanent polarization of the all memory cells is changed to the storage charge, and, thus, a data recall operation is carried out. Therefore, regardless of characteristics of the dummy cell, a stable data reading-and-rewriting operation may be carried out.

Other objects and further features of the present invention will be apparent from the following detailed description when read in conjunction with the accompanying drawings.

BRIEF DESCRIPTION OF THE DRAWINGS

FIG. 31A shows variation of the plate-line voltage $V_{PL}$, FIG. 31B shows polarization variation when the logic "1" is read out from the ferroelectric capacitor, and FIG. 31C shows polarization variation when the logic "0" is read out from the ferroelectric capacitor;

FIG. 33A shows a case where the logic "1" is read out from the ferroelectric capacitor, and FIG. 33B shows a case where the logic "0" is read out from the ferroelectric capacitor;

FIG. 35A shows variation of the plate-line voltage $V_{PL}$, FIG. 35B shows polarization variation when the logic "1" is read out from the ferroelectric capacitor, and FIG. 35C shows polarization variation when the logic "0" is read out from the ferroelectric capacitor;

DETAILED DESCRIPTION OF THE PREFERRED EMBODIMENTS

Figure 1:
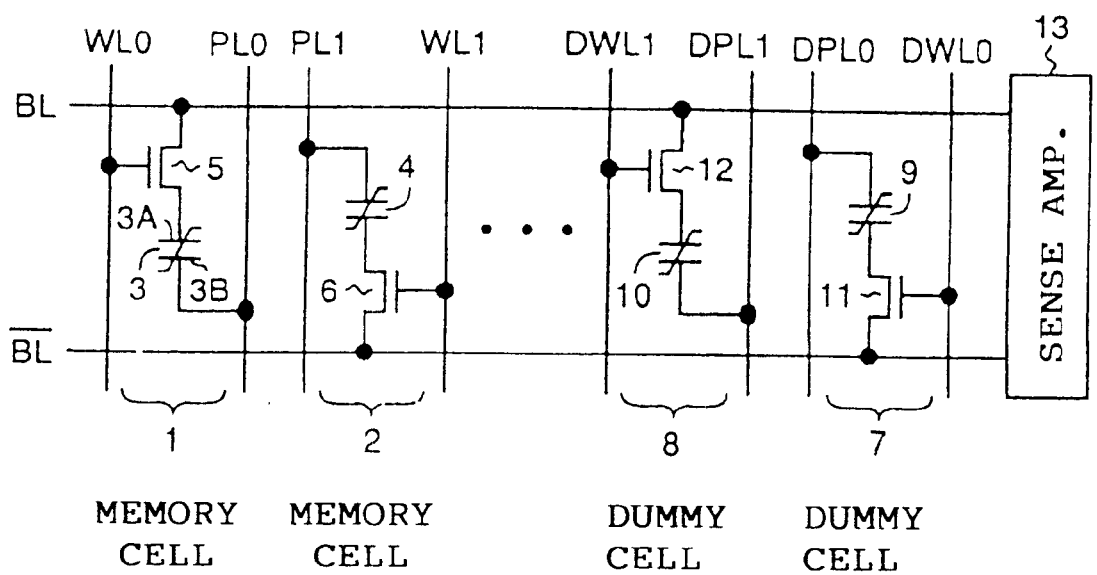
FIG. 1 shows a schematic diagram for illustrating a main part of one embodiment of a prior-art ferroelectric memory.
Figure 2:
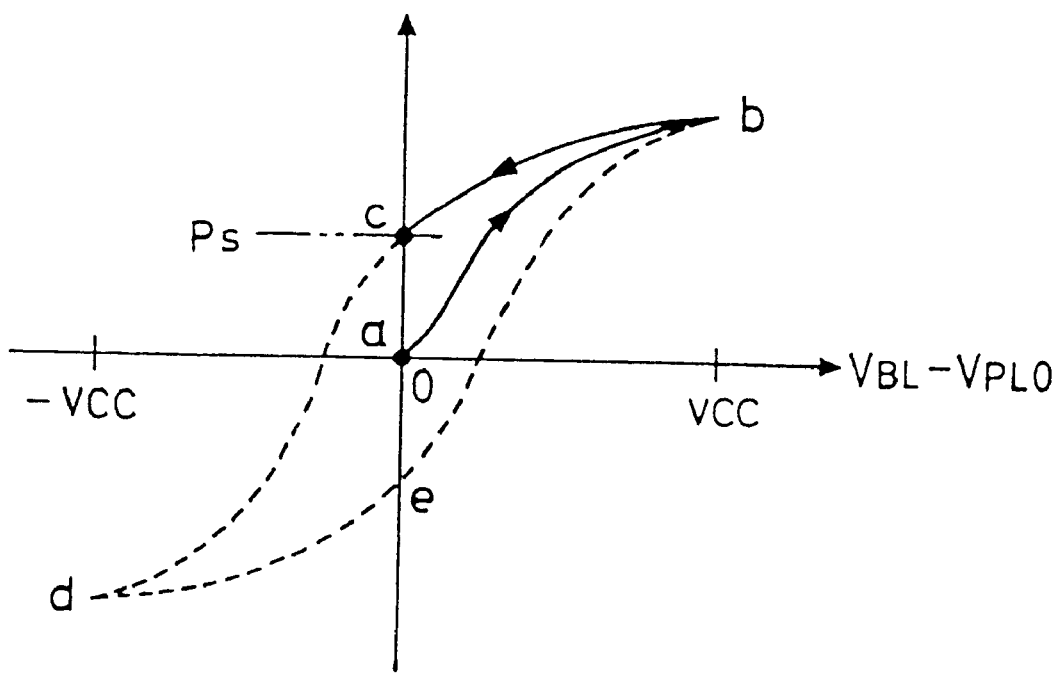
FIG. 2 and FIG. 3 show illustrations for explaining a data-writing sequence in a memory cell of the ferroelectric memory.
Figure 3:
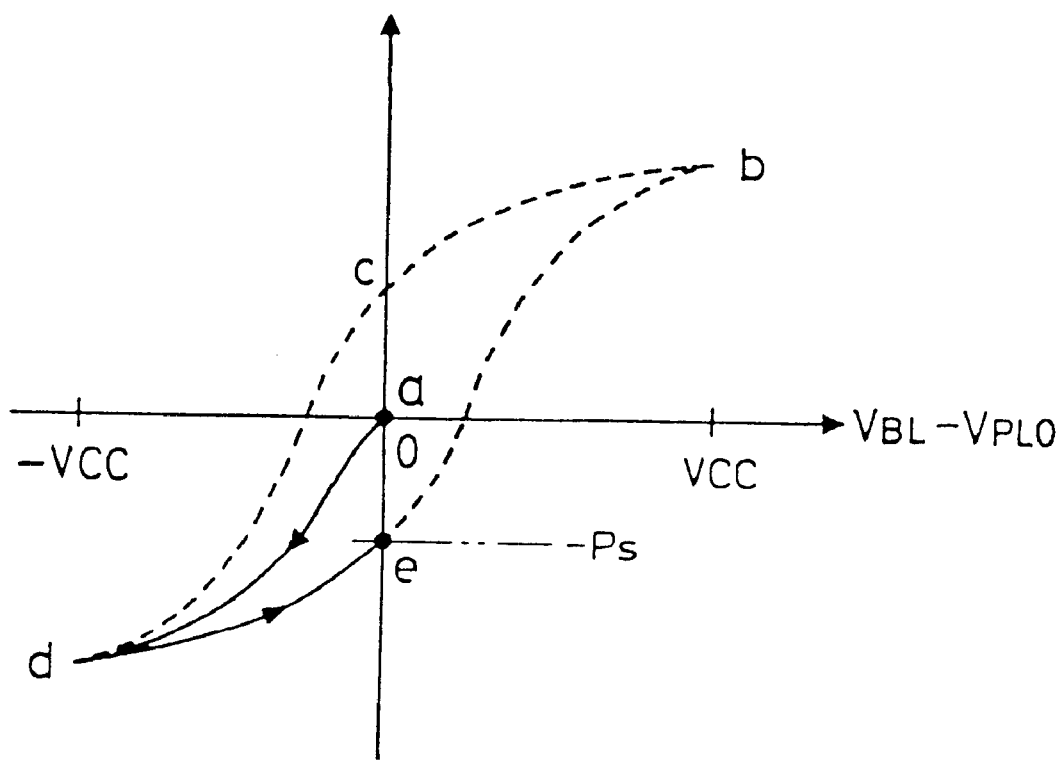
Figure 4:
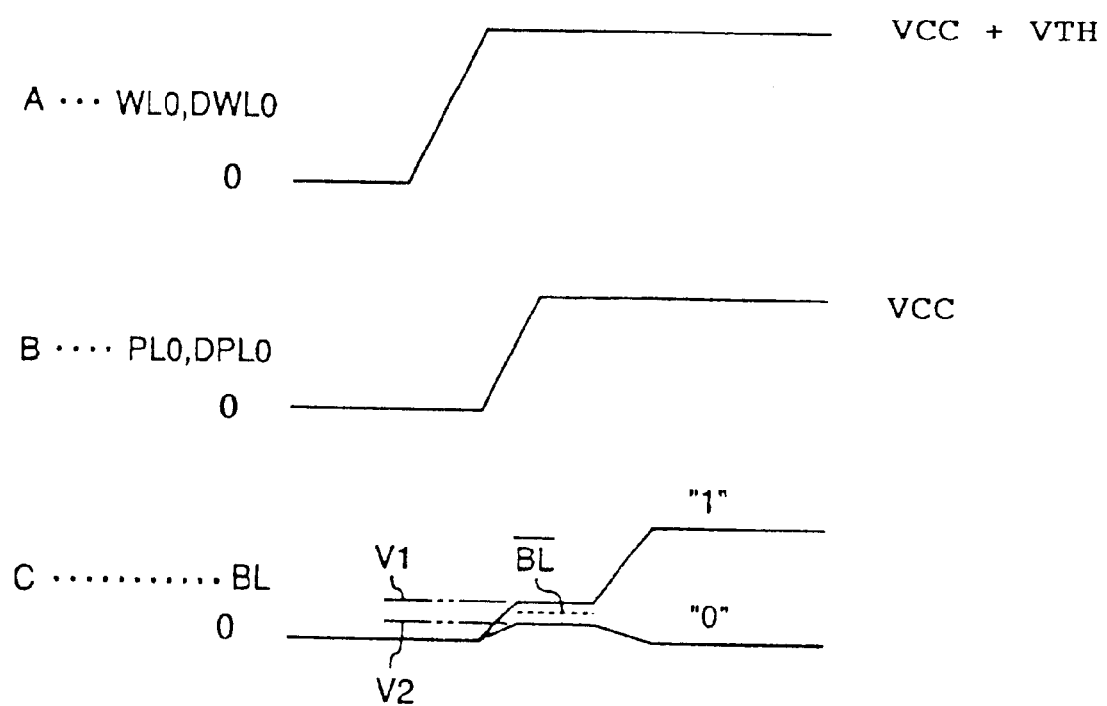
FIG. 4 shows waveforms for explaining a data-reading sequence from the memory cell of the ferroelectric memory.
Figure 5:
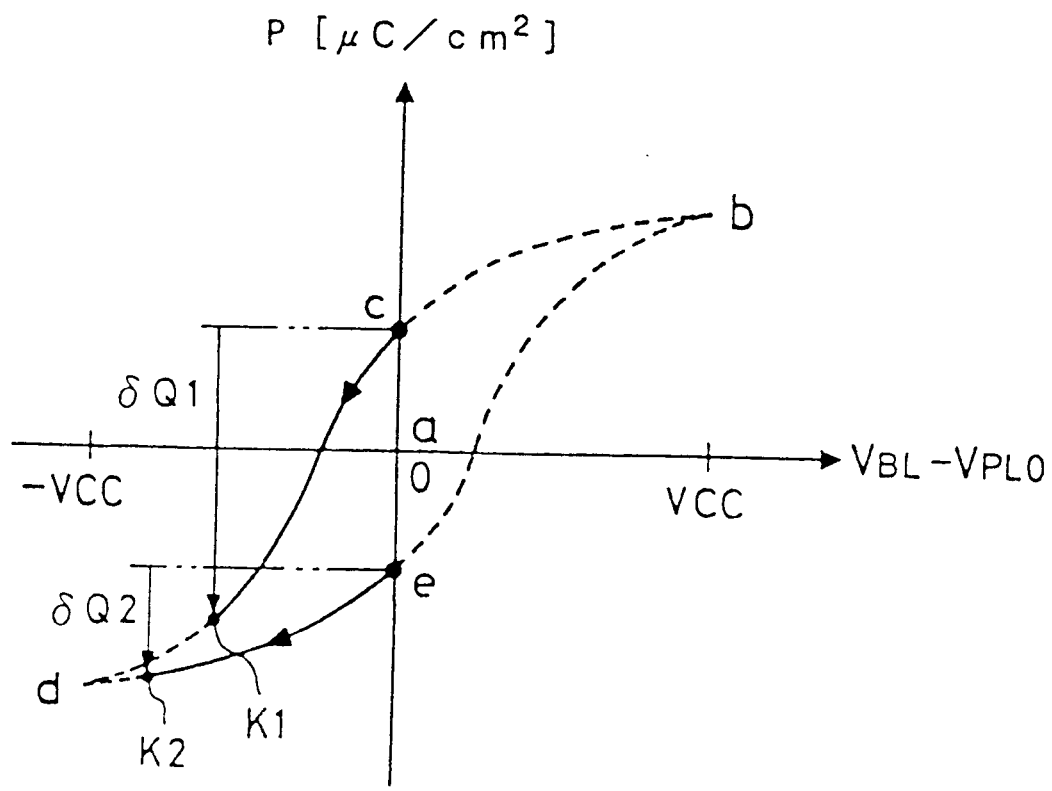
FIG. 5 shows an illustration for explaining the data-reading sequence from the memory cell of the ferroelectric memory.
Figure 6:
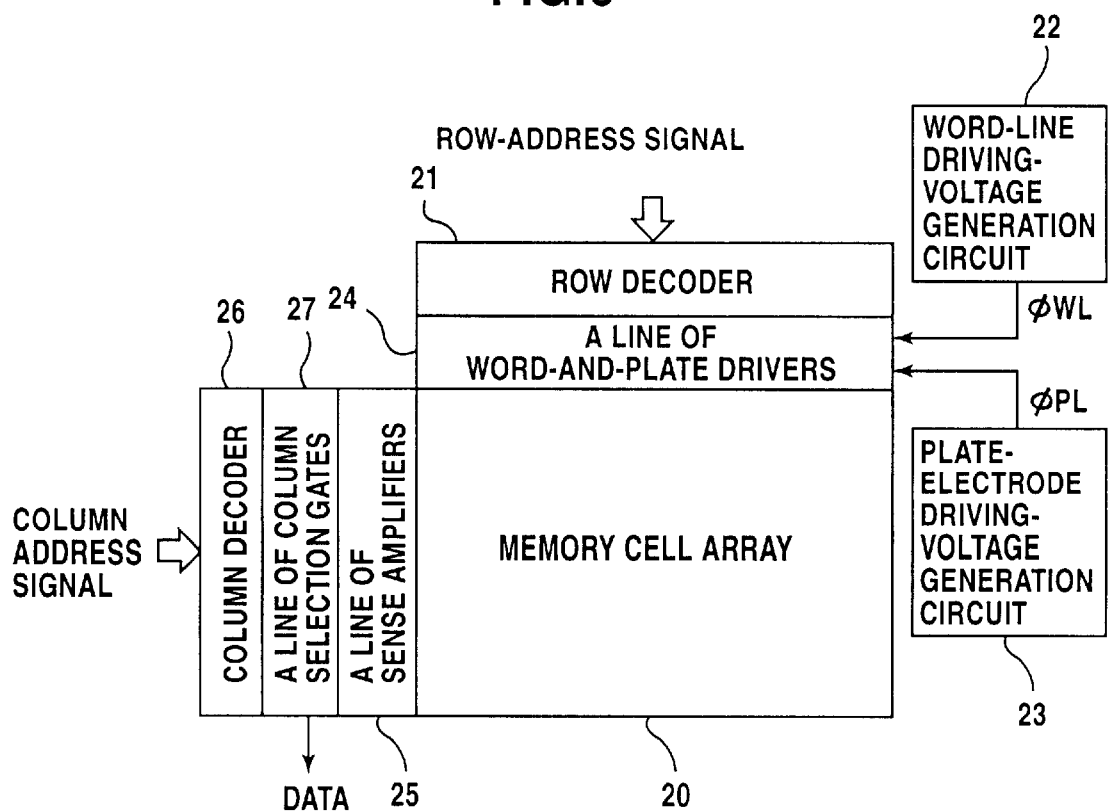
FIG. 6 shows a schematic diagram for illustrating a main part of one embodiment of a ferroelectric memory according to the present invention.

First, a description will be given of an embodiment of a ferroelectric memory according to the present invention. FIG. 6 shows a schematic diagram for illustrating a main part of one embodiment of the ferroelectric memory according to the present invention. The ferroelectric memory shown in FIG. 6 includes a memory-cell array 20 in which a plurality of memory cells are arranged and a row decoder 21 decoding a row-address signal to select a row.

The memory further is provided with a word-line driving-voltage generation circuit 22 generating a word-line driving voltage OWL which drives a word line, and a plate-electrode driving-voltage generation circuit 23 generating a plate-electrode driving voltage φPL which drives a plate electrode of a ferroelectric capacitor. The plate electrode of the ferroelectric capacitor constructs the memory cell.

Further, a line of word-and-plate drivers 24 in which word-and-plate drivers corresponding to the rows are arranged is provided in the memory. Each word-and-plate driver provides the word-line driving voltage φWL and the plate-electrode driving voltage φPL to the word line and the plate line corresponding to the row, respectively.

Also, a line of sense amplifiers 25 in which sense amplifiers are arranged is provided, each sense amplifier detecting data read out from the selected memory cell.

The ferroelectric memory further includes a column decoder 26 decoding a column-address signal to generate a column selection signal, and a line of column selection gates 27 in which a plurality of column selection gates are arranged. The column selection gate selects a column based on the column selection signal generated from the column decoder 26.

Figure 7:
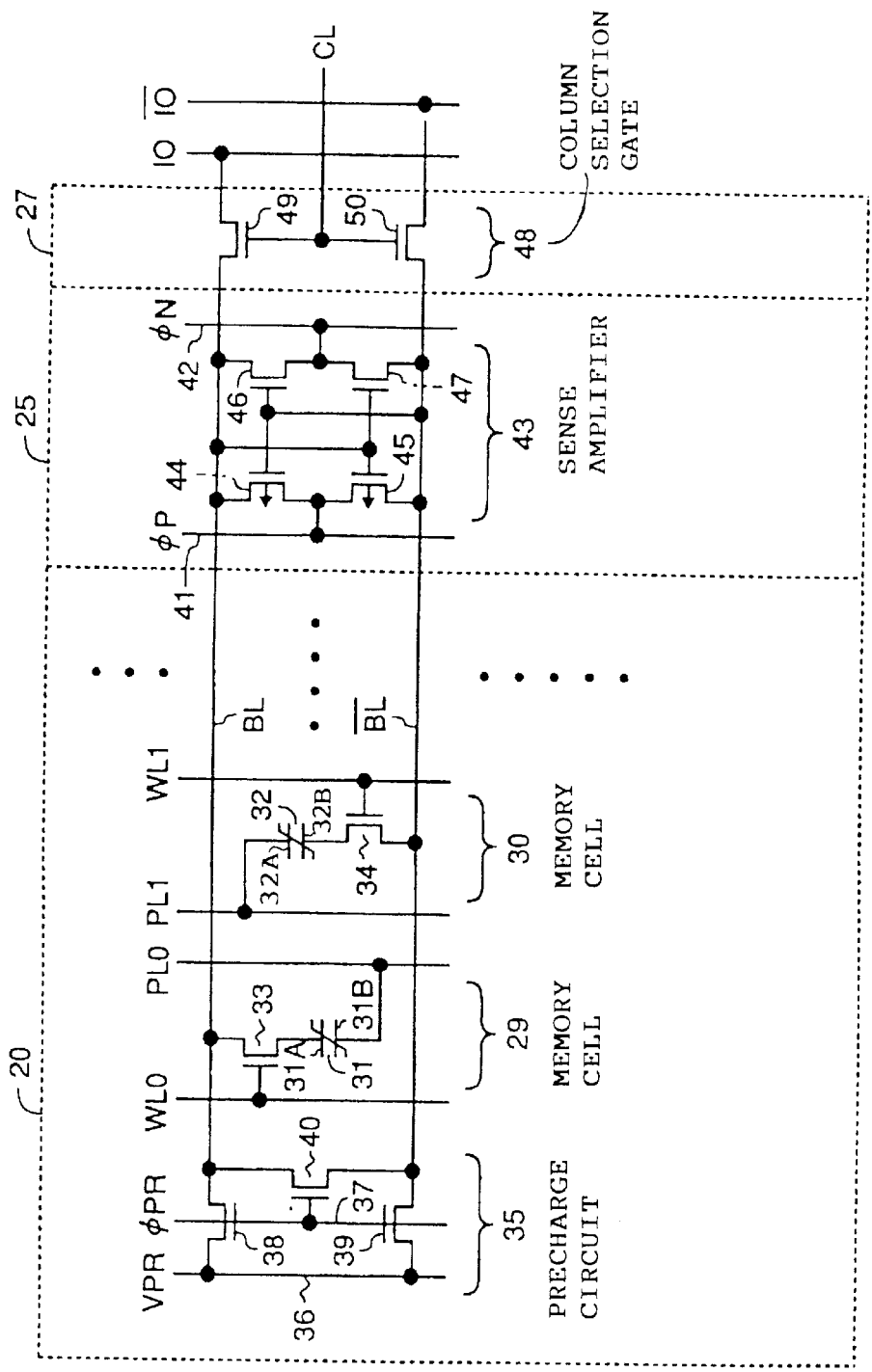
FIG. 7 shows a schematic diagram for illustrating main parts of a memory cell array 20, a line of sense amplifiers 25, and a line of column selection gates 27 shown in FIG. 6.

FIG. 7 shows a schematic diagram for illustrating main parts of the memory cell array 20, the line of sense amplifiers 25, and the line of column selection gates 27.

In FIG. 7, the memory cell array 20 includes memory cells 29, 30, which have ferroelectric capacitors 31, 32 constituting storage mediums and cell transistors 33, 34 formed by nMOS transistors constituting transmission gates.

Symbols "WL0 and WL1" indicate word lines for selecting the memory cell, the symbols "PL0 and PL1" indicate plate lines for driving a plate electrode of the ferroelectric capacitor of a selected memory cell, and symbols "BL and /BL" indicate bit lines constituting data lines (data transmission lines).

The memory cell array 20 further includes a precharge circuit 35 precharging the bit lines BL, /BL. The precharge circuit 35 has a precharge-voltage line 36 providing VCC (power source voltage)/2 as a precharge voltage VPR, a precharge-control-signal line 37 transmitting a precharge control signal φPR, and nMOS transistors 38 to 40 which are controlled to be in a conductive state (referred to as "ON", hereinafter) or a non-conductive state (referred to as "OFF", hereinafter) based on the precharge control signal φPR.

The line of sense amplifiers 25 includes a sense amplifier 43. The sense amplifier 43 has a sense-amplifier driving-voltage line 41 providing a sense-amplifier driving voltage φP, a sense-amplifier driving-voltage line 42 providing a sense-amplifier driving voltage φN, pMOS transistors 44, 45, and nMOS transistors 46, 47.

The line of column selection gates 27 includes a column selection gate 48. The column selection gate 48 has nMOS transistors 49, 50 controlled to be ON or OFF according to a column selection signal CL. Symbols "IO" and "/IO" indicate input and output buses used for a plurality of columns in common.

Figure 8:
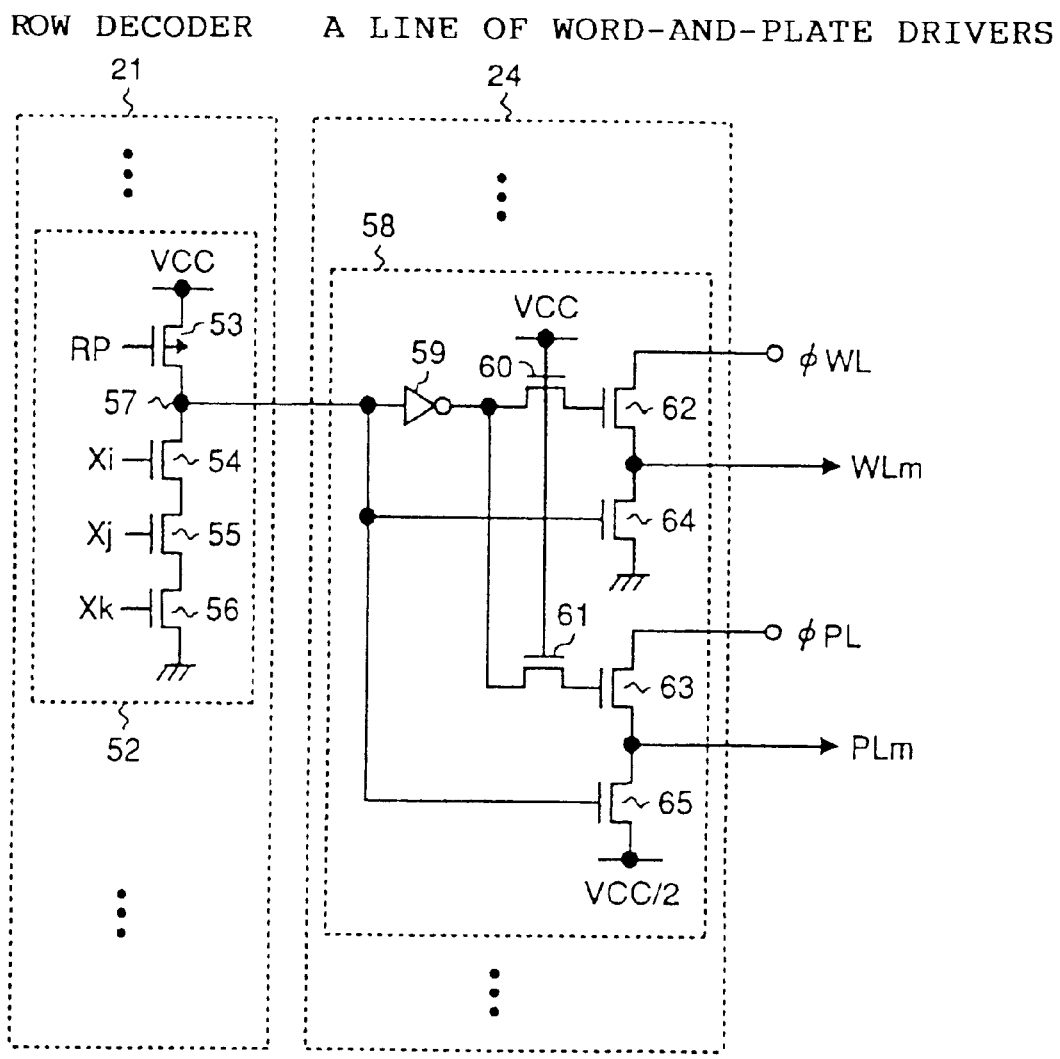
FIG. 8 shows a schematic diagram for illustrating main parts of a row decoder 21 and a line of word-and-plate drivers 24 shown in FIG. 6.

FIG. 8 shows a schematic diagram for illustrating main parts of the row decoder 21 and the line of word-and-plate drivers 24.

In FIG. 8, the row decoder 21 includes a dynamic-type NAND circuit 52 decoding column-address signals Xi, Xj, Xk to select a word line WLm and a plate line PLm. The NAND circuit 52 has a pMOS transistor 53 controlled to be ON or OFF by a reset signal PR, and nMOS transistors 54, 55, 56 of which ON and OFF states are controlled by the column-address signals Xi, Xj, Xk, respectively.

In the NAND circuit 52, before decoding, the reset signal RP is set to a low level (referred to as "an L level"), a state of the pMOS transistor 53 is set to ON, and a node 57 is precharged to the power source voltage VCC. When decoding is carried out, the reset signal RP is set to a high level (referred to as "an H level"), and the state of the pMOS transistor 53 is set to OFF.

When another word line except for the word line WLm is selected and the reset signal RP is set to the L level, one or all of the column-address signals Xi, Xj, Xk becomes the L level, and one or all of the nMOS transistors 54, 55, 56 are controlled to be OFF. As a result, a level of the node 57 is maintained at the power source voltage VCC.

On the other hand, when the word line WLm is selected, all of the column-address signals Xi, Xj, Xk become the H level, and all of the nMOS transistors 54, 55, 56 are controlled to be ON. As a result, the level of the node 57 becomes 0 V.

In FIG. 8, the line of word-and-plate drivers 24 includes a word-and-plate driver 58 driving the word line WLm and the plate line PLm. The word-and-plate driver 58 has an inverter 59 inverting an output of the NAND circuit 52, and nMOS transistors 60, 61 of which gate electrodes are provided with the power source voltage VCC.

The word-and-plate driver 58 further includes an nMOS transistor 62 having a gate provided with an output of the inverter 59 through the nMOS transistor 60, and a drain provided with the word-line driving voltage φWL.

The word-and-plate driver 58 still further includes an nMOS transistor 63 having a gate provided with the output of the inverter 59 through the nMOS transistor 61, and a drain provided with the plate-electrode driving voltage φPL.

Also, nMOS transistors 64, 65 are provided. The nMOS transistors 64, 65 are controlled to be ON or OFF by the output of the NAND circuit 52. A source of the nMOS transistor 64 is grounded, and a source of the nMOS transistor 65 is provided with VCC/2.

In this embodiment, the word line WLm is connected to a connection point of a source of the nMOS transistor 62 and a drain of the nMOS transistor 64, and the plate line PLm is connected to a connection point of a source of the nMOS transistor 63 and a drain of the nMOS transistor 65.

In the line of word-and-plate drivers 24, when the output of the NAND circuit 52 is VCC, namely, when another word line except the word line WLm is selected, states of the nMOS transistors 64, 65 become ON, the output of the inverter 59 switches to 0 V, states of the nMOS transistors 62, 63 are controlled to be OFF, the word line WLm becomes 0 V, and the plate line PLm becomes VCC/2.

On the other hand, when the output of the NAND circuit 52 is 0 V, namely, when the word line WLm is selected, the states of the nMOS transistors 64, 65 are controlled to be OFF, the output of the inverter 59 switches to VCC, the states of the nMOS transistors 62, 63 are controlled to be ON, the word line WLm is provided with the word-line driving voltage φWL through the nMOS transistor 61, and the plate line PLm is provided with the plate-electrode driving voltage φPL through the nMOS transistor 63.

Figure 9:
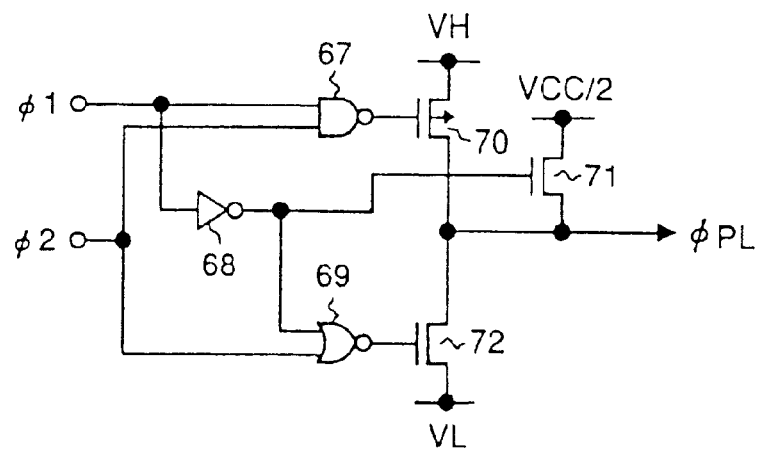
FIG. 9 shows a schematic diagram of a first embodiment of a plate-electrode driving-voltage generation circuit 23 shown in FIG. 6.

FIG. 9 shows a schematic diagram of a first embodiment of the plate-electrode driving-voltage generation circuit 23. The first embodiment of the plate-electrode driving-voltage generation circuit 23 generates the plate-electrode driving voltage φPL according to the plate-electrode driving-voltage generation control signals φ1, φ2.

In FIG. 9, the plate-electrode driving-voltage generation circuit 23 includes a NAND circuit 67 processing a NAND operation with the plate-electrode driving-voltage generation control signals φ1, φ2, an inverter 68 inverting the plate-electrode driving-voltage generation control signal φ1, and a NOR circuit 69 processing a NOR operation with an output of the inverter 68 and the plate-electrode driving-voltage generation control signal φ2.

The plate-electrode driving-voltage generation circuit 23 further includes a pMOS transistor 70 controlled to be ON or OFF by an output of the NAND circuit 67, an nMOS transistor 71 controlled to be ON or OFF by an output of the inverter 68, and an nMOS transistor 72 controlled to be ON or OFF by an output of the NOR circuit 69. A source of the pMOS transistor 70 is provided with a voltage VH, a drain of the nMOS transistor 71 is provided with VCC/2, and a source of the nMOS transistor 72 is provided with a voltage VL.

The voltage VH is set higher than VCC/2, and the voltage VL is set lower than VCC/2. For example, when VCC/2 is 1.5 V, the voltage VH may be 2.5 V, and the voltage VL may be 1.0 V.

In this embodiment, a drain of the pMOS transistor 70, a source of the nMOS transistor 71, and a drain of the nMOS transistor 72 are connected to each other at a connection point, and from the connection point, the plate-electrode driving voltage φPL is obtained.

The voltage VL and the voltage VH may be generated, for example, using an internal level-down power-supply converter and an internal level-up power-supply converter shown later in FIG. 36A and FIG. 36B.

Figure 10:
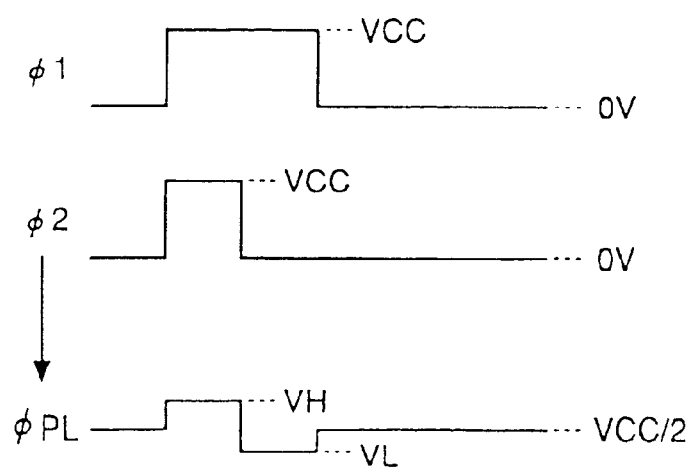
FIG. 10 shows waveforms for explaining an operation of the first embodiment of the plate-electrode driving-voltage generation circuit 23 shown in FIG. 9.

FIG. 10 shows waveforms for explaining an operation of the first embodiment of the plate-electrode driving-voltage generation circuit 23 shown in FIG. 9. FIG. 10 illustrates the waveforms of the plate-electrode driving-voltage generation control signals φ1, φ2 and the plate-electrode driving voltage φPL.

In the first embodiment of the plate-electrode driving-voltage generation circuit 23, when the plate-electrode driving-voltage generation control signals φ1, φ2 are at the L level, the output of the NAND circuit 67 becomes the H level, the output of the inverter 68 becomes the H level, and the output of the NOR circuit 69 becomes the L level.

As a result, in this case, the state of the pMOS transistor 70 is controlled to be OFF, the state of the nMOS transistor 71 is controlled to be ON, the state of the nMOS transistor 72 is controlled to be OFF, and the plate-electrode driving voltage φPL becomes VCC/2.

From the above situation, when the plate-electrode driving-voltage generation control signals φ1, φ2 become the H level, the output of the NAND circuit 67 becomes the L level, the output of the inverter 68 becomes the L level, and the output of the NOR circuit 69 is maintained at the L level.

As a result, in this case, the state of the pMOS transistor 70 is controlled to be ON, the state of the nMOS transistor 71 is controlled to be OFF, and the state of the nMOS transistor 72 is maintained at OFF. Accordingly, the plate-electrode driving voltage φPL becomes VH.

From the above situation, when the plate-electrode driving-voltage generation control signal φ2 becomes the L level, the output of the NAND circuit 67 becomes the H level, the output of the NOR circuit 69 becomes the H level, and the output of the inverter 68 is maintained at the L level.

As a result, in this case, the state of the pMOS transistor 70 is controlled to be OFF, the state of the nMOS transistor 72 is controlled to be ON, and the state of the nMOS transistor 71 is maintained to be OFF. Accordingly, the plate-electrode driving voltage φPL becomes VL.

From the above situation, when the plate-electrode driving-voltage generation control signal φ1 becomes the L level, the output of the NAND circuit 67 becomes the H level, and the output of the inverter 68 becomes the H level. Further, the output of the NOR circuit 69 becomes the L level.

As a result, in this case, the state of the nMOS transistor 71 is controlled to be ON, the state of the nMOS transistor 72 is controlled to be OFF, and the state of the pMOS transistor 70 is maintained at OFF. Accordingly, the plate-electrode driving voltage φPL returns to VCC/2.

Figure 11:
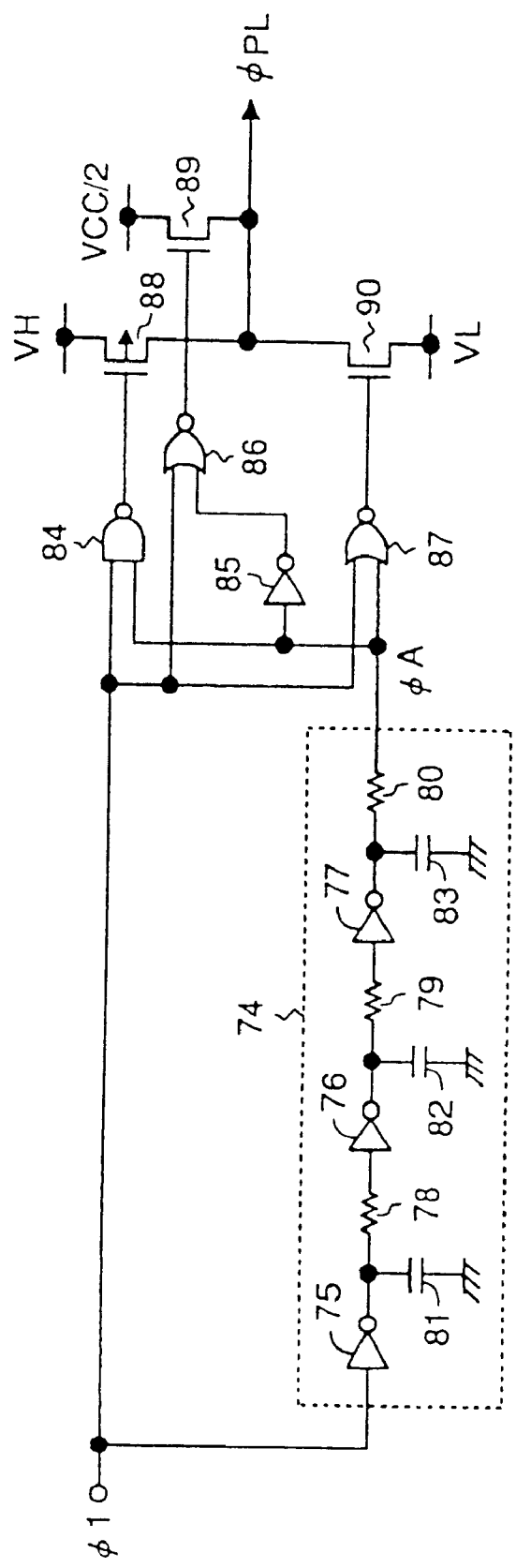
FIG. 11 shows a schematic diagram of a second embodiment of the plate-electrode driving-voltage generation circuit 23 shown in FIG. 6.

FIG. 11 shows a schematic diagram of a second embodiment of the plate-electrode driving-voltage generation circuit 23 shown in FIG. 6. The second embodiment of the plate-electrode driving-voltage generation circuit 23 generates the plate-electrode driving voltage φPL according to the plate-electrode driving-voltage generation control signal φ1.

In FIG. 11, the plate-electrode driving-voltage generation circuit 23 includes an inversion-and-delay circuit 74 inverting and delaying the plate-electrode driving-voltage generation control signal φ1. The inversion-and-delay circuit 74 has inverters 75 to 77, resistors 78 to 80, and capacitors 81 to 83.

The plate-electrode driving-voltage generation circuit 23 shown in FIG. 11 further includes a NAND circuit 84 processing a NAND operation with the plate-electrode driving-voltage generation control signal φ1 and an output φA of the inversion-and-delay circuit 74, an inverter 85 inverting the output φA of the inversion-and-delay circuit 74, a NOR circuit 86 processing a NOR operation with the plate-electrode driving-voltage generation control signal φ1 and an output of the inverter 85, and a NOR circuit 87 processing a NOR operation with the plate-electrode driving-voltage generation control signal φ1 and the output φA of the inversion-and-delay circuit 74.

The plate-electrode driving-voltage generation circuit 23 shown in FIG. 11 further includes a pMOS transistor 88 controlled to be ON or OFF by an output of the NAND circuit 84, an nMOS transistor 89 controlled to be ON or OFF by an output of the NOR circuit 86, and an nMOS transistor 90 controlled to be ON or OFF by an output of the NOR circuit 87. A source of the pMOS transistor 88 is provided with the voltage VH, a drain of the nMOS transistor 89 is provided with VCC/2, and a source of the nMOS transistor 90 is provided with the voltage VL.

In this embodiment, a drain of the pMOS transistor 88, a source of the nMOS transistor 89, and a drain of the nMOS transistor 90 are connected to each other at a connection point, and from the connection point, the plate-electrode driving voltage φPL is obtained.

Figure 12:
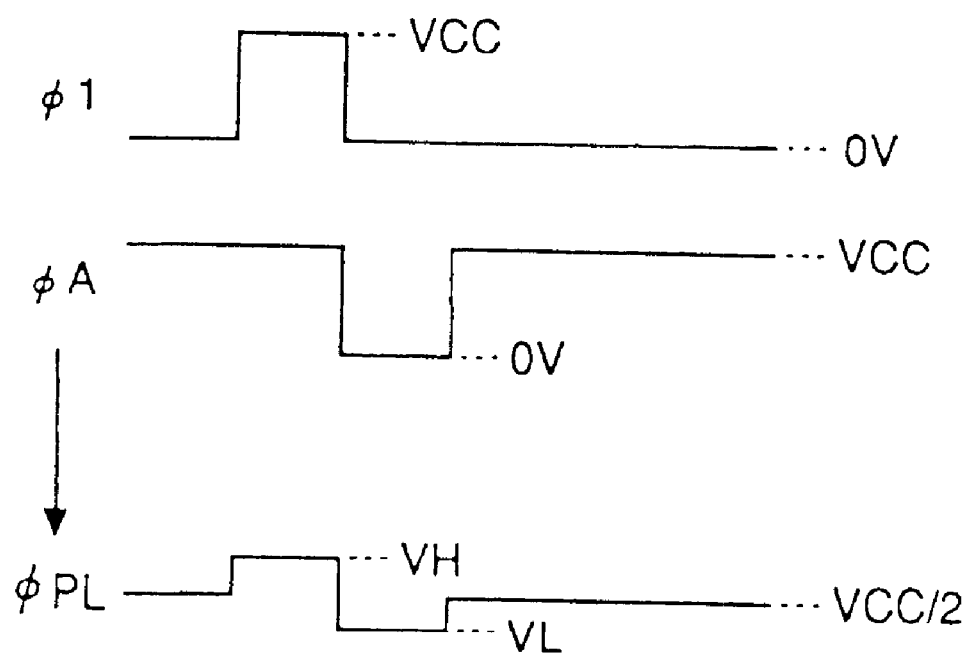
FIG. 12 shows waveforms for explaining an operation of the second embodiment of the plate-electrode driving-voltage generation circuit 23 shown in FIG. 11.

FIG. 12 shows waveforms for explaining an operation of the second embodiment of the plate-electrode driving-voltage generation circuit 23 shown in FIG. 11. FIG. 12 illustrates the waveforms of the plate-electrode driving-voltage generation control signal φ1, the output φA of the inversion-and-delay circuit 74 and the plate-electrode driving voltage φPL.

In the second embodiment of the plate-electrode driving-voltage generation circuit 23, when the plate-electrode driving-voltage generation control signal φ1 is at the L level, the output φA of the inversion-and-delay circuit 74 becomes the H level, the output of the NAND circuit 84 becomes the H level, the output of the inverter 85 becomes the L level, the output of the NOR circuit 86 becomes the H level and the output of the NOR circuit 87 becomes the L level.

As a result, in this case, a state of the pMOS transistor 88 is controlled to be OFF, a state of the nMOS transistor 89 is controlled to be ON, a state of the nMOS transistor 90 is controlled to be OFF, and the plate-electrode driving voltage φPL becomes VCC/2.

From the above situation, when the plate-electrode driving-voltage generation control signal φ1 becomes the H level, the output of the NAND circuit 84 becomes the L level, the output of the NOR circuit 86 becomes the L level, and the output of the NOR circuit 87 is maintained at the L level.

As a result, in this case, the state of the pMOS transistor 88 is controlled to be ON, the state of the nMOS transistor 89 is controlled to be OFF, and the state of the nMOS transistor 90 is maintained to be OFF. Accordingly, the plate-electrode driving voltage φPL becomes VH.

From the above situation, when the plate-electrode driving-voltage generation control signal φ1 becomes the L level and the output φA of the inversion-and-delay circuit 74 becomes the L level, the output of the NAND circuit 84 becomes the H level, the output of the inverter 85 becomes the H level, the output of the NOR circuit 87 becomes the H level, and the output of the NOR circuit 86 is maintained at the L level.

As a result, in this case, the state of the pMOS transistor 88 is controlled to be OFF, the state of the nMOS transistor 90 is controlled to be ON, and the state of the nMOS transistor 89 is maintained at OFF. Accordingly, the plate-electrode driving voltage φPL becomes VL.

From the above situation, when the output φA of the inversion-and-delay circuit 74 becomes the H level, the output of the inverter 85 becomes the L level, the output of the NOR circuit 86 becomes the H level, the output of the NOR circuit 87 becomes the L level, and the output of the NAND circuit 84 is maintained at the H level.

As a result, in this case, the state of the nMOS transistor 89 is controlled to be ON, the state of the nMOS transistor 90 is controlled to be OFF, and the state of the pMOS transistor 88 is maintained at OFF. Accordingly, the plate-electrode driving voltage φPL returns to VCC/2.

Figure 13:
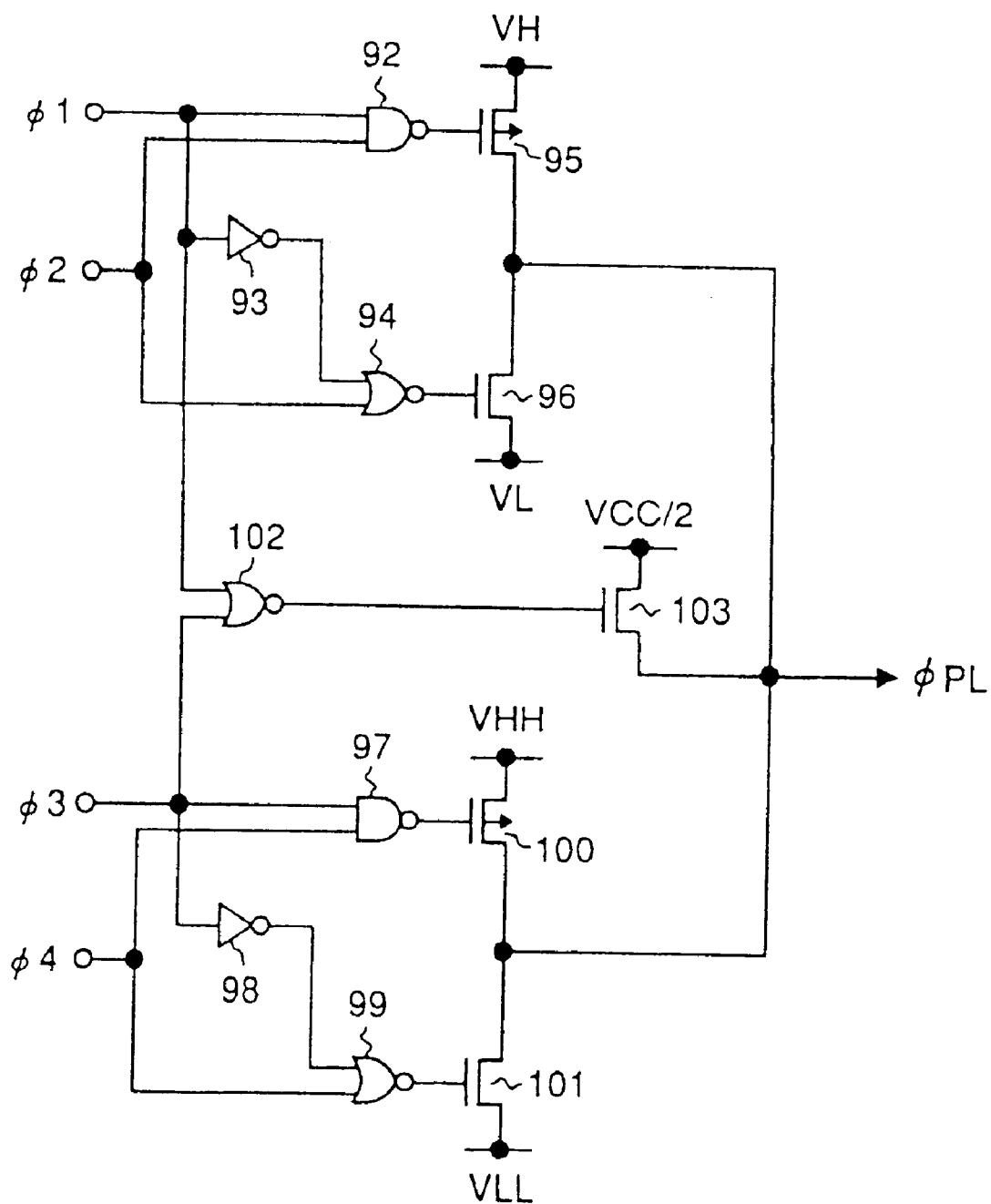
FIG. 13 shows a schematic diagram of a third embodiment of the plate-electrode driving-voltage generation circuit 23 shown in FIG. 6.

FIG. 13 shows a schematic diagram of a third embodiment of the plate-electrode driving-voltage generation circuit 23 shown in FIG. 6. The third embodiment of the plate-electrode driving-voltage generation circuit 23 generates the plate-electrode driving voltage φPL according to the plate-electrode driving-voltage generation control signals φ1, φ2, φ3, φ4.

In FIG. 13, the plate-electrode driving-voltage generation circuit 23 includes a NAND circuit 92 processing a NAND operation with the plate-electrode driving-voltage generation control signals φ1, φ2, an inverter 93 inverting the plate-electrode driving-voltage generation control signal φ1, and a NOR circuit 94 processing a NOR operation with an output of the inverter 93 and the plate-electrode driving-voltage generation control signal φ2.

With respect to the above-discussed gate circuits, the plate-electrode driving-voltage generation circuit 23 includes a pMOS transistor 95 controlled to be ON or OFF by an output of the NAND circuit 92, and an nMOS transistor 96 controlled to be ON or OFF by an output of the NOR circuit 94. A source of the pMOS transistor 95 is provided with the voltage VH, and a source of the nMOS transistor 96 is provided with the voltage VL.

Also, the plate-electrode driving-voltage generation circuit 23 includes a NAND circuit 97 processing a NAND operation with the plate-electrode driving-voltage generation control signals φ3, φ4, an inverter 98 inverting the plate-electrode driving-voltage generation control signal φ3, and a NOR circuit 99 processing a NOR operation with an output of the inverter 98 and the plate-electrode driving-voltage generation control signal φ4.

With respect to the above-discussed gate circuits, the plate-electrode driving-voltage generation circuit 23 includes a pMOS transistor 100 controlled to be ON or OFF by an output of the NAND circuit 97, and an nMOS transistor 101 controlled to be ON or OFF by an output of the NOR circuit 99. A source of the pMOS transistor 100 is provided with a voltage VHH, and a source of the nMOS transistor 101 is provided with a voltage VLL.

The voltage VHH is set higher than the voltage VH, and the voltage VLL is set lower than the voltage VL. For example, when VCC/2 is 1.5 V, the voltage VH is 2.5 V, the voltage VL is 1.0 V, the voltage VHH may be 3.0 V, and the voltage VLL may be 0 V.

Further, the plate-electrode driving-voltage generation circuit 23 includes a NOR circuit 102 processing a NOR operation with the plate-electrode driving-voltage generation control signals φ1, φ3, and an nMOS transistor 103 controlled to be ON or OFF by an output of the NOR circuit 102. A drain of the nMOS transistor 103 is provided with the voltage VCC/2.

In this embodiment, drains of the pMOS transistors 95, 100, drains of the nMOS transistors 96, 101, and a source of the nMOS transistor 103 are connected to each other at one connection point, and from the connection point, the plate-electrode driving voltage φPL is obtained.

Figure 14:
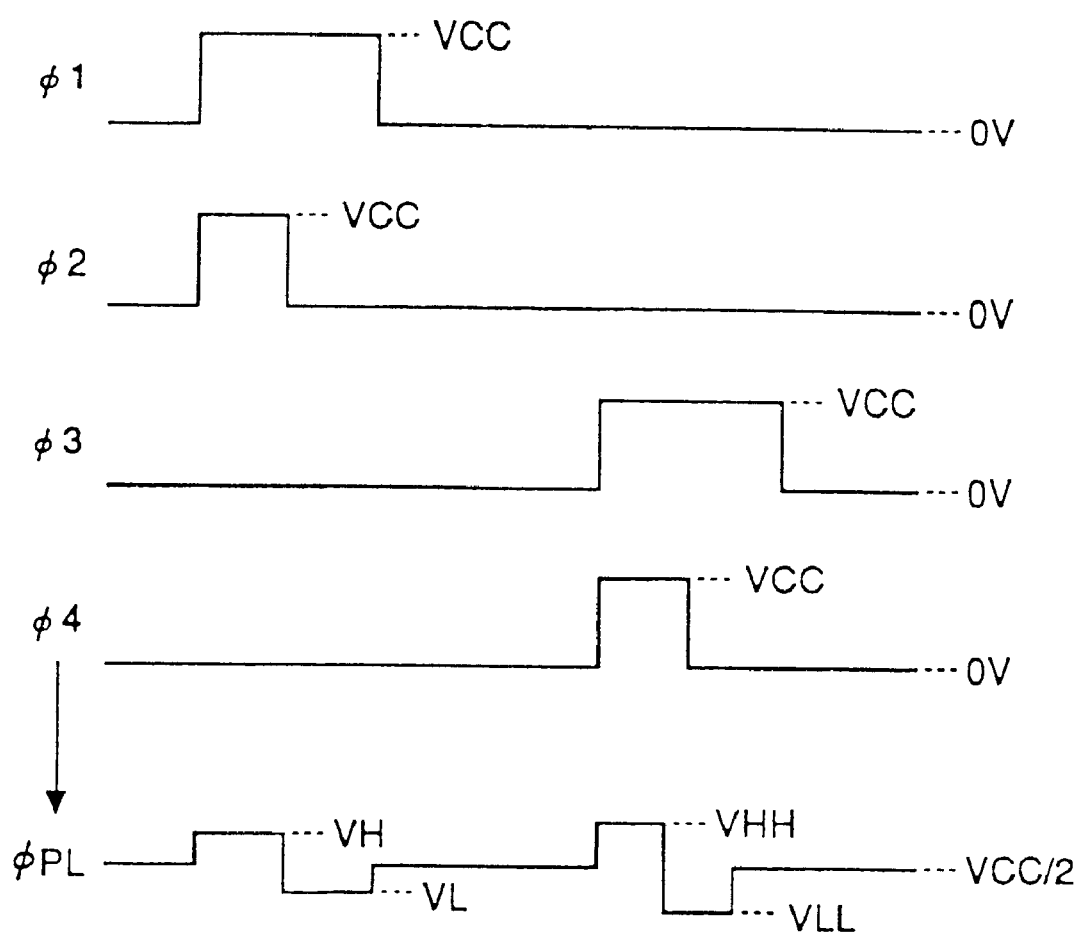
FIG. 14 shows waveforms for explaining an operation of the third embodiment of the plate-electrode driving-voltage generation circuit 23 shown in FIG. 13.

FIG. 14 shows waveforms for explaining an operation of the third embodiment of the plate-electrode driving-voltage generation circuit 23 shown in FIG. 13. FIG. 14 illustrates the waveforms of the plate-electrode driving-voltage generation control signals φ1, φ2, φ3, φ4, and the plate-electrode driving voltage φPL.

In the third embodiment of the plate-electrode driving-voltage generation circuit 23 shown in FIG. 13, when the plate-electrode driving-voltage generation control signals φ1, φ2, φ3, φ4 are at the L level, the output of the NAND circuit 92 becomes the H level, the output of the inverter 93 becomes the H level, the output of the NOR circuit 94 becomes the L level, the output of the NAND circuit 97 becomes the H level, the output of the inverter 98 becomes the H level, the output of the NOR circuit 99 becomes the L level and the output of the NOR circuit 102 becomes the H level.

As a result, in this case, states of the pMOS transistors 95, 100 are controlled to be OFF, states of the nMOS transistor 96, 101 are controlled to be OFF, a state of the nMOS transistor 103 is controlled to be ON, and, thus, the plate-electrode driving voltage φPL becomes VCC/2.

From the above situation, when the plate-electrode driving-voltage generation control signals φ1, φ2 become the H level, the output of the NAND circuit 92 becomes the L level, the output of the inverter 93 becomes the L level, the output of the NOR circuit 102 becomes the L level, the output of the NOR circuit 94 is maintained at the L level, the output of the NAND circuit 97 is maintained at the H level, the output of the inverter 98 is maintained at the H level, and the output of the NOR circuit 99 is maintained at the L level.

As a result, in this case, the state of the pMOS transistor 95 is controlled to be ON, the state of the nMOS transistor 103 is controlled to be OFF, the state of the pMOS transistor 100 is maintained at OFF, the states of the nMOS transistors 96, 101 are maintained at OFF and the plate-electrode driving voltage φPL becomes the voltage VH.

From the above situation, when the plate-electrode driving-voltage generation control signal φ2 becomes the L level, the output of the NAND circuit 92 becomes the H level, the output of the NOR circuit 94 becomes the H level, the output of the NAND circuit 97 is maintained at the H level, the output of the inverter 98 is maintained at the H level, the output of the NOR circuit 99 is maintained at the L level and the output of the NOR circuit 102 is maintained at the L level.

As a result, in this case, the state of the pMOS transistor 95 is controlled to be OFF, the state of the nMOS transistor 96 is controlled to be ON, the state of the pMOS transistor 100 is maintained at OFF, the states of the nMOS transistors 101, 103 are maintained at OFF, and, thus, the plate-electrode driving voltage φPL becomes the voltage VL.

From the above situation, when the plate-electrode driving-voltage generation control signal φ1 becomes the L level, the output of the inverter 93 becomes the H level, the output of the NOR circuit 94 becomes the L level, the output of the NOR circuit 102 becomes the H level, the output of the NAND circuit 92 is maintained at the H level, the output of the NAND circuit 97 is maintained at the H level, the output of the inverter 98 is maintained at the H level, and the output of the NOR circuit 99 is maintained at the L level.

As a result, in this case, the state of the nMOS transistor 96 is controlled to be OFF, the state of the nMOS transistor 103 is controlled to be ON, the states of the pMOS transistors 95, 100 are maintained at OFF, the state of the nMOS transistor 101 is maintained at OFF, and, thus, the plate-electrode driving voltage φPL returns to VCC/2.

From the above situation, when the plate-electrode driving-voltage generation control signals φ3, φ4 become the H level, the output of the NAND circuit 97 becomes the L level, the output of the inverter 98 becomes the L level, the output of the NOR circuit 99 is maintained at the L level, the output of the NAND circuit 92 is maintained at the H level, the output of the inverter 93 is maintained at the H level, and the output of the NOR circuit 94 is maintained at the L level.

As a result, in this case, the state of the pMOS transistor 100 is controlled to be ON, the state of the nMOS transistor 103 is controlled to be OFF, the state of the pMOS transistor 95 is maintained at OFF, the states of the nMOS transistors 96, 101 are maintained at OFF, and, thus, the plate-electrode driving voltage φPL becomes the voltage VHH.

From the above situation, when the plate-electrode driving-voltage generation control signal φ4 becomes the L level, the output of the NAND circuit 97 becomes the H level, the output of the NOR circuit 99 becomes the H level, the output of the NAND circuit 92 is maintained at the H level, the output of the inverter 93 is maintained at the H level, the output of the NOR circuit 94 is maintained at the L level and the output of the NOR circuit 102 is maintained at the L level.

As a result, in this case, the state of the pMOS transistor 100 is controlled to be OFF, the state of the nMOS transistor 101 is controlled to be ON, the state of the pMOS transistor 95 is maintained at OFF, the states of the nMOS transistors 96, 103 are maintained at OFF, and, thus, the plate-electrode driving voltage φPL becomes the voltage VLL.

From the above situation, when the plate-electrode driving-voltage generation control signal φ3 becomes the L level, the output of the inverter 98 becomes the H level, the output of the NOR circuit 99 becomes the L level, the output of the NOR circuit 102 becomes the H level, the output of the NAND circuit 97 is maintained at the H level, the output of the NAND circuit 92 is maintained at the H level, the output of the inverter 93 is maintained at the H level, and the output of the NOR circuit 94 is maintained at the L level.

As a result, in this case, the state of the nMOS transistor 101 is controlled to be OFF, the state of the nMOS transistor 103 is controlled to be ON, the state of the pMOS transistors 95, 100 are maintained at OFF, the state of the nMOS transistor 96 is maintained at OFF, and, thus, the plate-electrode driving voltage φPL returns to VCC/2.

Figure 15:
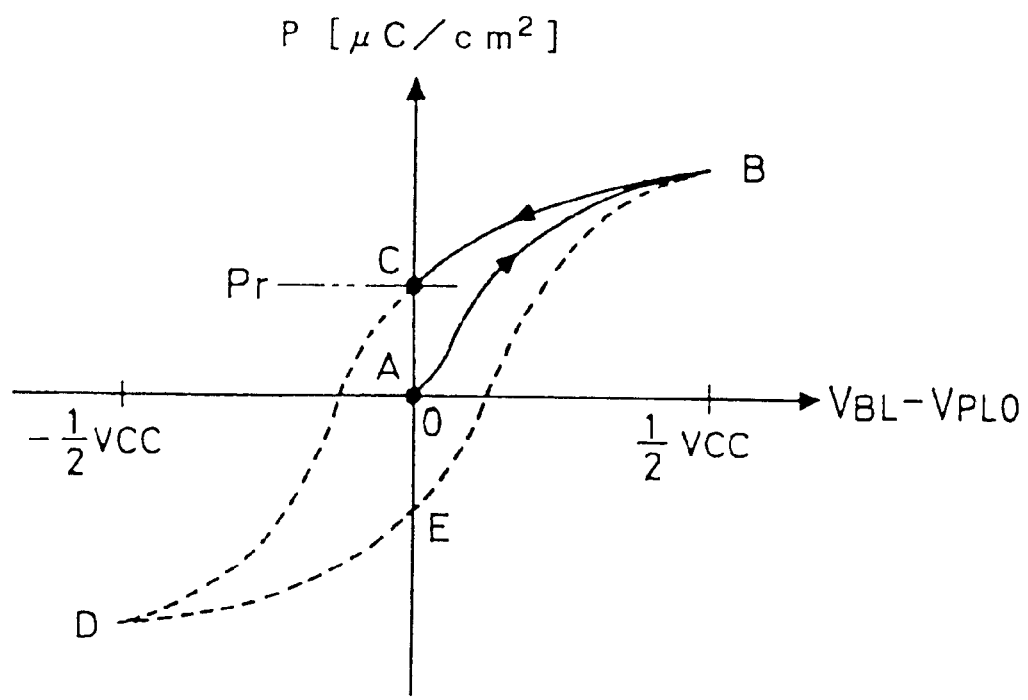
FIG. 15 and FIG. 16 show illustrations for explaining a data-writing sequence in the memory cell of the embodiment of the ferroelectric memory according to the present invention.
Figure 16:
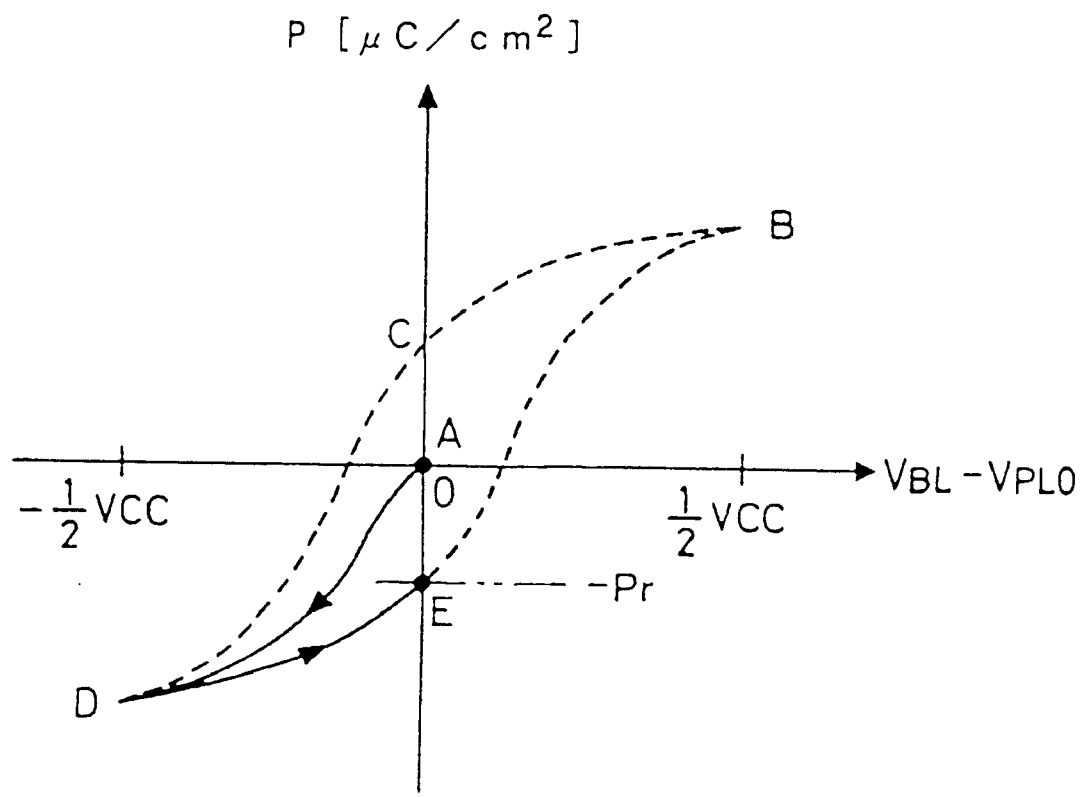

FIG. 15 and FIG. 16 show illustrations for explaining a data-writing sequence in the memory cell of the embodiment of the ferroelectric memory according to the present invention. These drawings show examples of the data-writing sequence regarding the memory cell 29 shown in FIG. 7. A horizontal axis indicates the voltage of the bit line BL to the voltage of the plate line PL0, $V_{BL}-V_{PL0}$. A vertical axis indicates polarization P of the ferroelectric capacitor 31.

For example, when the logic "1" is written into the memory cell 29, the voltage $V_{PL0}$ of the plate PL0 is set to VCC/2, and the cell transistor 33 is set to be conductive. Under this condition, the voltage $V_{BL}$ of the bit line BL is changed from VCC/2 to VCC (wherein the cell transistor turns off), and is subsequently changed to VCC/2.

In the above sequence, a state of the polarization P of the ferroelectric capacitor 31 changes, as shown in FIG. 15, from a point A to a point B, and then to a point C by a leak of the cell transistor. At the point C, the polarization P of the ferroelectric capacitor 31 becomes a positive polarization Pr. As a result, the logic "1" is stored in the ferroelectric capacitor 31. A closed curved line of B to C to D to E to B indicates a hysteresis loop.

On the other hand, when the logic "0" is written into the memory cell 29, the voltage $V_{PL0}$ of the plate line PL0 is set to VCC/2, and the cell transistor 33 is set to be conductive. Under this condition, the voltage $V_{BL}$ of the bit line BL is changed from VCC/2 to 0 V (wherein the cell transistor turns off), and is further changed to VCC/2.

In the above sequence, a voltage of a storage electrode 31A to that of a plate electrode 31B of the ferroelectric capacitor 31 changes from 0 V to −VCC/2, and is subsequently changed to 0 V by a leak of the cell transistor. The state of the polarization P of the ferroelectric capacitor 31 changes, as shown in FIG. 16, from a point A to a point D, and then to a point E. At the point E, the polarization P of the ferroelectric capacitor 31 becomes a negative polarization −Pr. As a result, the logic "0" is stored in the ferroelectric capacitor 31.

Figure 17:
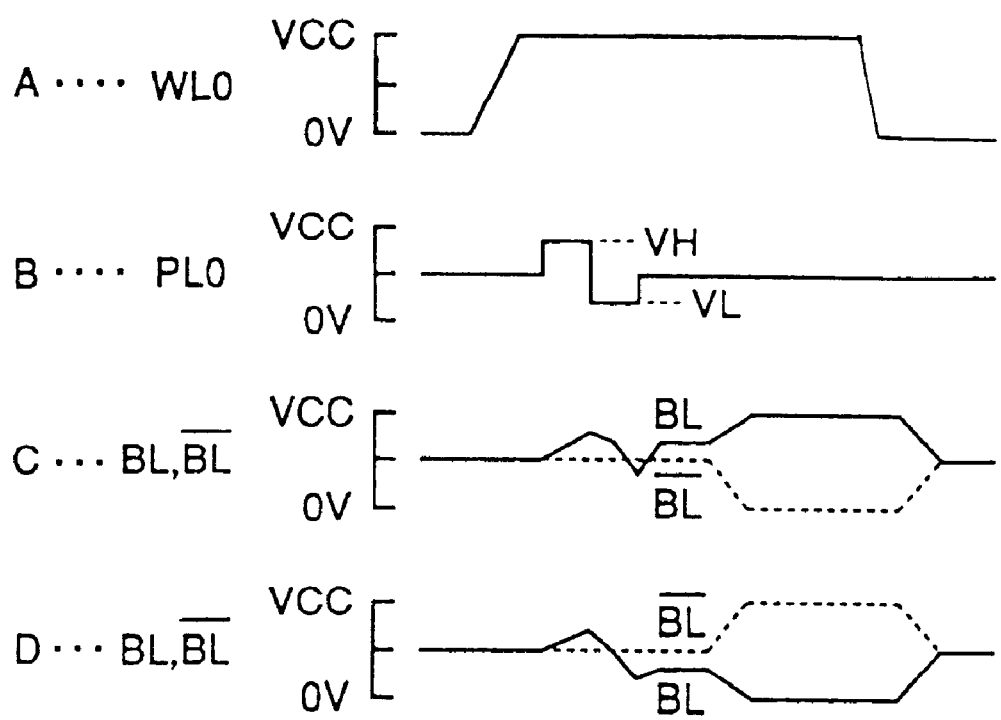
FIG. 17 shows waveforms for explaining a data-reading sequence from the memory cell of the embodiment of the ferroelectric memory according to the present invention.

In the following, a description will be given of a first embodiment of a method of reading out data in the ferroelectric memory according to the present invention. FIG. 17 shows waveforms for explaining a data-reading sequence from the memory cell of the embodiment of the ferroelectric memory according to the present invention. The drawing shows an example of the data-reading sequence regarding the memory cell 29 shown in FIG. 7. In FIG. 17, a waveform A indicates a variation of the voltage of the word line WL0, a waveform B indicates a variation of the voltage of the plate line PL0, waveforms C indicate variations of the voltages of the bit lines BL, /BL in a case where the logic "1" is written in the ferroelectric capacitor 31, and waveforms D indicate variations of the voltages of the bit lines BL, /BL in a case where the logic "0" is written in the ferroelectric capacitor 31.

Before the data is read out from the memory cell 29, the precharge control signal φPR is previously set to the H level, the states of the nMOS transistors 38 to 40 are previously controlled to be ON, and the bit lines BL, /BL are precharged to VCC/2.

Further, through the word-and-plate driver, the word line WL0 is increased to VCC+VTH (VTH is a threshold voltage of the cell transistor) to control the cell transistor 33 to be ON. Subsequently, through the word-and-plate driver, as shown in FIG. 10, FIG. 12, and FIG. 14, the plate-electrode driving voltage φPL is changed from VCC/2 to the voltage VH, to the voltage VL, and to VCC/2.

Figure 18A:
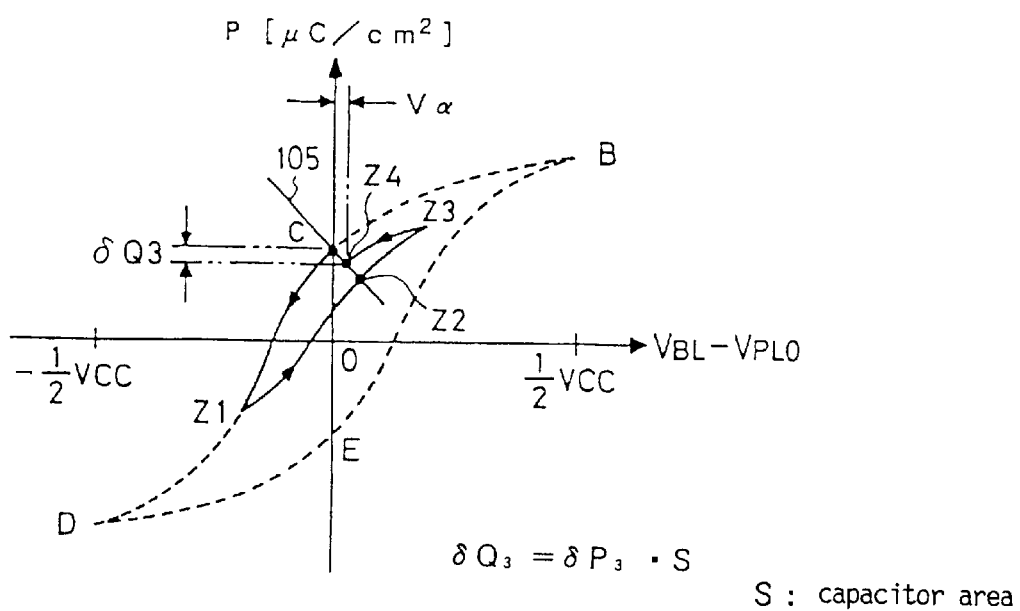
FIG. 18A shows a variation of polarization P of a ferroelectric capacitor 31 shown in FIG. 7.
Figure 18B:
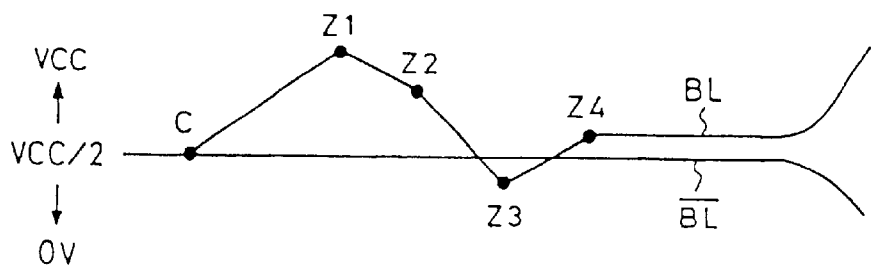
FIG. 18B shows a relationship between the variation of the polarization P of the ferroelectric capacitor 31 and a variation of a voltage of the bit line BL.

FIG. 18A and FIG. 18B show illustrations for explaining a variation of the voltage of the bit line BL in a case where the logic "1" is written in the ferroelectric capacitor 31. FIG. 18A shows a variation of polarization P of the ferroelectric capacitor 31, and FIG. 18B shows a relationship between the variation of the polarization P of the ferroelectric capacitor 31 and a variation of the voltage of the bit line BL.

In FIG. 18A, a straight line 105 indicates a relationship of $Q_{BL}=C_{BL}\ V_{BL}$, where $Q_{BL}$ is a charge which transfers from the ferroelectric capacitor 31 to the bit line BL, and $C_{BL}$ was a value of capacitance of the bit line BL.

In a case where the logic "1" is previously written in the ferroelectric capacitor 31, when the plate-electrode driving voltage φPL is successively changed from VCC/2 to the voltage VH, to the voltage VL, and to VCC/2, the polarization P of the ferroelectric capacitor 31, as shown in FIG. 18A, successively changes from a point C to a point Z1, to a point Z2, to a point Z3, and to a point Z4. Finally, a charge $\delta Q3$, by which the voltage $V_{BL}$ of the bit line BL is the same as the voltage of the storage electrode 31A of the ferroelectric capacitor 31, transfers from the ferroelectric capacitor 31 to the bit line BL. As a result, the voltage $V_{BL}$ of the bit line BL increases to VCC/2+Vα.

In this way, in the case where the logic "1" is written in the ferroelectric capacitor 31, the voltage $V_{BL}$ of the bit line BL increases to VCC/2+Vα, and the voltage $V_{/BL}$ of the bit line /BL is maintained at VCC/2. Therefore, as shown in the waveform C of FIG. 17, by the sense amplifier 43, the voltage $V_{BL}$ of the bit line BL increases to VCC, and the voltage $V_{/BL}$ of the bit line /BL decreases to 0 V. As a result, a voltage difference between the bit lines BL, \BL is amplified.

In this case, since the plate-electrode driving voltage φPL is maintained at VCC/2, the voltage $V_{BL}$ of the bit line BL increases from VCC/2+Vα to VCC. As a result, in the ferroelectric capacitor 31, the logic "1", namely, the data which has been read out, is re-written.

Figure 19A:
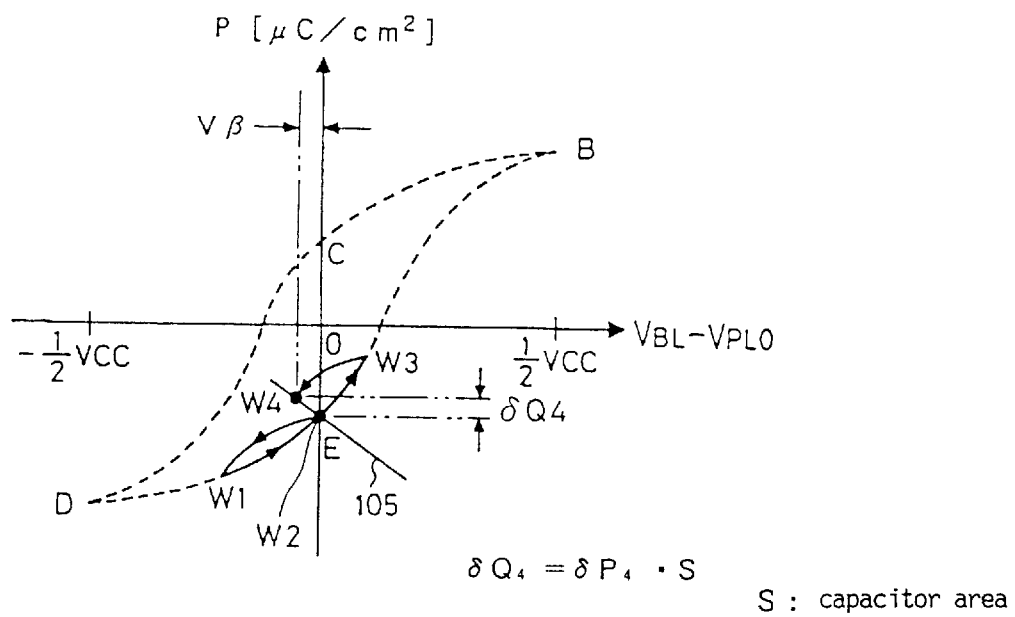
FIG. 19A shows a variation of polarization P of the ferroelectric capacitor 31 shown in 7.
Figure 19B:
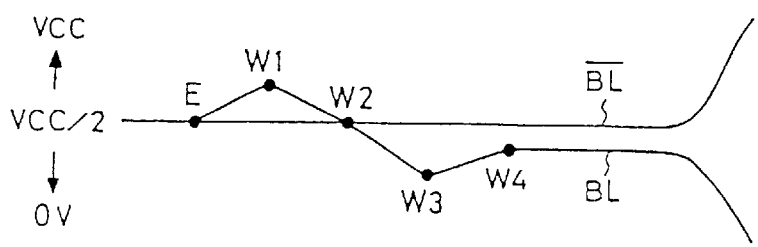
FIG. 19B shows a relationship between the variation of the polarization P of the ferroelectric capacitor 31 and a variation of the voltage of the bit line BL.

FIG. 19A and FIG. 19B show illustrations for explaining a variation of the voltage of the bit line BL in a case where the logic "0" is written in the ferroelectric capacitor 31. FIG. 19A shows a variation of polarization P of the ferroelectric capacitor 31, and FIG. 19B shows a relationship between the variation of the polarization P of the ferroelectric capacitor 31 and a variation of the voltage of the bit line BL.

In a case where the logic "0" was previously written in the ferroelectric capacitor 31, when the plate-electrode driving voltage φPL is successively changed from VCC/2 to the voltage VH, to the voltage VL, and to VCC/2, the polarization P of the ferroelectric capacitor 31, as shown in FIG. 19A, successively changes from a point E to a point W1, to a point W2, to a point W3, and to a point W4. Finally, a charge $\delta Q4$, by which the voltage $V_{BL}$ of the bit line BL is the same as the voltage of the storage electrode 31A of the ferroelectric capacitor 31, transfers from the bit line BL to the ferroelectric capacitor 31. As a result, the voltage $V_{BL}$ of the bit line BL decreases to VCC/2−Vβ.

In this way, in the case where the logic "0" is written in the ferroelectric capacitor 31, the voltage $V_{BL}$ of the bit line BL decreases to VCC/2−Vβ, and the voltage $V_{/BL}$ of the bit line /BL is maintained at VCC/2. Therefore, as shown in the waveform D of FIG. 17, by the sense amplifier 43, the voltage $V_{BL}$ of the bit line BL decreases to 0 V, and the voltage $V_{/BL}$ of the bit line /BL increases to VCC. As a result, the voltage difference between the bit lines BL, \BL is amplified.

In this case, since the plate-electrode driving voltage φPL is maintained at VCC/2, the voltage $V_{BL}$ of the bit line BL decreases from VCC/2−Vβ to 0 V. As a result, in the ferroelectric capacitor 31, the logic "0", namely, the data which has been read out, is re-written.

As discussed above, in the embodiment of the ferroelectric memory according to the present invention, for example, when the data is read out from the memory cell 29, and after the bit lines BL, /BL are precharged to VCC/2, the cell transistor 33 is controlled to be ON. Also, the voltage applied to the plate electrode 31B of the ferroelectric capacitor 31 is successively changed from VCC/2 to the voltage VH, to the voltage VL, and to VCC/2. At this time, when the logic "1" is written in the ferroelectric capacitor 31, the voltage $V_{BL}$ of the bit line BL increases to VCC/2+Vα, and when the logic "0" is written in the ferroelectric capacitor 31, the voltage $V_{BL}$ of the bit line BL decreases to VCC/2−Vβ. In this way, the voltage difference between the bit lines BL, \BL is amplified.

According to the ferroelectric memory of the present invention, the data which has been read out from the selected memory cell to the bit line may be detected in the same way as that of a DRAM using a method of precharging the bit line to VCC/2. Since the ferroelectric memory according to the present invention does not need a dummy cell, a stable operation for a long term may be expected.

Figure 20:
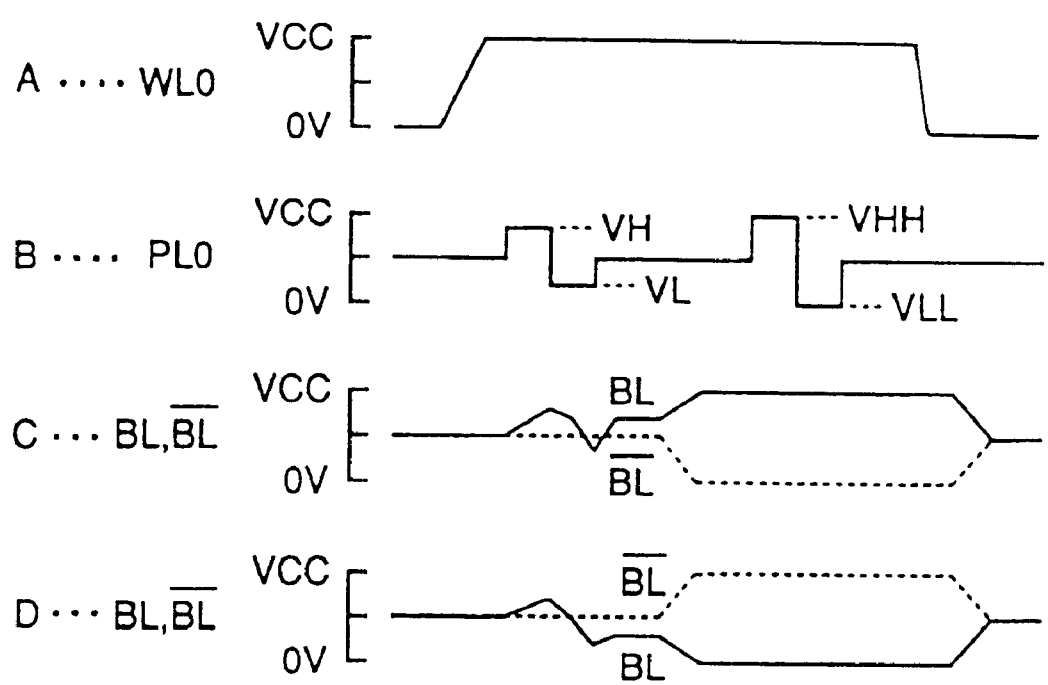
FIG. 20 shows waveforms for explaining a method of positively re-writing the data in the embodiment of the ferroelectric memory according to the present invention.

In the above-discussed embodiment of the ferroelectric memory according to the present invention, in the case where the plate-electrode driving-voltage generation circuit 23 is constructed as shown in FIG. 13, when the data is re-written after the plate-electrode driving voltage φPL is successively changed from VCC/2 to the voltage VH, to the voltage VL, and to VCC/2, the data may positively be written by successively changing the plate-electrode driving voltage φPL from VCC/2 to the voltage VHH, to the voltage VLL, and to VCC/2, as shown in FIG. 20.

When the data is re-written, and when the plate-electrode driving voltage φPL is successively changed from VCC/2 to the voltage VHH, to the voltage VLL, and to VCC/2, for example, when the logic "1" is previously written in the ferroelectric capacitor 31, the difference between the voltage $V_{BL}$ of the bit line BL and the voltage $V_{PL0}$ of the plate line PL0, $V_{BL}-V_{PL0}$, may be VCC. Accordingly, a sufficient polarization indicating that stored data is the logic "1" may be obtained.

On the other hand, when the logic "0" is previously written in the ferroelectric capacitor 31, the difference between the voltage $V_{BL}$ of the bit line BL and the voltage $V_{PL0}$ of the plate line PL0, $V_{BL}-V_{PL0}$, may be −VCC. Accordingly, a sufficient polarization indicating that stored data is the logic "0" may be obtained.

In the above-discussed embodiment of the ferroelectric memory according to the present invention, the descriptions has been given under the assumption that VHH (i.e. 3.0 V)>VH (i.e. 2.5 V), and VLL (i.e. 0 V)<VL (i.e. 1.0 V). However, the above assumption is not necessarily required.

Figure 21:
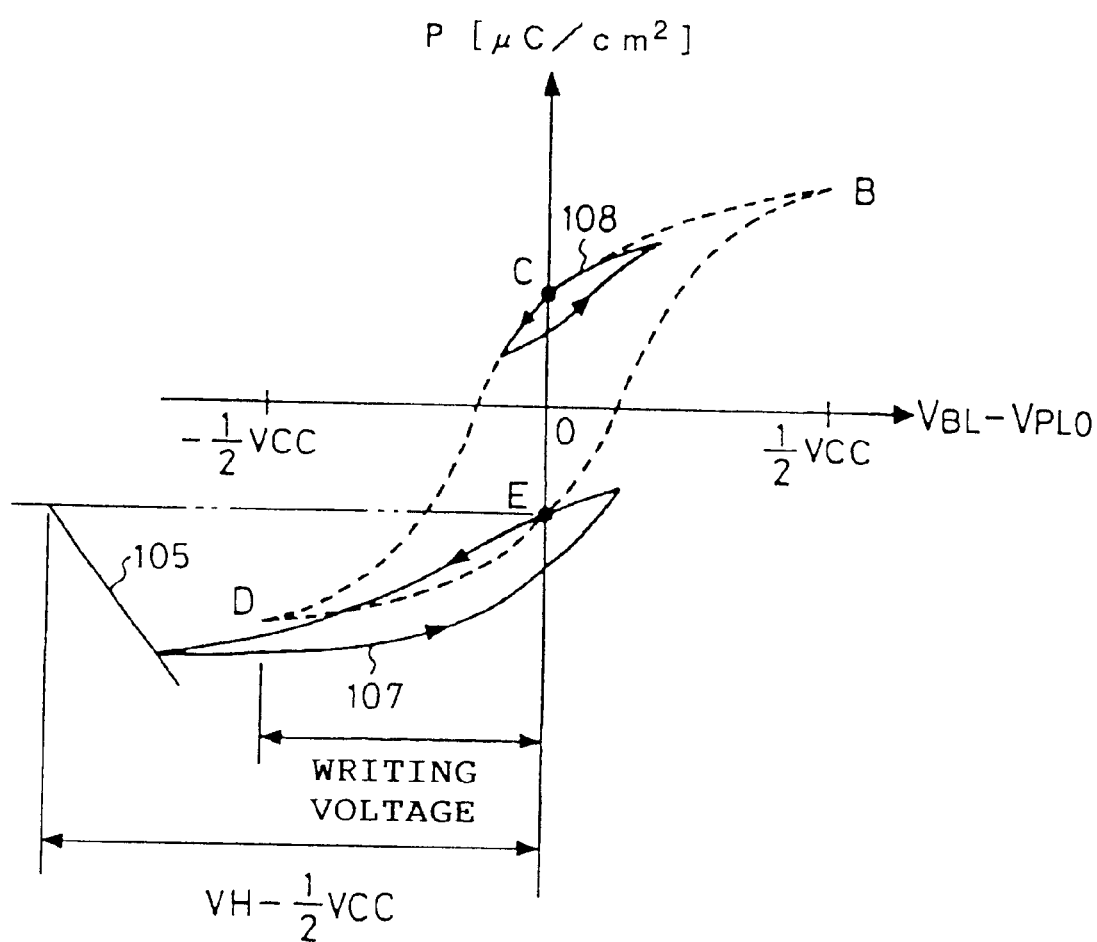
FIG. 21 shows an illustration for explaining preferred values of voltages VH and VL.

In the embodiment of the ferroelectric memory according to the present invention, when the voltage VH is set so that a voltage larger than a writing voltage is applied to the ferroelectric capacitor 31, namely, when the voltage VH is set so as to satisfy a relationship such that a voltage applied between the storage electrode 31A and the plate electrode 31B of the ferroelectric capacitor $31=V_{BL}-V_{PL0}=V_{BL}-VH<-VCC/2$, when the logic "0" is written in the ferroelectric capacitor 31, the polarization P of the ferroelectric capacitor 31 changes from a point E along a solid line 107, and returns to the point E, as shown in FIG. 21. In this situation, the voltage $V_{BL}$ of the bit line BL may be substantially the same as the voltage $V_{/BL}$ of the bit line /BL, or the polarization P may further increase as compared to that before the data is read out in a negative direction, and the voltage $V_{BL}$ of the bit line BL increases larger than the voltage $V_{/BL}$ of the bit line /BL. As a result, the data of the logic "1" may be read out in error.

Further, in a case in which the voltage VL is set so as to satisfy a relationship (VH−VCC/2)<(VCC/2−VL), when the logic "1" is written in the ferroelectric capacitor 31, the polarization P of the ferroelectric capacitor 31 changes from a point C along a solid line 108, and returns to the point C, as shown in FIG. 21. In this situation, the voltage $V_{BL}$ of the bit line BL may be substantially the same as the voltage $V_{/BL}$ of the bit line /BL, or the polarization P may further increase as compared to that before the data is read out in a positive direction, and the voltage $V_{BL}$ of the bit line BL decreases less than the voltage $V_{/BL}$ of the bit line /BL. As a result, the data of the logic "0" may be read out in error.

Therefore, in the embodiment of the ferroelectric memory according to the present invention, to prevent a voltage larger than the writing voltage from being applied to the ferroelectric capacitor, it is preferred that the voltage VH is selected so as to satisfy a relationship ($V_{BL}$−VH)>−VCC/2, and the voltage VL is selected so as to satisfy a relationship (VCC/2−VL)<(VH VCC/2).

Therefore, it is preferred that an electrical-field strength applied to the ferroelectric capacitor when the voltage VH is applied to the plate electrode is set to be less than an electrical-field strength applied when the data is written into the ferroelectric capacitor, and an electrical-field strength applied to the ferroelectric capacitor when the voltage VL is applied to the plate electrode is set to be less than the electrical-field strength applied to the ferroelectric capacitor when -the voltage VH is applied to the plate electrode.

Further, in the embodiment of the ferroelectric memory according to the present invention, it is preferred that the voltages VH and VL are set so that a reading margin when the logic "0" is written in the ferroelectric capacitor is substantially equal to a reading margin when the logic "1" is written in the ferroelectric capacitor.

Figure 22:
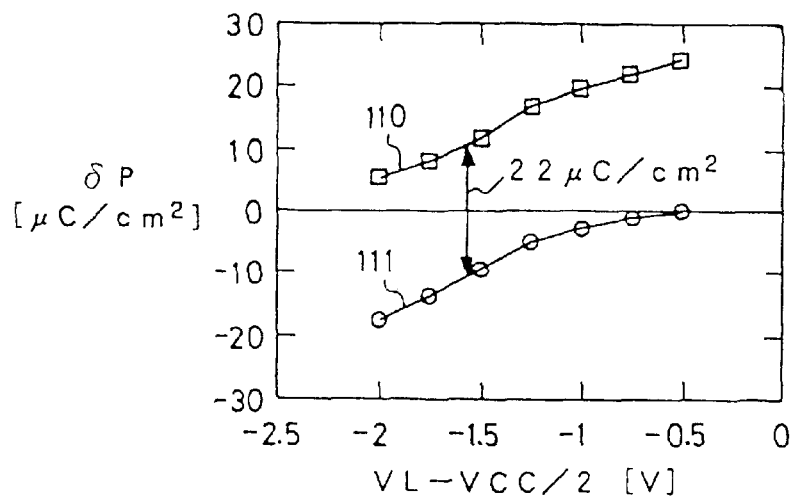
FIG. 22 shows an illustration for explaining a relationship of a voltage applied between a storage electrode and a plate electrode of the ferroelectric capacitor at a second time, namely, VL−VCC/2, and a variation of the polarization δP of the ferroelectric capacitor, namely, an amount of charge appearing at the electrodes.

FIG. 22 shows an illustration for explaining a relationship of a voltage applied between the storage electrode and the plate electrode of the ferroelectric capacitor at a second time, namely, VL−VCC/2, and a variation of the polarization δP of the ferroelectric capacitor, namely, an amount of charge appearing at the electrodes. In FIG. 22, the writing voltage is set to 5 V, and when the data is read out, a voltage applied between the storage electrode and the plate electrode of the ferroelectric capacitor at a first time, namely, VH−VCC/2, is set to 5 V. Also, a curved line 110 indicates a case where the logic "0" is written in the ferroelectric capacitor, and a curved line 111 indicates a case where the logic "1" is written in the ferroelectric capacitor.

In this case, when the voltage VL is set so as to satisfy a relationship VL−VCC/2=−1.6 V, the reading margin when the logic "0" is written in the ferroelectric capacitor may be substantially equal to the reading margin when the logic "1" is written in the ferroelectric capacitor.

Figure 23:
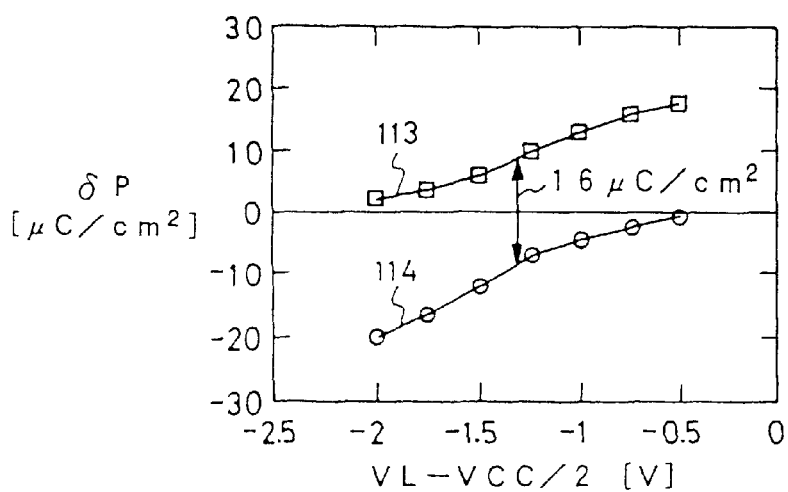
FIG. 23 shows an illustration for explaining a relationship of the voltage VL−VCC/2 and the variation of the polarization δP of the ferroelectric capacitor.

FIG. 23 shows an illustration for explaining a relationship of the voltage VL−VCC/2 and the variation of the polarization δP of the ferroelectric capacitor. In FIG. 23, the writing voltage is set to 5 V, and the voltage VH−VCC/2 is set to 2.5 V. Also, a curved line 113 indicates the case where the logic "0" is written in the ferroelectric capacitor, and a curved line 114 indicates a case where the logic "1" is written in the ferroelectric capacitor.

In this case, when the voltage VL is set so as to satisfy a relationship VL−VCC/2=−1.3 V, the reading margin when the logic "0" is written in the ferroelectric capacitor may be substantially equal to the reading margin when the logic "1" is written in the ferroelectric capacitor.

To amplify the voltage difference between the bit lines BL, /BL by the sense amplifier 43, when at least 10 fC/1 cell charge is required, a required variation of the polarization δP is 1 $\mu C/cm^2$ in a case where an area of the ferroelectric capacitor is 1 $\mu m^2$.

Therefore, a pulse applied to the plate electrode of the ferroelectric capacitor may be reduced within a range satisfying the above-discussed condition. By the reduction of the pulse, inversion fatigue of the ferroelectric capacitor may be reduced, and a life time of the device may be increased. Further, since an amount of charging for the ferroelectric capacitor and an amount of discharging for the ferroelectric capacitor may be reduced, speed of the reading operation may be increased, and power consumption may be reduced.

Figure 24:
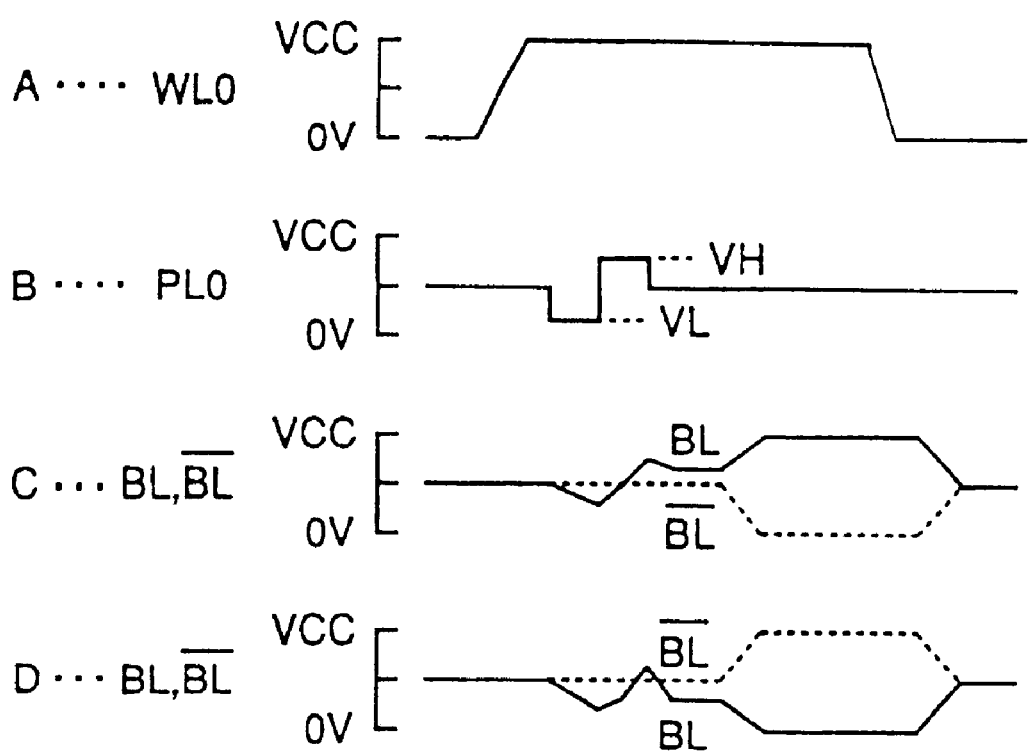
FIG. 24 shows waveforms for explaining another data-reading sequence from the memory cell of the embodiment of the ferroelectric memory according to the present invention.

In the following, a description will be given of a second embodiment of a method of reading out the data in the ferroelectric memory according to the present invention. FIG. 24 shows waveforms for explaining another data-reading sequence from the memory cell of the embodiment of the ferroelectric memory according to the present invention. The drawing shows an example of the data-reading sequence regarding the memory cell 29 shown in FIG. 7, In FIG. 24, a waveform A indicates a variation of the voltage of the word line WL0, a waveform B indicates a variation of the voltage of the plate line PL0, waveforms C indicate variations of the voltages of the bit lines BL, /BL in the case where the logic "1" is written in the ferroelectric capacitor 31, and waveforms D indicate variations of the voltages of the bit lines BL, /BL in the case where the logic "0" is written in the ferroelectric capacitor 31.

In the embodiment of the ferroelectric memory according to the present invention, for example, when VCC/2 is set to 1.5 V, and when the voltage VL is set to 0.5 V and the voltage VH is set to 2.0 V, even if the plate-electrode driving voltage φPL is changed from VCC/2 to the voltage VL, to the voltage VH, and to the voltage VCC/2, the data may be read out from the memory.

Figure 25A:
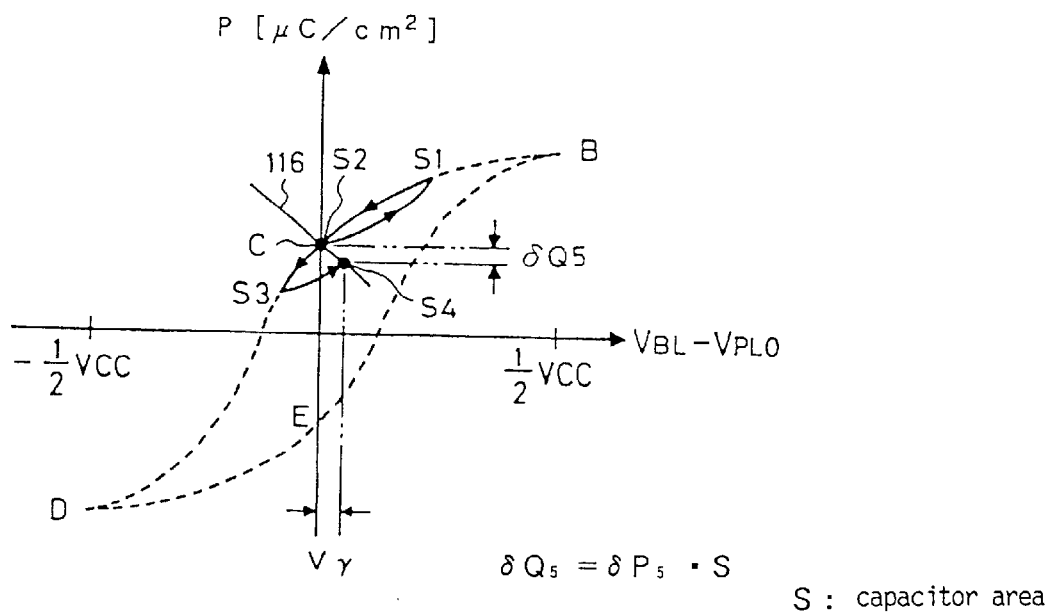
FIG. 25A shows the variation of polarization P of the ferroelectric capacitor 31 shown in FIG. 7.
Figure 25B:
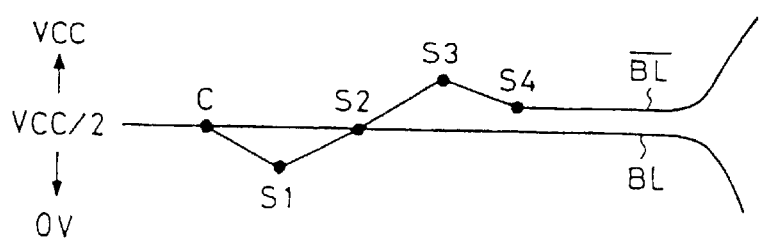
FIG. 25B shows the relationship between the variation of the polarization P of the ferroelectric capacitor 31 and the variation of the voltage of the bit line BL.

FIG. 25A and FIG. 25B show illustrations for explaining a variation of the voltage of the bit line BL in the case where the logic "1" is written in the ferroelectric capacitor 31. FIG. 25A shows a variation of polarization P of the ferroelectric capacitor 31, and FIG. 25B shows a relationship between the variation of the polarization P of the ferroelectric capacitor 31 and the variation of the voltage of the bit line BL.

In FIG. 25A, a straight line 116 indicates the relationship of $Q_{BL}=C_{BL} V_{BL}$, where $Q_{BL}$ is the charge which transfers from the ferroelectric capacitor 31 to the bit line BL, and $C_{BL}$ is the capacitance value of the bit line BL.

In the case where the logic "1" is previously written in the ferroelectric capacitor 31, when the plate-electrode driving voltage φPL is successively changed from VCC/2 to the voltage VL, to the voltage VH, and to VCC/2, the polarization P of the ferroelectric capacitor 31, as shown in FIG. 25A, successively changes from a point C to a point S1, to a point S2, to a point S3, and to a point S4. Finally, a charge δQ5, by which the voltage $V_{BL}$ of the bit line BL is the same as the voltage of the storage electrode 31A of the ferroelectric capacitor 31, transfers from the ferroelectric capacitor 31 to the bit line BL. As a result, the voltage $V_{BL}$ of the bit line BL increases to VCC/2+V.

In this way, in the case where the logic "1" was previously written in the ferroelectric capacitor 31, the voltage $V_{BL}$ of the bit line BL increases to VCC/2+V, and the voltage $V_{/BL}$ of the bit line /BL is maintained at VCC/2. Therefore, as shown in the waveform C of FIG. 24, by the sense amplifier 43, the voltage $V_{BL}$ of the bit line BL increases to VCC, and the voltage $V_{/BL}$ of the bit line /BL decreases to 0 V. As a result, the voltage difference between the bit lines BL, \BL is amplified.

In this case, since the plate-electrode driving voltage φPL is maintained at VCC/2, the voltage $V_{BL}$ of the bit line BL increases from VCC/2+V to VCC. As a result, in the ferroelectric capacitor 31, the data of the logic "1" which has been read out is re-written.

Figure 26A:
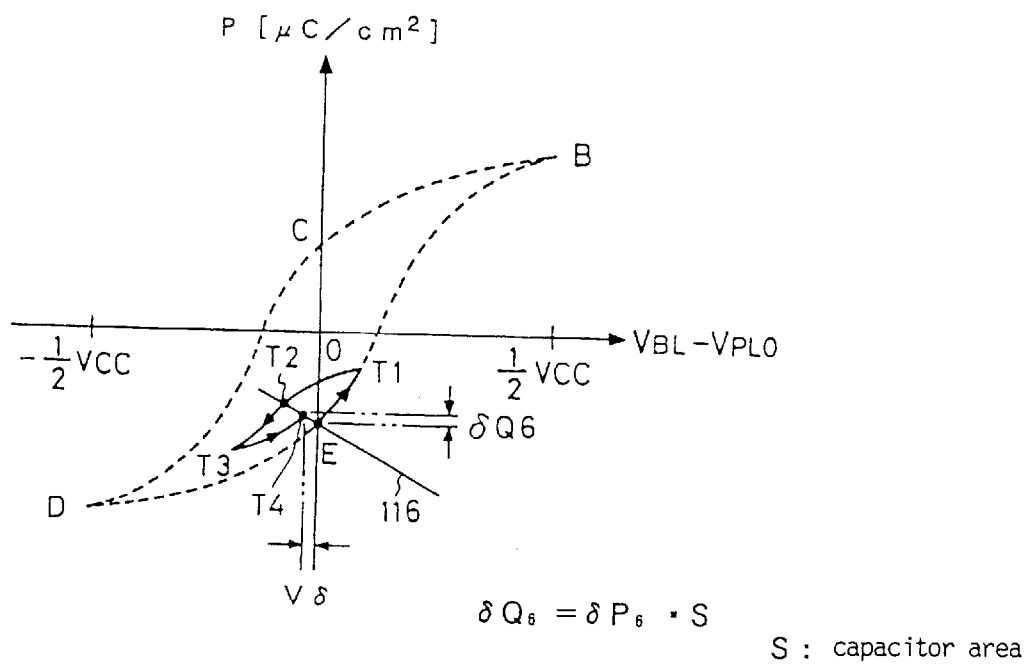
FIG. 26A shows the variation of polarization P of the ferroelectric capacitor 31 shown in FIG. 7.
Figure 26B:
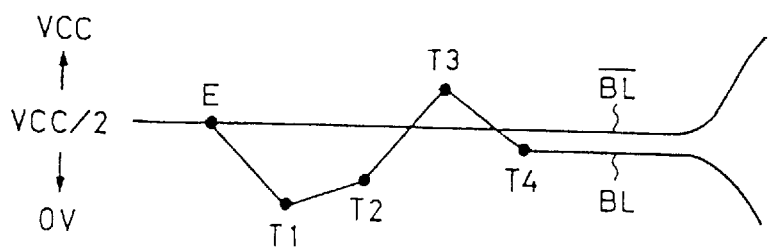
FIG. 26B shows the relationship between the variation of the polarization P of the ferroelectric capacitor 31 and the variation of the voltage of the bit line BL.

FIG. 26A and FIG. 26B show illustrations for explaining the variation of the voltage of the bit line BL in the case where the logic "0" is written in the ferroelectric capacitor 31 shown in FIG. 7. FIG. 26A shows the variation of polarization P of the ferroelectric capacitor 31, and FIG. 26B shows the relationship between the variation of the polarization P of the ferroelectric capacitor 31 and the variation of the voltage of the bit line BL.

In the case where the logic "0" was previously written in the ferroelectric capacitor 31, when the plate-electrode driving voltage φPL is successively changed from VCC/2 to the voltage VL, to the voltage VH, and to VCC/2, the polarization P of the ferroelectric capacitor 31, as shown in FIG. 26A, successively changes from a point E to a point T1, to a point T2, to a point T3, and to a point T4. Finally, a charge δQ6, by which the voltage $V_{BL}$ of the bit line BL is the same as the voltage of the storage electrode 31A of the ferroelectric capacitor 31, transfers from the bit line BL to the ferroelectric capacitor 31. As a result, the voltage $V_{BL}$ of the bit line BL decreases to VCC/2−Vδ.

In this way, in the case where the logic "0" was previously written in the ferroelectric capacitor 31, the voltage $V_{BL}$ of the bit line BL decreases to VCC/2−Vδ, and the voltage $V_{/BL}$ of the bit line /BL is maintained at VCC/2. Therefore, as shown in the waveform D of FIG. 24, by the sense amplifier 43, the voltage $V_{BL}$ of the bit line BL decreases to 0 V, and the voltage $V_{/BL}$ of the bit line /BL increases to VCC. As a result, the voltage difference between the bit lines BL, \BL is amplified.

In this case, since the plate-electrode driving voltage φPL is maintained at VCC/2, the voltage $V_{BL}$ of the bit line BL decreases from VCC/2−Vδ to 0 V. As a result, in the ferroelectric capacitor 31, the data of the logic "0" which has been read out is re-written.

Figure 27:
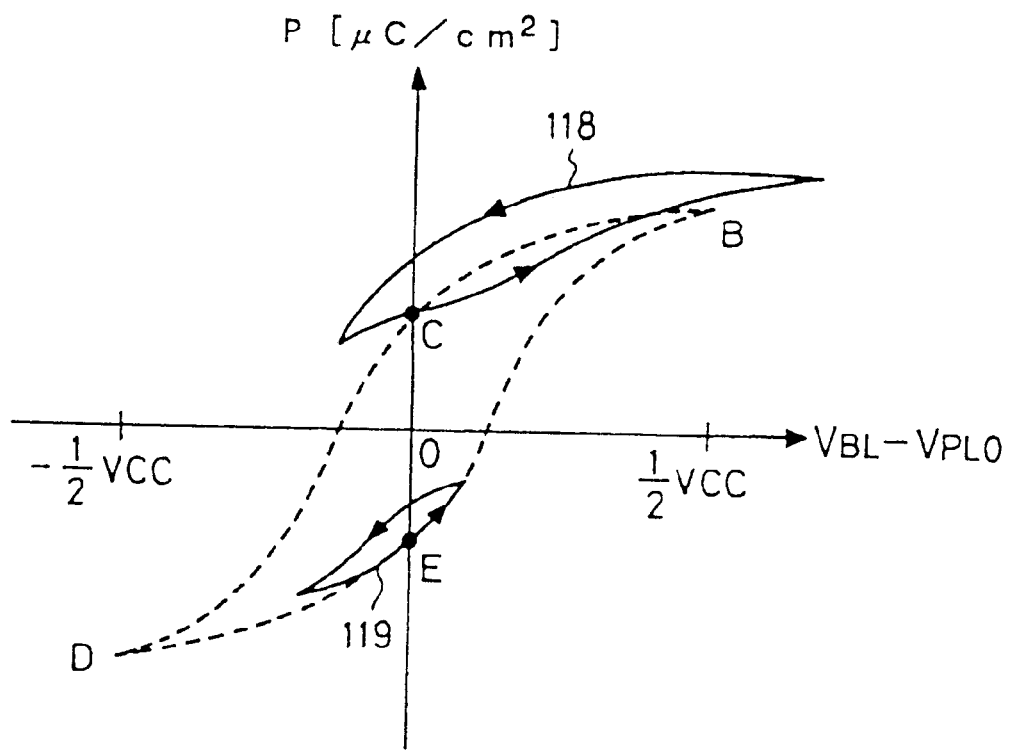
FIG. 27 shows an illustration for explaining a preferred voltage applied to the plate electrode 31B of the ferroelectric capacitor 31 when the data is read out from the memory cell.

For example, when the relationship $V_{BL}$−VL>VCC/2 is satisfied and when the logic "1" is written in the ferroelectric capacitor 31, the polarization P of the ferroelectric capacitor 31 changes from a point C along a solid line 118, and returns to the point C, as shown in FIG. 27. In this situation, the voltage $V_{BL}$ of the bit line BL may be substantially the same as the voltage $V_{/BL}$ of the bit line /BL, or the polarization P may further increase as compared to that before the data is read out in a positive direction, and the voltage $V_{BL}$ of the bit line BL may decrease less than the voltage $V_{/BL}$ of the bit line /BL. As a result, the data of the logic "0" may be read out in error.

Further, when the relationship (VCC/2−VL)<(VH−VCC/2) and when the logic "0" was previously written in the ferroelectric capacitor 31, the polarization P of the ferroelectric capacitor 31 changes from a point E along a solid line 119, and returns to the point E, as shown in FIG. 27. In this situation, the voltage $V_{BL}$ of the bit line BL may be substantially the same as the voltage $V_{/BL}$ of the bit line /BL, or the polarization P may further increase as compared to that before the data is read out in a negative direction, and the voltage $V_{BL}$ of the bit line BL may increase larger than the voltage $V_{/BL}$ of the bit line /BL. As a result, the data of the logic "1" may be read out in error.

Therefore, in the embodiment of the ferroelectric memory according to the present invention, to prevent such an error, it is preferred that the voltage VL is selected so as to satisfy a relationship ($V_{BL}$−VL)<VCC/2, and the voltage VH is selected so as to satisfy a relationship (VH−VCC/2)<(VCC/2−VL).

Therefore, it is preferred that the electrical-field strength applied to the ferroelectric capacitor when the voltage VL is applied to the plate electrode is set less than the electrical-field strength applied when the data is written into the ferroelectric capacitor, and the electrical-field strength applied to the ferroelectric capacitor when the voltage VH is applied to the plate electrode is set less than the electrical-field strength applied to the ferroelectric capacitor when the voltage VL is applied to the plate electrode.

In this case, after the plate-electrode driving voltage φPL is successively changed from VCC/2 (for sample, 1.5 V) to the voltage VL (for example, 0.5 V), to the voltage VH (for example, 2.0 V), and to VCC/2, when the plate-electrode driving voltage φPL is changed from VCC/2 to the voltage VLL (for example, 0 V), to the voltage VHH (for example, 3.0 V), and to VCC/2, the data may positively be re-written.

As discussed above, according to the present invention, without providing the dummy cell, the data may positively be read out from the memory cell, and, thus, a stable operation of the ferroelectric memory may be performed for a long term.

In the above description, in the ferroelectric memory according to the present invention, the preferred method of setting the voltages VH and the VL is shown. However, in practical use, a reading-out margin (an amplitude of the read-out signal) varies according to a ratio of a bit-line capacitance (shows parasitic capacitance of the bit line) to capacitance of the ferroelectric capacitor. Therefore, for obtaining a sufficient reading-out margin, a proper capacitance ratio and the voltages VH and VL need to be set.

In the following, a description will be given of the optimum capacitance ratio of the bit-line capacitor and the ferroelectric capacitor.

First, the basic operation of the above-discussed ferroelectric memory according to the present invention is summarized as follows.

Figure 28:
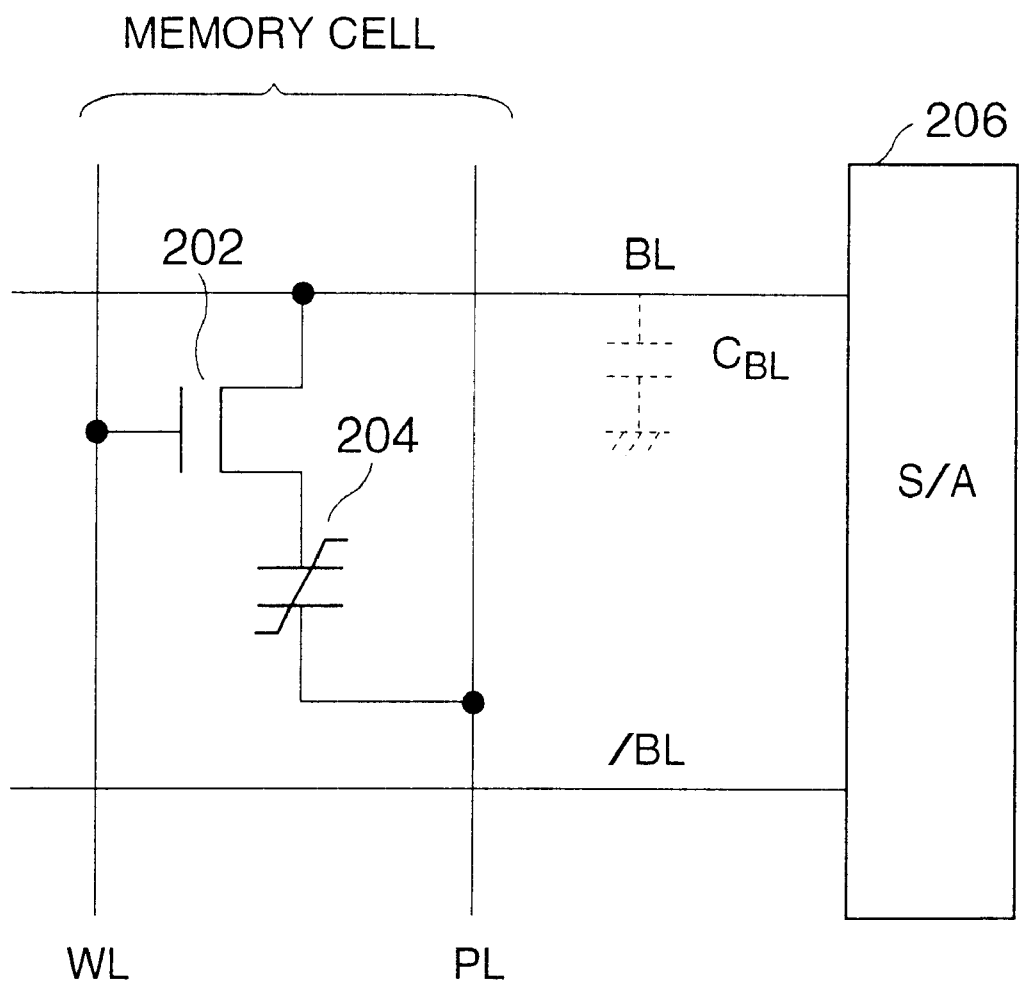
FIG. 28 shows a simplified circuit configuration of the ferroelectric memory according to the present invention.
Figure 29:
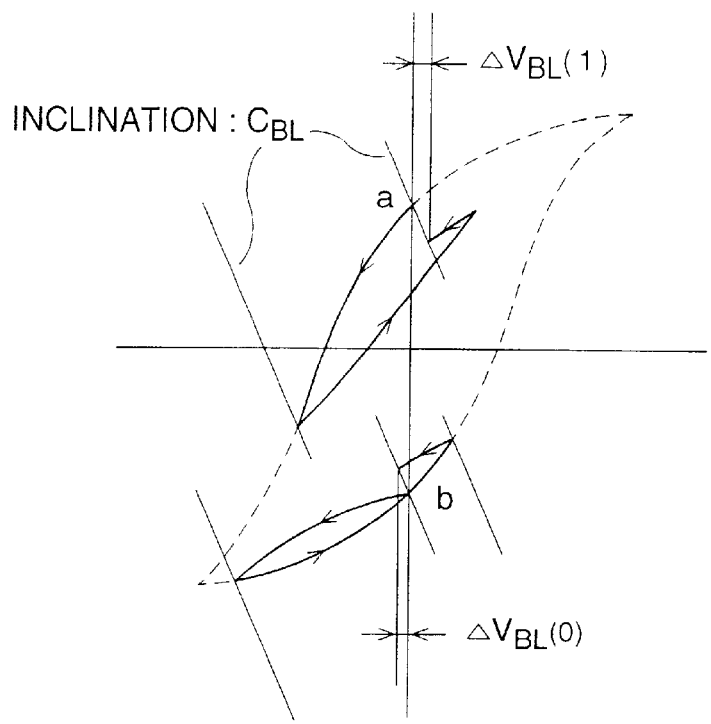
FIG. 29 shows hysteresis characteristics of the ferroelectric capacitor, where information of the logic "1" and "0" is respectively stored in conditions represented by symbols "a" and "b"
Figure 30:
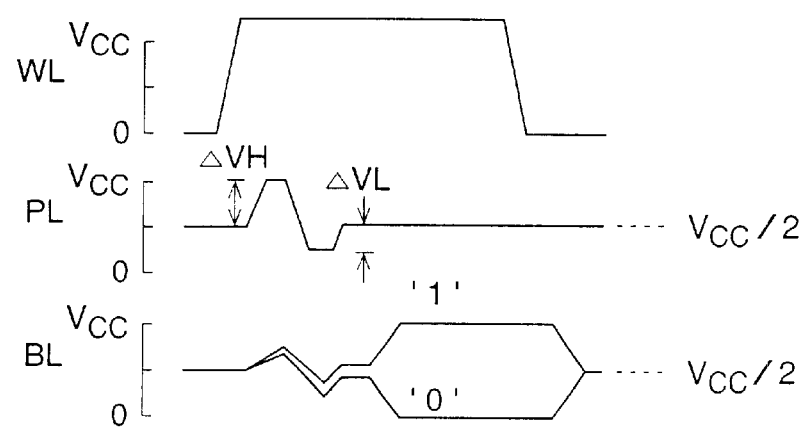
FIG. 30 shows a timing chart of the reading-out operation.

FIG. 28 shows a simplified circuit configuration example of the ferroelectric memory according to the present invention. FIG. 29 shows hysteresis characteristics of the ferroelectric capacitor, where information of the logic "1" and "0" is respectively stored in conditions represented by symbols "a" and "b". FIG. 30 shows a timing chart of the reading-out operation.

During storing of the data, the plate line (PL) and bit line (BL) are maintained at the voltage VCC/2. When reading out the data, the voltage of the word line (WL) is increased, a cell transistor is turned on, and opposite pulses having different polarization are provided to the plate line (PL). A horizontal axis in FIG. 29 indicates the voltage difference ($=V_{BL}-V_{PL}$) between the bit-line voltage $V_{BL}$ and the plate-line voltage $V_{PL}$, and the polarization of the ferroelectric capacitor 204 varies as shown in FIG. 29. Finally, the bit-line voltage $V_{BL}$ varies in a positive or negative direction from the voltage VCC/2 according to the direction of the stored polarization.

At this time, voltage deviation (dVBL) of the bit-line voltage $V_{BL}$ is represented by a decrease of the remanent polarization (δPrS) and the bit-line capacitance $C_{BL}$ is shown as follows:

$$dVBL=\delta PrS/C_{BL}.$$

Since the voltage $V_{/BL}$ of the complement bit line /BL is set to the voltage VCC/2, a voltage difference between the bit line BL and the bit line /BL is amplified in a sense amplifier 206. In this way, the data is externally read out, and a re-writing operation of the data to the capacitor is carried out.

The amplitude of the reading-out signal depends on an amplitude of the input pulse provided to the plate line PL. In the following, a voltage difference between the voltage VCC/2 and the voltage VH provided as the first pulse of the plate line voltage is represented by δVH, and a voltage difference between the voltage VCC/2 and the voltage VL provided as the second pulse of the plate line voltage is represented by δVL.

When the logic "1" is written in the ferroelectric capacitor 204, the reading-out margin increases, as δVH is larger and δVL is smaller, and when the logic "0" is written in the ferroelectric capacitor 204, the reading-out margin increases, as δVL is larger.

In the above-discussed ferroelectric memory, it is shown that the voltages VH and VL are preferably set so that the reading-out margin in a case where the logic "1" is written in the ferroelectric memory 204 may be substantially equal to that in a case where the logic "0" is written in the ferroelectric memory 204.

However, as discussed above, the reading-out margin (amplitude of the reading-out signal) varies according to the ratio of the bit-line capacitance $C_{BL}$ and the capacitance of the ferroelectric capacitor 204.

In the following, a description will be given of the methods of setting the optimum capacitance ratio and voltages VH and VL in the ferroelectric memory according to the present invention.

Figure 31A:
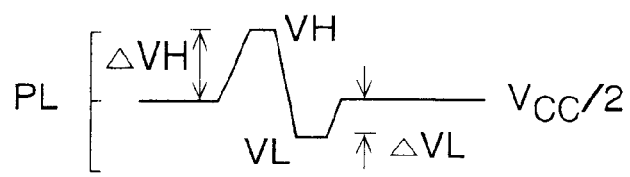
FIG. 31A to FIG. 31C show illustrations for explaining polarization variation when the data is read out from the ferroelectric capacitor in the circuits shown in FIG. 28.
Figure 31B:
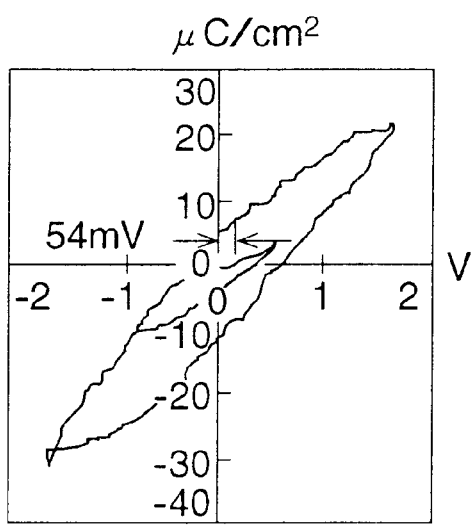
Figure 31C:
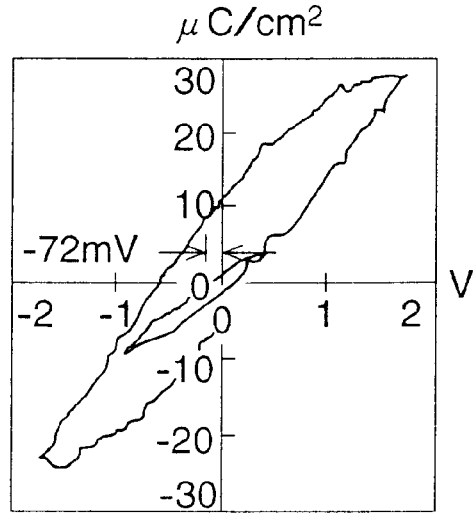

FIG. 31A to FIG. 31C show illustrations for explaining polarization variation when the data is read out from the ferroelectric capacitor in the circuits shown in FIG. 28. FIG. 31A shows variation of the plate-line voltage $V_{PL}$, FIG. 31B shows polarization variation when the logic "1" is read out from the ferroelectric capacitor, and FIG. 31C shows polarization variation when the logic "0" is read out from the ferroelectric capacitor. Operation parameters are shown in the drawing in FIG. 31A.

When the signal shown in FIG. 31A is provided to the plate line, the polarization of the ferroelectric capacitor 204 varies as shown in FIG. 31B and FIG. 31C. From these drawings, the voltage deviation dVBL appearing in the bit line BL may be the reading-out signal. This operation have been described in detail in the previous description, by referring to FIG. 17 to FIG. 19B.

Figure 32:
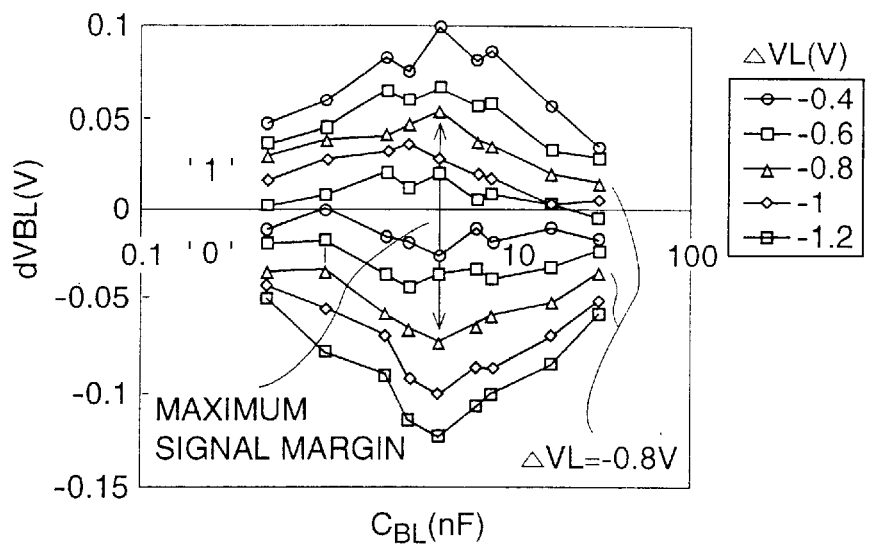
FIG. 32 shows an illustration for explaining dependence of voltage deviation dVBL in the bit line BL upon bit-line capacitance $C_{BL}$ for each voltage δVL in the operation described by referring to FIG. 31A to FIG. 31C.

FIG. 32 shows an illustration for explaining dependence of the voltage deviation dVBL in the bit line BL upon the bit-line capacitance $C_{BL}$ for each voltage δVL in the operation described by referring to FIG. 31A to FIG. 31C. In FIG. 32, a horizontal axis indicates the bit-line capacitance $C_{BL}$, and a vertical axis indicates the voltage deviation dVBL in the bit line BL.

When the voltage δVL is −0.8V, the voltage deviation dVBL for reading out the logic "1" and the voltage deviation dVBL for reading out the logic "0" are substantially the same. In this case, when the bit-line capacitance $C_{BL}$ is 4.26 nF, the margin for the reading-out signal is maximized. Therefore, a stable reading-out operation may be expected. At this time, the ratio of the bit-line capacitance $C_{BL}$ and the capacitance of the ferroelectric capacitor 204 is 1.9 [$V^{-1}$] ($=C_{BL}$/PrS [C]).

However, the bit-line capacitance $C_{BL}$ has an influence on consumption power and operation speed. In the following, a comparison of different bit-line capacitance $C_{BL}$, for example, 1 nF and 8 nF, will be discussed. In FIG. 32, for the two bit-line capacitance $C_{BL}$, 1 nF and 8 nF, the voltage deviation dVBL in the bit line BL has substantially the same value.

Figure 33A:
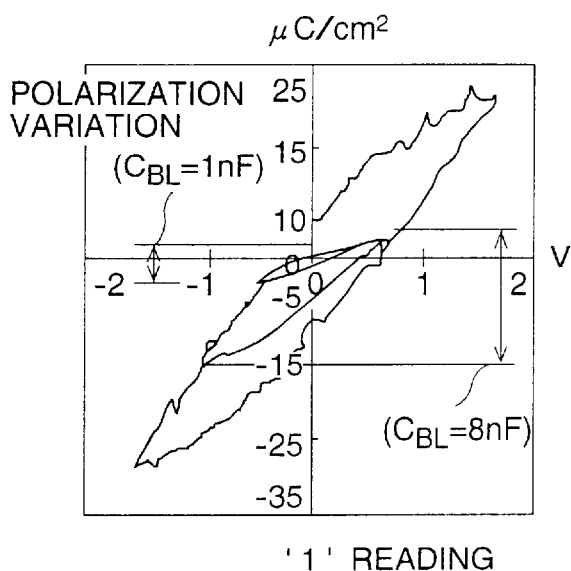
FIG. 33A and FIG. 33B show variation of the polarization of the ferroelectric capacitor for the bit-line capacitance $C_{BL}$ of 1 nF and 8 nF.
Figure 33B:
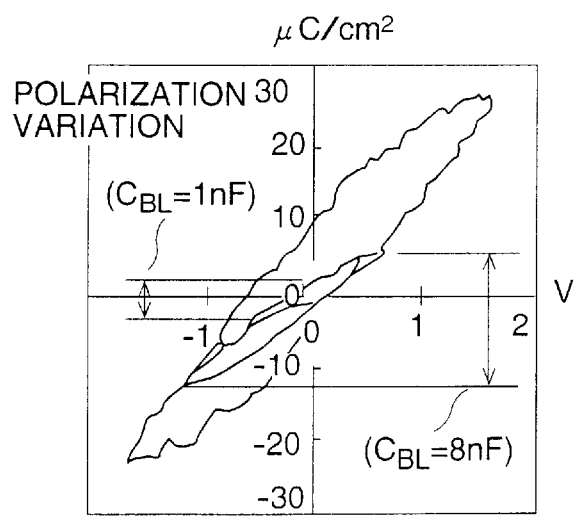

FIG. 33A and FIG. 33B show a variation of the polarization of the ferroelectric capacitor 204 for the bit-line capacitance $C_{BL}$ of 1 nF and 8 nF. FIG. 33A shows a case where the logic "1" is read out from the ferroelectric capacitor 204, and FIG. 33B shows a case where the logic "0" is read out from the ferroelectric capacitor 204.

As shown in FIG. 33A and FIG. 33B, variation of the polarization in the case where the bit-line capacitance $C_{BL}$ is 8 nF is larger than that in the case where the bit-line capacitance $C_{BL}$ is 1 nF. Namely, when the bit-line capacitance $C_{BL}$ is 8 nF, the power consumption may increase and the operation speed may decrease. Therefore, it is preferred that the bit-line capacitance $C_{BL}$ is smaller.

As a result, considering the above-discussed method of increasing the reading-out margin (the ratio of the bit-line capacitance and the capacitance of the ferroelectric capacitor 204, $C_{BL}$ [F]/PrS [C] is set to 1.9 [$V^{-1}$]), the ratio is preferably set so as to be less than the value that the reading-out signal dVBL is maximized. Therefore, for the ratio of the bit-line capacitance $C_{BL}$ and the capacitance of the ferroelectric capacitor, it is preferred to satisfy the following condition, $$0.5[V^{-1}]<(C_{BL}[F]/PrS[C])<2.$$

In addition to the above-discussed method, by increasing the driving voltage VH of the plate line PL larger than the voltage VCC using the internal level-up power-supply converter shown later in FIG. 36B, the reading-out signal (voltage deviation dVBL in the bit line BL) may be increased.

Figure 34:
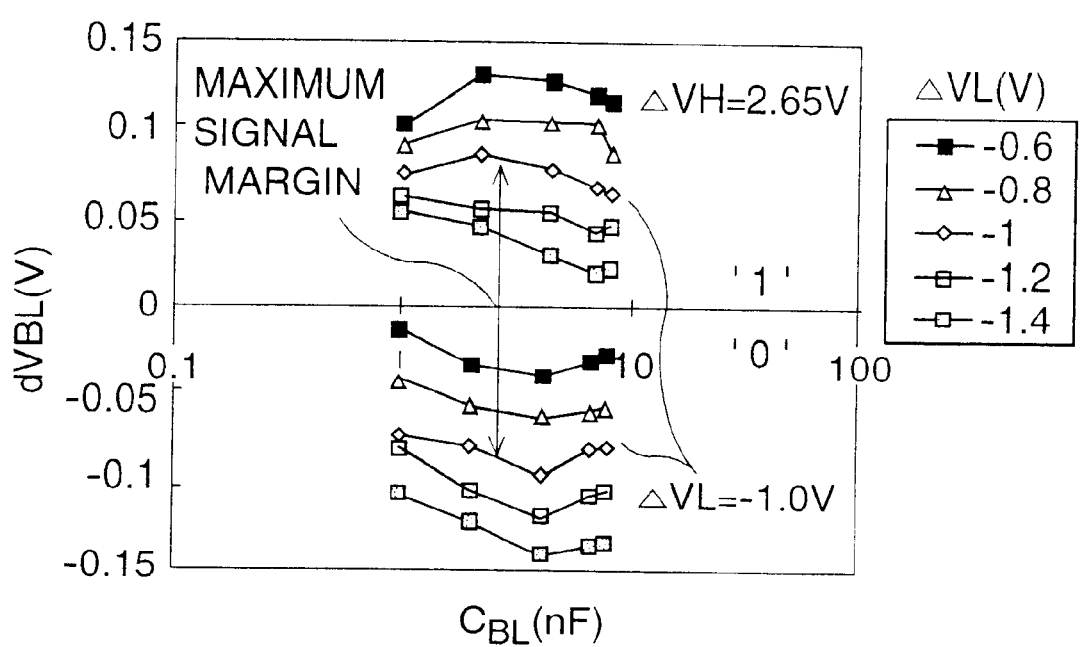
FIG. 34 shows an illustration for explaining dependence of the voltage deviation dVBL in the bit line BL upon the bit-line capacitance $C_{BL}$ in a case where a voltage δVH is 2.65 V.

FIG. 34 shows an illustration for explaining dependence of the voltage deviation dVBL in the bit line BL upon the bit-line capacitance $C_{BL}$ in a case where the voltage δVH is 2.65 V. In this case, when the voltage δVL is −1.0 V, the reading-out margins for the logic "1" and the logic "0" are substantially the same, and when the bit-line capacitance $C_{BL}$ is 2 to 3 nF, the reading-out margins are maximized, at 90 mV for the logic "1" and −80 mV for the logic "0".

Figure 35A:
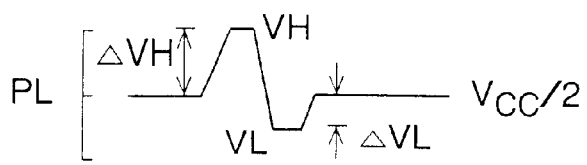
FIG. 35A to FIG. 35C show illustrations for explaining polarization variation of the ferroelectric capacitor under the condition shown in FIG. 34.
Figure 35B:
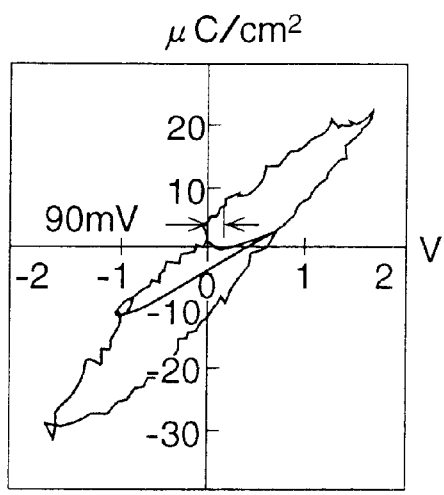
Figure 35C:
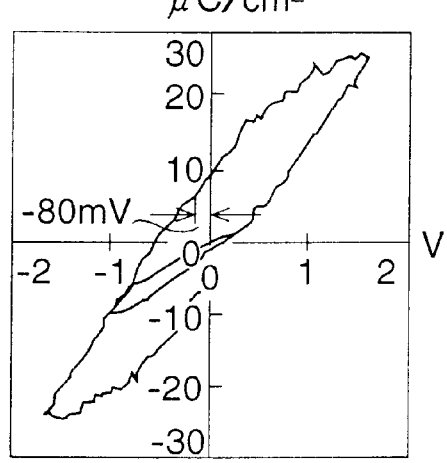

FIG. 35A to FIG. 35C show illustrations for explaining polarization variation of the ferroelectric capacitor under the condition shown in FIG. 34. FIG. 35A shows variation of the plate-line voltage $V_{PL}$, FIG. 35B shows polarization variation when the logic "1" is read out from the ferroelectric capacitor, and FIG. 35C shows polarization variation when the logic "0" is read out from the ferroelectric capacitor.

Compared with the drawings of FIG. 31B and FIG. 31C, an amount of variation of the polarization during the operation is substantially the same as compared with each other, but finally obtained signal margins in FIG. 35B and FIG. 35C are larger than those in FIG. 31B and FIG. 31C because the bit-line capacitance $C_{BL}$ has a smaller value.

In this way, by reducing the value of the bit-line capacitance $C_{BL}$, and using the level-up voltage provided from the level-up power-supply converter for the voltage VH, a larger reading-out signal may be obtained without increasing power consumption (since the polarization variation is reduced).

Figure 36A:
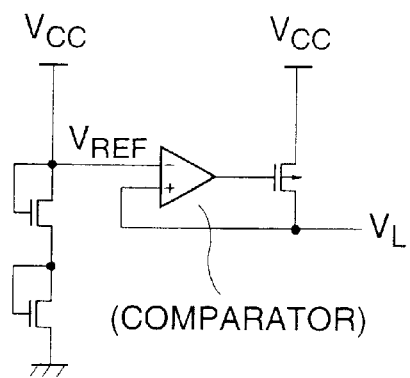
FIG. 36A and FIG. 36B respectively show configuration examples of an internal level-down power-supply converter and an internal level-up power-supply converter.
Figure 36B:
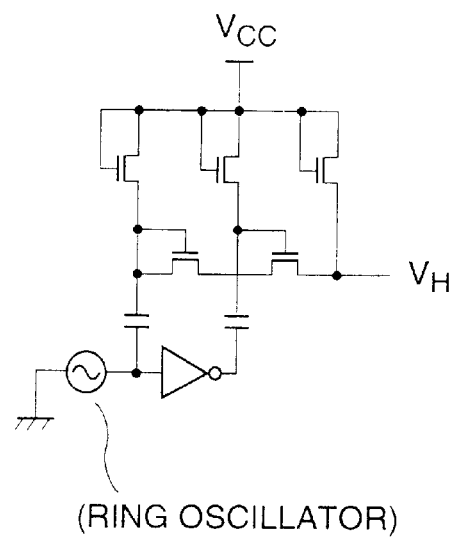

The above-mentioned voltages VL and VH may be provided from, for example, the internal level-down power-supply converter and the internal level-up power-supply converter shown in FIG. 36A and FIG. 36B. The internal level-down power-supply converter includes a comparator, and the internal level-up power-supply converter includes a ring oscillator. Since these circuits are well known, a description of these circuit operations is eliminated here.

As discussed above, by optimizing the ratio of the bit-line capacitance $C_{BL}$ and the capacitance of the ferroelectric capacitor 204, or by increasing the driving voltage VH of the plate line PL, a larger reading-out signal may be obtained, and, thus, a memory device operable for a long term may be provided.

In the above descriptions of the present inventions, ferroelectric memories have been described in which a stable reading-out operation from the memory cell may be carried out without the dummy cell.

However, the inventor has also found that for the ferroelectric memory using the dummy cell, it is possible to carry out a stable, long term data reading-out operation. In the following, a description will be given of the ferroelectric memory using the dummy cell according to the present invention.

First, before the description of the ferroelectric memory using the dummy cell according to the present invention, the operation of the prior art ferroelectric memory using the dummy cell will be summarized.

Figure 37:
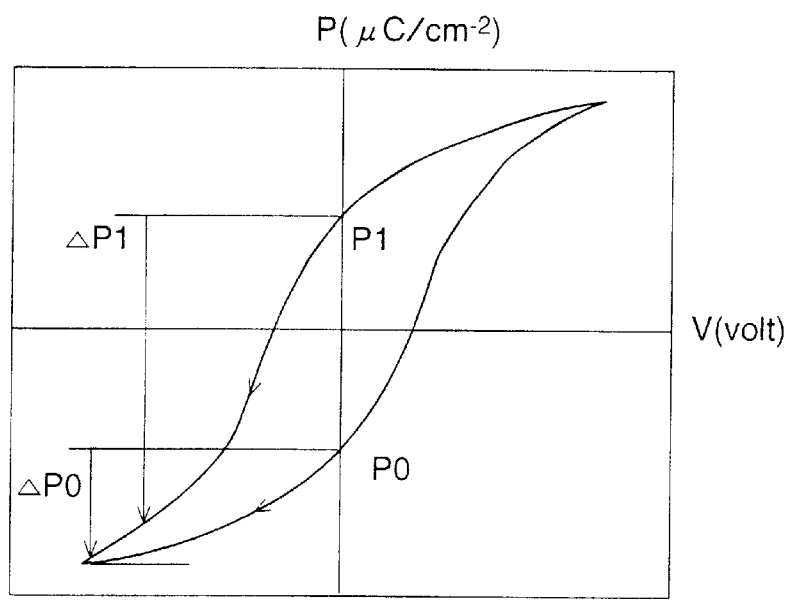
FIG. 37 shows hysteresis characteristics of polarization of the ferroelectric capacitor.
Figure 38:
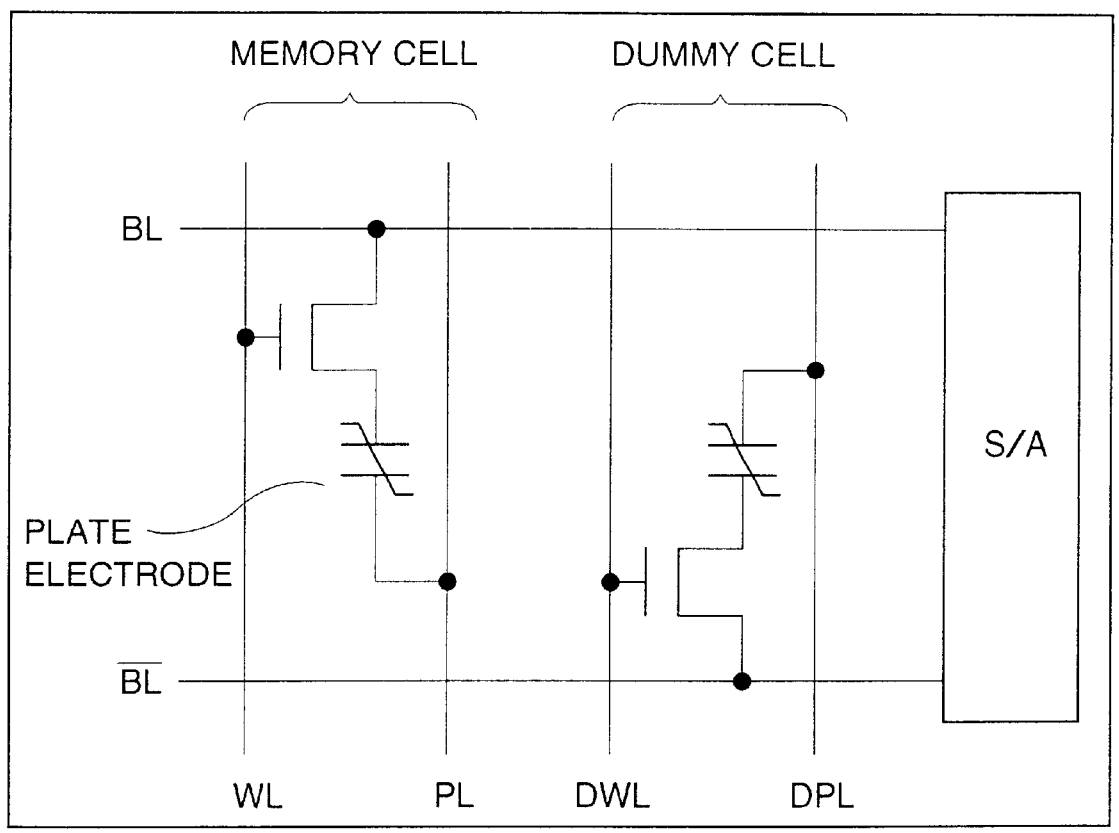
FIG. 38 shows a configuration example of the prior-art ferroelectric memory using the dummy cell.
Figure 39:
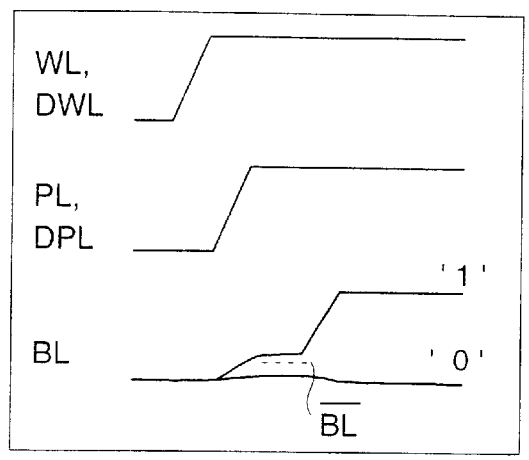
FIG. 39 shows voltage transition in each line of the ferroelectric memory shown in FIG. 38.

FIG. 37 shows hysteresis characteristics of polarization of the ferroelectric capacitor. FIG. 38 shows a configuration example of the prior art ferroelectric memory using the dummy cell. FIG. 39 shows voltage transition in each line of the ferroelectric memory shown in FIG. 38.

In FIG. 37, polarization P0 and polarization P1 respectively correspond to the logic "0" and the logic "1" of the data. A horizontal axis indicates the bit-line voltage $V_{BL}$ to plate-line voltage $V_{PL}$.

In the operation of the ferroelectric memory, first the bit-line voltage $V_{BL}$ and the plate-line voltage $V_{PL}$ are substantially the same. When the plate-line voltages $V_{PL}$ and $V_{DPL}$ increase as shown in FIG. 39, the polarization varies as led by arrows in FIG. 37, and the bit-line voltage $V_{BL}$ is deviated by δP0 or δP1. Based on the voltage deviation of the bit-line voltage $V_{BL}$, the data is discriminated.

In this case, using the reference voltage provided from the dummy cell, the bit-line voltage $V_{BL}$ is compared. This voltage difference is amplified by the sense amplifier, and, thus, whether the data is the logic "0" or the logic "1" is determined. In the above operation, for the driving voltages of the plate lines in the memory cell and the dummy cell, substantially the same voltage is provided. The above-discussed operation is described in detail in the "BACKGROUND OF THE INVENTION" of this specification.

In the operation of the prior art ferroelectric memory using the dummy cell, as previously discussed, since the dummy cell is driven every time when the data is read out, the characteristics is degraded due to inversion fatigue. As a result, there is a problem in that a stable, long term reading-out operation may not be carried out.

In the following, a description will be given of an operation of the ferroelectric memory using the dummy cell according to the present invention. The ferroelectric memory according to the present invention has a feature that when the reference voltage is generated in the dummy cell, the driving voltage of the plate line DPL in the dummy cell is set so as to be lower than the driving voltage of the plate line PL in the memory cell.

It has been shown, by Mihara, that the inversion fatigue of only the ferroelectric capacitor depends on the driving voltage of the capacitor (Applied Physics 64, 1188 (1995), in Japanese). By reducing the driving voltage of the capacitor, the inversion fatigue of the capacitor may be improved exponentially. However, the above report is directed to only the capacitor, but does not teach or suggest any applications for the memory.

In the memory using the ferroelectric capacitor according to the present invention, the driving voltage of the capacitor in the dummy cell for generating the reference voltage is set to be lower. Therefore, the inversion fatigue of the dummy cell may be reduced. As a result, a stable data reading-out operation may be carried out.

Figure 40:
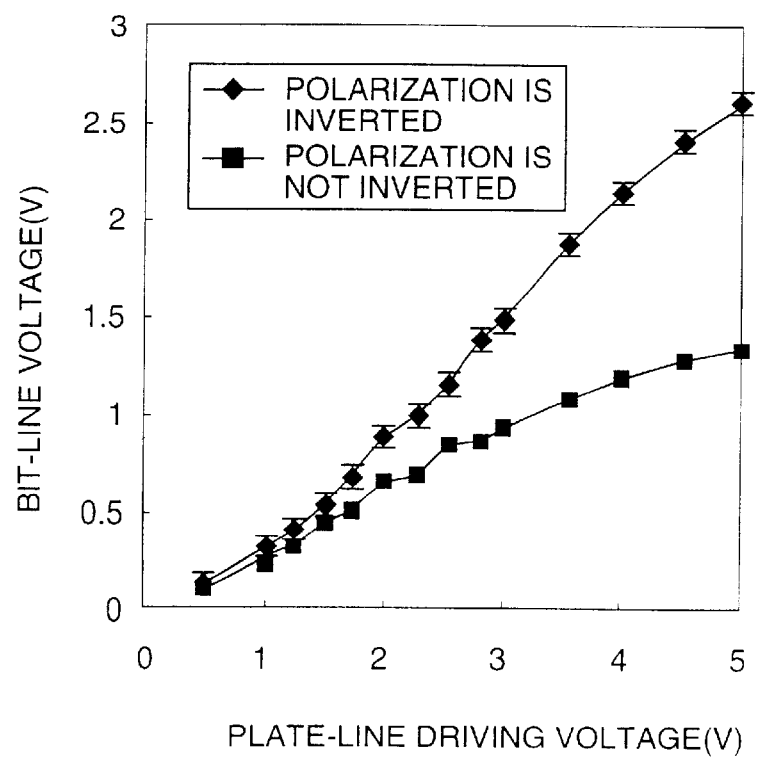
FIG. 40 shows a general relationship between a driving voltage of the plate line (PL or DPL) and a bit-line voltage (BL or /BL), where to the plate lines PL, DPL, the driving voltage, like a unit function as shown in FIG. 39, is provided.

FIG. 40 shows a general relationship between the driving voltage of the plate line (PL or DPL) and the bit-line voltage (BL or /BL). To the plate lines PL, DPL, the driving voltage like a unit function as shown in FIG. 39 is provided. Namely, the driving voltage of the plate lines PL, DPL varies as, for example, 0 V→VP (plate-line voltage).

In FIG. 40, when the driving voltage of the plate line is larger than 1.75 V, a difference on the bit-line voltage is generated according to a spontaneous direction of the ferroelectric capacitor. Therefore, if the reference voltage is generated by the dummy cell so as to be substantially an intermediate voltage of the two different bit-line voltages, the spontaneous direction of the ferroelectric capacitor may be easily discriminated.

For example, when the driving voltage of the plate line PL in the memory cell is maintained at 5 V, and when the driving voltage of the plate line DPL in the dummy cell is set to 3 to 4.5 V, the bit-line voltage $V_{BL}$ becomes 2.7 V (for the logic "1") or 1.3 V (for the logic "0"). In this case, the voltage $V_{/BL}$ of the bit line /BL as the reference voltage (when the spontaneous polarization is inverted) becomes 1.5 to 2.5 V. Namely, the reference voltage may be set to be an intermediate range of both voltages for the logic "1" and the logic "0" in the memory cell.

In this way, by adjusting the driving voltage of the plate line in the dummy cell to be lower than the driving voltage of the plate line in the memory cell, a proper reference voltage may be generated.

As previously discussed, since the dummy cell is driven every time when the data is read out, the inversion fatigue of the dummy cell occurs earlier compares to the memory cell. In the ferroelectric memory according to the present invention, since the inversion fatigue of the dummy cell is reduced by the lower plate-line driving voltage, a stable, long term data reading-out operation may be carried out.

Figure 41:
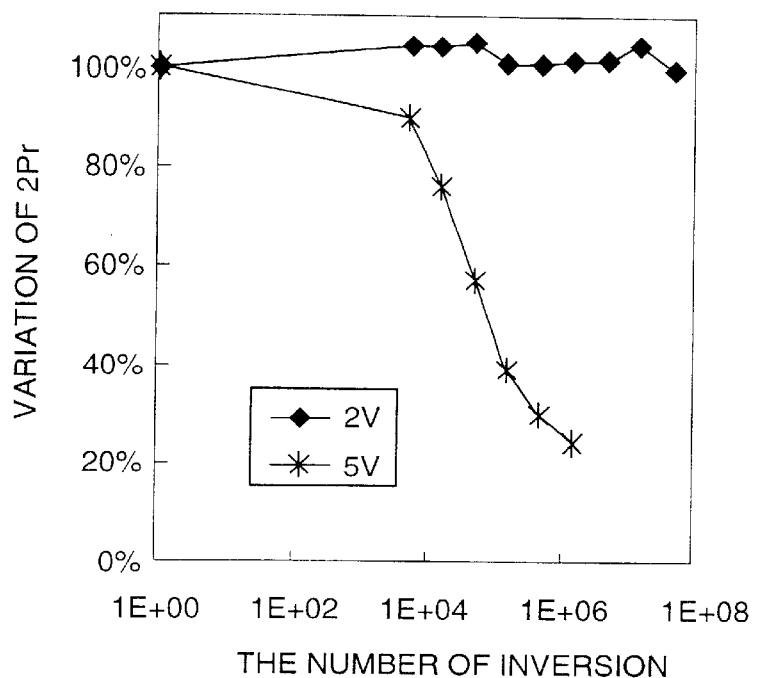
FIG. 41 shows characteristics of inversion fatigue of the ferroelectric capacitor.

FIG. 41 shows characteristics of the inversion fatigue of the ferroelectric capacitor. The horizontal axis indicates the number of inversion, and the vertical axis indicates remanent polarization (2×Pr). Reduction of the remanent polarization 2Pr indicates an increase in the inversion fatigue.

When the ferroelectric capacitor is driven at 5 V, and if the ferroelectric capacitor is inverted $10^5$ times, the remanent polarization 2Pr is reduced to one-half. On the contrary, when the ferroelectric capacitor is driven at 2 V, even if the ferroelectric capacitor is inverted $10^7$ times, reduction of the remanent polarization 2Pr does not occur, and fatigue does not appear in the ferroelectric capacitor.

In this way, for reducing the inversion fatigue of the dummy cell, it is preferred that the driving voltage of the plate line is adjusted as low as possible within a range of generating the reference voltage.

Figure 42:
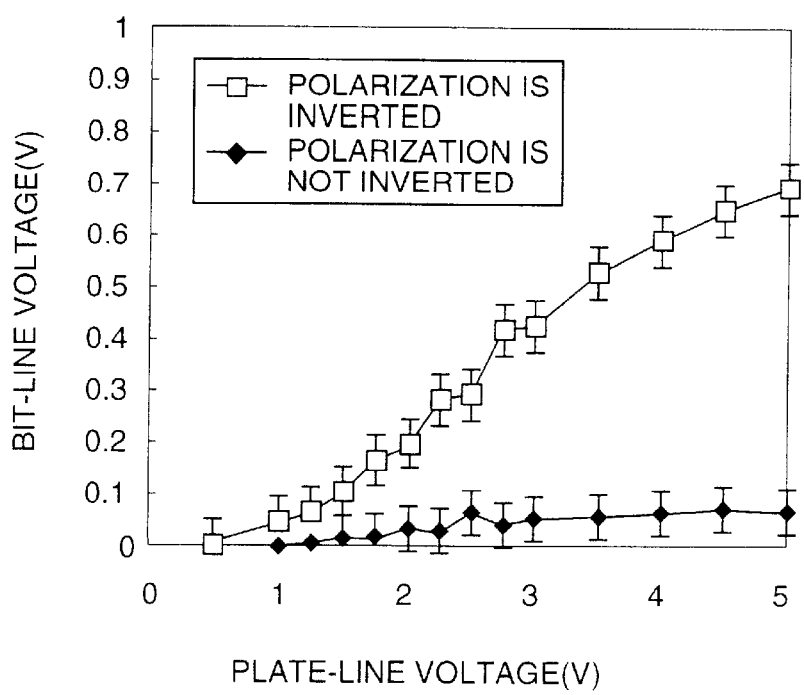
FIG. 42 shows a general relationship between the driving voltage of the plate line (PL or DPL) and the bit-line voltage (BL or /BL), where to the plate lines PL, DPL, the driving voltage, like a rectangular shaped pulse, is provided.

FIG. 42 shows a general relationship between the driving voltage of the plate line (PL or DPL) and the bit-line voltage (BL or /BL), where the driving voltage of a rectangular shaped pulse is provided to the plate lines PL, DPL. Namely, the driving voltage of the plate lines PL, DPL varies as, for example, 0 V→VP (plate-line voltage)→0 V.

In FIG. 42, when the spontaneous polarization of the ferroelectric capacitor is not inverted, the bit-line voltage does not extremely increase as in the case shown in FIG. 40. Therefore, a margin for setting the reference voltage may be increased. For example, when the driving voltage of the plate line in the memory cell is set to 5 V, and when the driving voltage of the plate line in the dummy cell is set to 1.75 to 3.5 V, the bit-line voltage $V_{BL}$ becomes 0.68 V (for the logic "1") or 0.08 V (for the logic "0"). In this case, the voltage $V_{/BL}$ of the bit line /BL as the reference voltage (when the spontaneous polarization is inverted) becomes 0.2 to 0.5 V. Namely, the reference voltage may be set to be an intermediate range of both voltages for the logic "1" and the logic "0" in the memory cell.

Therefore, compared with the case where the unit-function-type driving voltage is provided to the plate line for the reading-out operation (shown in FIG. 40), the case, where the rectangular-pulse-shaped driving voltage is provided to the plate line for the reading-out operation (shown in FIG. 42), can set the driving voltage of the plate line in the dummy cell to be lower.

In the above-discussed ferroelectric memory using the dummy cell according to the present invention, the different voltages are respectively applied to the plate lines of the memory cell and the dummy cell. However, considering dispersion of a power supply generating the voltage, it is preferred that the same power supply is used rather than preparing dedicated power supplies for the different voltages for the memory cell and the dummy cell.

Figure 43:
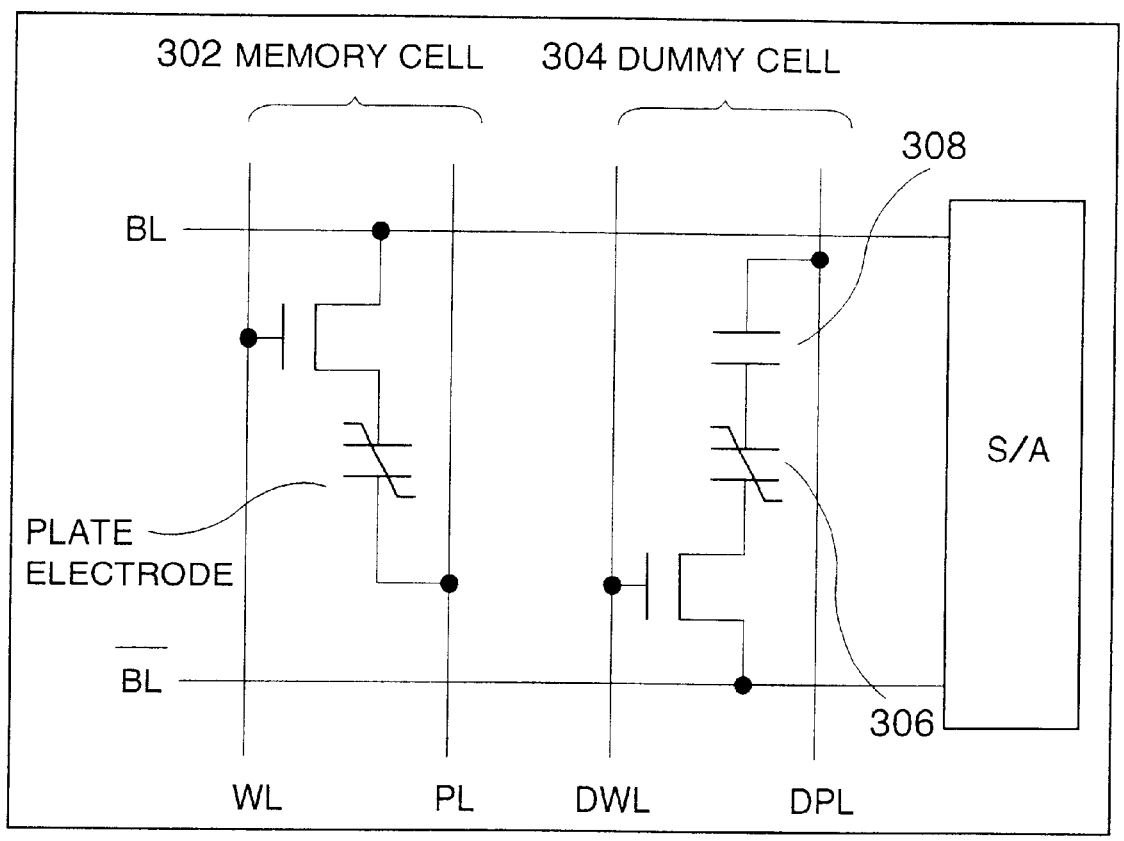
FIG. 43 shows a configuration example of the ferroelectric memory using the dummy cell according to the present invention.

FIG. 43 shows a configuration example of the ferroelectric memory using the dummy cell according to the present invention. In the ferroelectric memory shown in FIG. 43, a memory cell 302 and a dummy cell 304 are arranged in parallel, and are connected to the same power supply (not shown). However, timing of the provided voltages are different for each the memory cell 302 and the dummy cell 304.

Further, in order to reduce the driving voltage of the plate line DPL in the dummy cell 304, a capacitor 308 or a resistor (only the capacitor 304 is shown in FIG. 43) is connected in series to a ferroelectric capacitor 306. More particularly, by providing the capacitor 308 with the ferroelectric capacitor, dispersion of the ferroelectric capacitor 306 may be compensated by the capacitor 308, and, thus, a stable operable ferroelectric memory may be realized.

As discussed above, in the ferroelectric memory using the dummy cell according to the present invention, the driving voltage of the ferroelectric capacitor in the dummy cell is set to be lower than that of the ferroelectric capacitor in the memory cell. Therefore, inversion fatigue of the dummy cell is reduced, and, thus, a stable, long term data writing-in-and-reading-out operation may be expected.

Further, another ferroelectric memory according to the present invention is proposed. The ferroelectric memory according to the present invention may resolve the problem of the prior art ferroelectric memory disclosed in Japanese Patent Publication No. 7-13877.

In the ferroelectric memory according to the present invention, when the power source is supplied, voltage levels of the plate line and the bit line are set to the Vcc/2 voltage. Subsequently, for each word line, a voltage level of the word line is increased, and a voltage level of a corresponding plate line is successively changed like Vcc/2→(Vcc/2+Vα)→(Vcc−Vβ)→Vcc/2, where Vα and Vβ are respectively first and second given voltage.

In this way, a data reading-and-rewriting operation is carried out. After the remanent polarization of all memory cells is changed to a storage charge, the ferroelectric memory is set to be the DRAM mode.

According to the above-discussed data reading method, when the power source is supplied, a data recall operation is carried out. Therefore, regardless of characteristics of the dummy cell, a stable data reading-and-rewriting operation may be carried out.

Further, the present invention is not limited to these embodiments, but other variations and modifications may be made without departing from the scope of the present invention.

Next, descriptions will be given of three optional kinds of ferroelectric memories according to the present invention. However, the subject matter of the following invention is not indispensable for the above-discussed invention.

(1) FIRST OPTIONAL FERROELECTRIC MEMORY DEVICE

The invention of the first optional device generally relates to a ferroelectric memory device, and more particularly, to a ferroelectric memory device carrying out a non-volatile memory operation using a ferroelectric substance as a gate insulating film of a gate controlled diode.

First, a description will be given of the background of the above-mentioned ferroelectric memory according to the present invention.

In the prior art, as a non-volatile semiconductor memory device, an EEPROM and a flash memory, etc., are used. However, since these memories need a high voltage of 10 to 12V for a writing operation, there is a problem in that it is difficult to operate these memories by a single voltage (e.g. 5V) like other semiconductor memory devices. Further, there is also a problem in that these memories may not be operable at a fast writing speed, and, thus, they have a lengthy writing time.

Recently, to resolve the above-discussed problems such as high-voltage requirement and a lengthy writing time, a ferroelectric memory using a ferroelectric substance such as PZT ($PbZr_{0.52}Ti_{0.48}O_3$) as the gate insulating film has been developed. In operation of this ferroelectric memory, three methods are known, the first method is directed to detecting variation of storage capacitance of a ferroelectric capacitor, the second method detects variation of resistance according to remanent polarization of the ferroelectric substance, and the third method controls conductivity of the diode by using the remanent polarization of the ferroelectric substance.

With respect to the first method, FRAM (registered by Ramtron company) has been proposed by the Ramtron company. In the memory, by using the ferroelectric substance as a dielectric of the capacitor for storing information, the storage capacitor per one unit area may be increased. However, in commercial use, a cell configuration of (2Tr+ 2C) is used, and, thus, it is difficult to improve degree of integration of the memory.

Further, use of a FRAM having a cell configuration of (1Tr+1C) like the prior art DRAM has also been developed, however, this FRAM is in commercial use.

On the other hand, with respect to the second method, an SFRAM (Static FRAM) has been developed by Radiant company in the U.S.A. In this memory, a ferroelectric thin film is layered on a silicon substrate, and subsequently, an oxide semiconductor thin film is formed thereon. By the remanent polarization of the ferroelectric thin film, variation of resistance of the oxide semiconductor thin film is detected. In the following, a description will be given of the SFRAM, by referring to FIG. 44A and FIG. 44B (see U.S. Pat. No. 5,070,385).

Figure 44A:
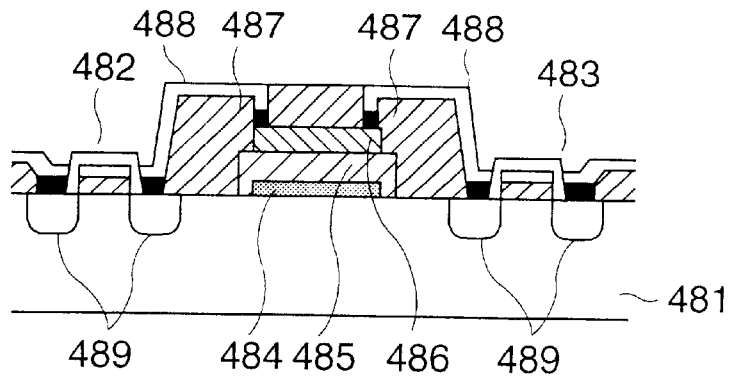
FIG. 44A shows a cross-sectional view of a prior art ferroelectric memory cell using a semiconductor thin-film resistor.

FIG. 44A shows a cross-sectional view of a prior art ferroelectric memory cell using a semiconductor thin-film resistor. In FIG. 44A, after forming a conventional pair of n-channel MISFETs 482 and 483 on a p-type silicon substrate 481, a Pt layer is formed through a thin Ti film. By patterning this thus formed Pt layer, a lower electrode (plate) 484 is formed. After that, a ferroelectric thin film made of PLZT ($Pb_{0.89}La_{0.02}Zr_{0.40}Ti_{0.60}O_3$) is layered, and a patterning process is carried out so as to cover the lower electrode 484.

Further, oxide semiconductor thin film is layered. By patterning this thin film, a semiconductor layer 486 is formed. Subsequently, both ends of the semiconductor layer 486 are respectively connected to one of source and drain regions of the pair of n-channel MISFETs 482, 483 through contact holes and a connection wiring layer 488 formed in an inter-layer insulating film 487.

Figure 44B:
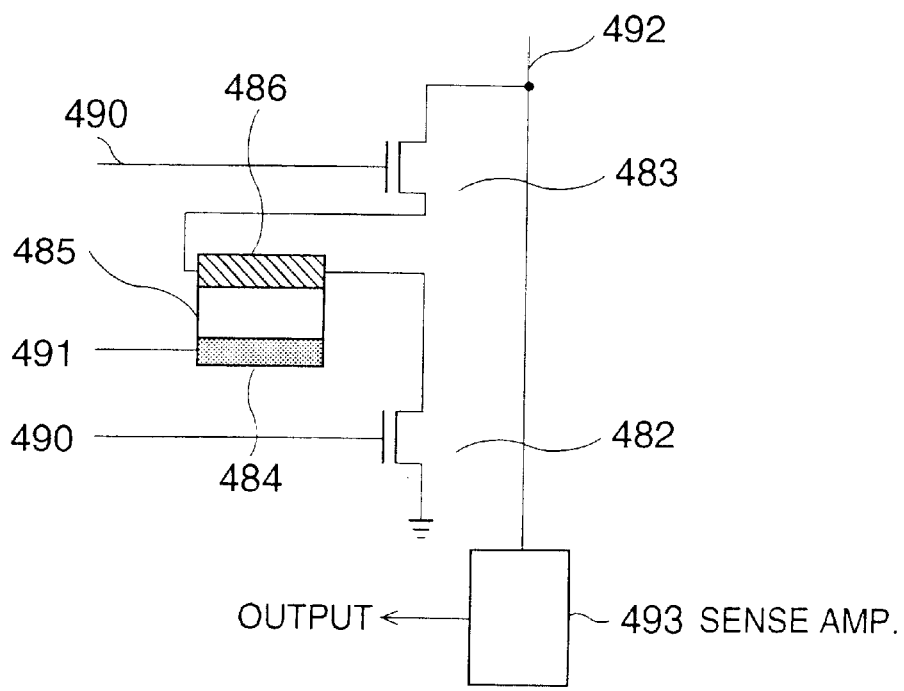
FIG. 44B shows a schematic diagram of the ferroelectric memory device shown in FIG. 44A.

FIG. 44B shows a schematic diagram of the ferroelectric memory device shown in FIG. 44A. When writing information into the ferroelectric memory device, to the n-channel MISFET 483 of the pair of the n-channel MISFETs, a bit line 492 is connected, and a word line 490 is connected to gate electrodes of the n-channel MISFETs 483 and 482. When a voltage is applied to the word line 490, the n-channel MISFET 483 is turned on, and the n-channel MISFET 482 is turned off. At this time, when a voltage is applied between the bit line 490 and the lower electrode 484 through a plate line 491, the ferroelectric thin film 485 is polarized.

In this case, when the bit line 492 is a "low" voltage, a electric-field vector of the polarization becomes oriented toward a p-type silicon substrate 481. Therefore, excess electrons are stored in the semiconductor layer 486, and, thus, the semiconductor layer 486 assumed a low resistance state.

On the other hand, when the bit line 492 is a "high" voltage, the electric-field vector of the polarization becomes oriented toward an opposite side of the p-type silicon substrate 481. Therefore, the semiconductor layer 486 is in a depletion state, and assumed a high resistance state. Accordingly, based on a resistance value of the semiconductor layer 486, a logic "1" or a logic "0" is stored.

Figure 45A:
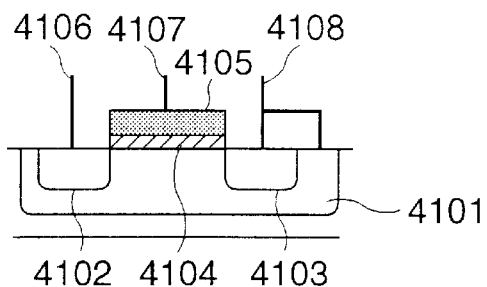
FIG. 45A shows a cross-sectional view of a prior art ferroelectric memory device having a memory cell configuration constructed with 1Tr-type MFS-FET (Metal Ferroelectric Semiconductor FET)
Figure 45B:
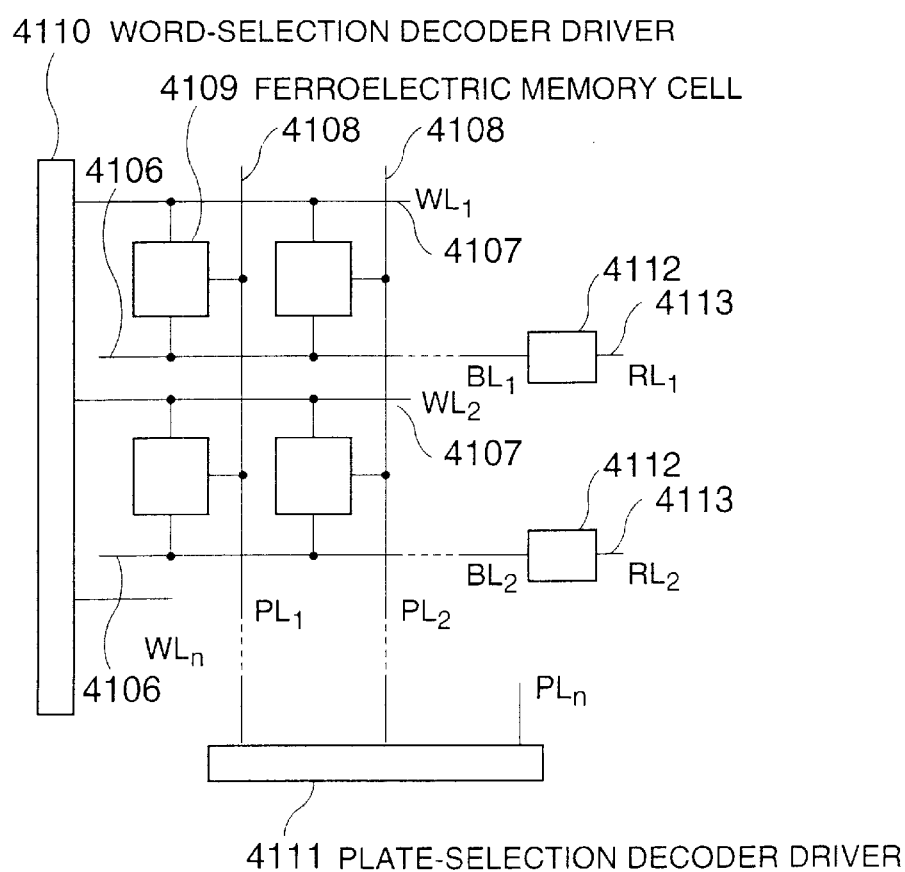
FIG. 45B shows a schematic diagram of the prior art ferroelectric memory device shown in FIG. 45A.

Next, a description will be given of another second method of detecting variation of the resistance according to remanent polarization of the ferroelectric substance, by referring to FIG. 45A and FIG. 45B. FIG. 45A shows a cross-sectional view of a prior art ferroelectric memory device having a memory cell configuration constructed with 1Tr-type MFS-FET (Metal Ferroelectric Semiconductor FET). FIG. 45B shows a schematic diagram of the prior art ferroelectric memory device shown in FIG. 45A. This ferroelectric memory device is disclosed in Japanese Laid-Open Patent Application No. 4-192173.

In FIG. 45A and FIG. 45B, after $n^+$-type source and drain regions 4103, 4102 are formed on a p-type well region 4101, a ferroelectric thin film 4104 such as PLZT is provided as a gate insulating film, nd subsequently, a gate electrode 4105 is further provided thereon. When a voltage is applied between the $n^+$-type source region 4103 connected with the p-type well region 4101 and the gate electrode 4105 so that the electric-field vector may is downwardly oriented, the ferroelectric thin film 4104 is polarized.

By the polarization, electrons are stored in a boundary region between the p-type well region 4101 and the ferroelectric thin film 4104, a normally-on state occurs, and the information may semipermanently be stored. In this case, when the applied electric field is inverted, a normally-off state occurs and the information also may be stored.

When reading-out the stored information, a voltage level of an initially selected bit line ($BL_1$) 4106 is set to 0 V, a reference voltage of a reference line ($RL_1$) 4113 connected to a sense amplifier 4112 is precharged to be Vcc(power-supply voltage)/2, and a selected plate line ($PL_1$) 4108 is provided with a 5-V voltage.

At this time, a selected word line ($WL_1$) 4107 is also provided with a 5-V voltage so that the data may not be changed, and non-selected plate lines ($PL_2$, ... ) 4108 and non-selected word lines ($WL_2$, ... ) 4107 are set to a floating state.

In this case, when the logic "1" is stored in the MFS-FET, and the MFS-FET is operative as a depletion-type FET, the voltage of the selected bit line 4106 gradually increases, and finally, the voltage thereof becomes greater than the reference voltage Vcc/2. At this time, when the sense amplifier 4112 is activated, the voltage of the bit line 4106 increases to 5 V, and the voltage of the reference line 4113 decreases to 0 V. By detecting these voltage levels, the information may be read out.

In such an MFS-FET, since the ferroelectric substance is an oxide, an $SiO_2$ film (not shown) is formed in a boundary region between the p-type well region 4101 and the ferroelectric thin film 4104. Due to the $SiO_2$ film, not only does the operational voltage increase, but also a trap level occurs. Therefore, there is thus a problem that an electric charge is provided the ferroelectric thin film 4104, as a result, an electric charge provided by the remanent polarization is cancelled.

Further, when film-forming temperature of the ferroelectric thin film 4104 is high, elements constituting the ferroelectric thin film 4104 are dispersed in the p-type well region 4101. Namely, the elements are dispersed in the silicon substrate, and, thus, characteristics of the memory device may be degraded. Therefore, to resolve the problem, ferroelectric memories, having an MFIS (Metal Ferroelectric Insulator Semiconductor) constitution shown in FIG. 46A, and an MFMIS (Metal Ferroelectric Metal Insulator Semiconductor) constitution shown in FIG. 46B, are proposed. Elements in FIG. 46A and FIG. 46B which are the same as those of FIG. 45A are given the same reference numerals.

Figure 46A:
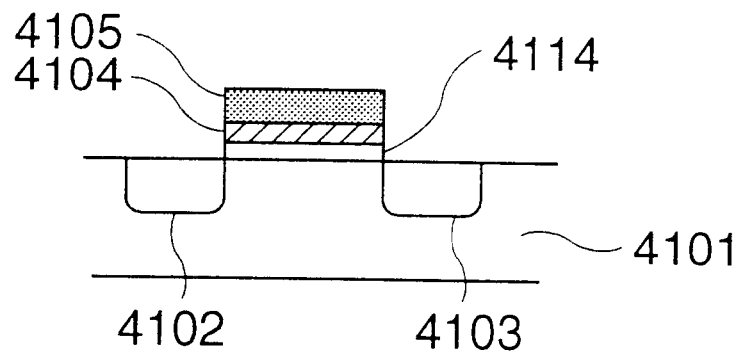
FIG. 46a shows a cross-sectional view of a ferroelectric memory having an MFIS (Metal Ferroelectric Insulator Semiconductor) constitution.
Figure 46B:
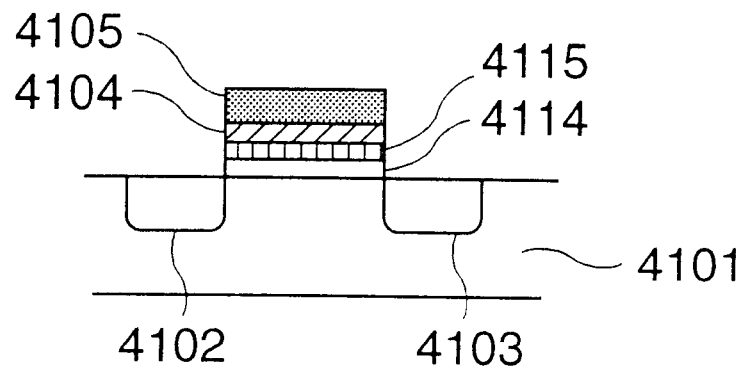
FIG. 46B shows a cross-sectional view of a ferroelectric memory having an MFMIS (Metal Ferroelectric Metal Insulator Semiconductor) constitution.

In the ferroelectric memory having the MFIS constitution shown in FIG. 46A, after an $SiO_2$ film 4114 is formed on the p-type well region 4101, i.e., on a surface of the silicon substrate, the ferroelectric thin film 4104 is formed thereon. In this case, by providing the $SiO_2$ film 4114, the elements constituting the ferroelectric thin film 4104 are prevented from dispersing in the silicon substrate.

In the ferroelectric memory having the MFMIS constitution shown in FIG. 46B, to improve storage characteristics of the remanent polarization of the MFIS, a Pt film having good adaptability to the ferroelectric thin film 4104 is provided between the SiO$_2$ film 4114 and the ferroelectric thin film 4104. Namely, by providing the Pt film, i.e., a stray gate 115, a good-quality ferroelectric thin film 4104 may be formed (see Japanese Laid-Open Patent Application No. 7-202035).

However, in such prior art ferroelectric memories, when the memory cell is semi-selected, the polarization characteristics of the ferroelectric memory may be degraded. To overcome this problem, a method of providing a two-port switch element between the ferroelectric thin film and the word line is proposed in Japanese Laid-Open Patent Application No. 7-106450.

Figure 47A:
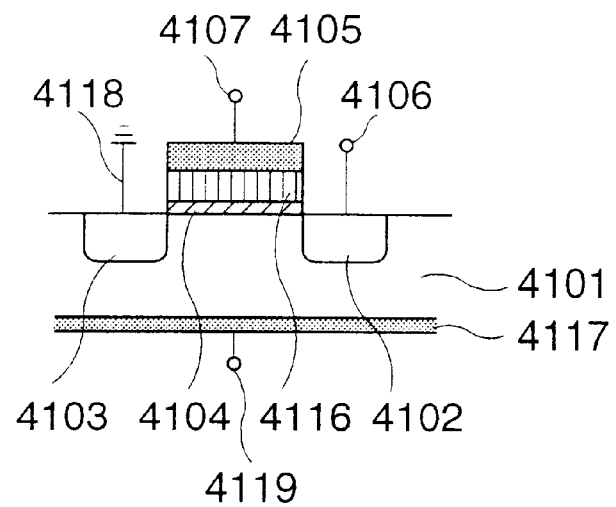
FIG. 47A shows a cross-sectional view of a prior art ferroelectric memory providing a two-port switch element between a ferroelectric thin film and a word line.
Figure 47B:
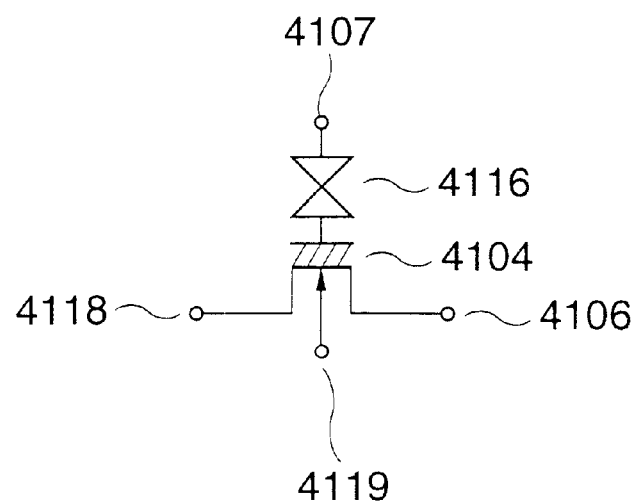
FIG. 47B shows a schematic diagram of the ferroelectric memory shown in FIG. 47A.

In the following, a description will be given of the above-mentioned method, by referring to FIG. 47A and FIG. 47B. FIG. 47A shows a cross-sectional view of a prior art ferroelectric memory providing the two-port switch element between the ferroelectric thin film and the word line. FIG. 47B shows a schematic diagram of the ferroelectric memory shown in FIG. 47A. Elements in FIG. 47A and FIG. 47B which are the same as those of FIG. 45A are given the same reference numerals.

Namely, when a selected memory cell and only one of the word line and the bit line are connected in common, the memory cell is in a semi-selection state. When writing the information of the logic "1" and the logic "0" into the memory cell, an intermediate voltage less than a coercive voltage Vc is applied alternatively in opposite directions between the gate electrode and one of the source and drain regions. Therefore, a phenomenon called "lack of true Ec" occurs, and the polarization characteristics are degraded. As a result, the information may unexpectedly be rewritten.

In the ferroelectric memory shown in FIG. 47A, to resolve the above-discussed problem, a two-port switch element 4116 is provided between the ferroelectric thin film 4104 and the gate electrode 4105 of the ferroelectric memory cell. In FIG. 47B, an equivalent schematic circuit of the ferroelectric memory cell is shown.

In the above-discussed modified ferroelectric memory, in the same way as an original ferroelectric memory (disclosed in Japanese Laid-Open Patent Application No. 7-45794), the gate electrode 4105 is connected to the word line 4107, and the n$^+$-type drain region 4102 is connected to the bit line 4106. Further, the n$^+$-type source region 4103 is grounded to earth through a source electrode 4118, and the p-type well region 4101 (or p-type substrate) is fixed to a minimum voltage in an integrated circuit through a substrate contact electrode 4117 and a substrate wiring electrode 4119.

In this way, by providing the two-port switch element 4116, characteristics of the polarization to the voltage, PrV, may show a good PrV curve having a large rectangular ratio. Therefore, a rising edge at an "on" state and a falling edge at an "off" state respectively may be sharpened. Accordingly, even when semi-selection is carried out, the polarization value is prevented from fluctuating due to the applied voltage. As a result, degradation of the polarization characteristics due to the "lack of true Ec" may be reduced.

Figure 48A:
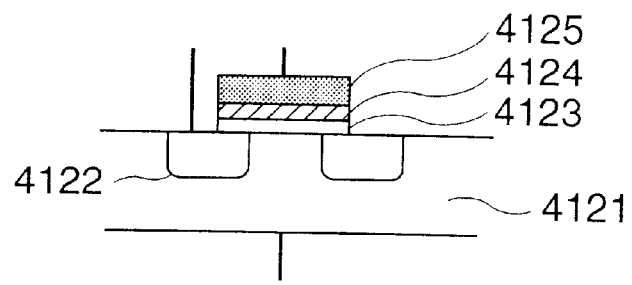
FIG. 48A shows a cross-sectional view of a memory cell of a prior art gate-controlled diode-matrix-type DRAM (Dynamic Random Access Memory)
Figure 48B:
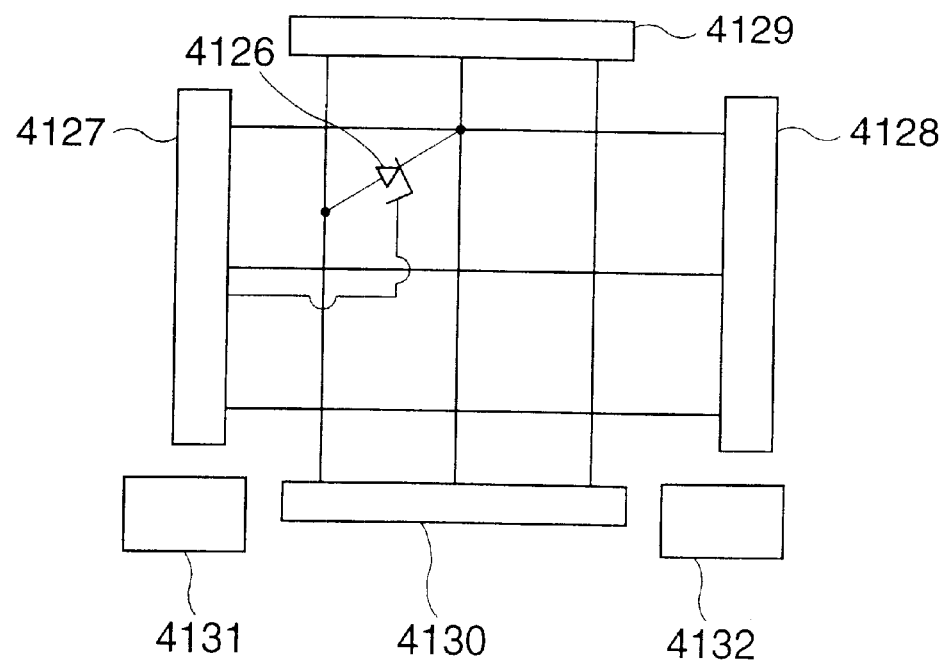
FIG. 48B shows a block diagram of the prior art gate-controlled diode-matrix-type DRAM shown in FIG. 48A.

Next, a description will be given of the third method of controlling conductivity of the diode by the remanent polarization of the ferroelectric substance, by referring to FIG. 48A and FIG. 48B. FIG. 48A shows a cross-sectional view of a memory cell of a prior art gate-controlled diode-matrix-type DRAM (Dynamic Random Access Memory). FIG. 48B shows a block diagram of the prior art gate-controlled diode-matrix-type DRAM shown in FIG. 48A. The above-mentioned DRAM is disclosed in WIPO No. 91-13465.

In FIG. 48A, an n$^+$-type region 4122 is formed on a p-type substrate 4121, and a p-n junction diode is formed. Subsequently, a ferroelectric gate, constructed with an insulating film 4123, a ferroelectric film 4124, and a gate electrode 4125, is provided so as to cover the p-n junction diode. In this way, a gate controlled diode 4126 is formed.

In FIG. 48B, a number of gate controlled diodes 4126 are arranged in a matrix form, and are connected to a row decoder 4127 and a column decoder 4129. Further, the gate controlled diodes 4126 are controlled by a reading-and-writing circuit 4131 and a gate control circuit 4132. In the drawing, numerals 128, 130 respectively indicate an X-output buffer and a Y-output buffer.

However, in the publication of the gatecontrolled diode-matrix-type DRAM, a detailed operational principle and a detailed circuit driving method are not disclosed.

The ferroelectric memory devices of the above-discussed first and second methods respectively use an FET constitution, and require storage capacitor. Therefore, the ferroelectric memory device has a complex configuration and a complicated driving operation. Further, it is difficult to improve integration for the above-discussed ferroelectric memory devices.

Particularly, in the driving method shown in FIG. 45B, when the information is read out, the voltages of the plate line 4108 and the word line 4107 are set to 5.0 V (=Vcc). As a result, the p-n junction forming the n$^+$-type drain region 4102 connected to the bit line 4106 is biased in a forward direction, and is set to be conductive. Therefore, regardless of existence of the information, the bit line 4106 is charged, and, thus, a memory operation may not be carried out.

Further, in the case of the modified ferroelectric memory shown in FIG. 47A, as discussed above, by the method of applying the bias voltage when writing the information, only a part sandwiched by the gate electrode 4105 of the ferroelectric thin film 4104 and the n$^+$-type drain region 4102 is polarized (which is disclosed in Japanese Laid-Open Patent Application No. 7-45794). In this case, there is a problem in that it may be difficult to carry out a stable operation for the memory cell in such a polarization condition.

In the above-discussed third method, only a general concept is proposed, and there is no disclosure of the detailed operational principle and the detailed circuit driving method. Therefore, it may be difficult to use the third method in practice.

Next, a description will be given of a summary of the invention.

It is an object of the present invention to provide a ferroelectric memory device. A memory-cell constitution of the ferroelectric memory device is simplified, and, thus, integration of the memory device is improved. Further, a driving method of the memory device is simplified. Also, degradation of polarization characteristics of the memory device can be reduced. This permits the disadvantages described above to be eliminated.

Figure 49:
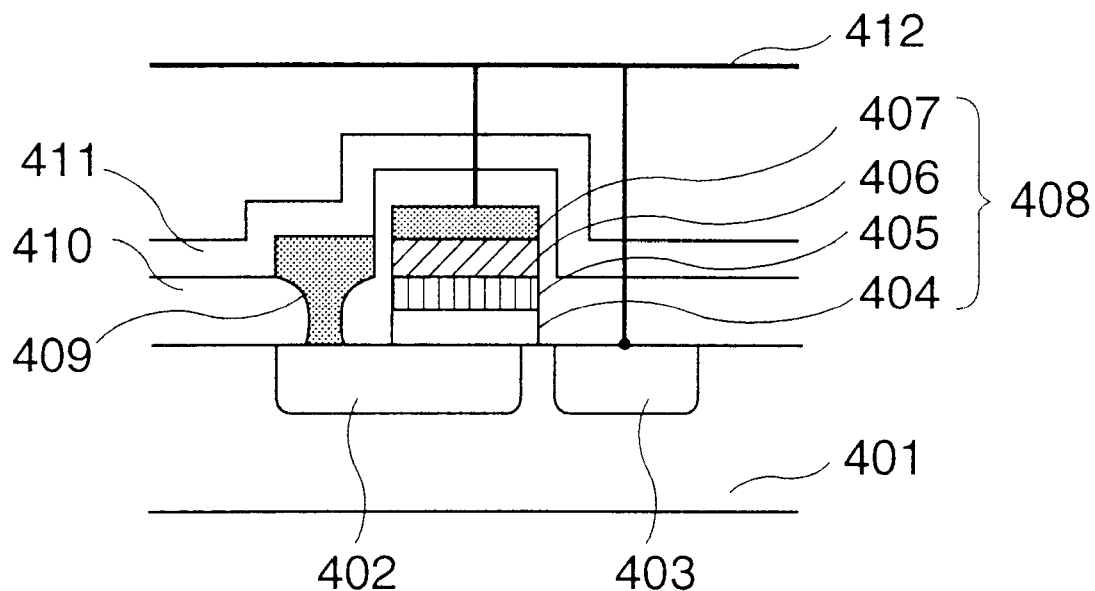
FIG. 49 shows a cross-sectional view of a simplified configuration example of the ferroelectric memory device according to the present invention for explaining an operational principle of the device.

FIG. 49 shows a cross-sectional view of a simplified configuration example of the ferroelectric memory device according to the present invention for explaining an operational principle of the device. In the following, by referring to FIG. 49, a summary of the invention will be described. In FIG. 49, numerals 409, 410, 411 and 412 respectively indicate a word line, an inter-layer insulating film, a cover film, and a bit line.

(1) The object described above is achieved by a ferroelectric memory device characterized in that there are provided: a gate control diode formed by providing a gate section 408 so as to cover at least one part of a p-n junction formed between a first one-conductive region 402 and an opposite conductive region 1, the gate part 408 having gate insulating films 404 to 406, and a ferroelectric substance being used for a part of the gate insulating films 404 to 406; and a second one-conductive region 403 forming a p-n junction with said opposite conductive region 401; wherein the second one-conductive region 403 is electrically connected to a gate electrode 407.

According to the above-discussed ferroelectric memory device, the memory cell is constructed with a diode structure without using an FET structure. Therefore, a configuration of the memory cell may be simplified. Further, the memory can carry out the same driving operation as that of the prior art diode-matrix-type memory (e.x. PROM:Programmable ROM). Accordingly, excessive elements such as a plate line and a plate voltage may be unnecessary, and, thus, a simple driving operation may be expected.

Further, compared with the prior art gate-controlled diode-matrix-type DRAM shown in FIG. 48B, the specified gate control circuit 4132 may be unnecessary, the memory can carry out the same driving operation as that of the prior art diode-matrix-type memory. Therefore, a configuration of the driving circuit may be simplified.

(2) The object described above is also achieved by the ferroelectric memory device mentioned in the above item (1), characterized in that: the gate section 408 is constructed by successively layering an insulating film 404, a ferroelectric film 406, and a gate electrode 407.

According to the above-mentioned ferroelectric memory device, between the opposite conductive region 401, namely, a semiconductor substrate, and the ferroelectric film 406, an insulating film is provided. Therefore, characteristics in a boundary surface region may be improved, and elements constituting the ferroelectric film 406 are prevented from being dispersed.

(3) The object described above is also achieved by the ferroelectric memory device mentioned in the above item (1), characterized in that: the gate section 408 is constructed by successively layering an insulating film 404, a floating gate 405, a ferroelectric film 406 and a gate electrode 407.

According to the above-mentioned ferroelectric memory device, between the insulating film 404 and the ferroelectric film 406, the floating gate 405 is provided. Therefore, the ferroelectric film 406 is formed on the floating gate 405 having a good connection with the ferroelectric film 406. Accordingly, a good quality ferroelectric film 406 may be formed.

Further, the above-mentioned ferroelectric memory device has the same configuration as that of the prior art MISFET except for having the ferroelectric substance. Therefore, when fabricating the ferroelectric memory device, peripheral circuits such as CMOS circuits also can simultaneously be formed, and, thus, a fabricating process of the ferroelectric memory device may be simplified.

(4) The object described above is also achieved by the ferroelectric memory device mentioned in one of the above items (2) and (3), characterized in that: to one of a first face between the ferroelectric film 406 and the gate electrode 407, and a second face of the gate electrode 407 opposite to the first face, a 2-port switch element having a metal-and-dielectric-and-metal configuration is provided.

According to the above-mentioned ferroelectric memory device, to one of the first face between the ferroelectric film 406 and the gate electrode 407, and the second face of the gate electrode 407 opposite to the first face, the 2-port switch element having the metal-and-dielectric-and-metal configuration, namely, an MIM structure, is provided. Therefore, polarization characteristics of the ferroelectric film 406 may be good characteristics having a sharp rectangular ratio. Accordingly, degradation of the polarization characteristics due to repetition of a writing operation may be reduced, and, thus, a writing error of the information is prevented.

(5) The object described above is also achieved by the ferroelectric memory device mentioned in one of the above items (1) to (4), characterized in that: the opposite conductive region 401 is an opposite-conductive-type well region arranged in an array formation on a one-conductive semiconductor substrate; the first one-conductive region 402 and the second one-conductive region 403 are provided in the well region 401; and impurity density of the first one-conductive region 402 is larger than that of the second one-conductive region 403.

According to the above-mentioned ferroelectric memory device, one of the two one-conductive depletion regions provided in the opposite-conductive-type well region, namely, the first one-conductive region 402, has higher impurity density of $4 \times 10^{18}$ to $3 \times 10^{20}$ cm$^{-3}$. Therefore, a breakdown voltage of the p-n junction may be reduced, and the other second one-conductive region 403 is operable as a backward blocking diode.

The ferroelectric memory device has the same memory cell structure as that of a lateral bipolar transistor. Therefore, when the ferroelectric memory device is fabricated, an element for detecting a reading-out current may simultaneously be formed as the lateral bipolar transistor. Accordingly, a fabricating process of the ferroelectric memory device may be simplified.

(6) The object described above is also achieved by the ferroelectric memory device mentioned in one of the above items (1) to (4), characterized in that: the first one-conductive region 402 is an internal-side one-conductive region constituting a vertical-type bipolar transistor structure constructed with a one-conductive region, and an opposite-conductive region, and a one-conductive region; the opposite conductive region 401 is an opposite conductive region constituting the vertical-type bipolar transistor structure; the second one-conductive region 403 is another one-conductive region constituting the vertical-type bipolar transistor structure; and impurity density of the first one-conductive region 402 is larger than that of the second one-conductive region 403.

According to the above-mentioned ferroelectric memory device, the ferroelectric memory device has the same memory cell structure as that of the vertical-type bipolar transistor. Therefore, when the memory cell of the ferroelectric memory device is fabricated, the element for detecting the reading-out current may simultaneously be formed as the vertical-type bipolar transistor. Accordingly, a fabricating process of the ferroelectric memory device may be simplified. Further, a p-n junction corresponding to a base-collector junction of the vertical-type bipolar transistor is operable as the backward blocking diode.

(7) The object described above is also achieved by the ferroelectric memory device mentioned in one of the above items (1) to (4), characterized in that: the first one-conductive region 402 is a one-conductive region constituting a structure of a one-conductive region, an opposite conductive region, and one-conductive region formed in a polycrystal semiconductor thin film which is mounted on an insulating substrate; the opposite conductive region 401 is an opposite conductive region constituting a structure of a one-conductive region, an opposite conductive region, and a one-conductive region; the second one-conductive region 403 is another one-conductive region constituting a structure of a one-conductive region, an opposite conductive region, and one-conductive region; and impurity density of the first one-conductive region 402 is larger than that of the second one-conductive region 403.

According to the above-mentioned ferroelectric memory device, since the memory cell may be fabricated thinner, the fabrication cost of the memory may be reduced. Further, compared with the prior art memory cell using oxide semiconductor thin film shown in FIG. 45A, the ferroelectric memory device may carry out a stable operation. Also, the driving circuit may be simplified.

In the above-discussed structure, as shown in the items (2) to (4), the gate part 408 is successively layered in an opposite order.

(8) The object described above is also achieved by the ferroelectric memory device mentioned in one of the above items (1) to (7), characterized in that: at least surface of the first one-conductive region 402 includes a large number of crystal defects.

According to the above-mentioned ferroelectric memory device, a large number of crystal defects are provided in the surface of the first one-conductive region 402. Therefore, a reverse current $I_R$ of the gate-controlled diode may be increased.

Other objects and further features of the present invention will be apparent from the following detailed description when read in conjunction with the accompanying drawings.

Figure 50A:
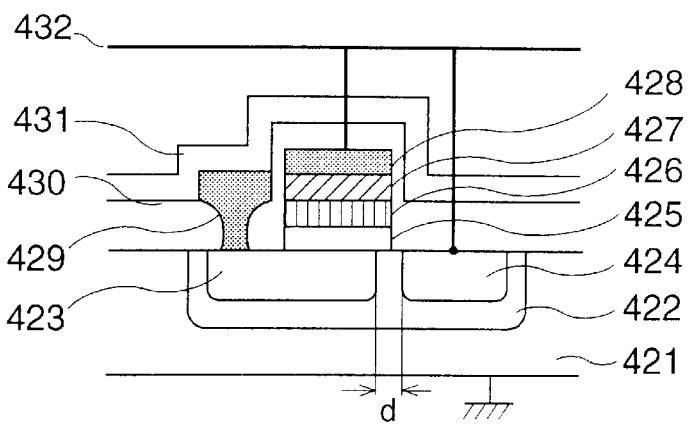
FIG. 50A shows a cross-sectional view of a memory cell structure of a first embodiment of the ferroelectric memory device having a lateral-bipolar-transistor structure according to the present invention.
Figure 50B:
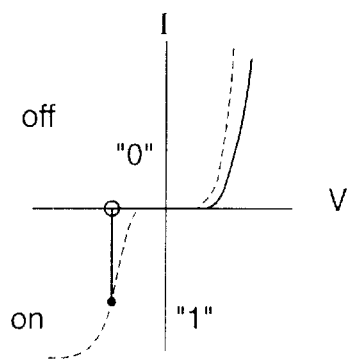
FIG. 50B shows operational characteristics of the memory cell shown in FIG. 50A.
Figure 50C:
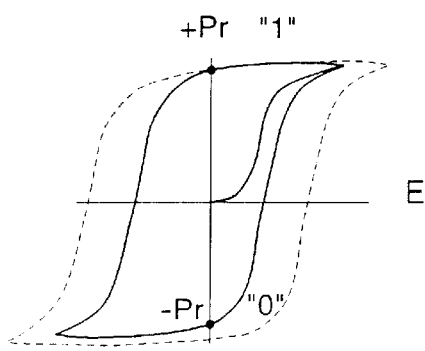
FIG. 50C shows an illustration for explaining polarization variation to an applied electric field in the ferroelectric thin film.
Figure 51:
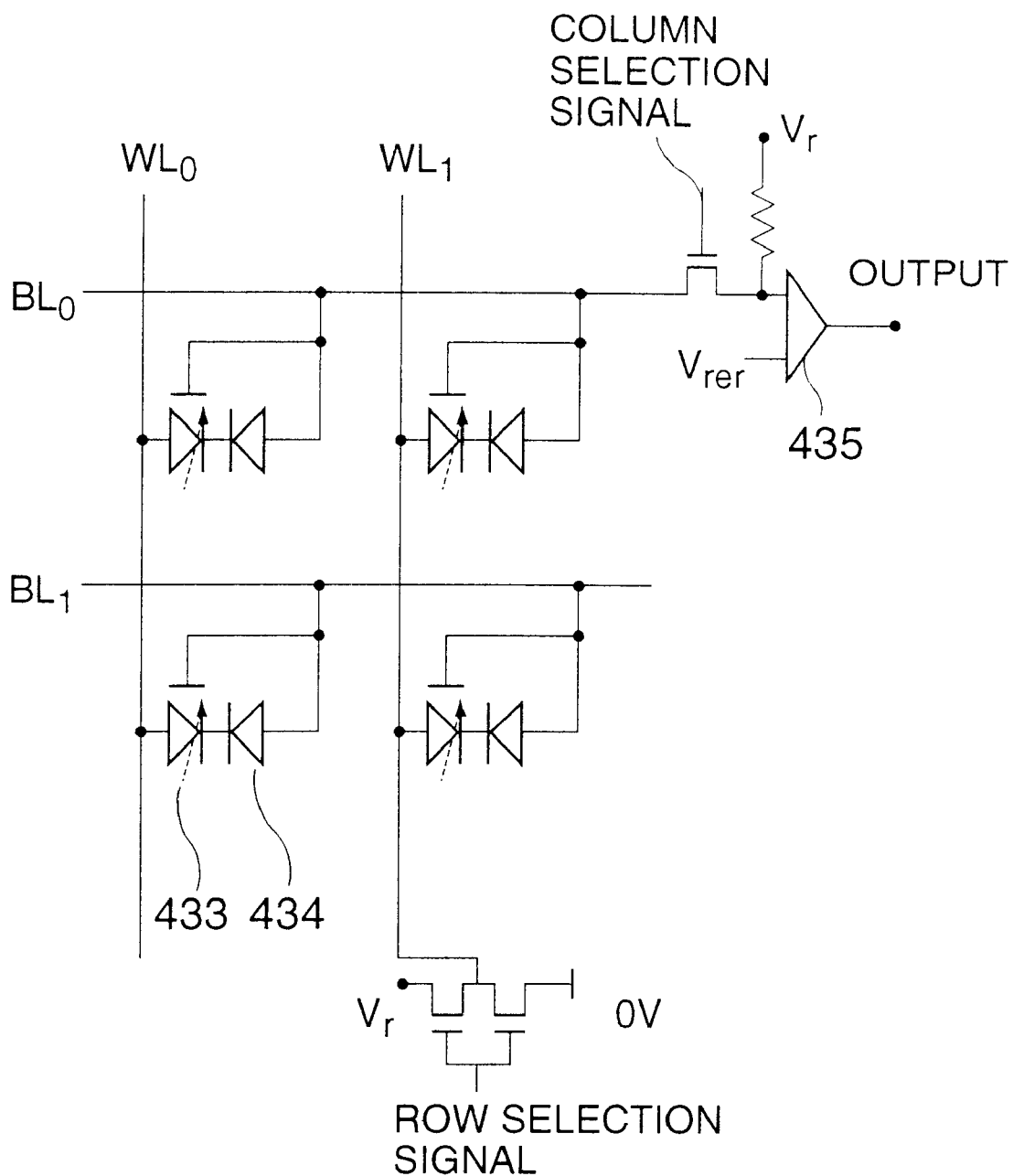
FIG. 51 shows an illustration for explaining a circuit configuration of a memory matrix using the memory cells shown in FIG. 50A.

First, a description will be given of a first embodiment of the ferroelectric memory device having a lateral-bipolar-transistor structure according to the present invention, by referring to FIG. 50A to FIG. 51. FIG. 50A shows a cross-sectional view of a memory cell structure of first embodiment of the ferroelectric memory device having the lateral-bipolar-transistor structure according to the present invention. FIG. 50B shows operational characteristics of the memory cell shown in FIG. 50A. FIG. 50C shows an illustration for explaining polarization variation to an applied electric field in the ferroelectric thin film. FIG. 51 shows an illustration for explaining a circuit configuration of a memory matrix using the memory cells shown in FIG. 50A.

In FIG. 50A, a first n-type impurity is selectively provided in a p-type silicon substrate 421 to form an n-type well region 422 arranged in a matrix structure. At this time, a region having an impurity density in the range of $4 \times 10^{18}$ to $3 \times 10^{20}$ cm$^{-3}$ is formed in the n-type well region 422. Preferably, a first p$^+$-type region 423 and a second p$^+$-type region 424 respectively having an impurity density of $1 \times 10^{19}$ cm$^{-3}$ are formed in the n-type well region 422.

A distance d between the first p$^+$-type region 423 and the second p$^+$-type region 424 is set to be from 0.5 to 5.0 μm, preferably 2.0 μm. Also, in a region for forming peripheral circuits, the same structure is simultaneously formed. In this case, the n-type well region 422 may be a base region, the first p$^+$-type region 423 and the second p$^+$-type region 424 respectively may be an emitter region and a collector region. In this way, the lateral-bipolar-transistor structure is formed.

A SiO$_2$ film having a thickness in the range of 0.5 to 3 μm, preferably, 2.5 μm, a Pt thin film having a thickness in the range of 15 to 30 μm, preferably, 20 μm, a PZT (PbZr$_{0.52}$Ti$_{0.48}$O$_3$) thin film having a thickness in the range of 10 to 70 μm, preferably, 40 μm, and a Pt film having a thickness in the range of 15 to 30 μm, preferably, 20 μm, are successively layered to form a layered film. By patterning the layered film so as to cover a part of a p-n junction formed by the first p$^+$-type region 423 and the n-type well region 422, a gate part comprising a gate insulating film 425, a floating gate 426, a PZT thin film 427, and a gate electrode 428, is formed.

Further, after an inter-layer insulating film made of a SiO$_2$ film 430 having a thickness in the range of 0.2 to 0.5 μm, preferably, 0.3 μm, is provided, a wiring layer to be connected to the first p$^+$-type region 423 is provided as a word line 429. Subsequently, a cover film made of a PSG film 431 having a thickness in the range of 0.5 to 1.0 μm, preferably, 0.8 μm, and the gate electrode 428 and the second p$^+$-type region 424 are connected to a bit line 432 through a roughly-illustrated connection wiring layer.

In the above-discussed structure, the first p$^+$-type region 423, the n-type well region 422, and the gate part 425 to 428 form the gate-controlled diode, and the second p$^+$-type region 424 and the n-type well region 422 form the backward blocking diode.

Next, a description will be given of operation characteristics of the first embodiment of the ferroelectric memory cell, by referring to FIG. 50B and FIG. 50C.

FIG. 50B shows characteristics of a p-n junction diode, namely, a gate-controlled diode, formed by the first p$^+$-type region 423 and the n-type well region 422 of the ferroelectric memory cell. A solid line in FIG. 50B indicates characteristics when the PZT thin film 427 has remanent polarization in a −Pr side shown in FIG. 50C. A dotted line in FIG. 50C indicates an ideal remanent-polarization characteristics having a good rectangular ratio.

Operational characteristics of a conventional gate-controlled diode are well known. However, the present invention is directed to, for example, "field-induced junction" (see, for example, A. S. Grove, "Physics and Technology of Semiconductor Devices", p.305–310). In this structure, when a voltage larger than a given value is applied to the gate electrode 428, the reverse current $I_R$ occurs. The gate voltage when the reverse current $I_R$ occurs depends on impurity density of the first p$^+$-type region 423 and an amount of crystal defects in the surface thereof.

The crystal defects are formed by ion implantation of the impurity forming a deep level such as Fe and Ni in the surface of the first p$^+$-type region 423, or are formed by a selective spin coating and a heating processing of a water solution including 10- to 100-ppm density Fe and Ni in the surface of the first p$^+$-type region 423. In the present specification, the meaning given to the inclusion of a large number of crystal defects indicates that the crystal defects are intended to be provided. Therefore, there is no specified lower-side limitation.

In the gate-controlled diode, for a part of the gate parts 425 to 428, the PZT thin film 427 made of ferroelectric is used. Therefore, when an electric field is previously applied to the gate parts, the PZT thin film 427 may have remanent polarization, whereby ferroelectric memory device may have non-volatile memory characteristics.

Namely, for example, when a 5.0-V voltage ($V_W$) is applied to the bit line 432, and a 0.0-V voltage is applied to the word line 429, polarization occurs in the PZT thin film 427. In this case, even if the voltage is turned off, the polarization remains as the remanent polarization.

By the remanent polarization, the reverse current $I_R$ flows into the p-n junction, namely, a normally-on state occurs, and information of the logic "1" is written. When the information is read out, a 2.0-V voltage ($V_r$) is applied to the bit line 432, and a 0.0-V voltage is applied to the word line 429. At this time, the gate-controlled diode is biased in a reverse direction. When the information of the logic "1" is previously written, the reverse current $I_R$ occurs and the gate-controlled diode is set to be conductive.

On the other hand, when a 0.0-V voltage is applied to the bit line 432, and a 5.0-V voltage is applied to the word line 429, the polarization in a backward direction occurs in the PZT thin film 427. Also, in this case, even if the voltage is turned off, the polarization remains as the remanent polarization.

By the remanent polarization, the reverse current $I_R$ does not flow into the p-n junction, namely, an off state occurs, and information of the logic "0" is written. When the information is read out, a 2.0-V voltage is applied to the bit line 432, and a 0.0-V voltage is applied to the word line 429. At this time, the gate-controlled diode is biased in a reverse direction. When the information of the logic "0" is previously written, the reverse current $I_R$ does not occur and the gate-controlled diode is set to be non-conductive.

FIG. 51 shows the ferroelectric memory device in which the above-discussed ferroelectric memory cells are arranged in a matrix form. In FIG. 51, a p-type region of a gate-controlled diode 433 constituting the ferroelectric memory cell is connected to word lines $WL_0$, $WL_1$, . . . . Further, the gate electrode of the gate-controlled diode 433 constituting the ferroelectric memory device and a p-type region of a backward blocking diode 434 are connected to bit lines $BL_0$, $BL_1$, . . . .

Each of the bit lines $BL_0$, $BL_1$, . . . is connected to a sense amplifier 435 through a column selection transistor. Each of the word lines $WL_0$, $WL_1$, . . . is supplied with a 0.0-V voltage or a 2.0-V voltage through a row selection transistor.

When writing the information into the ferroelectric memory device, non-selected bit lines and non-selected word lines are respectively supplied with a 2.5-V ($V_W/2$) voltage, the selected bit line and the selected word line to which the logic "1" is written are respectively supplied with a 5-V voltage and a 0.0-V voltage.

On the other hand, when writing the logic "0", the selected bit line and the selected word line are respectively supplied with a 0.0-V voltage and a 5.0-V voltage.

When the previously-written information is read out, the non-selected bit lines are set to a floating state, and the non-selected word lines are maintained at 2.0 V. At this time, a column selection signal is applied to a gate of the column selection transistor connected to the bit line of the selected cell to apply 2.0 V to the selected bit line, and a row selection signal is applied to a gate electrode of the row selection transistor connected to the selected word line to apply 0.0 V to the selected word line.

In this way, by constructing the memory cell with the gate-controlled diode 433 in which the ferroelectric substance is used in the gate part, and the backward blocking diode 434, the ferroelectric memory device may be driven by substantially the same operation as that of the prior art diode matrix array. Therefore, the driving operation of the ferroelectric memory device may be simplified.

In the above-discussed operation, a 2.0-voltage is used for the reading-out voltage (Vr). The reading-out voltage is not limited to 2.0 V, but may be, for example, a half voltage of the writing voltage (Vw), Vw/2, i.e., 2.5 V.

Further, by constructing the peripheral circuits such as a sense amplifier 35 with the lateral-bipolar-transistors, the peripheral circuits may be manufactured in the same process as that of the memory cell. Therefore, a manufacturing process may also be simplified.

In addition, since storage capacitance storing information is unnecessary, the degree of integration of the ferroelectric memory device may be improved as compared to the memory having a (1Tr+1C) structure. For example, when a length in a direction of the first p⁺-type region 423 and the second p⁺-type region 424, namely, a length of the memory cell, is set to 5.0 μm, and a width of the memory cell is set to 2.0 μm, a 64-Mbit ferroelectric memory device may be provided in a small chip area of 40 mm×16 mm.

In the above description, the floating gate 426 is provided between the gate insulating film 425 and the PZT thin film 427. By the above structure, a stable layering of the PZT thin film 427 can be carried out, and an adverse influence on a silicon boundary face may be prevented. However, the floating gate 426 is not an indispensable element for the ferroelectric memory device according to the present invention.

Figure 52:
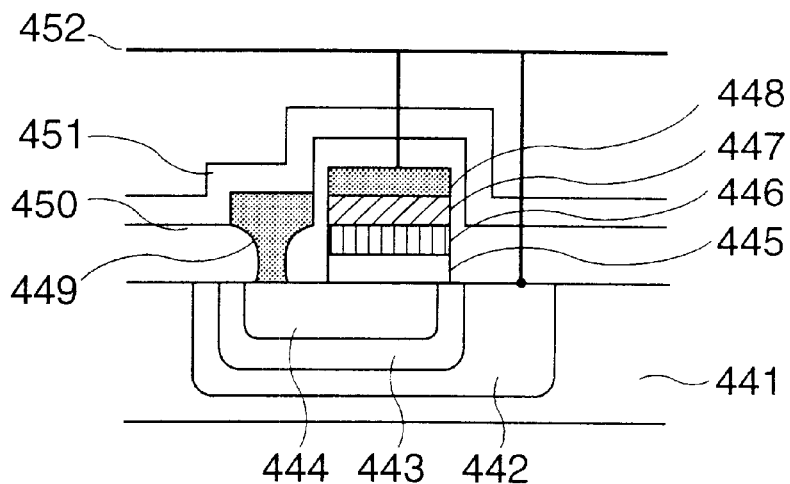
FIG. 52 shows a cross-sectional view of a memory cell structure of a second embodiment of the ferroelectric memory device having the lateral-bipolar-transistor structure according to the present invention.

Next, a description will be given of a second embodiment of the ferroelectric memory device having the lateral-bipolar-transistor structure according to the present invention, by referring to FIG. 52. FIG. 52 shows a cross-sectional view of a memory cell structure of the second embodiment of the ferroelectric memory device having the lateral-bipolar-transistor structure according to the present invention.

In FIG. 52, a first p-type impurity and n-type impurity are alternatively selectively provided in an n-type silicon substrate 441 to form the lateral-bipolar-transistor structure comprising a second p-type region 442, an n-type region 443, and first p-type region 444 arranged in a matrix structure.

At this time, impurity density of the first p-type region 444 is set to be in a rage of $4 \times 10^{18}$ to $3 \times 10^{20}$ cm⁻³, preferably, $1 \times 10^{19}$ cm⁻³, to control a breakdown voltage.

In this case, also in the area where the peripheral circuits are formed, the same structure is simultaneously formed. At this time, the second p-type region 442 may be a collector region, the n-type region 443 may be a base region, and the first p-type region 444 may be an emitter region. In this way, the lateral-bipolar-transistor structure is formed.

Further, in the same way as the first embodiment, the $SiO_2$ film, the Pt thin film, the PZT thin film, and the Ti film, are successively layered to form the layered film. By patterning the layered film so as to cover a part of a p-n junction formed by the first p-type region 444 and the n-type region 443, a gate part comprising a gate insulating film 445, a floating gate 446, a PZT thin film 447, and a gate electrode 448, is formed.

Further, after an inter-layer insulating film made of a $SiO_2$ film 450 is provided, a wiring layer connected to the first p-type region 444 is provided as a word line 449. Subsequently, a cover film made of a PSG film 451 is provided and the gate electrode 448 and the second p-type region 442 are connected to a bit line 452 through a roughly-illustrated connection wiring layer.

In the above-discussed structure, the first p-type region 444, the n-type region 443, and the gate parts 445 to 448 form the gate-controlled diode, and the second p-type region 442 and the n-type region 443 form the backward blocking diode.

The operational characteristics of the second embodiment of the ferroelectric memory device is substantially the same as that of the first embodiment of the ferroelectric memory device. Further, overall construction and driving method of the second embodiment also are substantially the same as those of the first embodiment of the ferroelectric memory device.

In addition, in the second embodiment of the ferroelectric memory device, since given margins are required between any regions at the least, a width of the ferroelectric memory cell increases. Except for this point, the second ferroelectric memory device may have the same features as those of the first embodiment of the ferroelectric memory device.

Figure 53:
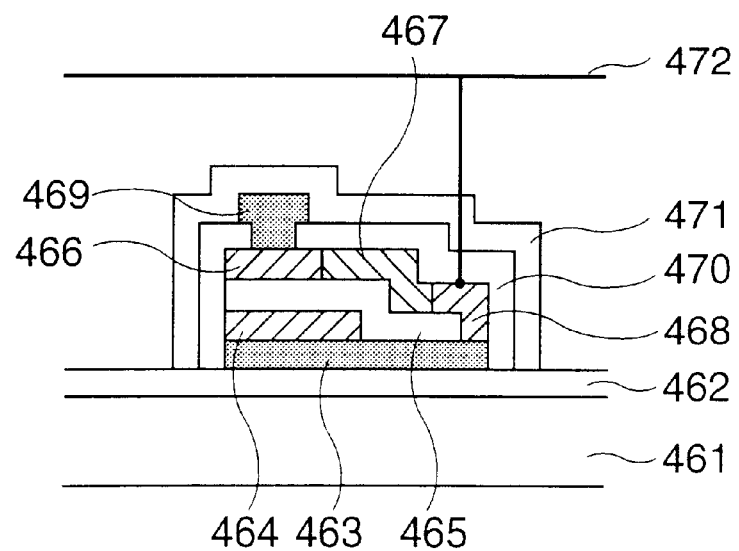
FIG. 53 shows a cross-sectional view of a third embodiment of the ferroelectric memory cell according to the present invention.

Next, a description will be given of a third embodiment of the ferroelectric memory cell having a thin-film semiconductor layer according to the present invention, by referring to FIG. 53. FIG. 53 shows a cross-sectional view of the third embodiment of the ferroelectric memory cell according to the present invention.

In FIG. 53, first, on a quartz substrate 461, a $SiO_2$ film 462 having a thickness in the range of 10 to 30 $\mu$m, preferably, 20 $\mu$m, is layered using a spattering method, and a Pt film having a thickness in the range of 15 to 30 $\mu$m, preferably, 20 $\mu$m, is layered thereon. After that, by patterning the films to form a gate electrode 463. Subsequently, in an approximately-800° C. substrate, a PZT thin film having a thickness in the range of 10 to 70 $\mu$m, preferably 40 $\mu$m, is layered thereon. By patterning, a PZT thin film 467 is formed.

Further, by using a PCVD method (plasma CVD method), in an approximately-350° C. substrate, an $SiO_2$ film having a thickness in the range of 5 to 15 $\mu$m, preferably, 10 $\mu$m, is layered. By patterning the $SiO_2$ film, a gate insulating film 465 is formed. After that, in a 450-to-550° C. substrate, an amorphous silicon film having a thickness in the range of 5 to 15 $\mu$m, preferably 8 $\mu$m, is layered. Further, by laser annealing to form a crystal again, an i-type thin-film semiconductor layer made of a polycrystal silicon film is formed.

Subsequently, after providing arsenic (As) to the thin-film semiconductor layer to set to an n type, the memory cell is divided into individual island-shaped regions by patterning the thin-film semiconductor layer so as to adjust size of a gate electrode 463.

In addition, by selectively providing boron (B) using a mask (not shown), a first p-type region 466 and a second p-type region 468 are formed.

At this time, a region sandwiched between the first p-type region 466 and the second p--type region 468 may be an n-type region 467.

Subsequently, by providing boron(B) to the first p-type region 466 using a new mask (not shown), a $p^+$ region having an impurity density in the range of $4\times10^{18}$ to $3\times10^{20}$ $cm^{-3}$, preferably $1\times10^{19}$ $cm^{-3}$, is formed.

However, in the first boron providing process for forming the first p-type region 466 and the second p-type region 468, if an impurity in the range of $4\times10^{18}$ to $3\times10^{20}$ $cm^{-3}$, preferably $1\times10^{19}$ $cm^{-3}$, is provided, the second boron providing process may be unnecessary.

Further, in the same way as the first embodiment, after an inter-layer insulating film made of a $SiO_2$ film 470 having a thickness in the range of 0.2 to 0.5 $\mu$m, preferably, 0.3 $\mu$m, is provided, a wiring layer connected to the first p-type region 466 is provided as a word line 469. Subsequently, a cover film made of a PSG film 471 having a thickness in the range of 0.5 to 1.0 $\mu$m, preferably, 0.8 $\mu$m, and second p-type region 468 is connected to a bit line 472 through a roughly-illustrated connection wiring layer.

In this case, the gate electrode 463 is connected to the bit line 472 through the second p-type region 468.

In the above-discussed structure, the first p-type region 466, the n-type region 467, and the gate parts 463 to 465 form the gate-controlled diode, and the second p-type region 468 and the n-type region 467 form the backward blocking diode.

The operational characteristics of the third embodiment of the ferroelectric memory device is substantially the same as that of the first embodiment of the ferroelectric memory device. Further, an overall construction and driving method of the third embodiment are also substantially the same as those of the first embodiment of the ferroelectric memory device.

In the third embodiment of the ferroelectric memory device, using the thin-film semiconductor layer forming the memory cell, a thin-film transistor (TFT) constituting the peripheral circuits may be formed. In this case, in order to increase operation speed in the thin film, it is preferred that the impurity is provided in different regions to form an nin-type TFT.

In the third embodiment of the ferroelectric memory device, the thin-film semiconductor device made of a high-quality polycrystal semiconductor is used. The high-quality polycrystal semiconductor is made by re-crystallizing an amorphous semiconductor which is in practical use in the field of an active-matrix-type liquid crystal display. Therefore, while obtaining good device characteristics, manufacturing cost of the ferroelectric memory device may be extremely reduced.

When a 0.5-$\mu$m rule is applied for manufacturing the memory, a memory size having a 3.0 $\mu$m length and a 1.5-$\mu$m width may be provided. In this case, a chip area of a 16-Mbit ferroelectric memory device may be approximately 17 mm×7 mm=98 $mm^2$. Accordingly, the degree of integration may be extremely improved.

In the third embodiment of the ferroelectric memory device, since the PZT thin film 464 is provided on the gate electrode 463, elements constituting the PZT are prevented from diffusing in the semiconductor layer in the process of layering the PZT thin film 464. Therefore, the floating gate does not need to be provided in the third embodiment against the first embodiment. However, in order to prevent the elements constituting the PZT from diffusing in the semiconductor layer in the laser annealing process for re-crystallizing the amorphous film or in the annealing process for activating the provided impurity density, the floating gate may be provided between the PZT thin film 464 and the gate insulating film 465.

Further, in the above description of the third embodiment, a quartz substrate 61 is used as the substrate. However, the substrate is not limited to a quartz substrate, but other insulating substrates such as sapphire may also be used. Further, an insulating substrate whose surface is provided with an oxide film by thermally oxidizing a silicon substrate may also be used.

In addition, in the above description of the third embodiment, the $SiO_2$ film 462 formed by the CVD method is provided on the quartz substrate. However, the $SiO_2$ film 462 is not necessarily required. Further, when the gate electrode made of Pt is formed, in order to improve contacting performance of the Pt film, a thin Ti film may be provided as an under layer.

In the above, the descriptions of the first to third embodiments has been given. In these operations, in the same way as the modified ferroelectric memory device shown in FIG. 47A and FIG. 47B, there is a problem in that when the writing operation of the logic "1" and the logic "0" is repeated many times, a writing error of the information may occur.

Figure 54A:
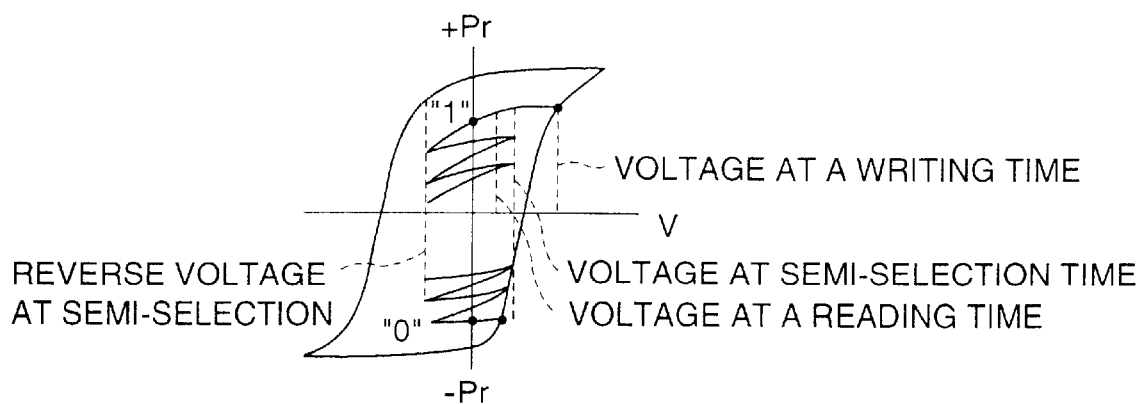
FIG. 54A and FIG. 54B show illustrations for explaining a problem in the first to third embodiments of the ferroelectric memory devices shown in FIG. 50A, FIG. 52, and FIG. 53.
Figure 54B:
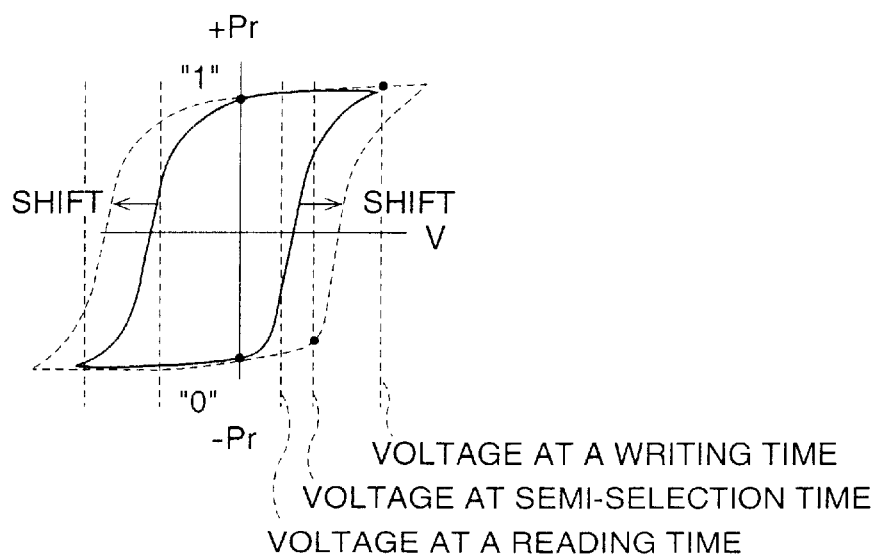

In the following, a description will be given of the above problem, by referring to FIG. 54A and FIG. 54B. FIG. 54A and FIG. 54B show illustrations for explaining the problem in the first to third embodiments of the ferroelectric memory devices shown in FIG. 50A, FIG. 52, and FIG. 53.

As shown in FIG. 54B, polarization characteristics of the ferroelectric thin film 406 represented by a solid line is different from the ideal polarization characteristics having a good rectangular-shape ratio. Therefore, as shown in FIG. 54A, when information is written, a semi-selection voltage is alternatively applied to a semi-selected memory cell. The polarization point repeatedly moves on a history curve with reduction of the polarization. Finally, the information of the logic "1" written in the memory cell disappears.

Also, in the case where the information of the logic "0" is written in the memory cell, the same operation may be carried out, and the information of the logic "0" written in the memory cell disappears.

As described above, in the present cell structure of the first to third embodiments, when the writing operation is repeated many times, a writing error may occur. Therefore, in the same way as a flash memory, there is a need for simultaneously writing the logic "0" into all memory cells, and, subsequently, writing the logic "1" into a selected memory cell. Accordingly, it is difficult to operate the ferroelectric memory device in the first to third embodiments like the DRAM.

If the history curve of the polarization characteristics is set to be the ideal characteristics represented by the dotted line, even if the semi-selection voltage is applied to the semi-selected memory cell, the polarization value may not change. In this case, even when the writing operation is repeated many times, degradation of the polarization characteristics may be reduced, and, thus, occurrence of the writing error may also be reduced.

In order to obtain such an ideal polarization characteristics, as shown in FIG. 47A, the two-port switch element may be provided between the ferroelectric thin film and the bit line (word line in the case of FIG. 47A) so as to shift the history curve in positive and negative directions. In this case, the writing voltage needs to be a voltage a little higher than a summation of the coercive voltage Vc and the on voltage Von of the two-port switch element. Therefore, for the first to third embodiments of the ferroelectric memory devices, a higher voltage by the on voltage Von of the two-port switch element is required.

Figure 55:
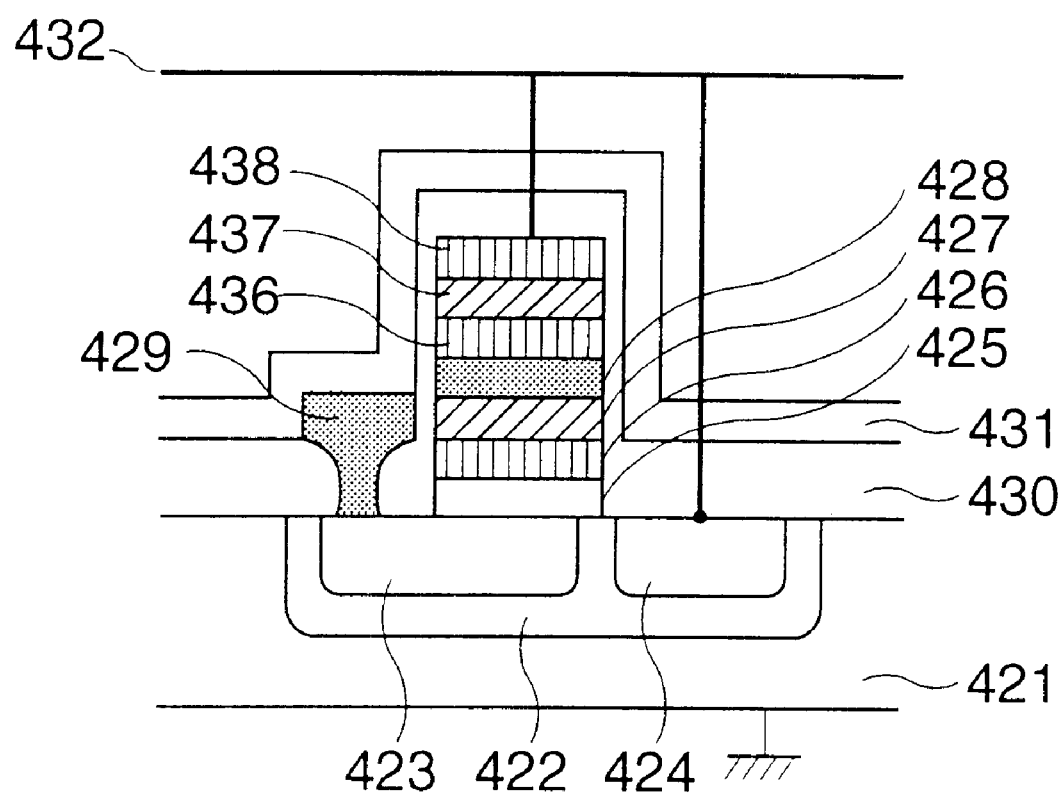
FIG. 55 shows a cross-sectional view of a fourth embodiment of the ferroelectric memory device using an MIM element as a two-port switch element.

Next, a description will be given of a fourth embodiment of the ferroelectric memory device, by referring to FIG. 55. FIG. 55 shows a cross-sectional view of the fourth embodiment of the ferroelectric memory device using an MIM element as the two-port switch element.

In the ferroelectric memory device shown in FIG. 55, as compared to the first embodiment of the ferroelectric memory device shown in FIG. 50A, the MIM element comprising a Ta electrode 436, a $Ta_2O_5$ thin film 437, and a Ta electrode 438 is layered on the gate electrode 428. Other configurations are the same as that of the first embodiment of the ferroelectric memory device shown in FIG. 50A.

In this case, the on voltage Von of the MIM element depends on a thickness of the $Ta_2O_5$ thin film 437. It is preferred that the on voltage Von is set to approximately 1.5 to 5.0 V, at least about the coercive voltage (Vc).

However, when the on voltage Von is set to 5.0 V, the driving voltage needs to be 8 to 10 V. In such a case, disturbance may hardly occur.

In the case where the MIM element is provided, when the writing or reading operation is carried out, charges are stored in the Ta electrode between the $Ta_2O_5$ thin film 437 operating as an I layer of the MIM element and the PZT thin film 427. When the logic "1" is written in the memory cell, the memory cell is set to the normally-on state. Therefore, it is not necessarily required to reset the voltage level to 0 V by applying a voltage for pulling out the stored charge just after the writing or reading operation.

In the above-discussed fourth embodiment, the description of the fourth embodiment has been given so as to provide the MIM element to the gate part in the configuration of the first embodiment shown in FIG. 50A. However, the feature of providing the MIM element may also be applied for the configurations of the second and third embodiments shown in FIG. 52 and FIG. 53.

Further, in the above description of the fourth embodiment, it has been shown that the two-port switch element is the MIM element comprising the Ta electrode 436, the $Ta_2O_5$ thin film 437, and the Ta electrode 438. However, the two-port switch element is not limited to such substances, but a variety of substances, which are well known as substances constituting the MIM element, are usable. In addition, the two-port switch element is not limited to the MIM element, but it is possible to use other switch elements having characteristics obtained when the diodes are connected in series in a reverse direction.

In each of the above-discussed embodiments, for the ferroelectric thin film, PZT is used. However, the ferroelectric thin film is not limited to PZT, but other ferroelectric thin film such as PLZT, $BaTiO_3$, $PbTiO_3$, and $Bi_4Ti_3O_{12}$, are also applicable.

Further, in each of the above-discussed embodiments, Pt is used for the floating gate. However, the polycrystal silicon is usable for the floating gate.

When polycrystal silicon is used for the floating gate, since it is difficult to directly layer PZT on polycrystal silicon film, it is preferred that PZT is layered on polycrystal silicon through an $IrO_2$ film. In this case, by using polycrystal silicon for the floating gate, a boundary face condition of the gate $SiO_2$ is improved, and, thus, an increased yield from manufacturing and an improvement in operational stability are provided ("Electronic Material" in Japanese, August, 1994, p.27–32).

In addition, in each of the above-discussed embodiments, using a p-n-p structure, the gate-controlled diode and the backward blocking diode are constructed. However, these diodes may also be constructed with an n-p-n structure. Further, these diodes are not limited to silicon, but other IV-group semiconductor such as SiGe combination crystal, and III–V-group compound semiconductor such as GaAs are also usable.

As described above, the present inventions have the following features.

According to the present invention, the memory cell is constructed with the gate-controlled diode, and the gate electrode is connected to the backward blocking diode. Therefore, the cell structure may be simplified, and the degree of integration may be improved.

Further, since the memory device has substantially the same structure as that of the PROM constructed with the diode matrix array, driving operation may be simplified, and a stable operation may be expected.

In addition, by inserting the MIM element between the ferroelectric thin film and the bit line, the polarization characteristics are prevented from being degraded, and, thus, a stable writing and reading operation may be performed.

Further, the present invention is not limited to these embodiments, but other variations and modifications may be made without departing from the scope of the present invention.

(2) SECOND OPTIONAL FERROELECTRIC MEMORY DEVICE

The invention of the second optional device generally relates to a ferroelectric memory device and its driving method, and more particularly, to a ferroelectric memory device and driving method which carries out a non-volatile memory operation using an MISFET having a ferroelectric substance as a gate insulating film.

First, a description will be given of the background of the above-mentioned second optional ferroelectric memory according to the present invention.

In the prior art, as a non-volatile semiconductor memory device, an EEPROM and a flash memory, etc., are used. However, since these memories need a high voltage of 10 to 12V for a writing operation, there is a problem in that it is difficult to operate these memories by a single voltage (e.g. 5V) like other semiconductor memory devices. Further, there is also a problem in that these memories may not be operable at a fast writing speed, and, thus, they have a lengthy writing time.

Recently, to resolve the above-discussed problems such as high-voltage requirement and a lengthy writing time, a ferroelectric memory using a ferroelectric substance such as PZT ($PbZr_{0.52}Ti_{0.48}O_3$) as the gate insulating film has been developed. In operation of this ferroelectric memory, two methods are known, the first method is directed to detecting variation of storage capacitance of a ferroelectric capacitor, and the second method detects variation of resistance according to remanent polarization of the ferroelectric substance.

With respect to the first method, FRAM (registered by Ramtron company) has been proposed. In the memory, by using the ferroelectric substance as a dielectric of the capacitor for storing information, variation of the storage capacitance with polarization inversion is detected. However, in commercial use, a cell configuration of (2Tr+2C) is used, and, thus, it is difficult to improve the degree of integration of the memory. Further, it may be "destructive reading".

Further, use of a FRAM having a cell configuration of (1Tr+1C) like the prior art DRAM has also been developed, however, this FRAM is in commercial use.

On the other hand, with respect to the second method of detecting variation of the resistance 35 according to remanent polarization of the ferroelectric substance, a 1Tr-type MFS-FET (Metal Ferroelectric Semiconductor FET) has been developed.

Figure 56A:
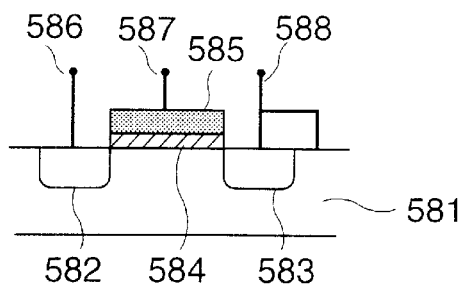
FIG. 56A shows a cross-sectional view of a prior art ferroelectric memory device having a memory cell configuration constructed with a 1Tr-type MFS-FET (Metal Ferroelectric Semiconductor FET)
Figure 56B:
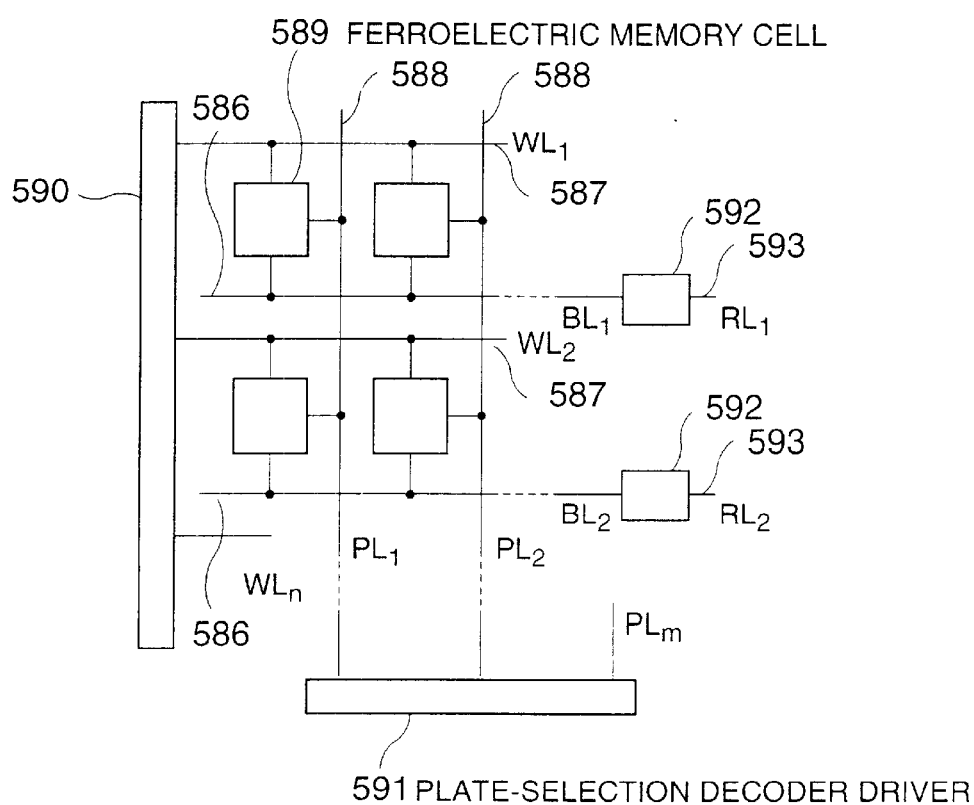
FIG. 56B shows a schematic diagram of the prior art ferroelectric memory device shown in FIG. 56A.

FIG. 56A shows a cross-sectional view of a prior art ferroelectric memory device having a memory cell configuration constructed with the 1Tr-type MFS-FET. FIG. 56B shows a schematic diagram of the prior art ferroelectric memory device shown in FIG. 56A. This ferroelectric memory device is disclosed in Japanese Laid-Open Patent Application No. 4-192173.

In FIG. 56A and FIG. 56B, after $n^+$-type source and drain regions 582, 583 are formed on a p-type well region 581, a ferroelectric thin film 584 such as PLZT is provided as a gate insulating film, and subsequently, a gate electrode 585 is further provided thereon. When a voltage is applied between the $n^+$-type source region 583 connected with the p-type well region 581 and the gate electrode 585 so that the electric-field vector is downwardly oriented, the ferroelectric thin film 584 is polarized.

Since the polarization may remain as a remanent polarization even if the voltage is set to 0 V, electrons are stored in a boundary region between the p-type well region 581 and the ferroelectric thin film 584, a normally-on state occurs, and the information may semipermanently be stored. In this case, when the applied electric field is inverted, a normally-off state occurs and the information may also be stored.

When reading-out the stored information, a voltage level of an initially selected bit line ($BL_1$) 586 is set to 0 V, a reference voltage of a reference line ($RL_1$) 593 connected to a sense amplifier 592 is precharged to Vcc (power-supply voltage)/2, and a selected plate line ($PL_1$) 588 is provided with a 3.3-V voltage.

At this time, a selected word line ($WL_1$) 587 is also provided with a 3.3-V voltage so that the data may not be changed, and unselected plate lines ($PL_2$, . . . ) 588 and unselected word lines ($WL_2$, . . . ) 587 are set to a floating state.

In this case, when the logic "1" is stored in the MFS-FET, and the MFS-FET is operative as a normally-on-type FET, i.e., a depletion-type FET, the voltage of the selected bit line 586 gradually increases, and finally, the voltage thereof becomes greater than the reference voltage Vcc/2. At this time, when the sense amplifier 592 is activated, the voltage of the bit line 586 increases to 3.3 V, and the voltage of the reference line 592 decreases to 0 V. By detecting these voltage levels, the information may be read out.

In FIG. 56B, numerals 589, 590 and 591 respectively indicate a ferroelectric memory cell, a word-selection decoder driver, and a plate-selection decoder driver.

In such a MFS-FET, since the ferroelectric substance is an oxide, an $SiO_2$ film (not shown) is formed in a boundary region between the p-type well region 581 and the ferroelectric thin film 584. Due to the $SiO_2$ film, not only does the operational voltage increase, but also a trap level occurs. Therefore, there is thus a problem that an electric charge is provided to the ferroelectric thin film 584, as a result, an electric charge provided by the remanent polarization is cancelled.

Further, when a film-forming temperature of the ferroelectric thin film 584 is high, elements constituting the ferroelectric thin film 584 are diffused in the p-type well region 581. Namely, the elements are diffused in the silicon substrate, and, thus, characteristics of the memory device may be degraded. Therefore, to resolve the problem, ferroelectric memories, having an MFIS (Metal Ferroelectric Insulator Semiconductor) constitution shown in FIG. 57A, and an MFMIS (Metal Ferroelectric Metal Insulator Semiconductor) constitution shown in FIG. 57B, are proposed. Elements in FIG. 57A and FIG. 57B which are the same as those of FIG. 56A are given the same reference numerals.

Figure 57A:
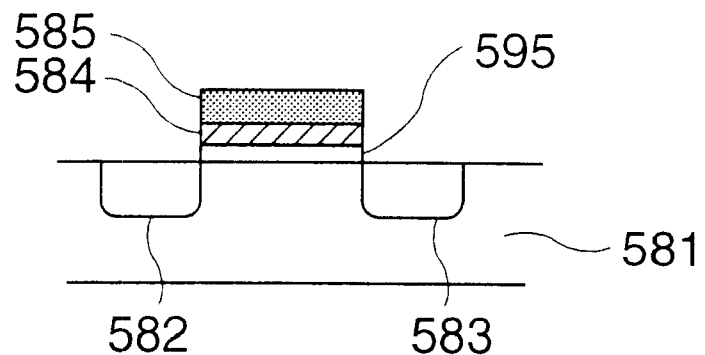
FIG. 57A shows a cross-sectional view of a ferroelectric memory having an MFIS (Metal Ferroelectric Insulator Semiconductor) constitution.
Figure 57B:
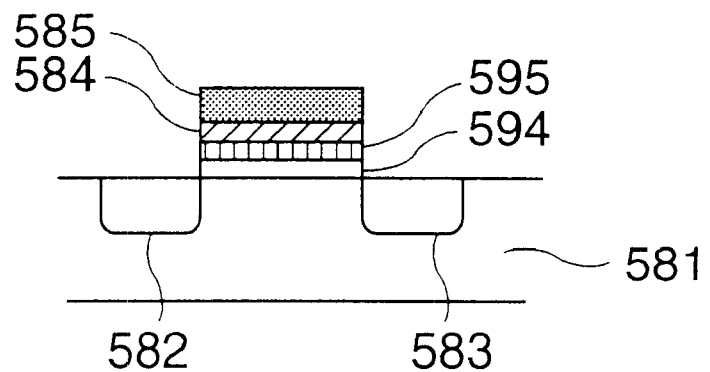
FIG. 57B shows a cross-sectional view of a ferroelectric memory having an MFMIS (Metal Ferroelectric Metal Insulator Semiconductor) constitution.

In the ferroelectric memory having the MFIS constitution shown in FIG. 57A, after an $SiO_2$ film 594 is formed on the p-type well region 581, i.e., on a surface of the silicon substrate, the ferroelectric thin film 584 is formed thereon. In this case, by providing the $SiO_2$ film 594, the elements constituting the ferroelectric thin film 584 are prevented from diffusing in the silicon substrate.

In the ferroelectric memory having the MFMIS constitution shown in FIG. 57B, to improve storage characteristics of the remanent polarization of the MFIS, a Pt film having good adaptability to the ferroelectric thin film 584 is provided between the $SiO_2$ film 594 and the ferroelectric thin film 584. Namely, by providing the Pt film, i.e., a floating gate 595, a good-quality ferroelectric thin film 584 may be formed (see Japanese Laid-Open Patent Application No. 7-202035).

The ferroelectric memory devices of -the above-discussed first and second methods respectively require storage capacitor. Therefore, the ferroelectric memory device has a complex configuration and a complicated driving operation. Further, at the present time, a detailed driving circuit for carrying out a stable operation has not been proposed.

Particularly, in the driving method shown in FIG. 56B, when the information is read out, the voltages of the plate line 588 and the word line 587 are set to 3.3 V. As a result, the p-n junction forming the $n^+$-type drain region 582 connected to the bit line 586 is biased in a forward direction, and is set to be conductive. Therefore, regardless of existence of the information, the bit line 586 is charged, and, thus, a memory operation may not be carried out.

Next, a description will be given of a summary of the invention.

It is an object of the present invention to provide a ferroelectric memory device. A memory-cell constitution of the ferroelectric memory device is simplified, and, thus, the degree of integration of the memory device is improved. Further, a driving method of the memory device is simplified. Also, a stable and reliable driving method of the memory device may be provided. This permits the disadvantages described above to be eliminated.

Figure 58:
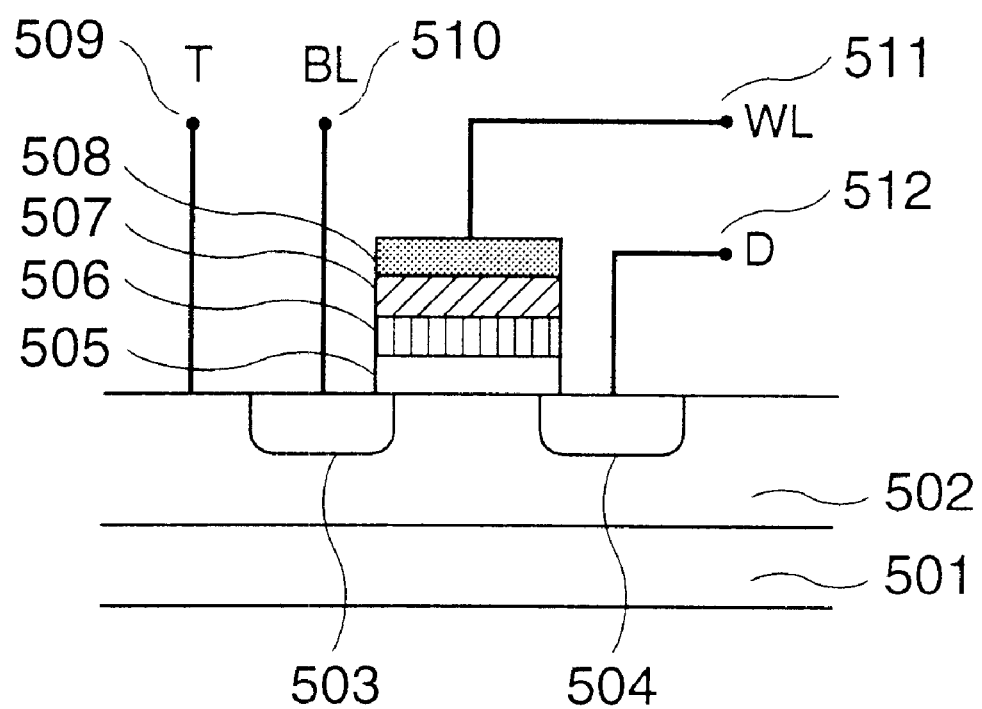
FIG. 58 shows a cross-sectional view of a simplified configuration example of a ferroelectric memory device according to the present invention for explaining an operational principle of the device.

FIG. 58 shows a cross-sectional view of an example of a simplified configuration of the ferroelectric memory device according to the present invention for explaining an operational principle of the device. In the following, by referring to FIG. 58, a summary of the invention will be described.

(1) The object described above is achieved by a ferroelectric memory device in which ferroelectric memory cells are arranged in a matrix form, each of the ferroelectric memory cells having one field-effect transistor (FET) in which a ferroelectric film 507 is used for a part of gate insulating films 505 to 507, said ferroelectric memory device characterized in that there is provided: source and drain regions 503, 504 formed in a well region 502 extending in a direction of a bit line 510; column selection means provided by using the well region 502 as a writing signal line 509 in the same way as the bit line 510; and row selection means provided by using a gate electrode 508 of the field-effect transistor as a word line 511; wherein one 503 of the source and drain regions 503, 504 is connected to the bit line 510, and the other 504 of the source and drain regions 503, 504 is connected to a drive line 512 in a direction of the word line 511.

According to the above-discussed ferroelectric memory device, the well region 502 extending in the direction of the bit line 510 is used for the writing signal line 509. Therefore, a space for wiring the writing signal line 509 is not required, and, thus, the degree of integration may be improved.

(2) The object described above is also achieved by the ferroelectric memory device mentioned in the above item (1), characterized in that: the gate insulating films are constructed by successively layering an insulating film 505, a floating gate 506, and the ferroelectric film 507.

According to the above-mentioned ferroelectric memory device, between the insulating film 505 and the ferroelectric film 507, the floating gate 506 is provided. Therefore, in the same way as the prior art MFMIS, the ferroelectric film 507 having a high quality may positively be provided. Further, when the ferroelectric film 507 is polarized by applying a voltage to the gate electrode 508, a stable normally-off state having a given threshold voltage (Vth) may be realized.

(3) The object described above is also achieved by the ferroelectric memory device mentioned in one of the above items (1) and (2), characterized in that there is further provided third-voltage-level trimming means having a polycrystal semiconductor fuse in a chip in order to trim the third voltage level (>Vcc/2) for writing information into the ferroelectric memory cell for each chip.

According to the above-mentioned ferroelectric memory device, the third voltage level (>Vcc/2) for writing the information into the ferroelectric memory cell may be trimmed for each chip. Therefore, when a logic "1" is written in the ferroelectric memory cell, the threshold voltage (Vth) of the ferroelectric memory cell may positively be set to be in a stable condition.

(4) The object described above is also achieved by a method of driving the ferroelectric memory device mentioned in one of the above items (1) to (3), the method characterized in that there is provided the steps of: (a) applying a power-source voltage (Vcc) to all writing signal lines 509; (b) setting all gate electrodes 508 to an earth-ground voltage level; (c) floating the bit line 510 and the drive line 512; and (d) polarizing so that all ferroelectric memory cells are set to be non-conductive, and setting the information to be a logic "0" in order to erase the information.

According to the above-mentioned method of driving the ferroelectric memory device, in this way, by applying the voltage, the information of all ferroelectric memory cells may simultaneously be erased. Therefore, the ferroelectric memory device may be operable in the same way as a prior art floating-gate-transistor-type flash memory.

(5) The object described above is also achieved by a method of driving the ferroelectric memory device mentioned in one of the above items (1) to (3), characterized in that there are provided the steps of: (a) setting the bit line 510 and the drive line 512 to a second voltage level (approximately Vcc/2); (b) setting the selected writing signal line 509 to the earth-ground voltage level; (c) setting a selected word line 511 to the third voltage level (>Vcc/2); (d) setting unselected word lines 511 and writing signal lines 509 to the second voltage level (approximately Vcc/2); and (e) polarizing so that the ferroelectric memory cell is set to be conductive when information is read out from a selected ferroelectric memory cell, and writing the information of the logic "1".

According to the above-mentioned method of driving the ferroelectric memory device, when the information is written into the ferroelectric memory, the unselected word lines 511 and the unselected bit lines 510 are set to the second voltage level (approximately Vcc/2). Therefore, an unstable operation such as error writing may not occur as in the prior art 1Tr-type ferroelectric memory device shown in FIG. 56B.

(6) The object described above is also achieved by a method of driving the ferroelectric memory device mentioned in one of the above items (1) to (3), the method characterized in that there are provided the steps of: (a) setting the writing signal line 509 to the earth-ground voltage level; (b) setting the drive line 512 to the second voltage level (approximately Vcc/2); (c) setting a selected word line 511 to a first voltage level (approximately Vcc/2); (d) setting a selected bit line 510 to be a side of the earth-ground voltage level; and (e) detecting whether a selected ferroelectric memory cell is set to be conductive or non-conductive, and reading out data of the ferroelectric memory cell.

According to the above-mentioned method of driving the ferroelectric memory device, when the data is read out, the writing signal line 509 corresponding to a plate line is set to the earth-ground voltage level as compared to the prior art 1Tr-type ferroelectric memory device shown in FIG. 56B. Therefore, a p-n junction of one 503 of the unselected source-drain regions 503 and 504 connected to the bit line 510 is not biased in a forward direction, and, thus, the memory cell may positively be operable.

(7) The object described above is also achieved by a method of driving the ferroelectric memory device mentioned in one of the above items (1) to (3), the method characterized in that there are provided the steps of: (a) setting the writing signal line 509 and the drive line 512 to the earth-ground voltage level; (b) setting a selected word line 511 to the first voltage level (approximately Vcc/2); (c) setting the bit line 510 to be a side of the second voltage level (approximately Vcc/2); and (d) detecting whether a selected ferroelectric memory cell is set to be conductive or non-conductive, and reading out data of the ferroelectric memory cell.

According to the above-mentioned method of driving the ferroelectric memory device, the information may also be read out in a different driving method from that described in the item (6). Therefore, flexibility of the method of driving the ferroelectric memory device may be improved.

(8) The object described above is also achieved by a ferroelectric memory device in which ferroelectric memory cells are arranged in a matrix form, each of the ferroelectric memory cells having one field-effect transistor (FET) in which a ferroelectric film 507 is used for a part of gate insulating films 505 to 507, said ferroelectric memory device characterized in that there is provided: source and drain regions 503, 504 respectively formed in island-shaped well regions 502 in each ferroelectric memory cell, the well regions 502 and one 503 of the source-drain regions 503, 504 being shortened each other and being connected to a bit line 510 in common; and row selection means provided by using a gate electrode 508 of the field-effect transistor as a word line 511; wherein the other one 504 of the source and drain regions 503, 504 is connected to a drive line 512 in a direction of the word line 511.

According to the above-discussed ferroelectric memory device, the well region 502 and the one of the source-drain regions 503 and 504 are shortened each other, and are connected to the bit line 510 in common. Therefore, a writing operation of the information may be carried out using the bit line 510. Accordingly, a writing signal line is not unnecessary, and, thus, the degree of integration may be improved.

(9) The object described above is also achieved by the ferroelectric memory device mentioned in the above item (8), characterized in that: the gate insulating films are constructed by successively layering an insulating film 505, a floating gate 506, and the ferroelectric film 507.

According to the above-mentioned ferroelectric memory device, between the insulating film 505 and the ferroelectric film 507, the floating gate 506 is provided. Therefore, in the same way as the prior art MFMIS, the high quality ferroelectric film 507 may positively be provided. Further, when the ferroelectric film 507 is polarized by applying a voltage to the gate electrode 508, a stable normally-off state having a given threshold voltage (Vth) may be realized.

(10) The object described above is also achieved by the ferroelectric memory device mentioned in one of the above items (8) and (9), characterized in that there is further provided third-voltage-level trimming means having a polycrystal semiconductor fuse in a chip in order to trim the third voltage level (>Vcc/2) for writing information into the ferroelectric memory cell for each chip.

According to the above-mentioned ferroelectric memory device, the third voltage level (>Vcc/2) for writing the information into the ferroelectric memory cell may be trimmed for each chip. Therefore, when the logic "1" is written in the ferroelectric memory cell, the threshold voltage (Vth) of the ferroelectric memory cell may positively be set to be in a stable condition, and, thus, a reading margin may be improved.

(11) The object described above is also achieved by a method of driving the ferroelectric memory device mentioned in one of the above items (8) to (10), the method characterized in that there are provided the steps of: (a) applying a power-source voltage (Vcc) to all bit lines 510; (b) setting all gate electrodes 508 to an earth-ground voltage level; (c) floating the drive line 512; and (d) polarizing so that all ferroelectric memory cells are set to be non-conductive, and setting the information to be a logic "0" in order to erase the information.

According to the above-mentioned method of driving the ferroelectric memory device, in this way, by applying the voltage, the information of all ferroelectric memory cells may simultaneously be erased. Therefore, the ferroelectric memory device may be operable in the same way as the prior art floating-gate-transistor-type flash memory.

(12) The object described above is also achieved by a method of driving the ferroelectric memory device mentioned in one of the above items (8) to (10), characterized in that there are provided the steps of: (a) setting the drive line 512 to a second voltage level (approximately Vcc/2); (b) setting a selected bit line 510 to the earth-ground voltage level; (c) setting a selected word line 511 to the third voltage level (>Vcc/2); (d) setting unselected word lines 511 and bit lines 510 to the second voltage level (approximately Vcc/2); and (e) polarizing so that the ferroelectric memory cell is set to be conductive when information is read out from a selected ferroelectric memory cell, and writing the information of the logic "1".

According to the above-mentioned method of driving the ferroelectric memory device, in the same way as the item (5), when the information is written into the ferroelectric memory, the unselected word lines 511 and bit lines 510 are set to the second voltage level (approximately Vcc/2). Therefore, an unstable operation such as error writing may not occur as in the prior art 1Tr-type ferroelectric memory device shown in FIG. 56B.

(13) The object described above is also achieved by a method of driving the ferroelectric memory device mentioned in one of the above items (8) to (10), the method characterized in that there are provided the steps of: (a) setting the drive line 512 to the second voltage level (approximately Vcc/2); (b) setting the word line 511 to a first voltage level (approximately Vcc/2); (c) setting a selected bit line 510 to the earth-ground voltage level; and (e) detecting whether a selected ferroelectric memory cell is set to be conductive or non-conductive, and reading out data of the ferroelectric memory cell.

According to the above-mentioned method of driving the ferroelectric memory device, when the data is read out, the unselected bit lines 510 are set to a floating state. Since the well region 502 and the one 503 of the unselected source-drain region are shortened each other, a p-n junction of the one 503 of the unselected source-drain region is not biased in a forward direction. Therefore, the memory cell may positively be operable.

(14) The object described above is also achieved by a ferroelectric memory device in which ferroelectric memory cells are arranged in a matrix form, each of the ferroelectric memory cells having one field-effect transistor (FET) in which a ferroelectric film is used for a part of the gate insulating films, said ferroelectric memory device characterized in that there is provided: source and drain regions 503, 504 respectively formed in island-shaped well regions 502 in each ferroelectric memory cell, the well regions 502 and one 503 of the source-drain regions 503, 504 being shortened each other and being connected to a bit line 510 in common; and row selection means provided by using a gate electrode 508 of the field-effect transistor as a word line 511; and a region for forming a p-n junction with the other 504 of the source-drain regions 503, 504 in the other 504 of source-drain regions 503, 504; wherein the region forming the p-n junction is connected to the word lines 511 in common.

According to the above-discussed ferroelectric memory device, in the other 504 of the source-drain regions 503, 504, the region for forming the p-n junction with the other 504 of the source-drain regions 503, 504 is formed. Therefore, the p-n junction is operative as a backward blocking diode, and, thus, the ferroelectric memory cell is operable in a normally-on state by polarization. Accordingly, an over all configuration of the ferroelectric memory device may be substantially the same as that of a PROM constructed with the diode matrix array. As a result, the configuration of the ferroelectric memory device may be simplified.

(15) The object described above is also achieved by the ferroelectric memory device mentioned in the above item (14), characterized in that: the gate insulating films are constructed by successively layering an insulating film 505, a floating gate 506, and the ferroelectric film 507.

According to the above-mentioned ferroelectric memory device, between the insulating film 505 and the ferroelectric film 507, the floating gate 506 is provided. Therefore, in the same way as the prior art MFMIS, the high quality ferroelectric film 507 may positively be provided.

(16) The object described above is also achieved by a method of driving the ferroelectric memory device mentioned in one of the above items (14) and (15), the method characterized in that there are provided the steps of: (a) setting a selected bit line 510 to an earth-ground voltage level and setting a selected word line 511 to a power-source voltage (Vcc); (b) setting unselected word lines 511 and unselected bit lines 510 to a second voltage level (approximately Vcc/2); (c) polarizing so that a selected ferroelectric memory cell are set to be conductive when data is read out from the selected ferroelectric memory cell and writing information of a logic "1" into the ferroelectric memory cell, (d) setting the selected word line 511 to the earth-ground voltage level and setting the selected bit line 510 to the power-source voltage (Vcc); (e) setting the unselected word lines 511 and the unselected bit lines 510 to the second voltage level (approximately Vcc/2); and (f) polarizing so that the selected ferroelectric memory cell are set to be non-conductive when data is read out from the selected ferroelectric memory cell and writing information of a logic "0" into the ferroelectric memory cell.

According to the above-mentioned method of driving the ferroelectric memory device described in one of the items (14) and (15), the ferroelectric memory device may be operative as a random access memory. Therefore, a non-volatile fast main memory may be provided.

Further, in the same way as the item (5), when the information is written into the ferroelectric memory, the unselected word lines 511 and the unselected bit lines 510 are set to the second voltage level (approximately Vcc/2). Therefore, an unstable operation such as error writing may not occur as in the prior art 1Tr-type ferroelectric memory device shown in FIG. 56B.

(17) The object described above is also achieved by a method of driving the ferroelectric memory device mentioned in one of the above items (14) and (15), the method characterized in that there are provided the steps of: (a) setting a selected word line 511 to a first voltage level (approximately Vcc/2); (b) setting a selected bit line 510 to an earth-ground voltage level; and (c) detecting whether a selected ferroelectric memory cell is set to be conductive or non-conductive, and reading out data of the ferroelectric memory cell.

According to the above-mentioned method of driving the ferroelectric memory device, when the data is read out, the unselected bit lines 510 are set to a floating state. Since the p-n junction operating as the backward blocking diode is provided in the other one 504 of the source-drain regions 503, 504, the p-n junction of the one 503 of the unselected source-drain regions is not biased in a forward direction. Therefore, the memory cell may positively be operable.

(18) The object described above is achieved by a ferroelectric memory device in which ferroelectric memory cells are arranged in a matrix form, each of the ferroelectric memory cells having one field-effect transistor (FET) in which a ferroelectric film is used for a part of gate insulating films, said ferroelectric memory device characterized in that: said field-effect transistor is a p-channel-type thin film transistor; and said thin film transistor comprises: a word line as a gate electrode extending in a row direction in an insulating substrate; a gate insulating film provided on the word line; a re-crystallizing polycrystal semiconductor layer provided on the gate insulating film; a writing signal line, connected to the polycrystal semiconductor layer, extending in a direction at approximately right angle with the word line; and source-drain regions provided on both sides of the writing signal line in the polycrystal semiconductor layer; wherein one of the source-drain regions is connected to the bit lines in common, and the other one of the source-drain regions is connected to drive lines in a direction of the word line.

According to the above-discussed ferroelectric memory device, the FET-type ferroelectric memory cell is constructed with the p-channel-type thin film transistor. Therefore, a highly-integrated semiconductor storage device may be manufactured with low cost. Further, since -the word line is provided on the insulating substrate, a space for the word lines is not necessary. Therefore, the degree of integration may be improved as compared to the prior art thin-film semiconductor storage device.

(19) The object described above is also achieved by the ferroelectric memory device mentioned in the above item (18), characterized in that: an end part of the source-drain regions has a self adjustment relationship to an end part of a side wall of the writing signal line provided on a surface of the writing signal line, the side wall being made of a positive-electrode oxide film.

According to the above-mentioned ferroelectric memory device, using the writing signal line made of the positive-electrode oxide film, the source-drain regions are formed in the self-adjustment manner. Therefore, a manufacturing process of the ferroelectric memory device may be simplified, and a cell area in the ferroelectric memory device may be further reduced.

(20) The object described above is also achieved by the ferroelectric memory device mentioned in one of the above items (18) and (19), characterized in that: the gate insulating films are constructed by successively layering an insulating film, a floating gate, and the ferroelectric film.

According to the above-mentioned ferroelectric memory device, between the insulating film and the ferroelectric film, the floating gate is provided. Therefore, when the ferroelectric film is polarized by applying a voltage to the gate electrode, a stable normally-off state having a given threshold voltage (Vth) may be realized. Further, by a heating process carried out when the amorphous silicon layer is recrystallized, and by a heating process carried out when the source-drain regions are formed in the re-crystallized polycrystal semiconductor layer, elements constituting the ferroelectric film are prevented from being diffused in the re-crystallized polycrystal semiconductor layer.

(21) The object described above is also achieved by the ferroelectric memory device mentioned in one of the above items (18) to (20), characterized in that there is further provided third-voltage-level (>Vcc/2) trimming means having a polycrystal semiconductor fuse in a chip in order to trim the third voltage level (>Vcc/2) for writing information into the ferroelectric memory cell for each chip.

According to the above-mentioned ferroelectric memory device, the third voltage level (>Vcc/2) for writing the information into the ferroelectric memory cell may be trimmed for each chip. Therefore, when a logic "1" is written in the ferroelectric memory cell, the threshold voltage (Vth) of the ferroelectric memory cell may positively be set to be in a stable condition, and the reading-out margin may be improved.

(22) The object described above is also achieved by a method of driving the ferroelectric memory device mentioned in one of the above items (18) to (21), the method characterized in that there are provided the steps of: (a) applying an earth-ground voltage to all writing signal lines; (b) setting all word lines to a power-source voltage (Vcc); (c) setting all bit lines and all drive lines to an earth-ground voltage level; and (d) polarizing so that all ferroelectric memory cells are set to be non-conductive, and setting information to be a logic "0" in order to erase the information.

According to the above-mentioned method of driving the ferroelectric memory device, by applying the voltage as discussed above, the information of all ferroelectric memory cells may simultaneously be erased. Therefore, the ferroelectric memory device may be operable in the same way as the prior art floating-gate-transistor-type flash memory.

(23) The object described above is also achieved by a method of driving the ferroelectric memory device mentioned in one of the above items (18) to (21), characterized in that there are provided the steps of: (a) setting the bit line and the drive line to a second voltage level (approximately Vcc/2); (b) setting a selected writing signal line 509 to a third voltage level (>Vcc/2); (c) setting a selected word line to an earth-ground voltage level; (d) setting unselected word lines and writing signal lines to the second voltage level (approximately Vcc/2); and (e) polarizing so that the ferroelectric memory cell is set to be conductive when information is read out from a selected ferroelectric memory cell, and writing the information of the logic "1".

According to the above-mentioned method of driving the ferroelectric memory device, when the information is written into the ferroelectric memory, the unselected word lines and the unselected writing lines are set to the second voltage level (approximately Vcc/2). Therefore, an unstable operation such as error writing may not occur as in the prior art 1Tr-type ferroelectric memory device shown in FIG. 56B.

(24) The object described above is also achieved by a method of driving the ferroelectric memory device mentioned in one of the above items (18) to (21), the method characterized in that there are provided the steps of: (a) setting all writing signal lines and all drive lines to a second voltage level (approximately Vcc/2); (b) setting a selected word line to an earth-ground voltage level; (c) setting a selected bit line to the earth-ground voltage level; and (d) detecting whether a selected ferroelectric memory cell is set to be conductive or non-conductive, and reading out data of the ferroelectric memory cell.

According to the above-mentioned method of driving the ferroelectric memory device, when the data is read out, the writing signal line is set to the second voltage level (approximately Vcc/2), a p-n junction of one of the unselected source-drain regions connected to the bit line is not biased in a forward direction, and, thus, the memory cell may positively be operable.

(25) The object described above is also achieved by a method of driving the ferroelectric memory device mentioned in one of the above items (18) to (21), the method characterized in that there are provided the steps of: (a) setting the writing signal line and the drive line to an earth-ground voltage level; (b) setting a selected word line to a first voltage level (approximately Vcc/2); (c) setting a selected bit line to be a side of a second voltage level (approximately Vcc/2); and (d) detecting whether a selected ferroelectric memory cell is set to be conductive or non-conductive, and reading out data of the ferroelectric memory cell.

According to the above-mentioned the method of driving the ferroelectric memory device, the information may also be read out in a different driving method from that described in the item (24). Therefore, increased flexibility of the method of driving the ferroelectric memory device is provided.

(26) The object described above is achieved by a ferroelectric memory device in which ferroelectric memory cells are arranged in a matrix form, each of the ferroelectric memory cells having one field-effect transistor (FET) in which a ferroelectric film is used for a part of the gate insulating films, said ferroelectric memory device characterized in that: said field-effect transistor is a p-channel-type thin film transistor; and said thin film transistor comprises: gate electrodes arranged in an array form on an insulating substrate; a gate insulating film provided on a part of the gate electrodes; a re-crystallizing polycrystal semiconductor layer provided on a part of the gate insulating film and the gate electrodes; source-drain regions provided in the re-crystallized polycrystal semiconductor layer so as to sandwich a channel region; and an n-type region, electrically connected to a part of the gate electrode, forming a p-n junction with one of the source-drain regions; wherein the other one of the source-drain regions and the channel region are shortened each other, and are connected to the bit line in common; and the gate electrode is connected to the word line in common.

According to the above-discussed ferroelectric memory device, the FET-type ferroelectric memory cell is constructed with the p-channel-type thin film transistor. Therefore, a highly-integrated semiconductor storage device may be manufactured with low cost. Further, in the other one of the source-drain regions, the n-type region forming the p-n junction with the other one of the source-drain regions is provided. Therefore, the p-n junction is operable as the backward blocking diode, and, thus, the ferroelectric memory cell is operable in the normally-on state by polarization. Accordingly, an overall configuration of the ferroelectric memory device may be substantially the same as that of the PROM constructed with the diode matrix array. As a result, the configuration of the ferroelectric memory device may be simplified.

(27) The object described above is also achieved by the ferroelectric memory device mentioned in the above item (26), characterized in that: the gate insulating films are constructed by successively layering an insulating film, a floating gate, and the ferroelectric film.

According to the above-mentioned ferroelectric memory device, between the insulating film and the ferroelectric film, the floating gate is provided. Therefore, when the ferroelectric film is polarized by applying a voltage to the gate electrode, a stable normally-off state having a given threshold voltage (Vth) may be realized. Further, by the heating process carried out when the amorphous silicon layer is re-crystallized, and by the heating process carried out when the source-drain regions are formed in the re-crystallized polycrystal semiconductor layer, the elements constituting the ferroelectric film are prevented from being diffused in the re-crystallized polycrystal semiconductor layer.

(28) The object described above is also achieved by a method of driving the ferroelectric memory device mentioned in one of the above items (26) and (27), the method characterized in that there are provided the steps of: (a) setting a selected bit line to a power-source voltage (Vcc) and setting a selected word line to an earth-ground voltage level; (b) setting unselected word lines and unselected bit lines to a second voltage level (approximately Vcc/2); (c) polarizing so that a selected ferroelectric memory cell is set to be conductive when data is read out from the selected ferroelectric memory cell and writing information of a logic "1" into the ferroelectric memory cell; (d) setting the selected word line to the power-source voltage (Vcc) and setting the selected bit line to the earth-ground voltage level; (e) setting the unselected word lines and the unselected bit lines to the second voltage level (approximately Vcc/2); and (f) polarizing so that the selected ferroelectric memory cell is set to be non-conductive when data is read out from the selected ferroelectric memory cell and writing information of a logic "0" into the ferroelectric memory cell.

According to the above-mentioned method of driving the ferroelectric memory device described in one of the items (26) and (27), the ferroelectric memory device may be operative as a random access memory. Therefore, a non-volatile fast main memory may be provided.

Further, in the same way as the item (5), when the information is written into the ferroelectric memory, the unselected word lines and the unselected bit lines are set to the second voltage level (approximately Vcc/2). Therefore, an unstable operation such as error writing may not occur as in the prior art 1Tr-type ferroelectric memory device shown in FIG. 56B.

(29) The object described above is also achieved by a method of driving the ferroelectric memory device mentioned in one of the above items (26) and (27), the method characterized in that there are provided the steps of: (a) setting a selected word line to an earth-ground voltage level; (b) setting a selected bit line to a first voltage level (approximately Vcc/2); and (c) detecting whether a selected ferroelectric memory cell is set to be conductive or non-conductive, and reading out data of the ferroelectric memory cell.

According to the above-mentioned method of driving the ferroelectric memory device, when the data is read out, the unselected bit lines are set to the floating state. Since the p-n junction operating as the backward blocking diode is provided in the other one of the source-drain regions, the p-i junction of the one of the unselected source-drain regions is not biased in a forward direction. Therefore, the memory cell may positively be operable.

Other objects and further features of the present invention will be apparent from the following detailed description when read in conjunction with the accompanying drawings.

Figure 59A:
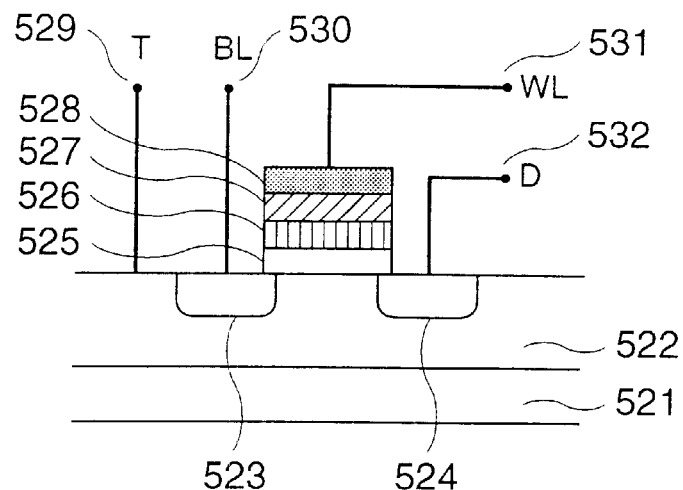
FIG. 59A shows a cross-sectional view of a memory cell structure of the first embodiment of the ferroelectric memory device having the common well region used for the writing signal line according to the present invention.
Figure 59B:
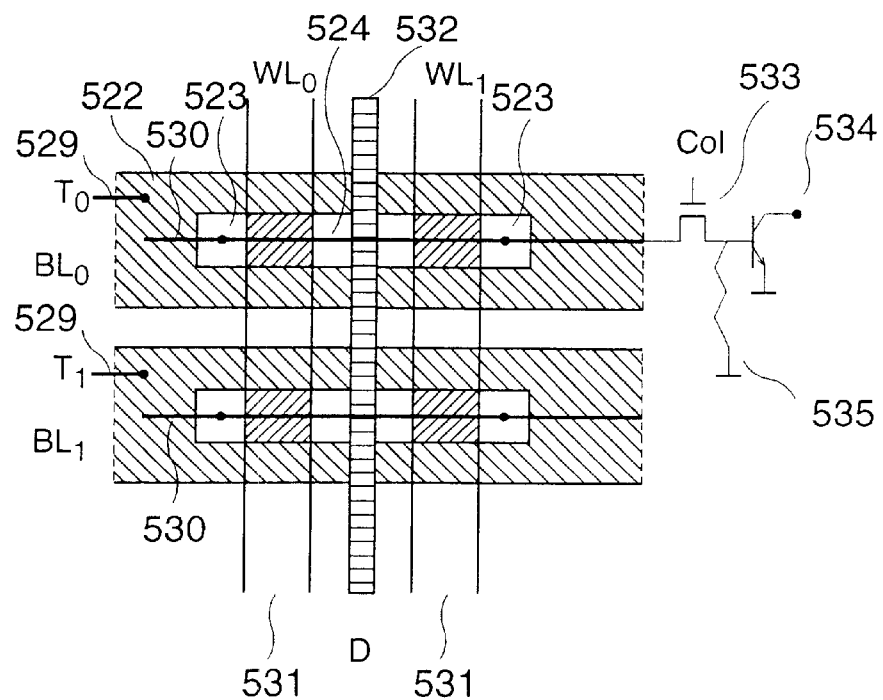
FIG. 59B shows a simplified top plan view of a pattern of the ferroelectric memory cell shown in FIG. 59A.
Figure 60A:
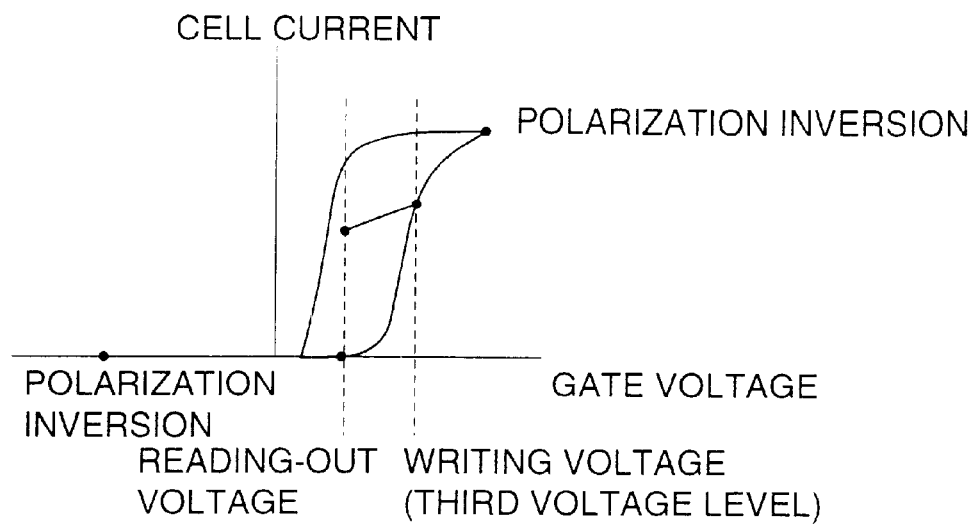
FIG. 60A and FIG. 60B show illustrations for explaining operational characteristics of the first embodiment of the ferroelectric memory cell shown in FIG. 59A.
Figure 60B:
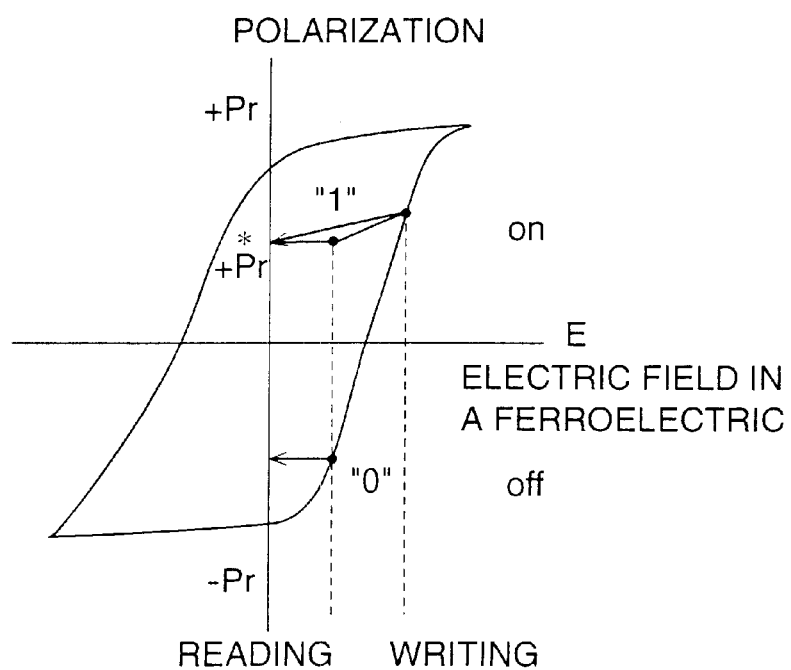

First, a description will be given of a first embodiment of a ferroelectric memory device having a common well region used for a writing signal line according to the present invention, by referring to FIG. 59A to FIG. 60B. FIG. 59A shows a cross-sectional view of a memory cell structure of the first embodiment of the ferroelectric memory device having the common well region used for the writing signal line according to the present invention. FIG. 59B shows a simplified top plan view of a pattern of the ferroelectric memory cell shown in FIG. 59A. FIG. 60A and FIG. 60B show illustrations for explaining operational characteristics of the first embodiment of the ferroelectric memory cell shown in FIG. 59A.

In FIG. 59A, first in an n-type semiconductor substrate 521, like a bit line (BL) 530, a common p-type well region 522 is formed in a direction of a column-selection line. Next, an SiO$_2$ film having a thickness in the range of 1 to 3 µm, preferably, 2.5 µm, a Pt film used for a floating gate having a thickness in the range of 15 to 30 µm, preferably, 20 µm, a PZT thin film used for a ferroelectric film having a thickness in the range of 10 to 70 µm, preferably, 40 µm, and a conductive film such as a Pt film are successively layered to form a layered film.

After that, by patterning the layered film, a gate insulating film comprising an SiO$_2$ film 525, a Pt film 526, and a PZT thin film 527, and a gate electrode 528 are formed, and a plurality of groups of the gate insulating film and the gate electrode 528 are arranged in the direction of the column-selection line. In FIG. 59A, only one group of the gate insulating film and the gate electrode 528 is shown.

Next, by selectively providing an n-type impurity such as As by using the gate electrode 528 as a mask, an n-type drain region 523 and an n-type source region 524 are formed. Subsequently, a writing signal line (T) 529 is connected to the p-type well region 522, the bit line (BL) 530 is connected to the n-type drain region 523, a word line (WL) 531 is connected to the gate electrode 528, and a drive line (D) 532 is connected to the n-type source region 524. In this way, the ferroelectric memory cell is formed.

In FIG. 59B, the ferroelectric memory cell is formed in a symmetric mirror formation, and to each of the bit lines (BL$_0$, BL$_1$, . . . ) 530, a column selection transistor 533 is connected, and a sense amplifier 534 is also connected through a resistor 535 connected to an earth-ground voltage level. The column selection transistor 533, the sense amplifier 534, and the resistor 535 construct column selection means.

The sense amplifier 534 is formed, by using the p-type well region 522 formed in a fabricating process of the ferroelectric memory cell as a base region, as a lateral-bipolar-transistor in which the n-type drain region 523 and the n-type source region 524 are respectively used for an emitter region and a collector region.

Further, to each of the writing signal lines ($T_0$, $T_1$, ...) 529, in the same way as the bit lines ($BL_0$, $BL_1$, ...) 530, the column selection means is connected, and to each of the word lines ($WL_0$, $WL_1$, ...) 531 and to each of the drive lines ($D_0$, $D_1$, ...) 532, row selection means for applying the earth-ground voltage level or a 1.65-V (Vcc/2) first voltage level is respectively connected. The above-discussed structure is not shown in the drawing.

In such a memory structure, the p-type well region 522 is usable for the writing signal line (T). Therefore, a dedicated wiring space for the writing signal line (T) is not necessary, and, thus, the degree of integration of the ferroelectric memory device may be improved.

FIG. 60A shows an illustration for explaining the operational characteristics of the ferroelectric memory cell, and FIG. 60B shows an illustration for explaining polarization to an electric field applied to the ferroelectric thin film.

In FIG. 60A and FIG. 60B, all bit lines (BL) and the drive lines (D) are set to a floating state, all writing signal lines (T) are supplied with a power-source voltage Vcc (3.3 V), and all word lines (WL) are supplied with the earth-ground voltage level in order to set the ferroelectric memory cell to be non-conductive. At this time, the PZT thin film 527 is inversely polarized in a −Pr direction, and a logic "0" is set. In this way, in the same way as a floating-gate-transistor-type flash memory, information of all ferroelectric memory cells may simultaneously be erased.

When logic "1" data is written in the ferroelectric memory cell, all bit lines (BL) and the drive lines (D) are supplied with a 1.65-V (Vcc/2) second voltage level, a selected writing signal line (T) is supplied with 0 V (earth-ground voltage level), and a selected word line (WL) is supplied with a third voltage level. In this way, the logic 1 data is written into the selected ferroelectric memory cell.

In this case, unselected writing signal lines (T) and unselected word lines (WL) are previously supplied with the 1.65-V second voltage level. Therefore, the logic "1" data is inhibited from being written into the memory cell in which writing data is a logic "0".

The third voltage level is set to polarize the PZT thin film 527 by +Pr* in a +Pr direction so that an output of the memory cell is the logic "1" when the data is read out. When the PZT thin film 527 is polarized by the +Pr*, a threshold voltage (Vth) decreases so that the memory cell is set to be conductive when a reading-out voltage level is applied. As a result, the memory cell is set to a normally-off state.

In the ferroelectric memory device, for trimming the third voltage level, third-voltage-level generating means, which has trimming means constructed with a polycrystal silicon fuse, is provided in a chip of the ferroelectric memory device. Therefore, for each chip, the third voltage level may flexibly be adjusted according to characteristics of the memory cell, and, thus, a reading-out margin may be improved.

In this case, unselected writing signal lines (T) and unselected word lines (WL) are previously supplied with the 1.65-V second voltage level. Therefore, when writing data, the information is prevented from erroneously being written into unselected memory cells. Accordingly, a writing operation may be stabilized.

When the information is read out from the ferroelectric memory cell, all writing signal lines (T) are set to the earth-ground voltage level, all drive lines (D) are set to the 1.65-V second voltage level, a selected bit line (BL) is set to the earth-ground voltage level, namely to be a side of the earth-ground voltage level, and a selected word line (WL) is set to the 1.65-V (Vcc/2) first voltage level.

In this case, unselected bit lines (BL) are set to the floating state, and unselected word lines (WL) are set to 0 V.

When the logic "1" data is previously written in the memory cell, the memory cell is set to be conductive by applying the reading-out voltage (1.65 V). At this time, by voltage-level variation of the bit line (BL), the information is detected through the sense amplifier.

When the logic "1" data is not previously written in the memory cell, namely when the data of the memory cell is the logic "0", the memory cell is set to be non-conductive. Therefore, no voltage-level variation occurs in the bit line (BL).

Further, different from the prior art 1Tr-type ferroelectric memory device shown in FIG. 56A, the writing signal line (T) corresponding to a plate line is set to the earth-ground voltage level. Therefore, a p-n junction of an unselected n-type drain region 523 connected to the bit line (BL) is not biased in a forward direction, and, thus, the memory cell may positively operate.

In addition, for the first embodiment of the ferroelectric memory device, another reading method is applicable. In the following, a description will be given of the reading method.

In the reading method, while all writing signal lines (T) and all drive lines (D) are set to the earth-ground voltage level, the selected bit line (BL) is supplied with the 1.65-V (Vcc/2) second voltage level and the selected word line (WL) is supplied with the 1.65-V (Vcc/2) first voltage level.

In this case, unselected bit lines (BL) are set to the floating state, and unselected word lines (WL) are set to 0 V.

When the logic "1" data is previously written in the memory cell, the memory cell is set to be conductive by applying the reading-out voltage (1.65 V). At this time, by voltage-level variation of the bit line (BL), the information is detected through the sense amplifier.

When the logic "1" data is not previously written in the memory cell, namely when the data of the memory cell is the logic "0", the memory cell is set to be non-conductive. Therefore, no voltage-level variation occurs in the bit line (BL).

The first embodiment of the ferroelectric memory device has features including a high degree of integration and a stable operation, and, thus, is usable for a high-integration-degree-and-low-speed file memory.

In the above description of the first embodiment of the ferroelectric memory device, the Pt film 526 is provided as the floating gate. By providing the Pt film 526, quality of the PZT thin film 527 formed on the Pt film 526 may be improved, and the memory cell may be positively set to the normally-off state having a low threshold voltage. However, the Pt film 526 is not necessarily required. It is possible to directly provide the PZT thin film 527 on the $SiO_2$ film 525.

Figure 61A:
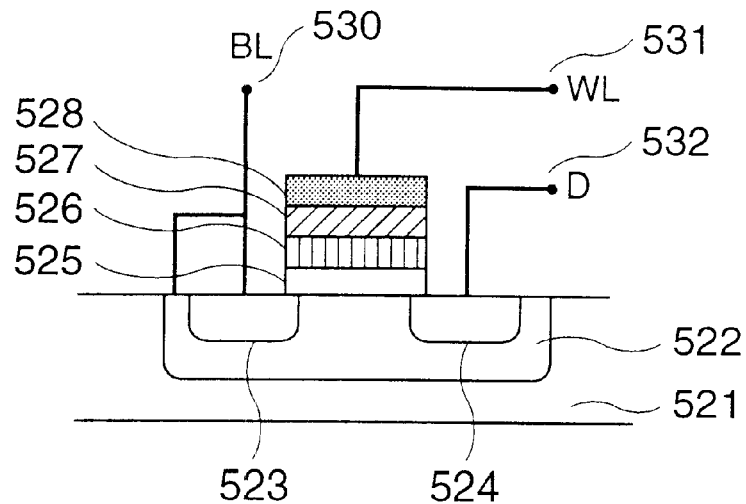
FIG. 61A shows a cross-sectional view of a memory cell structure of a second embodiment of a ferroelectric memory device the individual island-shaped well region according to the present invention.
Figure 61B:
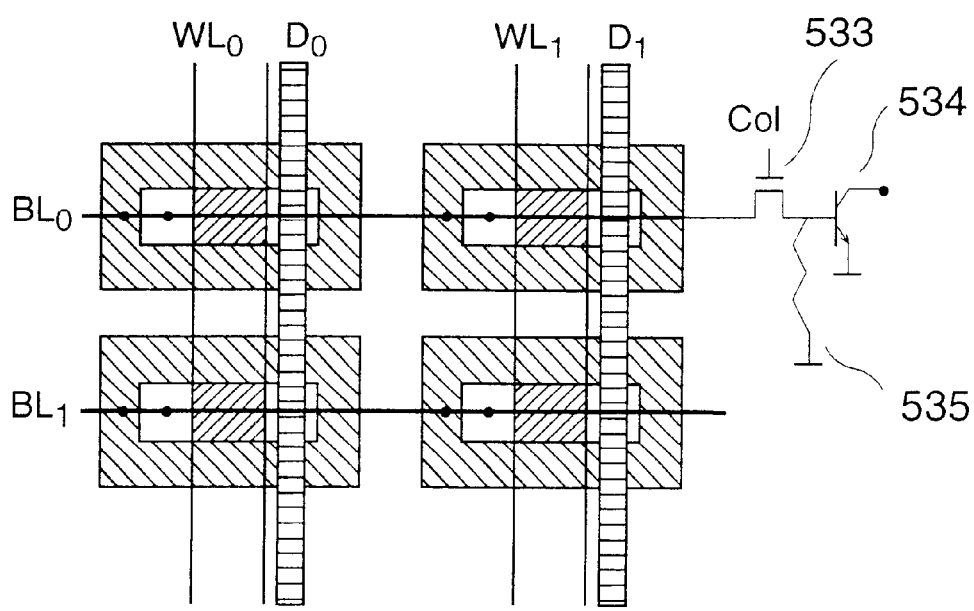
FIG. 61B shows a top plan view of a pattern of the ferroelectric memory cell shown in FIG. 61A.

Next, a description will be given of a second embodiment of a ferroelectric memory device having an individual island-shaped well region according to the present invention, by referring to FIG. 61A and FIG. 61B. FIG. 61A shows a cross-sectional view of a memory cell structure of the second embodiment of the ferroelectric memory device having the individual island-shaped well region according to the present invention. FIG. 61B shows a top plan view of a pattern of the ferroelectric memory cell shown in FIG. 61A.

In FIG. 61A, first in the n-type semiconductor substrate 521, like the bit line (BL) 530, an individual island-shaped p-type well region 522 is formed in the direction of the column-selection line. Next, in the same way as the first embodiment, the $SiO_2$ film having a thickness in the range of 1 to 3 μm, preferably, 2.5 μm, the Pt film used for the floating gate having a thickness in the range of 15 to 30 μm, preferably, 20 μm, the PZT thin film used for the ferroelectric film having a thickness in the range of 10 to 70 μm, preferably, 40 μm, and the conductive film such as a Pt film are successively layered to form the layered film.

After that, by patterning the layered film, the gate insulating film comprising the $SiO_2$ film 525, the Pt film 526, and the PZT thin film 527, and the gate electrode 528 are formed in each p-type well region 522.

Next, by selectively providing an n-type impurity such as As by using the gate electrode 528 as a mask, the n-type drain region 523 and the n-type source region 524 are formed. Subsequently, the p-type well region 522 and the n-type drain region 523 are electrically shortened each other, and are connected to the bit line (BL) 530. Further, the word line (WL) 531 is connected to the gate electrode 528, and the drive line (D) 532 is connected to the n-type source region 524. In this way, the ferroelectric memory cell is formed.

As shown in FIG. 61B, in the ferroelectric memory cell, to each of the bit lines ($BL_0$, $BL_1$, ... ) 530, the column selection transistor 533 is connected, and also, the sense amplifier 534 is connected through the resistor 535 connected to the earth-ground voltage level. The column selection transistor 533, the sense amplifier 534, and the resistor 535 construct the column selection means.

The sense amplifier 534 is formed, by using the p-type well region 522 formed in the fabricating process of the ferroelectric memory cell as a base region, as the lateral-bipolar-transistor in which the n-type drain region 523 and the n-type source region 524 are respectively used for the emitter region and the collector region.

Further, to each of the word lines ($WL_0$, $WL_1$, ... ) 531 and to each of the drive lines ($D_0$, $D_1$, ... ) 532, the row selection means for applying the earth-ground voltage level or a 1.65-V (Vcc/2) voltage level is respectively connected. The above-discussed structure is not shown in the drawing.

In such a memory structure, the bit line (BL) is used for the writing signal line (T). Therefore, a dedicated wiring space for the writing signal line (T) is not necessary, and, thus, the degree of integration of the ferroelectric memory device may be improved.

Next, a description will be given of a driving method of the second embodiment of the ferroelectric memory device, by referring to FIG. 61B.

The second embodiment of the ferroelectric memory device has substantially the same operational characteristics as those of the first embodiment of the ferroelectric memory device shown in FIG. 59A and FIG. 59B.

In FIG. 61B, all drive lines (D) are set to the floating state, all bit lines (BL) are supplied with the power-source voltage Vcc (3.3 V), and all word lines (WL) are supplied with the earth-ground voltage level in order to set the ferroelectric memory cell to be non-conductive. At this time, the PZT thin film 527 is inversely polarized in a −Pr direction, and a logic "0" is set. In this way, in the same way as the floating-gate-transistor-type flash memory, information of all ferroelectric memory cells may simultaneously be erased.

When logic "1" data is written in the ferroelectric memory cell, while all drive lines (D) are supplied with the 1.65-V (Vcc/2) second voltage level, a selected bit line (BL) is supplied with the earth-ground voltage level through the resistor, and a selected word line (WL) is supplied with the third voltage level. In this way, the logic "1" data is written into the selected ferroelectric memory cell.

In this case, unselected bit lines (BL) and unselected word lines (WL) are previously supplied with the 1.65-V second voltage level.

The third voltage level is set in substantially the same way as that of the first embodiment of the ferroelectric memory device. Further, also in the second embodiment of the ferroelectric memory device, the third-voltage-level generating means, which has the trimming means constructed with the polycrystal silicon fuse, is provided in a chip of the ferroelectric memory device. Therefore, a reading-out margin may also be improved.

In addition, also in the second embodiment of the ferroelectric memory device, in the same way as the first embodiment, the writing operation may be stabilized.

When the information is read out from the ferroelectric memory cell, while all drive lines (D) are set to the 1.65-V (Vcc/2) second voltage level, a selected bit line (BL) is set to the earth-ground voltage level through the resistor, and a selected word line (WL) is set to the 1.65-V (Vcc/2) first voltage level.

In this case, unselected bit lines (BL) are set to the floating state, and unselected word lines (WL) are set to 0 V.

In this way, the second embodiment of the ferroelectric memory device has substantially the same information detecting principle as that of the first embodiment of the ferroelectric memory device.

Further, in the second embodiment of the ferroelectric memory device, when the information is read out, unselected bit lines (BL) are set to the floating state. However, since the p-type well region 522 and the n-type drain region 523 are electrically shortened each other, the p-n junction of the unselected n-type drain region 523 is not biased in a forward direction, and, thus, the memory cell may positively operate.

The second embodiment of the ferroelectric memory device also has features of a high degree of integration and stable operation, and, thus, in the same way as the first embodiment of the ferroelectric memory device, is usable for the high-integration-degree-and-low-speed file memory.

In the above description of the second embodiment of the ferroelectric memory device, the Pt film 526 is provided as the floating gate. By providing the Pt film 526, quality of the PZT thin film 527 formed on the Pt film 526 may be improved, and the memory cell may be positively set to the normally-off state having a low threshold voltage. However, the Pt film 526 is not necessarily required. It is possible to directly provide the PZT thin film 527 on the $SiO_2$ film 525.

Figure 62A:
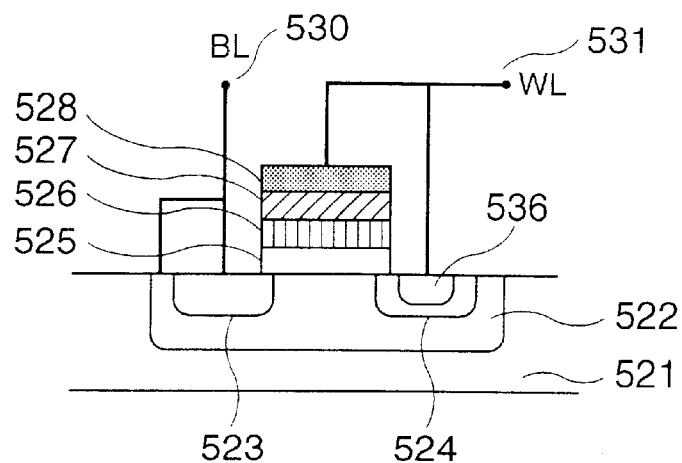
FIG. 62A shows a cross-sectional view of a memory cell structure of a third embodiment of a normally-on-type ferroelectric memory device having a backward blocking diode according to the present invention.
Figure 62B:
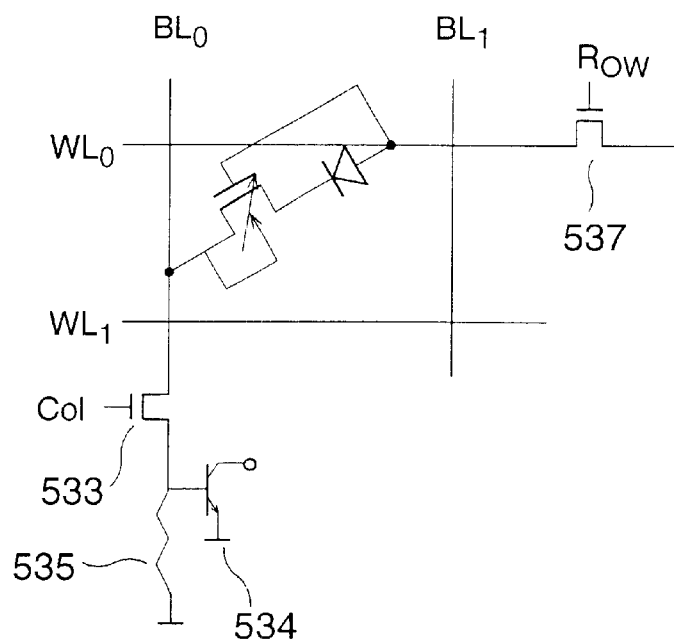
FIG. 62B shows a simplified schematic diagram of the ferroelectric memory device shown in FIG. 62A.

Next, a description will be given of a third embodiment of a normally-on-type ferroelectric memory device having a backward blocking diode according to the present invention, by referring to FIG. 62A and FIG. 62B. FIG. 62A shows a cross-sectional view of a memory cell structure of the third embodiment of the normally-on-type ferroelectric memory device having the backward blocking diode according to the present invention. FIG. 62B shows a simplified schematic diagram of the ferroelectric memory device shown in FIG. 62A.

In FIG. 62A, first in the same way as the second embodiment, in the n-type semiconductor substrate 521, the individual island-shaped p-type well region 522 is formed in the direction of the column-selection line like the bit line (BL) 530. Next, the $SiO_2$ film having a thickness in the range of 1 to 3 μm, preferably, 2.5 μm, the Pt film used for the floating gate having a thickness in the range of 15 to 30 μm, preferably, 20 μm, the PZT thin film used for the ferroelectric film having a thickness in the range of 10 to 70 μm, preferably, 40 μm, and the conductive film such as a Pt film are successively layered to from the layered film.

After that, by patterning the layered film, the gate insulating film comprising the $SiO_2$ film 525, the Pt film 526, and the PZT thin film 527, and the gate electrode 528 are formed in each p-type well region 522.

Next, by selectively providing an n-type impurity such as As by using the gate electrode 528 as a mask, the n-type drain region 523 and the n-type source region 524 are formed. After that, using a new mask (not shown), by providing a p-type impurity such as B, a p-type region 536 is formed in the n-type source region 524.

Subsequently, the p-type well region 522 and the n-type drain region 523 are electrically shortened each other, and are connected to the bit line (BL) 530. Further, the gate electrode 528 is connected to the word line (WL) 531, and the n-type source region 524 is connected to the word line (WL) 531 -through the p-type region 536. In this way, the ferroelectric memory cell is formed.

As shown in FIG. 62B, in the ferroelectric memory cell, to each of the bit lines ($BL_0$, $BL_1$, . . . ) 530, the column selection transistor 533 is connected, and also, the sense amplifier 534 is connected through the resistor 535 connected to the earth-ground voltage level. The column selection transistor 533, the sense amplifier 534, and the resistor 535 construct the column selection means.

Further, to each of the word lines ($WL_0$, $WL_1$, . . . ) 531, the row selection means for applying the earth-ground voltage level or the 1.65-V (Vcc/2) voltage level is respectively connected.

In the same way as the first and second embodiments, the sense amplifier 534 is formed, by using the p-type well region 522 formed in the fabricating process of the ferroelectric memory cell as a base region, as the lateral-bipolar-transistor in which the n-type drain region 523 and the n-type source region 524 are respectively used for the emitter region and the collector region.

In such a memory structure, a p-n junction formed with the n-type source region 524 and the p-type region 536 is operative as the backward blocking diode. Therefore, the ferroelectric memory may be driven in the same way as that of the PROM constructed with a diode matrix array. Accordingly, a driving method of the ferroelectric memory device may be simplified. Further, a dedicated wiring space for the writing signal line (T) is not necessary, and, thus, the degree of integration of the ferroelectric memory device may be improved.

Next, a description will be given of a driving method of the third embodiment of the ferroelectric memory device, by referring to FIG. 62B.

In FIG. 62B, when logic "1" data is written in the ferroelectric memory cell, the selected bit line (BL) is supplied with the earth-ground voltage level through the resistor, and the selected word line (WL) is supplied with the power-source voltage Vcc. In this case, the PZT thin film 527 is polarized so that the selected ferroelectric memory cell is set to a normally-on state, and the logic "1" data is written into the selected ferroelectric memory cell.

In this case, unselected bit lines (BL) and unselected word lines (WL) are previously supplied with the 1.65-V (approximately Vcc/2) second voltage level.

In this way, when the information is written into the ferroelectric memory device, the unselected word lines (WL) and the unselected bit lines (BL) are set to the second voltage level (approximately Vcc/2). Therefore, different from the prior art 1Tr-type ferroelectric memory device shown in FIG. 56A, an unstable operation such as erroneous writing is prevented.

When the information is read out from the ferroelectric memory cell, the selected bit line (BL) is set to the earth-ground voltage level through the resistor, and the selected word line (WL) is supplied with the 1.65-V (Vcc/2) first voltage level.

Also, in this case, the unselected bit lines (BL) are set to the floating state, and the unselected word lines (WL) are set to 0 V.

In this way, when the information is read out from the ferroelectric memory device, the unselected bit line (BL) is set to the floating state. However, since the p-n junction operating as the backward blocking diode is provided in the n-type source region 524, the p-n junction of the unselected n-type drain region 523 is not biased in a forward direction. Therefore, the memory cell may positively operate.

The third embodiment of the ferroelectric memory device uses the normally-on-type memory cell. By combining with the backward blocking diode, the ferroelectric memory device may be driven in the same way as the diode-matrix-array-type PROM. Further, for example, when the ferroelectric memory device is designed using a 0.3-μm rule, memory cell size may be 2.0 μm×1.0 μm. Therefore, a chip area of a 16-Mbit ferroelectric memory device may be reduced to 8 mm×4 mm. As a result, the third embodiment of the ferroelectric memory device is usable as a semiconductor storage device for a high-integration-degree-and-high-speed main memory.

In the above description of the third embodiment of the ferroelectric memory device, the Pt film 526 is provided as the floating gate. By providing the Pt film 526, quality of the PZT thin film 527 formed on the Pt film 526 may be improved. However, since the memory cell does not need to be in a normally-off state, the Pt film 526 is not necessarily required. It is possible to directly provide the PZT thin film 527 on the $SiO_2$ film 525.

Figure 63A:
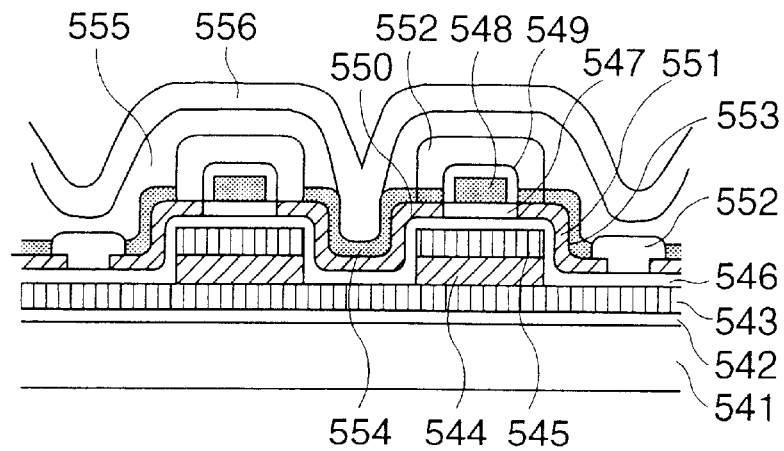
FIG. 63A shows a cross-sectional view of a memory cell structure of a fourth embodiment of a ferroelectric memory device having a thin-film semiconductor layer according to the present invention.
Figure 63B:
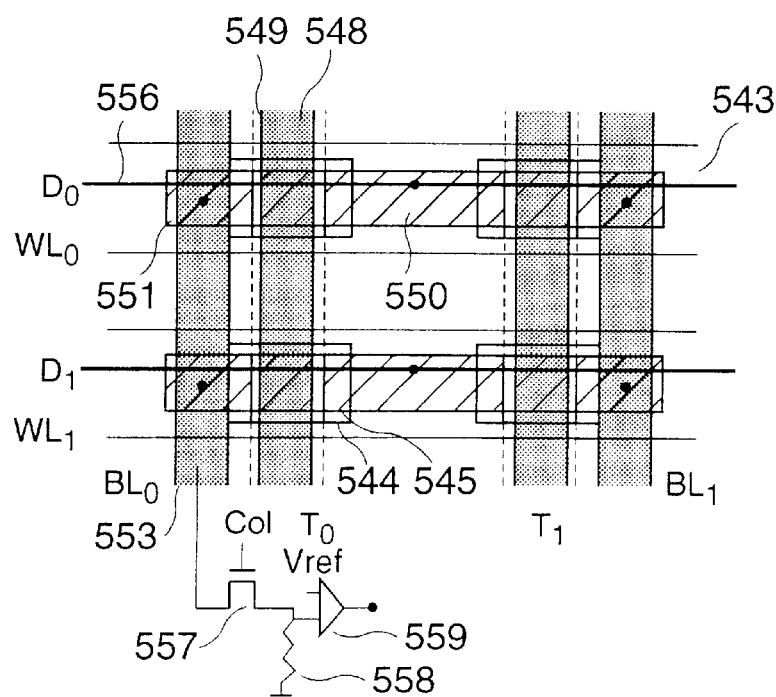
FIG. 63B shows a simplified top plan view of a pattern of the ferroelectric memory cell shown in FIG. 63A.
Figure 64A:
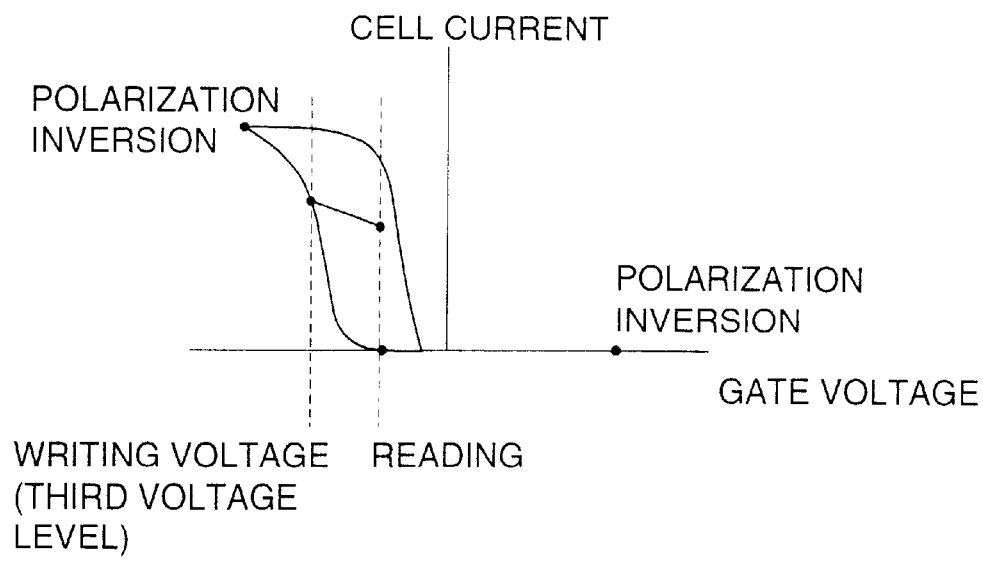
FIG. 64A and FIG. 64B show illustrations for explaining operational characteristics of the fourth embodiment of the ferroelectric memory cell shown in FIG. 63A.
Figure 64B:
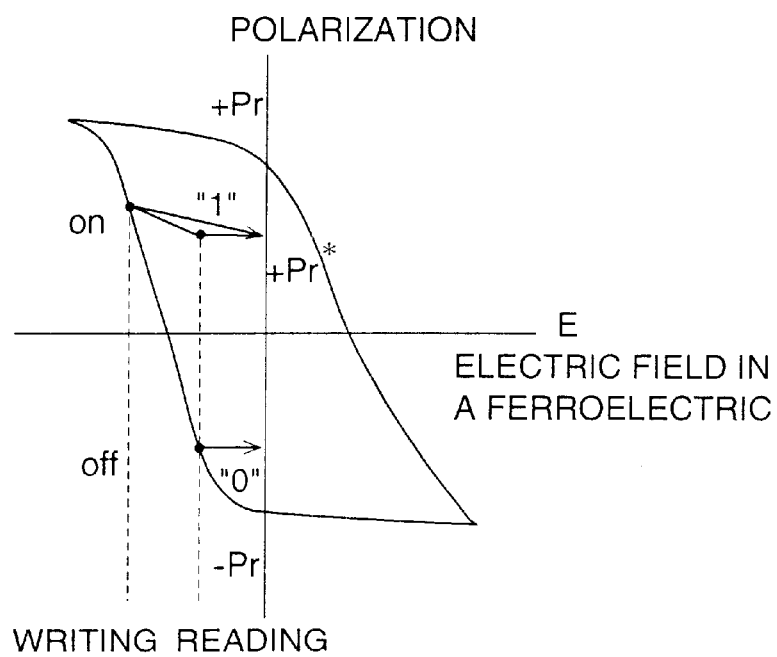

Next, a description will be given of a fourth embodiment of a ferroelectric memory device having a thin-film semiconductor layer according to the present invention, by referring to FIG. 63A to FIG. 64B. FIG. 63A shows a cross-sectional view of a memory cell structure of the fourth embodiment of the ferroelectric memory device having the thin-film semiconductor layer according to the present invention. FIG. 63B shows a simplified top plan view of a pattern of the ferroelectric memory cell shown in FIG. 63A. FIG. 64A and FIG. 64B show illustrations for explaining operational characteristics of the fourth embodiment of the ferroelectric memory cell shown in FIG. 63A.

To simplify the description, in FIG. 63A and FIG. 63B, a thin-film transistor constituting a peripheral circuit is not shown.

In FIG. 63A, first in a quartz substrate 541, an $SiO_2$ film 542 having a thickness in the range of 10 to 30 μm, preferably, 20 μm, is formed by using a sputtering method. Next, through the $SiO_2$ film 542, a Ti film having a thickness in the range of 5 to 15 μm, preferably, 10 μm, and a Pt film having a thickness in the range of 15 to 30 μm, preferably, 20 μm, are successively layered to from a layered film.

After that, by patterning the layered film, a word line 543 extending in a direction of a row-selection line is formed, and a gate electrode of a thin-film transistor constituting the peripheral circuit is formed.

Next, over the above layered film, a PZT thin film as the ferroelectric film having a thickness in the range of 10 to 70 $\mu$m, preferably, 40 $\mu$m, and a Pt film having a thickness in the range of 15 to 30 $\mu$m, preferably, 20 $\mu$m, are successively layered to form a second layered film.

After that, by patterning the second layered film, a PZT film 544 and a floating gate 545 are formed, and the PZT film and the Pt film in the region where the peripheral circuit is formed are selectively removed.

Next, over the second layer, an insulating film made of the SiO$_2$ film, etc., having a thickness in the range of 5 to 15 $\mu$m, preferably, 10 $\mu$m, is layered, and an amorphous silicon film having a thickness in the range of 5 to 15 $\mu$m, preferably, 8 $\mu$m, is layered thereon. After that, using a laser anneal, the amorphous silicon film is re-crystallized, and is changed to the polycrystal silicon film.

Next, by patterning the polycrystal silicon film, an island-shaped polycrystal silicon film 547 is formed. The polycrystal silicon film 547 constitutes a pair of memory cells in a symmetric mirror formation. On the other hand, in the region forming the peripheral circuit, the island-shaped polycrystal silicon film is formed in order to operate as an active region of the thin-film transistor in the gate insulating film.

Then, after an Al film is layered thereon, the writing signal line of the ferroelectric memory cell is formed by an patterning operation. At this time, an Al electrode 548 is also formed as a substrate electrode of the thin-film transistor.

Next, the Al electrode 548 is oxidized in a positive electrode, and a positive-electrode oxide film 549 is formed on a surface of the Al electrode 548. This positive-electrode oxide film 549 is used for a side wall, and a p-type impurity is selectively provided. In a ferroelectric-memory-cell side, a p-type source region 550 and a p-type drain region 551, which are self-adjusted to the positive-electrode oxide film 549, are formed. On the other hand, in a thin-film-transistor side, by providing an n-type impurity, an n-type drain region and an n-type source region, which are self-adjusted to the positive-electrode oxide film 549, are formed.

Next, by a PCVD method (plasma CVD method), an SiO$_2$ film 552 is layered overall. After an open part for forming an electrode is formed, a conductive film such as WSi is layered overall. By a patterning process, a source electrode 554 to be connected to the p-type source region 550 is formed, and a drain electrode used for a bit line 553, which is connected to the p-type drain region 551, is also formed. Further, also in the peripheral circuit, source and drain electrodes are formed.

Next, a PSG film 555 is layered overall, and an open part for contacting the source electrode 554 is provided. After that, a conductive film such as Al is layered overall. By a patterning process, a drive line 556 connected to the p-type source region 550 is formed.

As shown in FIG. 63B, the ferroelectric memory cell is formed in a symmetric mirror formation, and to each of the bit lines (BL$_0$, BL$_1$, . . . ) 553, a column selection transistor 557 is connected, and also, a sense amplifier 559 is connected through a resistor 558 connected to the earth-ground voltage level. The column selection transistor 557 and the sense amplifier 559 construct column-selection means.

The sense amplifier 559 is constructed using an n-channel thin-film transistor formed in a fabricating process of the ferroelectric memory cell.

In the same way as the first embodiment, to each of the writing signal lines (T$_0$, T$_1$, . . . ) formed by the Al electrode 548, in the same way as the bit lines (BL$_0$, BL$_1$, . . . ) 553, the column-selection means is connected. Further, to each of the word lines (WL$_0$, WL$_1$, . . . ) 543 and to each of the drive lines (D$_0$, D$_1$, . . . ) 556, the row selection means for applying the earth-ground voltage level or the 1.65-V (Vcc/2) voltage level is respectively connected. The above-discussed structure is not shown in the drawing.

In this way, the ferroelectric memory cell is constructed using the thin-film semiconductor layer manufacturing technique established in an active-matrix-type liquid crystal display. Therefore, cost of the ferroelectric memory device may be reduced. Further, since the word line (WL) is provided in a side of the quartz substrate 541, a dedicated wiring space for the word line (WL) is not necessary, and, thus, the degree of integration of the ferroelectric memory device may be improved.

FIG. 64A shows an illustration for explaining the operational characteristics of the ferroelectric memory cell comprising the p-channel-type thin-film transistor shown in FIG. 63A, and FIG. 64B shows an illustration for explaining polarization to an electric field applied to the ferroelectric thin film. These characteristics are substantially the same as the characteristics of the first embodiment of the ferroelectric memory cell using the n-channel-type MISFET except that the characteristics are turned in opposite directions.

In the following, a description will be given of a driving method of the ferroelectric memory device, by referring to FIG.64B.

In FIG. 64B, all bit lines (BL) and all drive lines (D) are set to the earth-ground voltage level, all writing signal lines (T) are supplied with the earth-ground voltage level, and all word lines (WL) are supplied with the power-source voltage Vcc, and, thus, the ferroelectric memory cell is set to be non-conductive. At this time, the PZT thin film 544 is inversely polarized in a −Pr direction, and a logic "0" is set. In this way, in the same way as the floating-gate-transistor-type flash memory, information of all ferroelectric memory cells may simultaneously be erased.

When logic "1" data is written in the ferroelectric memory cell, while all bit lines (BL) and all drive lines (D) are supplied with the 1.65-V (Vcc/2) second voltage level, a selected writing signal line (T) is supplied with the third voltage level, and a selected word line (WL) is supplied with the earth-ground voltage level. In this way, the logic "1" data is written into the selected ferroelectric memory cell.

In this case, unselected writing signal lines (T) and unselected word lines (WL) are previously supplied with the 1.65-V second voltage level. Therefore, the logic "1" data is inhibited from being written into the memory cell in which logic "0" data is written.

The third voltage level is set to polarize the PZT thin film 544 by +Pr* in a +Pr direction so that an output of the memory cell is the logic "1" when the data is read out. When the PZT thin film 544 is polarized by the +Pr*, a threshold voltage (Vth) decreases so that the memory cell is set to be conductive when a reading-out voltage level is applied. At this time, the memory cell is set to a normally-off state.

Also in this case, in the ferroelectric memory device, for trimming the third voltage level, third-voltage-level generating means, which has trimming means constructed with the polycrystal silicon fuse, is provided in a chip of the ferroelectric memory device. Therefore, for each chip, the third voltage level may be flexibly adjusted according to characteristics of the memory cell, and, thus, a read-out margin of the ferroelectric memory device may be improved.

In this case, unselected writing signal lines (T) and unselected word lines (WL) are previously supplied with the 1.65-V second voltage level. Therefore, when writing data, the information is prevented from being erroneously written into unselected memory cells. Accordingly, a writing operation of the ferroelectric memory device may be stabilized.

When the information is read out from the ferroelectric memory cell, while all writing signal lines (T) and all drive lines (D) are set to the 1.65-V second voltage level, a selected bit line (BL) is set to the earth-ground voltage level through the resistor and a selected word line (WL) is set to the earth-ground voltage level.

In this case, unselected bit lines (BL) are set to the floating state, and unselected word lines (WL) are set to 1.65 V.

In this case, different from the prior art 1Tr-type ferroelectric memory device shown in FIG. 56A, the writing signal line (T) corresponding to the plate line is supplied with 1.65 V, and unselected bit lines (BL) are set to the floating state. Therefore, a p-i junction of an unselected p-type drain region 551 connected to the bit line (BL) is not biased in a forward direction, and, thus, the memory cell of the ferroelectric memory device may positively operate.

In addition, for the fourth embodiment of the ferroelectric memory device, another reading method is applicable. In the following, a description will be given of the reading method.

In the reading method, while all writing signal lines (T) are set to the 1.65-V (Vcc/2) second voltage level and all drive lines (D) are set to the earth-ground voltage level, the selected bit line (BL) is supplied with the 1.65-V (Vcc/2) second voltage level and the selected word line (WL) is supplied with the earth-ground voltage level.

In this case, unselected bit lines (BL) are set to the floating state.

In the fourth embodiment of the ferroelectric memory device, when the ferroelectric memory device is designed using a 0.5-$\mu$m rule, memory cell size may be 1.5 $\mu$m×3 $\mu$m. Therefore, a chip area of a 16-Mbit semiconductor storage device for the main memory may be provided in a chip area of 6 mm×12 mm.

In the above description of the fourth embodiment of the ferroelectric memory device, the Pt film is provided as the floating gate 545. By providing the Pt film, the memory cell may be positively set to the normally-off state having a low threshold voltage. However, after the PZT film 544 is formed, a polycrystal silicon film 547 is formed as an operation region, whereby the PZT film 544 has substantially no influence on a channel boundary of the device. Therefore, the Pt film is not necessarily required. It is possible to directly provide the insulating film 546 on the PZT thin film 544.

Figure 65A:
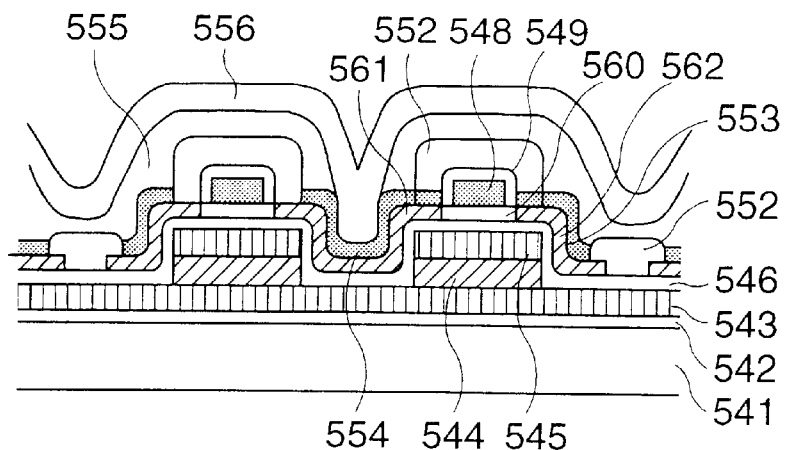
FIG. 65A shows a cross-sectional view of an n-channel-type memory cell and a thin-film transistor (TFT) constituting a peripheral circuit in a modification of the fourth embodiment of the ferroelectric memory device according to the present invention.
Figure 65B:
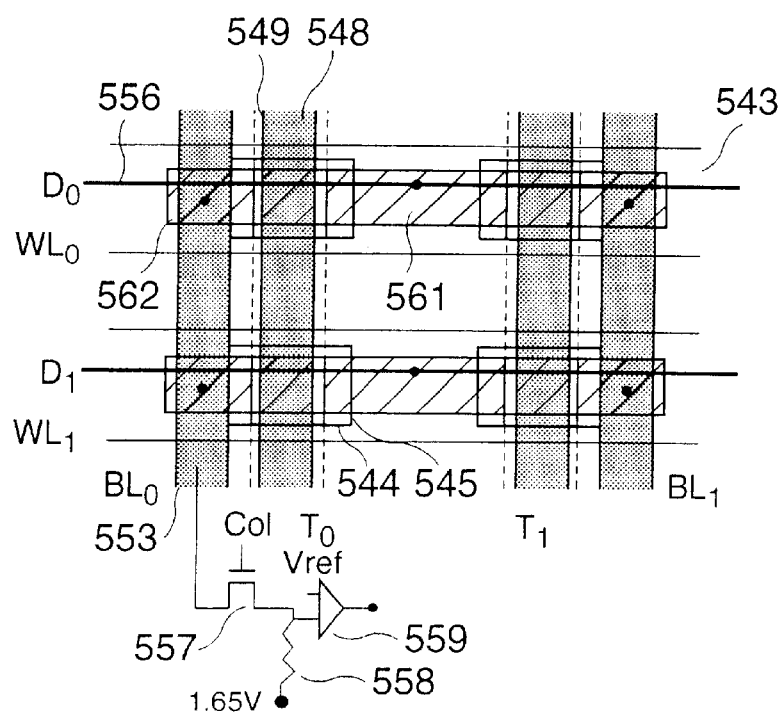
FIG. 65B shows a simplified top plan view of a pattern of the memory cell shown in FIG. 65A.

Next, a description will be given of a modification of the fourth embodiment of the ferroelectric memory device according to the present invention, by referring to FIG. 65A and FIG. 65B. FIG. 65A shows a cross-sectional view of an n-channel-type memory cell and a thin-film transistor (TFT) constituting a peripheral circuit in the modification of the fourth embodiment of the ferroelectric memory device according to the present invention. FIG. 65B shows a simplified top plan view of a pattern of the memory cell shown in FIG. 65A.

In the n-channel-type memory cell shown in FIG. 65A, an i-type polycrystal silicon film 547 in the fourth embodiment of the ferroelectric memory device is replaced to a p$^-$-type polycrystal silicon film 560. Further, in the memory-cell side, an n-type impurity such as As is provided to form an n-type source region 561 and an n-type drain region 562. Other element configurations of the modification device is substantially the same as the fourth embodiment of the ferroelectric memory device.

As shown in FIG. 65B, the ferroelectric memory cell also is formed in a symmetric mirror formation, and to each of the bit lines (BL$_0$, BL$_1$, . . . ), the column selection transistor 557 is connected, and also, the sense amplifier 559 is connected through the resistor 558 connected to the 1.65-V voltage level. In the same way as the fourth embodiment, the column selection transistor 557 and the sense amplifier 559 construct column-selection means.

The sense amplifier 559 also is constructed using the n-channel thin-film transistor formed in the fabricating process of the ferroelectric memory cell. In this case, since the ferroelectric memory cell is also the n-channel type, a manufacturing process of the modified device may be simplified as compared to the fourth embodiment of the ferroelectric memory device.

In the same way as the fourth embodiment, to each of writing signal lines (T$_0$, T$_1$, . . . ), in the same way as the bit lines (BL$_0$, BL$_1$, . . . ), the column-selection means is connected. Further, to each of the word lines (WL$_0$, WL$_1$, . . . ) and to each of the drive lines (D$_0$, D$_1$, . . . ), the row selection means for applying the earth-ground voltage level or the 1.65-V (Vcc/2) voltage level is respectively connected. The above-discussed structure is not shown in the drawing.

In the following, a description will be given of a driving method of the modified ferroelectric memory device, by referring to FIG. 65B.

In FIG. 65B, all bit lines (BL) and all drive lines (D) are set to the power-source voltage Vcc, all writing signal lines (T) are supplied with the power-source voltage Vcc, and all word lines (WL) are supplied with the earth-ground voltage level, and, thus, the ferroelectric memory cell is set to be non-conductive. In this way, information of all ferroelectric memory cells may be simultaneously erased.

When logic "1" data is written in the ferroelectric memory cell, while all bit lines (BL) and all drive lines (D) are supplied with the 1.65-V (Vcc/2) second voltage level, a selected writing signal line (T) is supplied with the earth-ground voltage level and a selected word line (WL) is supplied with the third voltage level. In this way, the logic "1" data is written into the selected ferroelectric memory cell.

In this case, unselected writing signal lines (T) and unselected word lines (WL) are previously supplied with the 1.65-V second voltage level. Therefore, the logic "1" data is inhibited from being written into the memory cell in which logic "0" data is written.

When the information is read out from the ferroelectric memory cell, while all writing signal lines (T) and all drive lines (D) are set to the earth-ground voltage level, a selected bit line (BL) is set to the 1.65-V side through the resistor 558 and a selected word line (WL) is set to the 1.65-V (Vcc/2) first voltage level.

In this case, unselected bit lines (BL) are set to the floating state, and unselected word lines (WL) are set to earth-ground voltage level.

Figure 66A:
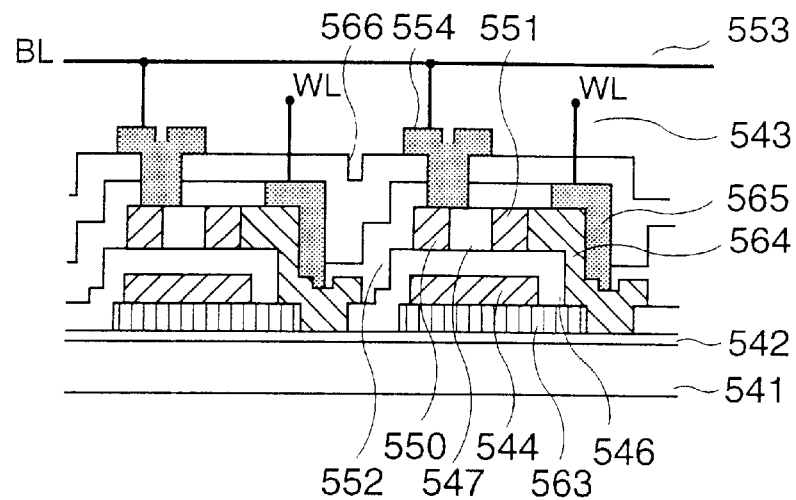
FIG. 66A shows a cross-sectional view of a memory cell structure of a fifth embodiment of a normally-on-type ferroelectric memory device in which the backward blocking diode is provided in the thin-film semiconductor layer according to the present invention.
Figure 66B:
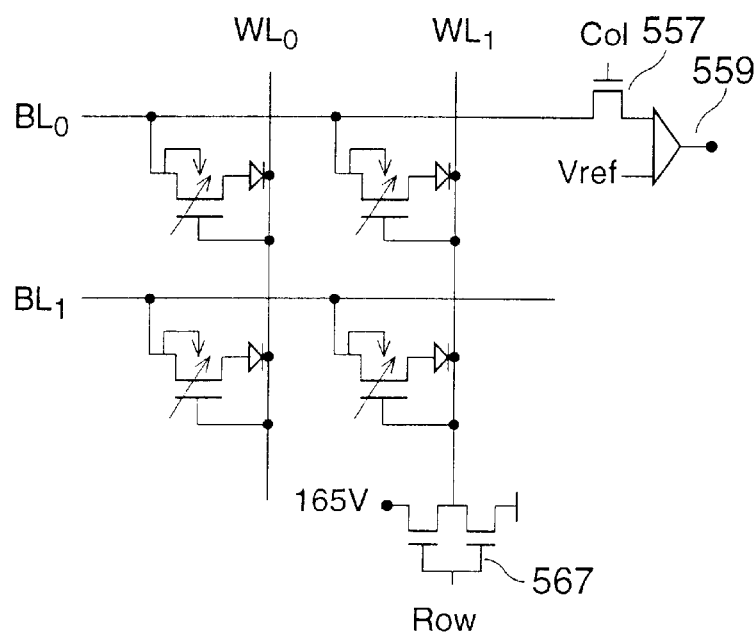
FIG. 66B shows a simplified schematic diagram of the ferroelectric memory cell shown in FIG. 66A.

Next, a description will be given of a fifth embodiment of a normally-on-type ferroelectric memory device in which the backward blocking diode is provided in the thin-film semiconductor layer according to the present invention, by referring to FIG. 66A to FIG. 66B. FIG. 66A shows a cross-sectional view of a memory cell structure of the fifth embodiment of the normally-on-type ferroelectric memory device in which the backward blocking diode is provided in the thin-film semiconductor layer according to the present invention. FIG. 66B shows a simplified schematic diagram of the ferroelectric memory cell shown in FIG. 66A.

In FIG. 66A, first in the quartz substrate 541, the $SiO_2$ film 542 having a thickness in the range of 10 to 30 μm, preferably, 20 μm, is formed by using the sputtering method. Next, through the $SiO_2$ film 542, the Ti film having a thickness in the range of 5 to 15 μm, preferably, 10 μm, and the Pt film having a thickness in the range of 15 to 30 μm, preferably, 20 μm, are successively layered to form a layered film. After that, by patterning the layered film, a gate electrode 563 is formed.

Next, over the above layered film, after the PZT thin film as the ferroelectric film having a thickness in the range of 10 to 70 μm, preferably, 40 μm, is layered, the PZT film 544 is formed by patterning so as to expose a part of the gate electrode 563. Further, after the insulating film having a thickness in the range of 5 to 15 μm, preferably, 10 μm, is layered, the insulating film 546 is formed by patterning so as to expose a part of the gate electrode 563.

Next, over the layers thus formed, an amorphous silicon film is layered. After that, by a laser annealing, the amorphous silicon film is re-crystallized and is changed to the genuine polycrystal silicon film 547. Subsequently, after a patterning process is carried out, p-type impurity such as B is provided using a mask (not shown), and the p-type source region 550 and the p-type drain region 551 are formed.

Further, by using a new mask (not shown), an n-type impurity such as As is provided, and the p-type drain region 551 and an $n^+$-type region 564 are formed. After that, an Al electrode 565 is formed. The Al electrode 565 is used as the word line (WL) 543 which is connected to the $n^+$-type region 564 through the open part provided in the $SiO_2$ film 552 layered overall.

Next, the source electrode 554 is provided as the bit line (BL) 553. The source electrode 554 is connected to the p-type source region 550 and the genuine polycrystal silicon region through a contact hole provided in a cover film 566 such as PSG.

Also in this case, in the same way as the fourth embodiment, the sense amplifier, etc., constituting the peripheral circuit is formed by using the fabrication process of the ferroelectric memory cell.

As shown in FIG. 66B, in the ferroelectric memory cell, to each of the bit lines ($BL_0$, $BL_1$, . . . ), the sense amplifier 559 is connected through the column selection transistor 557. Further, to each of the word lines ($WL_0$, $WL_1$, . . . ) 531, a row selection transistor 567 for applying the earth-ground voltage level or the 1.65-V (Vcc/2) voltage level is respectively connected.

In such a memory structure, a p-n junction formed with the p-type drain region 551 and the $n^+$-type region 564 is operative as the backward blocking diode. Therefore, the ferroelectric memory may be driven in the same way as that of the PROM constructed with the diode matrix array. Accordingly, a driving method of the ferroelectric memory device may be simplified. Further, a dedicated wiring space for the writing signal line (T) is not necessary, and, thus, the degree of integration of the ferroelectric memory device may be improved.

Next, a description will be given of a driving method of the fifth embodiment of the ferroelectric memory device, by referring to FIG. 66B.

In FIG. 66B, when logic "1" data is written in the ferroelectric memory cell, the selected bit line (BL) is supplied with the power-source voltage Vcc, and the selected word line (WL) is supplied with the earth-ground voltage level. Further, unselected bit lines (BL) and unselected word lines (WL) are previously supplied with the 1.65-V (approximately Vcc/2) second voltage level.

When logic "0" data is written in the ferroelectric memory cell, the selected bit line (BL) is supplied with the earth-ground voltage level, and the selected word line (WL) is supplied with the power-source voltage Vcc. Further, the unselected bit lines (BL) and the unselected word lines (WL) are previously supplied with the 1.65-V (approximately Vcc/2) second voltage level.

In this way, when the information is written into the ferroelectric memory device, the unselected word lines (WL) and the unselected bit lines (BL) are set to the second voltage level (approximately Vcc/2). Therefore, different from the prior art 1Tr-type ferroelectric memory device shown in FIG. 56A, an unstable operation such as erroneous writing is prevented.

When the information is read out from the ferroelectric memory cell, the selected bit line (BL) is suppled with the 1.65-V voltage level, and the selected word line (WL) is supplied with the earth-ground voltage level. Further, the unselected bit lines (BL) are set to the floating state, and the unselected word lines (WL) are set to 1.65 V.

In this way, when the information is read out from the ferroelectric memory device, the unselected bit lines (BL) are set to the floating state. However, since the p-n junction operating as the backward blocking diode is provided in the p-type drain region 551, the p-i junction of the unselected p-type source region 550 is not biased in a forward direction. Therefore, the memory cell of the ferroelectric memory device may positively operate.

The fifth embodiment of the ferroelectric memory device uses the normally-on-type memory cell. By combining with the backward blocking diode, the fifth embodiment of the ferroelectric memory device may be driven in the same way as the diode-matrix-array-type PROM. Further, the fifth embodiment of the ferroelectric memory device is usable as a semiconductor storage device for a high-integration-degree-and-high-speed main memory.

In the above description of the fifth embodiment of the ferroelectric memory device, since the ferroelectric memory device uses the normally-on-type memory cell, the floating gate such as a Pt film is not provided. However, it is possible to form the floating gate by providing the Pt film on the PZT film 544.

In the above descriptions of the first to third embodiments of the ferroelectric memory device, the n-channel-type memory cell is used. However, in these ferroelectric memory devices, a p-channel-type memory cell is also usable. In this case, according to changing of the channel-conduction type, a voltage level applied to each line needs to be changed in the same way as the fourth embodiment.

In the above-discussed fourth and fifth embodiments, the gate electrode for the word line is provided on the quartz substrate 541. However, also in another method, the gate insulating film and the gate electrode may be formed. For example, after forming a re-crystallized polycrystal silicon film on the quartz substrate 541, the insulating film 546, the floating gate 545, the PZT film 544, and the conductive film are successively layered. Subsequently, by patterning these layers, the gate insulating film and the gate electrode are formed. The above-discussed manufacturing process is complex, but the degree of integration may be improved.

In the above descriptions of the fourth and fifth embodiments of the ferroelectric memory device, the quartz substrate 541 is used for a substrate, and the $SiO_2$ film 542 is formed on the quartz substrate 541 by the CVD method. However, the $SiO_2$ film 542 is not necessarily required. Further, the substrate is not limited to the quartz substrate, but other insulating substrates such as sapphire are also usable. Also, an insulating substrate, on which an oxide film is provided by thermally oxidizing a silicon substrate, is usable. In the present specification, the term "insulating substrate" includes a variety of substrates.

In each of the above-discussed embodiments, for the ferroelectric thin film, PZT is used. However, the ferroelectric thin film is not limited to PZT, but other ferroelectric thin film such as PLZT, $BaTiO_3$, $PbTiO_3$, and $Bi_4Ti_3O_{12}$, are also applicable.

Further, in each of the above-discussed embodiments, Pt is used for the floating gate. However, polycrystal silicon is usable for the floating gate.

When polycrystal silicon is used for the floating gate, since it is difficult to directly layer PZT on polycrystal silicon film, it is preferred that PZT is layered on polycrystal silicon through an $IrO_2$ film. In this case, by using polycrystal silicon for the floating gate, a boundary face condition of the gate $SiO_2$ is improved, and, thus, an increased yield from manufacturing and an improvement in operational stability are provided ("Electronic Material" in Japanese, August, 1994, p.27–32).

In addition, in each of the above-discussed embodiments, for the semiconductor, a silicon substrate or polycrystal silicon film is used. However, the semiconductor is not limited to silicon, but other IV-group semiconductor such as SiGe combination crystal and a III–V-group compound semiconductor such as GaAs are also usable.

As described above, the present inventions have the following features.

According to the present invention, the memory cell is constructed with a single MISFET having a ferroelectric gate insulating film, and has a connection structure requiring no excessive wiring space. Further, when the data is written in the ferroelectric memory device, the ferroelectric memory device may be driven to apply bias voltages so as to prevent a writing error. Therefore, the degree of integration of the ferroelectric memory device may be improved. Further, the 1Tr-type ferroelectric memory device and its driving method for carrying out a stable driving operation and a positive memory operation may be utilized.

Further, the present invention is not limited to these embodiments, but other variations and modifications may be made without departing from the scope of the present invention.

(3) THIRD OPTIONAL FERROELECTRIC MEMORY DEVICE

The invention of the third optional device generally relates to a ferroelectric memory device and its driving method, and more particularly, to a ferroelectric memory device and driving method which carries out a non-volatile memory operation using an MISFET having a ferroelectric substance as a gate insulating film.

First, a description will be given of the background of the above-mentioned ferroelectric memory according to the present invention.

In the prior art, as a non-volatile semiconductor memory device, an EEPROM and a flash memory, etc., are used. However, since these memories need a high voltage of 10 to 12V for a writing operation, there is a problem in that it is difficult to operate these memories by a single voltage (e.g. 5V) like other semiconductor memory devices. Further, there is also a problem in that these memories may not be operable at a fast writing speed, and, thus, they have a lengthy writing time.

Recently, to resolve the above-discussed problems such as the high-voltage requirement and a lengthy writing time, a ferroelectric memory using a ferroelectric substance such as PZT ($PbZr_{0.52}Ti_{0.48}O_3$) as the gate insulating film has been developed. In operation of this ferroelectric memory, two methods are known, the first method is directed to detecting variation of storage capacitance of a ferroelectric capacitor, and the second method detects variation of resistance according to remanent polarization of the ferroelectric substance.

With respect to the first method, FRAM (registered by Ramtron company) has been proposed. In the memory, by using the ferroelectric substance as a dielectric of the capacitor for storing information, variation of the storage capacitance with polarization inversion is detected. However, in commercial use, a cell configuration of (2Tr+2C) is used, and, thus, it is difficult to improve the degree of integration of the memory. Further, it may be "destructive reading" meaning that data is destroyed at a reading operation.

Further, use of a FRAM having a cell configuration of (1Tr+1C) like the prior art DRAM has also been developed, however, this FRAM is in commercial use.

On the other hand, with respect to the second method of detecting variation of the resistance according to remanent polarization of the ferroelectric substance, a 1Tr-type MFS-FET (Metal Ferroelectric Semiconductor FET) has been developed.

Figure 67A:
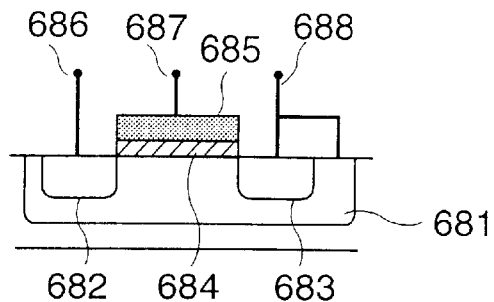
FIG. 67A shows a cross-sectional view of a prior art ferroelectric memory device having a memory cell configuration constructed with a 1Tr-type MFS-FET (Metal Ferroelectric Semiconductor FET)
Figure 67B:
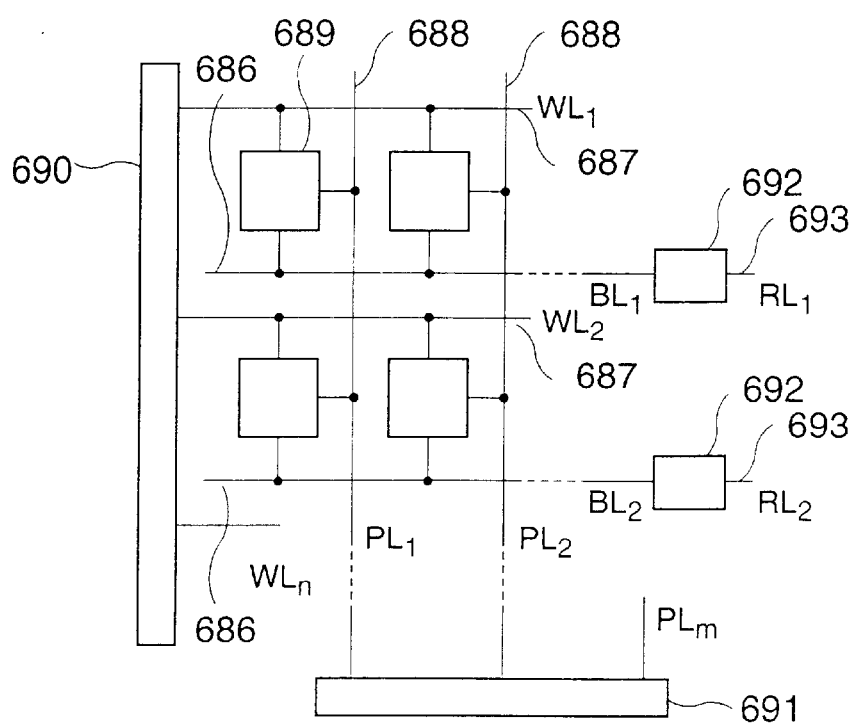
FIG. 67B shows a schematic diagram of the prior art ferroelectric memory device shown in FIG. 56A.

FIG. 67A shows a cross-sectional view of a prior art ferroelectric memory device having a memory cell configuration constructed with the 1Tr-type MFS-FET. FIG. 67B shows a schematic diagram of the prior art ferroelectric memory device shown in FIG. 56A. This ferroelectric memory device is disclosed in Japanese Laid-Open Patent Application No. 4-192173.

In FIG. 67A and FIG. 67B, after $n^+$-type source and drain regions 682, 683 are formed on a p-type well region 681, a ferroelectric thin film 684 such as PLZT is provided as a gate insulating film, and subsequently, a gate electrode 685 is further provided thereon. When a voltage is applied between the $n^+$-type source region 683 connected with the p-type well region 681 and the gate electrode 685 so that the electric-field vector is downwardly oriented, the ferroelectric thin film 684 is polarized.

Since the polarization may remain as a remanent polarization even if the voltage is set to 0 V, electrons are stored in a boundary region between the p-type well region 681 and the ferroelectric thin film 684, a normally-on state occurs, and the information may semipermanently be stored. In this case, when the applied electric field is inverted, a normally-off state occurs and the information may also be stored.

When reading-out the stored information, a voltage level of an initially selected bit line ($BL_1$) 686 is set to 0 V, a reference voltage of a reference line ($RL_1$) 693 connected to a sense amplifier 692 is precharged to Vcc (power-supply voltage)/2, and a selected plate line ($PL_1$) 688 is provided with a 5.0-V voltage.

At this time, a selected word line ($WL_1$) 687 is also provided with a 5.0-V voltage so that the data may not be changed, and unselected plate lines ($PL_2$, . . . ) 688 and unselected word lines ($WL_2$, . . . ) 687 are set to a floating state.

In this case, when the logic "1" is stored in the MFS-FET, and the MFS-FET is operative as a normally-on-type FET, i.e., a depletion-type FET, the voltage of the selected bit line 686 gradually increases, and finally, the voltage thereof becomes greater than the reference voltage Vcc/2. At this time, when the sense amplifier 692 is activated, the voltage of the bit line 686 increases to 5.0 V, and the voltage of the reference line 692 decreases to 0 V. By detecting these voltage levels, the information may be read out.

In FIG. 67B, numerals 689, 690 and 691 respectively indicate a ferroelectric memory cell, a word-selection decoder driver, and a plate-selection decoder driver.

In such an MFS-FET, when the data is read out, the plate line (PL) 688 and the word line (WL) 687 are set to 5.0 V. As a result, a p-n junction, which forms an $n^+$-type drain region 882 connected to the bit line (BL) 686, is biased in a forward direction, and is set to be conductive. There is thus a problem in that a memory operation is not carried out.

Figure 68A:
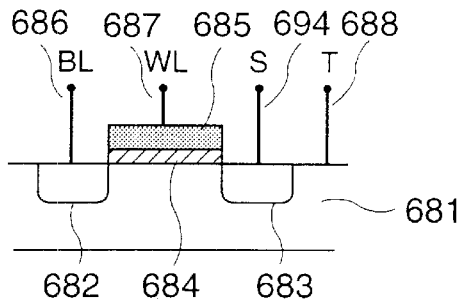
FIG. 68A shows a cross-sectional view of another prior art ferroelectric memory device having a memory cell configuration constructed with the 1Tr-type MFS-FET.
Figure 68B:
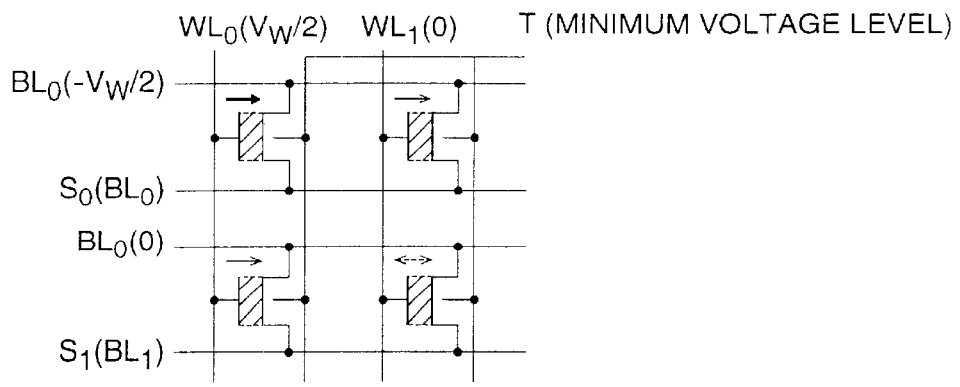
FIG. 68B and FIG. 68C show schematic diagrams for explaining driving methods of the prior art ferroelectric memory device shown in FIG. 68A.
Figure 68C:
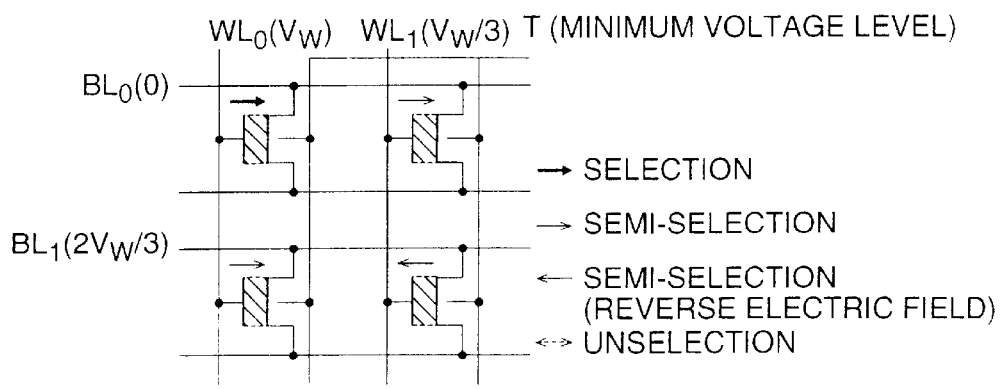

To resolve the above-discussed problem in the MFS-FET, a 1Tr-type ferroelectric memory device shown in FIG. 68A to FIG. 68C is proposed. The ferroelectric memory device is disclosed in Japanese Laid-Open Patent Application No. 7-45794.

FIG. 68A shows a cross-sectional view of another prior art ferroelectric memory device having a memory cell configuration constructed with the 1Tr-type MFS-FET. FIG. 68B and FIG. 68C show schematic diagrams for explaining driving methods of the prior art ferroelectric memory device shown in FIG. 68A.

The 1Tr-type ferroelectric memory device has substantially the same cell structure as that of the ferroelectric memory device shown in FIG. 67A. However, with respect to a wiring structure and a bias structure, there are differences between the two ferroelectric memory devices.

Referring to FIG. 68B, a plate electrode T connected to the p-type well region 681 and a source-leading electrode S connected to the $n^+$-type source region 883 are individually formed. In this case, a minimum voltage level in an integrated circuit is applied to the plate electrode T, and to the source-leading electrode S, the same voltage as that of the bit line (BL) or an earth-ground voltage level is applied. FIG. 68B shows a case where the same voltage as that of the bit line (BL) is applied to the source-leading electrode S.

When $-\frac{1}{2}$ of a writing voltage $V_W$, namely, a $-V_W/2$ voltage, is applied to a selected bit line $BL_0$, the $-V_W/2$ voltage is also applied to a source-leading electrode $S_0$. At this time, a voltage level of a channel region under the gate electrode 885 is also set to the $-V_W/2$ voltage. Further, when $\frac{1}{2}$ of the writing voltage $V_W$, namely, $V_W/2$, is applied to a selected word line $WL_0$, a selected cell (a left-and-upper side cell in FIG. 68B) is supplied with the $V_W$ voltage, and, thus, a writing operation is carried out.

In this case, when the source-leading electrode S is supplied with the earth-ground voltage level, only the ferroelectric thin film 684 of an overlapped part between the $n^+$-type drain region 882 and the gate electrode 885 is polarized.

Referring to FIG. 68C, another driving method is shown. In the driving method, a selected word line $WL_0$ is supplied with the writing voltage $V_W$, and an unselected word line $WL_1$ is supplied with a $V_W/3$ voltage. Further, a selected bit line $BL_0$ is supplied with 0 V, and an unselected bit line $BL_1$ is supplied with a $2V_W/3$ voltage. As a result, a selected cell (a left-and-upper side cell in FIG. 68C) is supplied with the $V_W$ voltage, and, thus, a writing operation is carried out.

In this case, FIG. 68C shows a case where the source-leading electrode S is supplied with the earth-ground voltage level.

However, in such a MFS-FET, since the ferroelectric substance is an oxide, an $SiO_2$ film (not shown) is formed in a boundary region between the p-type well region 681 and the ferroelectric thin film 684. Due to the $SiO_2$ film, not only does the operational voltage increase, but also a trap level occurs. Therefore, there is a problem that an electric charge is provided to the ferroelectric thin film 684, as a result, an electric charge provided by the remanent polarization is cancelled.

Further, when a film-forming temperature of the ferroelectric thin film 684 is high, elements constituting the ferroelectric thin film 684 are diffused in the p-type well region 681. Namely, the elements are diffused in the silicon substrate, and, thus, characteristics of the memory device may be degraded. Therefore, to resolve the problem, ferroelectric memory devices, having an MFIS (Metal Ferroelectric Insulator Semiconductor) constitution and an MFMIS (Metal Ferroelectric Metal Insulator Semiconductor) constitution, are proposed. These ferroelectric memory devices are disclosed in Japanese Laid-Open Patent Application No. 7-202035.

In the ferroelectric memory having the MFIS constitution (not shown in a drawing), after an $SiO_2$ film is formed on a p-type well region or a surface of a silicon substrate, a ferroelectric thin film is formed thereon. In this case, by providing the $SiO_2$ film, the elements constituting the ferroelectric thin film are prevented from diffusing in the well region or the silicon substrate.

Figure 69A:
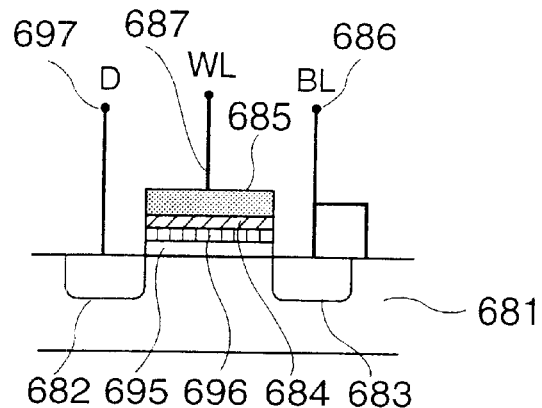
FIG. 69A shows a cross-sectional view of a prior art ferroelectric memory cell having an MFMIS (Metal Ferroelectric Metal Insulator Semiconductor) constitution.
Figure 69B:
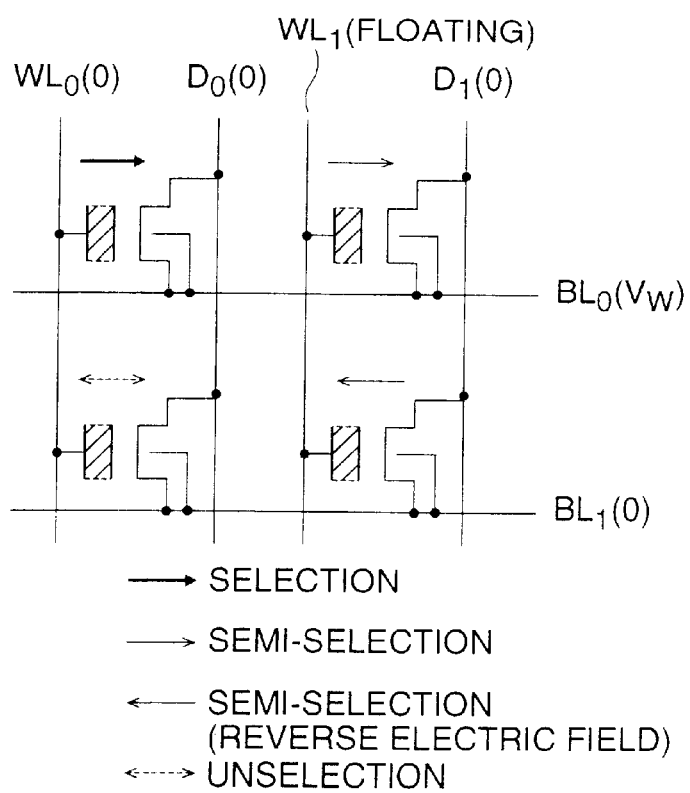
FIG. 69B shows a schematic diagram for explaining a driving method of the prior art MFMIS-type ferroelectric memory cell shown in FIG. 69A.

FIG. 69A shows a cross-sectional view of the prior art MFMIS-type ferroelectric memory cell. FIG. 69B shows a schematic diagram for explaining a driving method of the prior art MFMIS-type ferroelectric memory cell shown in FIG. 69A.

In the ferroelectric memory having the MFMIS constitution shown in FIG. 69A, to improve storage characteristics of the remanent polarization of the MFIS-type ferroelectric memory, a Pt film having good adaptability to the ferroelectric thin film 684 is provided between the $SiO_2$ film 694 and the ferroelectric thin film 684. Namely, by providing the Pt film, i.e., a floating gate 695, a good-quality ferroelectric thin film 684 may be formed.

However, in the driving method disclosed in Japanese Laid-Open Patent Application No. 7-202035, since an unselected word line $WL_1$ is set to be in a floating condition, the voltage level may be unstable. Further, the ferroelectric thin film 684 of an unselected cell (a right-and-lower side cell in FIG. 69B) connected to the unselected word line $WL_1$ and an unselected bit line $BL_1$ is supplied with a reverse electric field opposite to an electric field of a selected cell (a left-and-upper side cell in FIG. 69B). Therefore, when a writing operation is repeated many times, there is a problem in that stored information may be destroyed.

Accordingly, in order to improve the wiring structure and the driving method of the above-discussed prior art ferroelectric memory device, the inventors have proposed the ferroelectric memory device having features of a stable operation and a high degree of integration in the previously-discussed item (2) "SECOND OPTIONAL FERROELECTRIC MEMORY DEVICE".

In the following, the second optional ferroelectric memory device will be summarized, by referring to FIG. 70A and FIG. 70B.

Figure 70A:
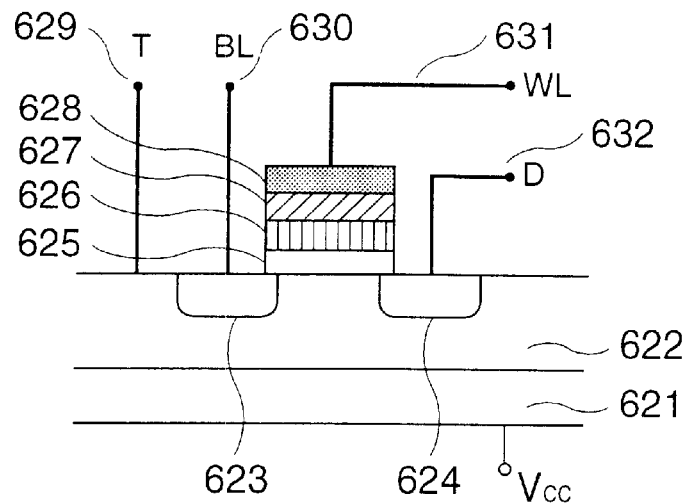
FIG. 70A shows a cross-sectional view of a memory cell structure of a ferroelectric memory device having a common well region.

FIG. 70A shows a cross-sectional view of a memory cell structure of the ferroelectric memory device having a common well region. FIG. 70B shows a simplified top plan view of a pattern of the ferroelectric memory cell shown in FIG. 70A.

In FIG. 70A, first in an n-type semiconductor substrate 621, like a bit line (BL) 630, a common p-type well region 622 is formed in a direction of a column-selection line. Next, an $SiO_2$ film having a thickness in the range of 1 to 3 μm, preferably, 2.5 μm, a Pt film used for a floating gate having a thickness in the range of 15 to 30 μm, preferably, 20 μm, a PZT thin film used for a ferroelectric film having a thickness in the range of 10 to 70 μm, preferably, 40 μm, and a conductive film such as a Pt film are successively layered to form a layered film.

After that, by patterning the layered film, a gate insulating film comprising an $SiO_2$ film 625, a Pt film 626, and a PZT thin film 627, and a gate electrode 628 are formed, and a plurality of groups of the gate insulating film and the gate electrode 628 are arranged in the direction of the column-selection line. In FIG. 70A, only one group of the gate insulating film and the gate electrode 628 is shown.

Next, by selectively providing an n-type impurity such as As by using the gate electrode 628 as a mask, an n-type drain region 623 and an n-type source region 624 are formed. Subsequently, a plate line (T) 629 is connected to the p-type well region 622, the bit line (BL) 630 is connected to the n-type drain region 623, a word line (WL) 631 is connected to the gate electrode 628, and a drive line (D) 632 is connected to the n-type source region 624. In this way, the ferroelectric memory cell is formed.

Figure 70B:
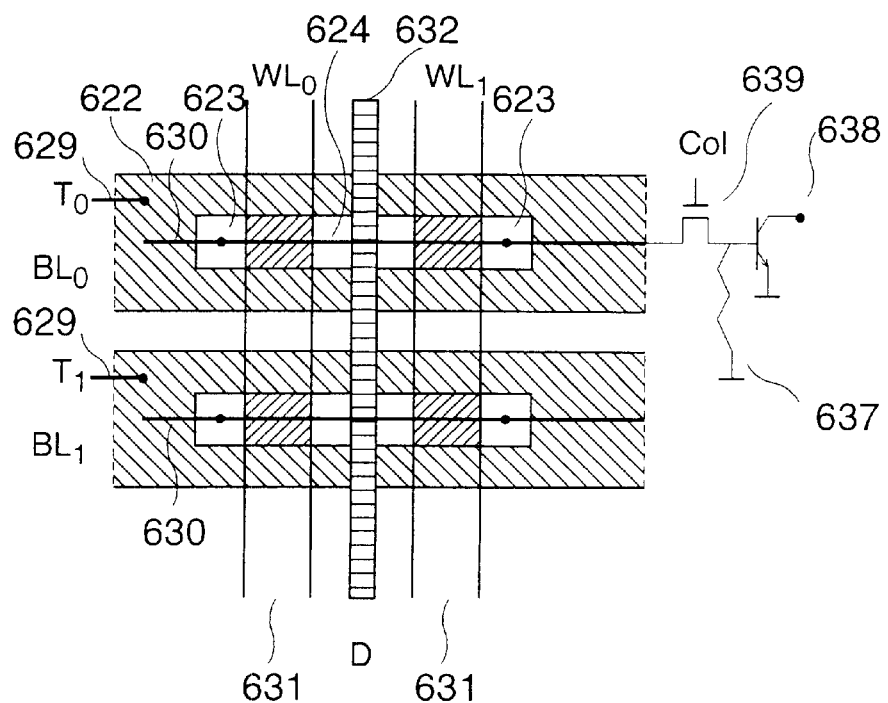
FIG. 70B shows a simplified top plan view of a pattern of the ferroelectric memory cell shown in FIG. 70A.

In FIG. 70B, the ferroelectric memory cell is formed in a symmetric mirror formation, and to each of the bit lines ($BL_0$, $BL_1$, ...) 630, a column selection transistor 639 is connected, and a sense amplifier 638 is also connected through a resistor 637 connected to an earth-ground voltage level. The column selection transistor 639, the sense amplifier 638, and the resistor 637 construct column selection means.

The sense amplifier 638 is formed, by using the p-type well region 622 formed in a fabricating process of the ferroelectric memory cell as a base region, as a lateral-bipolar-transistor in which the n-type drain region 623 and the n-type source region 624 are respectively used for an emitter region and a collector region.

Further, to each of the plate lines ($T_0$, $T_1$, ...) 629, in the same way as the bit lines ($BL_0$, $BL_1$, ...) 630, the column selection means is connected, and to each of the word lines ($WL_0$, $WL_1$, ...) 631 and to each of the drive lines ($D_0$, $D_1$, ...) 632, row selection means for applying the earth-ground voltage level or a 1.65-V (Vcc/2) first voltage level is respectively connected. The above-discussed structure is not shown in the drawing.

In such a memory structure, the p-type well region 622 is usable for the plate line (T). Therefore, a dedicated wiring space for the plate line (T) is not necessary, and, thus, the degree of integration of the ferroelectric memory device may be improved.

When the information of the ferroelectric memory device is erased, all bit lines (BL) and the drive lines (D) are set to a floating state, all plate lines (T) are supplied with a power-source voltage Vcc (3.3 V), and all word lines (WL) are supplied with the earth-ground voltage level in order to set the ferroelectric memory cell to be non-conductive. At this time, the PZT thin film 627 is inversely polarized in a −Pr direction, and a logic "0" is set. In this way, in the same way as a floating-gate-transistor-type flash memory, information of all ferroelectric memory cells may be simultaneously erased.

When logic "1" data is written in the ferroelectric memory cell, all bit lines (BL) and the drive lines (D) are supplied with a 1.65-V (Vcc/2) second voltage level, a selected plate line (T) is supplied with 0 V (earth-ground voltage level), and a selected word line (WL) is supplied with a third voltage level. In this way, the logic "1" data is written into the selected ferroelectric memory cell.

In this case, unselected plate lines (T) and unselected word lines (WL) are previously supplied with the 1.65-V second voltage level. Therefore, the logic "1" data is inhibited from being written into the memory cell in which writing data is a logic "0".

The third voltage level ($V_W$) is set to polarize the PZT thin film 627 by +Pr* in a +Pr direction so that an output of the memory cell is the logic "1" when the data is read out. When the PZT thin film 627 is polarized by the +Pr*, a threshold voltage (Vth) decreases so that the memory cell is set to be conductive when a reading-out voltage level is applied. As a result, the memory cell is set to a normally-off state.

In this case, unselected plate lines (T) and unselected word lines (WL) are previously supplied with the 1.65-V second voltage level. Therefore, when writing data, the information is prevented from erroneously being written into unselected memory cells. Accordingly, a writing operation may be stabilized.

When the information is read out from the ferroelectric memory cell, all plate lines (T) are set to the earth-ground voltage level, all drive lines (D) are set to the 1.65-V second voltage level, a selected bit line (BL) is set to the earth-ground voltage level, namely to be a side of the earth-ground voltage level, and a selected word line (WL) is set to the 1.65-V (Vcc/2) first voltage level.

In this case, unselected bit lines (BL) are set to the floating state, and unselected word lines (WL) are set to 0 V.

When the logic "1" data is previously written in the memory cell, the memory cell is set to be conductive by applying the reading-out voltage (1.65 V). At this time, by voltage-level variation of the bit line (BL), the information is detected through the sense amplifier.

When the logic "1" data is not previously written in the memory cell, namely when the data of the memory cell is the logic "0", the memory cell is set to be non-conductive. Therefore, no voltage-level variation occurs in the bit line (BL).

Further, different from the prior art 1Tr-type ferroelectric memory device shown in FIG. 67A, the plate line (T) corresponding to a plate line is set to the earth-ground voltage level. Therefore, a p-n junction of an unselected n-type drain region 623 connected to the bit line (BL) is not biased in a forward direction, and, thus, the memory cell may positively operate.

Further, in such ferroelectric memories, when the memory cell is semi-selected or unselected, the polarization characteristics of the ferroelectric memory may be degraded. To overcome this problem, a method of providing a two-port switch element between the ferroelectric thin film and the word line is proposed in Japanese Laid-Open Patent Application No. 7-106450.

Figure 71A:
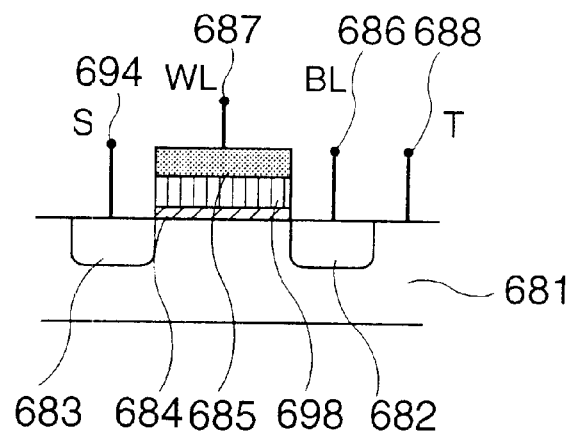
FIG. 71A shows a cross-sectional view of a prior art ferroelectric memory providing a two-port switch element between a ferroelectric thin film and a word line.
Figure 71B:
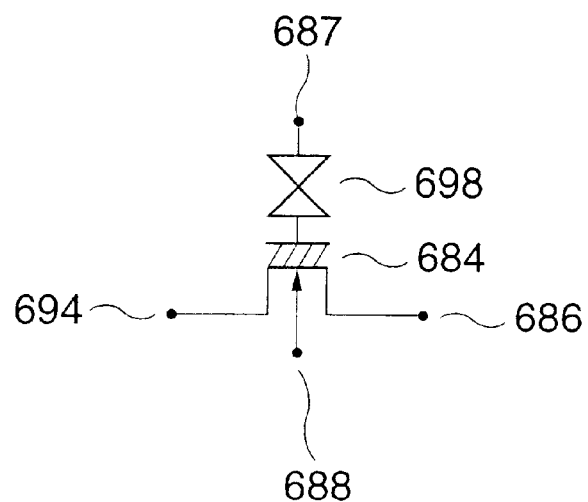
FIG. 71B shows a schematic diagram of the ferroelectric memory shown in FIG. 71A.

In the following, a description will be given of the above-mentioned method, by referring to FIG. 71A and FIG. 71B. FIG. 71A shows a cross-sectional view of a prior art ferroelectric memory providing the two-port switch element between the ferroelectric thin film and the word line. FIG. 71B shows a schematic diagram of the ferroelectric memory shown in FIG. 71A.

Namely, when a selected memory cell and only one of the word line and the bit line are connected in common, the memory cell is in a semi-selection state. When writing the information of the logic "1" and the logic "0" into the memory cell, an intermediate voltage less than a coercive voltage Vc is applied alternately in opposite directions between the gate electrode and one of the source and drain regions. Therefore, a phenomenon called "lack of true Ec" occurs, and the polarization characteristics are degraded. As a result, the information may unexpectedly be rewritten.

In the ferroelectric memory shown in FIG. 71A, to resolve the above-discussed problem, a two-port switch element 698 is provided between the ferroelectric thin film 684 and the gate electrode 685 of the ferroelectric memory cell. In FIG. 71B, an equivalent schematic circuit of the ferroelectric memory cell is shown.

In the above-discussed modified ferroelectric memory, in the same way as the ferroelectric memory shown in FIG. 68A, the gate electrode 685 is connected to the word line 687, and the n$^+$-type drain region 682 is connected to the bit line 686. Further, the n$^+$-type source region 683 is grounded to earth through a source-leading electrode 694, and the p-type well region 681 (or a p-type substrate) is fixed to a minimum voltage in an integrated circuit through the plate electrode 688.

In this way, by providing the two-port switch element 698, characteristics of the polarization to the voltage, namely, PrV characteristics, may show a good PrV curve having a large rectangular ratio. Therefore, a rising edge at an "on" state and a falling edge at an "off" state respectively may be sharpened. Accordingly, even when semi-selection is carried out, the polarization value is prevented from fluctuating due to the applied voltage. As a result, degradation of the polarization characteristics due to the "lack of true Ec" may be reduced.

However, in the above-discussed ferroelectric memory devices, there are the following problems.

In the ferroelectric memory device proposed by Ramtron company, since storage capacitance is required, the ferroelectric memory device has a complex configuration and a complicated driving operation. Further, it is difficult to improve the degree of integration of the ferroelectric memory devices.

In the ferroelectric memory device shown in FIG. 67A, a positive memory operation may not be provided.

In the ferroelectric memory device shown in FIG. 68A, when the voltage level of the source-leading electrode S is set to the voltage level of the bit line BL, there is ambiguity whether the voltage level of the channel region is set to the voltage level of the bit line BL, and, thus, a positive writing operation may not be carried out.

Further, when the source-leading electrode S is set to the earth-ground voltage level, there is a problem in that a positive writing operation may not be provided by an overlap of the source region and the gate electrode.

Even if writing operation can be carried out, information of the semi-selected cell may be destroyed. When the ferroelectric memory cell is used as a flash memory, the driving method shown in FIG. 68B is usable. However, in the driving method shown in FIG. 68C, a semi-selected cell (a right-and-lower side cell in FIG. 68C) is supplied with a reverse electric field of $-V_W/3$ ($=V_W/3-2V_W/3$).

In this case, when the writing operation is repeated many times, the information of the semiselected cell applied with the reverse electric field may be destroyed.

Further, the ferroelectric memory device is used as a random access memory (RAM), the information of the memory may be easily destroyed in both the driving methods shown in FIG. 68B and FIG. 68C.

In the ferroelectric memory device shown in FIG. 69A, as discussed above, since the unselected word line WL$_1$ is set to be in a floating state, the voltage level has ambiguity, and, thus, the memory operation may become unstable. Further, the reverse electric field is supplied to the unselected memory cell connected to the unselected word line WL$_1$ and the unselected bit line BL$_1$. Therefore, when the writing operation is repeated many times, the stored information may be destroyed.

In the ferroelectric memory device shown in FIG. 70A, when logic "1" data is written, a channel is generated, and a voltage level of the channel becomes the same as that of the source-drain regions which is applied with the second voltage level. However, in this case, since the ferroelectric thin film is supplied with only Vcc/2, it is assumed that the writing operation cannot be carried out.

As discussed above, the ferroelectric memory devices shown in FIG. 67A to FIG. 70A has the problem in that the polarization characteristics for the writing operation and the reading operation are degraded. In the ferroelectric memory device shown in FIG. 71A, such problem may be overcome. However, the writing operation of the ferroelectric memory device shown in FIG. 71A is substantially the same as that of the ferroelectric memory device shown in FIG. 68A.

Accordingly, as in the ferroelectric memory device shown in FIG. 68A, a positive writing operation also may not be carried out in the ferroelectric memory device shown in FIG. 71A. Particularly, when the source-leading electrode S is set to the earth-ground voltage level, there is a problem in that a positive writing operation may not be provided by an overlap part of the drain region and the gate electrode.

Next, a description will be given of a summary of the invention.

It is an object of the invention to provide a ferroelectric memory device. The device has a ferroelectric memory structure in which there is no unbalance in writing voltages. Also, the device provides a driving method in which a positive writing operation may be carried out. Further, degradation of polarization characteristics in writing and reading operations may be reduced. This permits the disadvantages described above to be eliminated.

Figure 72:
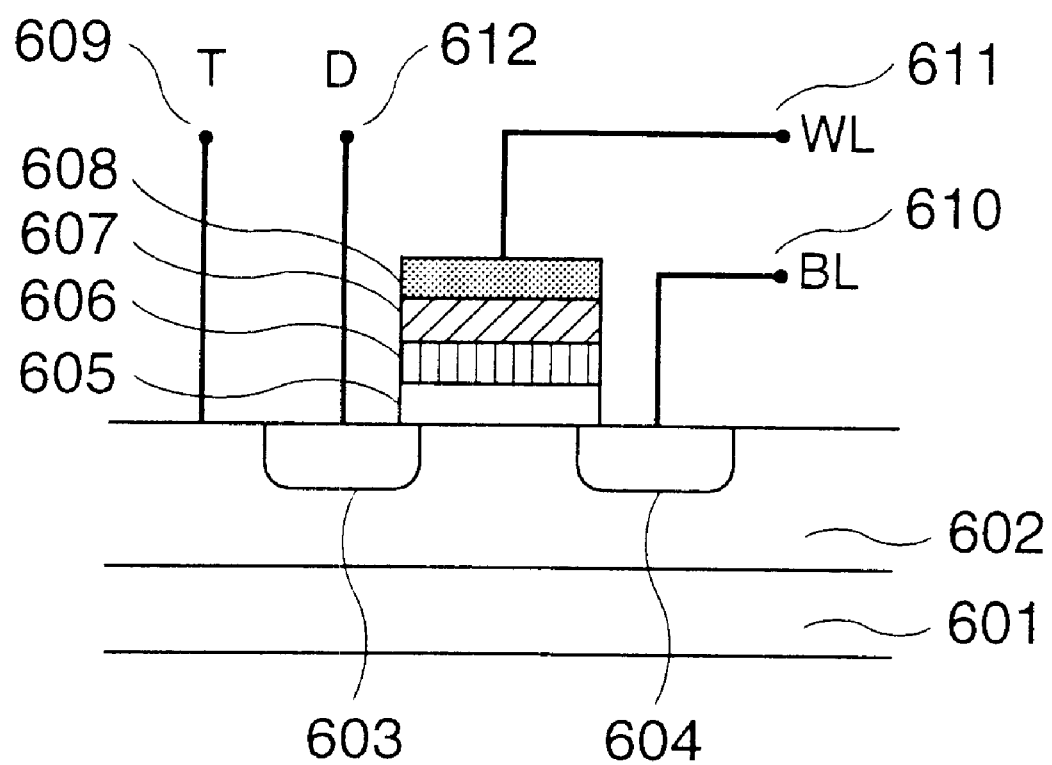
FIG. 72 shows a cross-sectional view of a simplified configuration example of a ferroelectric memory device according to the present invention for explaining an operational principle of the device.

FIG. 72 shows a cross-sectional view of an example of a simplified configuration of the ferroelectric memory device according to the present invention for explaining an operational principle of the device. In the following, by referring to FIG. 72, a summary of the invention will be described.

(1) The object described above is achieved by a ferroelectric memory device in which ferroelectric memory cells are arranged in a matrix form, each of the ferroelectric memory cells having one field-effect transistor (FET) in which a ferroelectric film 607 is used for a part of gate insulating films 605 to 607, said ferroelectric memory device characterized in that there is provided: source and drain regions 603, 604 formed in a well region 602 connected to a plate line 609; and row selection means provided by using a gate electrode 608 of the field-effect transistor as a word line 611; wherein one 604 of the source and drain regions 603, 604 is connected to the bit line 610, and the other 603 of the source and drain regions 603, 604 is connected to a drive line 612 in a direction of the bit line 610.

According to the above-discussed ferroelectric memory device, the well region 602 is used for the plate line 609. Therefore, a space for wiring the plate line 609 which applies an erasing voltage is not required, and, thus, the degree of integration may be improved. Further, when the logic "1" information is written, the writing operation is carried out by an electric field applied between a channel generated just under the gate electrode 608 and the gate electrode 608. Therefore, writing voltages for logic "1" and "0" are prevented from being unbalanced.

(2) The object described above is also achieved by the ferroelectric memory device mentioned in the above item (1), characterized in that: the gate insulating films are constructed by successively layering an insulating film 605, a floating gate 606, and the ferroelectric film 607.

According to the above-mentioned ferroelectric memory device, between the insulating film 605 and the ferroelectric film 607, the floating gate 606 is provided. Therefore, in the same way as the prior art MFMIS, the ferroelectric film 607 having a high quality may positively be provided. Further, when the ferroelectric film 607 is polarized by applying a voltage to the gate electrode 608, a stable normally-off state having a given threshold voltage (Vth) may be realized.

(3) The object described above is also achieved by the ferroelectric memory device mentioned in one of the above items (1) and (2), characterized in that there is further provided third-voltage-level trimming means having a polycrystal semiconductor fuse in a chip in order to trim the third voltage level ($V_W$) for writing information into the ferroelectric memory cell for each chip.

According to the above-mentioned ferroelectric memory device, the third voltage level ($V_W$) for writing the information into the ferroelectric memory cell may be trimmed for each chip. Therefore, when a logic "1" is written in the ferroelectric memory cell, the threshold voltage (Vth) of the ferroelectric memory cell may be positively set to be in a stable condition.

(4) The object described above is also achieved by a method of driving the ferroelectric memory device mentioned in one of the above items (1) to (3), the method characterized in that there is provided the steps of: (a) applying an erasing voltage ($V_E$) between the plate line 609 and all gate electrodes 608; (b) setting a surface of a semiconductor layer facing the gate electrode 608 to be in a storage state; and (d) polarizing so that all ferroelectric memory cells are set to be non-conductive, and setting the information to be a logic "0" in order to erase the information.

According to the above-mentioned method of driving the ferroelectric memory device, in this way, by applying the voltage, the surface of the semiconductor layer facing the gate electrode 608 is set to be in a storage state, and, thus, a sufficient electric field is applied to the ferroelectric thin film 607. Therefore, the information of all ferroelectric memory cells may be simultaneously erased. Accordingly, the ferroelectric memory device may be operable in the same way as a prior art floating-gate-transistor-type flash memory.

(5) The object described above is also achieved by a method of driving the ferroelectric memory device mentioned in one of the above items (1) to (3), characterized in that there are provided the steps of: (a) setting the plate line 609 to an earth-ground voltage level; (b) setting an selected word line 611 to a third voltage level ($V_W$); (c) setting a selected bit line 610 and a selected drive line 612 to the earth-ground voltage level; (d) setting unselected word lines 611, bit lines 610 and drive lines 612 to the second voltage level (approximately $V_W/2$); and (e) polarizing so that the ferroelectric memory cell is set to be conductive when information is read out from a selected ferroelectric memory cell, and writing the information of the logic "1".

According to the above-mentioned method of driving the ferroelectric memory device, when the information is written into the ferroelectric memory, the writing operation is carried out by the electric field applied between the channel generated just under the gate electrode 608 and the gate electrode 608. Therefore, the writing voltages for logic "1" and "0" are prevented from being unbalanced.

Further, the unselected word lines 611 and the unselected bit lines 610 are set to the second voltage level (approximately $V_W/2$). Therefore, an unstable operation such as error writing in a semiselected cell may not occur as in the prior art 1Tr-type ferroelectric memory device shown in FIG. 68A.

(6) The object described above is also achieved by a method of driving the ferroelectric memory device mentioned in one of the above items (1) to (3), the method characterized in that there are provided the steps of: (a) setting the plate line 609 and the drive line 612 to the earth-ground voltage level; (b) setting a selected word line 611 to a first voltage level (Vr); (c) setting a selected bit line 610 to a side of the first voltage level (Vr); and (e) detecting whether a selected ferroelectric memory cell is set to be conductive or non-conductive, and reading out data of the ferroelectric memory cell.

According to the above-mentioned method of driving the ferroelectric memory device, when the data is read out, the plate line 609 is set to the earth-ground voltage level as compared to the prior art 1Tr-type ferroelectric memory device shown in FIG. 67A. Therefore, a p-n junction of one 603 of the unselected source-drain regions 603 and 604 connected to the bit line 610 is not biased in a forward direction, and, thus, the memory cell may be positively operable.

(7) The object described above is also achieved by a method of driving the ferroelectric memory device mentioned in one of the above items (1) to (3), the method characterized in that there are provided the steps of: (a) setting the plate line 609 to the earth-ground voltage level and setting the drive line 612 to the first voltage level (Vr); (b) setting a selected word line 611 to the first voltage level (Vr); (c) setting the bit line 610 to a side of the earth-ground voltage level; and (d) detecting whether a selected ferroelectric memory cell is set to be conductive or non-conductive, and reading out data of the ferroelectric memory cell.

According to the above-mentioned method of driving the ferroelectric memory device, the information may also be read out in a different driving method from that described in item (6). Therefore, flexibility of the method of driving the ferroelectric memory device may be improved.

(8) The object described above is also achieved by a ferroelectric memory device in which ferroelectric memory cells are arranged in a matrix form, each of the ferroelectric memory cells having one field-effect transistor (FET) in which a ferroelectric film 607 is used for a part of gate insulating films 605 to 607, said ferroelectric memory device characterized in that there are provided: source and drain regions 603, 604 respectively formed in a common well region 602 extending in a direction of the bit line 610 in each ferroelectric memory cell, the well regions 602 being shortened to one 603 of the source-drain regions 603, 604 and being used for a drive line; and row selection means provided by using a gate electrode 608 of the field-effect transistor as a word line 611; wherein the other one 604 of the source and drain regions 603, 604 is connected to a bit line 610 in common.

According to the above-discussed ferroelectric memory device, the common well region 602 is shortened to the one 603 of the source-drain regions 603 and 604, and is used for the drive line 12. Therefore, a writing operation of the information may be carried out using the well region 602. Accordingly, a wiring layer such as an Al wiring layer for the drive line 612 is unnecessary, and, thus, the degree of integration may be improved and a manufacture process may be simplified.

(9) The object described above is also achieved by the ferroelectric memory device mentioned in the above item (8), characterized in that: the gate insulating films are constructed by successively layering an insulating film 605, a floating gate 606, and the ferroelectric film 607.

According to the above-mentioned ferroelectric memory device, between the insulating film 605 and the ferroelectric film 607, the floating gate 606 is provided. Therefore, in the same way as the prior art MFMIS, the high quality ferroelectric film 607 may be positively provided. Further, when the ferroelectric film 607 is polarized by applying a voltage to the gate electrode 608, a stable normally-off state having a given threshold voltage (Vth) may be realized.

(10) The object described above is also achieved by the ferroelectric memory device mentioned in one of the above items (8) and (9), characterized in that there is further provided third-voltage-level trimming means having a polycrystal semiconductor fuse in a chip in order to trim the third voltage level ($V_W$) for writing information into the ferroelectric memory cell for each chip.

According to the above-mentioned ferroelectric memory device, the third voltage level ($V_W$) for writing the information into the ferroelectric memory cell may be trimmed for each chip. Therefore, when the logic "1" is written in the ferroelectric memory cell, the threshold voltage (Vth) of the ferroelectric memory cell may be positively set to be in a stable condition, and, thus, a reading margin may be improved.

(11) The object described above is also achieved by the ferroelectric memory device mentioned in one of the above items (8) to (10), characterized in that: a two-port switch element having a metal/dielectric/metal structure is provided between the gate insulating film and the word line 611.

According to the above-mentioned ferroelectric memory device, in this way, the two-port switch element having a metal/dielectric/metal structure, namely, an MIM structure, is provided between the gate insulating film and the word line 611. Therefore, the polarization characteristics of the ferroelectric thin film 607 may have a good rectangular ratio. Accordingly, degradation of the polarization characteristics due to repetition of the writing operation may be reduced, and, thus, an information writing error is prevented.

Further, when the writing operation or the reading operation is carried out, a charge is stored in an M layer (metal layer) between an I layer (dielectric thin film) of the MIM structure and the ferroelectric thin film 607. Therefore, after the writing operation or the reading operation, a voltage for deriving the stored charge needs to be applied to reset the voltage level to 0 V.

(12) The object described above is also achieved by a method of driving the ferroelectric memory device mentioned in one of the above items (8) to (10), the method characterized in that there are provided the steps of: (a) setting all bit lines 610 and all drive lines 612 to the same voltage level; (b) applying the erasing voltage ($V_E$) between the bit line 610 and all gate electrodes 608; (c) setting the surface of the semiconductor layer facing the gate electrode 608 to be in a storage state; and (d) polarizing so that all ferroelectric memory cells are set to be non-conductive, and setting the information to be a logic "0" in order to erase the information.

According to the above-mentioned method of driving the ferroelectric memory device, in this way, by applying the voltage, the information of all ferroelectric memory cells may be simultaneously erased by a normally-used erasing voltage. Therefore, the ferroelectric memory device may be operable in the same way as the prior art floating-gate-transistor-type flash memory.

(13) The object described above is also achieved by a method of driving the ferroelectric memory device mentioned in one of the above items (8) to (10), characterized in that there are provided the steps of: (a) setting the bit line 610 and the drive line 612 corresponding to the bit line 610 to the same voltage level; (b) setting a selected bit line 610 to the earth-ground voltage level; (c) setting a selected word line 611 to the third voltage level ($V_W$); (d) setting unselected word lines 611 and bit lines 610 to the second voltage level ($V_W/2$); and (e) polarizing so that the ferroelectric memory cell is set to be conductive when information is read out from a selected ferroelectric memory cell, and writing the information of the logic "1".

According to the above-mentioned method of driving the ferroelectric memory device, in the same way as the item (5), when the information is written into the ferroelectric memory, the writing operation is carried out by the electric field applied between the channel generated just under the gate electrode 608 and the gate electrode 608. Therefore, the writing voltages for logic "1" and "0" are prevented from being unbalanced.

Further, the unselected word lines 611 and bit lines 610 are set to the second voltage level ($V_W$). Therefore, an unstable operation such as error writing may not occur as in the prior art 1Tr-type ferroelectric memory device shown in FIG. 67A.

(14) The object described above is also achieved by a method of driving the ferroelectric memory device mentioned in one of the above items (8) to (10), the method characterized in that there are provided the steps of: (a) setting the drive line 612 to the earth-ground voltage level; (b) setting a selected word line 611 to be a first voltage level (Vr); (c) setting a selected bit line 610 to a side of the first voltage level (Vr); and (e) detecting whether a selected ferroelectric memory cell is set to be conductive or non-conductive, and reading out data of the ferroelectric memory cell.

According to the above-mentioned method of driving the ferroelectric memory device, when the data is read out, the unselected bit lines 610 are set to a floating state. Since the well region 602 and the one 603 of the unselected source-drain region are electrically shorted with respect to each other, a p-n junction of the one 603 of the unselected source-drain region is not biased in a forward direction. Therefore, the memory cell may be positively operable.

(15) The object described above is also achieved by a method of driving the ferroelectric memory device mentioned in the above items (11), the method characterized in that there are provided the steps of: (a) applying one of a positive writing voltage and a negative writing voltage to a selected cell; and (b) writing one of logic "1" and "0" according to positive and negative levels of the writing voltage; wherein the ferroelectric memory device is operative as a random access memory.

According to the above-mentioned method of driving the ferroelectric memory device, when the positive writing voltage is applied to the common well region 602 in which the selected cell extending in a direction of the bit line 610 is provided, and when the gate electrode 608 is supplied with 0 V, the logic "0" information may be written any time.

Further, when the positive writing voltage is applied to the gate electrode of the selected cell, and when a voltage is applied between the selected bit line 610 and the channel region which are set to the same voltage level (0 V), the logic "1" information may be written. Therefore, the ferroelectric memory device is operable as the random access memory (RAM).

(16) The object described above is achieved by a ferroelectric memory device in which ferroelectric memory cells are arranged in a matrix form, each of the ferroelectric memory cells having one field-effect transistor (FET) in which a ferroelectric film is used for a part of gate insulating films, said ferroelectric memory device characterized in that: said field-effect transistor is a thin film transistor; and said thin film transistor comprises: a word line as a gate electrode extending in a row direction in an insulating substrate; a gate insulating film provided on the word line; a re-crystallizing polycrystal semiconductor layer provided on the gate insulating film; and source-drain regions provided in the polycrystal semiconductor layer; wherein one of the source-drain regions is connected to the bit lines in common, and the other one of the source-drain regions is connected to drive lines extending in a direction of the bit line in common.

According to the above-discussed ferroelectric memory device, the FET-type ferroelectric memory cell is constructed with the thin film transistor. Therefore, a highly-integrated semiconductor storage device may be manufactured at low cost. Further, since the word line is provided on the insulating substrate, a space for the word lines is not necessary. Therefore, the degree of integration may be improved as compared to the prior art thin-film semiconductor storage device.

(17) The object described above is achieved by the ferroelectric memory device mentioned above, characterized in that overlapped capacitance of the other one of the source-drain regions connected to the drive line in common and the gate electrode is larger than overlapped capacitance of one of the source-drain regions connected to the bit line in common and the gate electrode.

According to the above-discussed ferroelectric memory device, the overlapped capacitance ($C_{GS}$) of the source-drain region connected to the drive line and the gate electrode is larger than the overlapped capacitance ($C_{GD}$) of the source-drain region connected to the bit line and the gate electrode. Therefore, by the electric field applied between an overlapped area of the source-drain regions and the gate electrode, the logic "0" information may be easily written.

(18) The object described above is also achieved by the ferroelectric memory device mentioned in one of the above items (16) and (17), characterized in that: the gate insulating films are constructed by successively layering an insulating film, a floating gate, and the ferroelectric film.

According to the above-mentioned ferroelectric memory device, between the insulating film and the ferroelectric film, the floating gate is provided. Therefore, when the ferroelectric film is polarized by applying a voltage to the gate electrode, a stable normally-off state having a given threshold voltage (Vth) may be realized. Further, by a heating process carried out when the amorphous silicon layer is recrystallized, and by a heating process carried out when the source-drain regions are formed in the re-crystallized polycrystal semiconductor layer, elements constituting the ferroelectric film are prevented from being diffused in the re-crystallized polycrystal semiconductor layer.

(19) The object described above is also achieved by the ferroelectric memory device mentioned in one of the above items (16) to (18), characterized in that there is further provided third-voltage-level ($V_W$) trimming means having a polycrystal semiconductor fuse in a chip in order to trim the third voltage level ($V_W$) for writing information into the ferroelectric memory cell for each chip.

According to the above-mentioned ferroelectric memory device, the third voltage level ($V_W$) for writing the information into the ferroelectric memory cell may be trimmed for each chip. Therefore, when a logic "1" is written in the ferroelectric memory cell, the threshold voltage (Vth) of the ferroelectric memory cell may be positively set to be in a stable condition, and the reading-out margin may be improved.

(20) The object described above is also achieved by the ferroelectric memory device mentioned in one of the above items (16) to (19), characterized in that: a two-port switch element having a metal/dielectric/metal structure is provided between the gate insulating film and the word line.

According to the above-mentioned ferroelectric memory device, in this way, the two-port switch element having the MIM structure is provided between the gate insulating film and the word line. Therefore, the polarization characteristics of the ferroelectric thin film may have a good rectangular ratio. Accordingly, degradation of the polarization characteristics due to repetition of the writing operation may be reduced, and, thus, an information writing error is prevented.

(21) The object described above is also achieved by a method of driving the ferroelectric memory device mentioned in one of the above items (16) to (19), the method characterized in that there are provided the steps of: (a) setting all word lines to the earth-ground voltage level; (b) setting all bit lines and drive lines to the erasing voltage ($V_E$); and (c) polarizing so that all ferroelectric memory cells are set to be non-conductive, and setting the information to be a logic "0" in order to erase the information.

According to the above-mentioned method of driving the ferroelectric memory device, by applying the voltage as discussed above, the information of all ferroelectric memory cells may be simultaneously erased. Therefore, the ferroelectric memory device may be operable in the same way as the prior art floating-gate-transistor-type flash memory.

(22) The object described above is also achieved by a method of driving the ferroelectric memory device mentioned in one of the above items (16) to (19), characterized in that there are provided the steps of: (a) setting the bit line and the drive line corresponding to the bit line to the same voltage level; (b) setting a selected bit line to an earth-ground voltage level; (c) setting a selected word line to a third voltage level ($V_W$); (d) setting unselected word lines and bit lines to be the second voltage level ($V_W/2$); and (e) polarizing so that the ferroelectric memory cell is set to be conductive when information is read out from a selected ferroelectric memory cell, and writing the information of the logic "1".

According to the above-mentioned method of driving the ferroelectric memory device, when the information is written into the ferroelectric memory, the writing operation is carried out by an electric field applied between a channel generated just under the word line and the word line. Therefore, writing operation of logic "1" may be carried out by a normally-used writing voltage ($V_W$).

Further, the unselected word lines and the unselected bit lines are set to the second voltage level ($V_W/2$). Therefore, an unstable operation such as error writing may not occur as in the prior art 1Tr-type ferroelectric memory device shown in FIG. 68A.

(23) The object described above is also achieved by a method of driving the ferroelectric memory device mentioned in one of the above items (16) to (19), the method characterized in that there are provided the steps of: (a) setting all drive lines to a first voltage level (Vr); (b) setting a selected word line to the first voltage level (Vr); (c) setting a selected bit line to the earth-ground voltage level; and (d) detecting whether a selected ferroelectric memory cell is set to be conductive or non-conductive, and reading out data of the ferroelectric memory cell.

According to the above-mentioned method of driving the ferroelectric memory device, since a channel generated just under the word line is used, a stable reading operation may be carried out.

(24) The object described above is also achieved by a method of driving the ferroelectric memory device mentioned in one of the above items (16) to (19), the method characterized in that there are provided the steps of: (a) setting the drive line to an earth-ground voltage level; (b) setting a selected word line to a first voltage level (Vr); (c) setting a selected bit line to a side of the first voltage level (Vr); and (d) detecting whether a selected ferroelectric memory cell is set to be conductive or non-conductive, and reading out data of the ferroelectric memory cell.

According to the above-mentioned method of driving the ferroelectric memory device, the information may also be read out in a different driving method from that described in the item (23). Therefore, increased flexibility of the method of driving the ferroelectric memory device is provided.

(25) The object described above is also achieved by a method of driving the ferroelectric memory device mentioned in the above item (20), the method characterized in that there are provided the steps of: (a) applying one of a positive writing voltage and a negative writing voltage to a selected cell; and (b) writing one of logic "1" and "0" according to positive and negative levels of the writing voltage; wherein the ferroelectric memory device is operative as a random access memory.

According to the above-mentioned method of driving the ferroelectric memory device, when the positive writing voltage is applied to the drive line of the selected cell, and when the gate electrode is supplied with 0 V, a voltage is applied to an overlapped area of the other one of the source-drain regions connected to the drive line and the gate electrode. In this way, the logic "0" information may be written any time.

Further, when the positive writing voltage is applied to the gate electrode of the selected cell, and when a voltage is applied between the selected bit line and the channel region which are set to -the same voltage level (0 V), the logic "1" information may be written. Therefore, the ferroelectric memory device is operable as a random access memory (RAM).

Other objects and further features of the present invention will be apparent from the following detailed description when read in conjunction with the accompanying drawings.

First, a description will be given of a first embodiment of a third optional ferroelectric memory device according to the present invention, by referring to FIG. 73A to FIG. 76B.

Figure 73A:
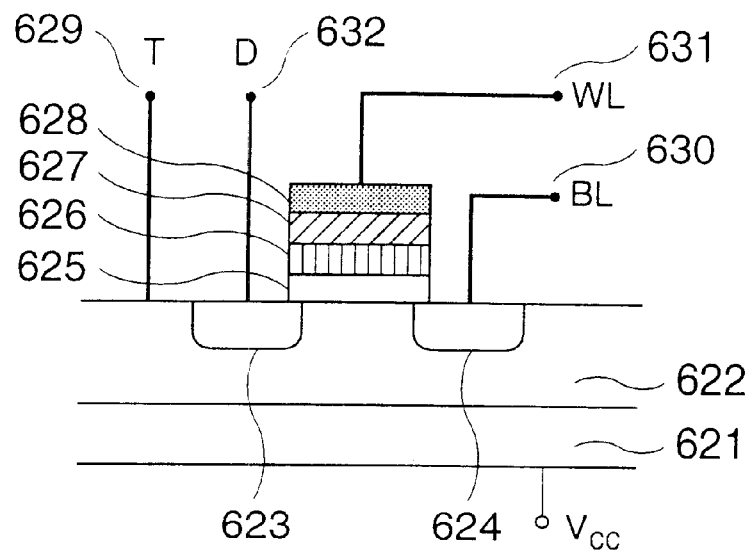
FIG. 73A shows a cross-sectional view of a memory cell structure of a first embodiment of a third optional ferroelectric memory device according to the present invention.
Figure 73B:
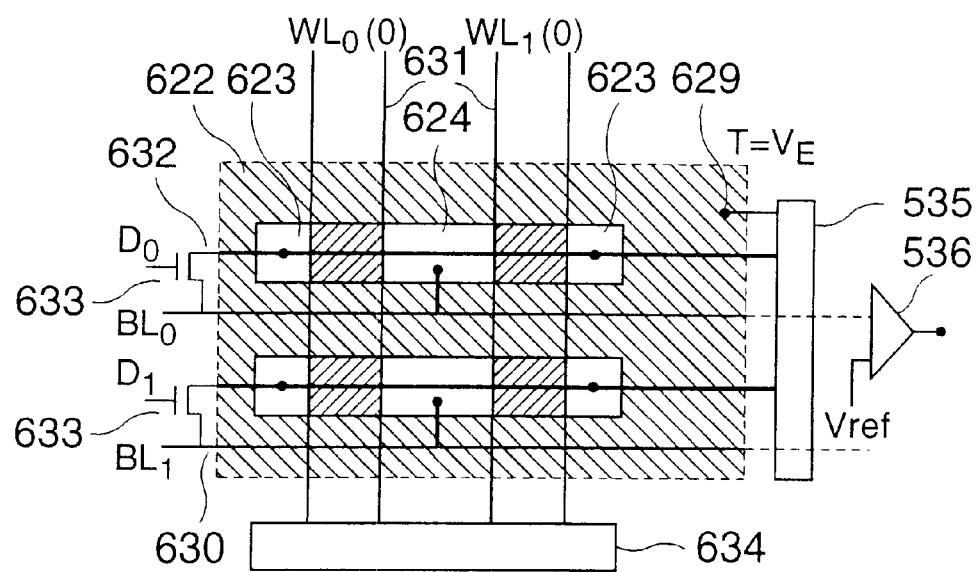
FIG. 73B shows a simplified top plan view of a pattern of the ferroelectric memory cell shown in FIG. 73A.
Figure 74A:
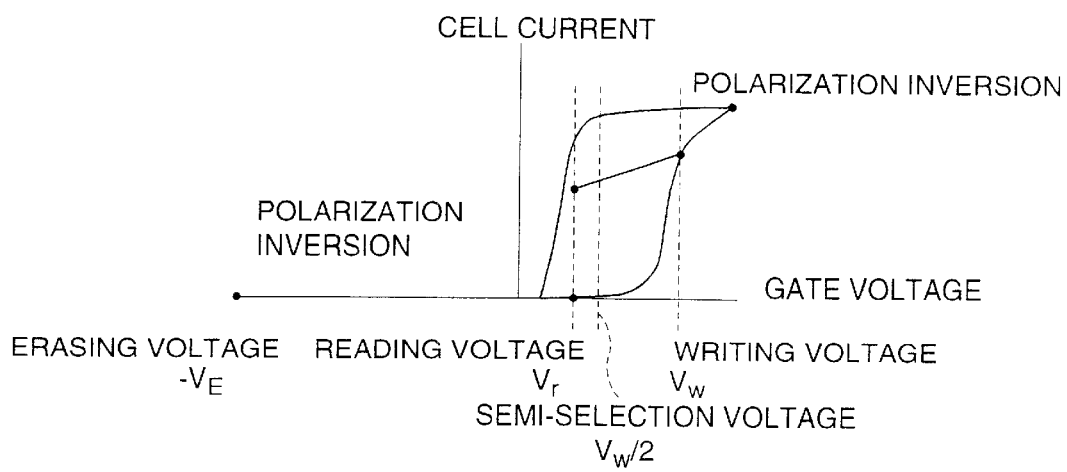
FIG. 74A and FIG. 74B show illustrations for explaining operational characteristics of the first embodiment of the ferroelectric memory cell shown in FIG. 73A.
Figure 74B:
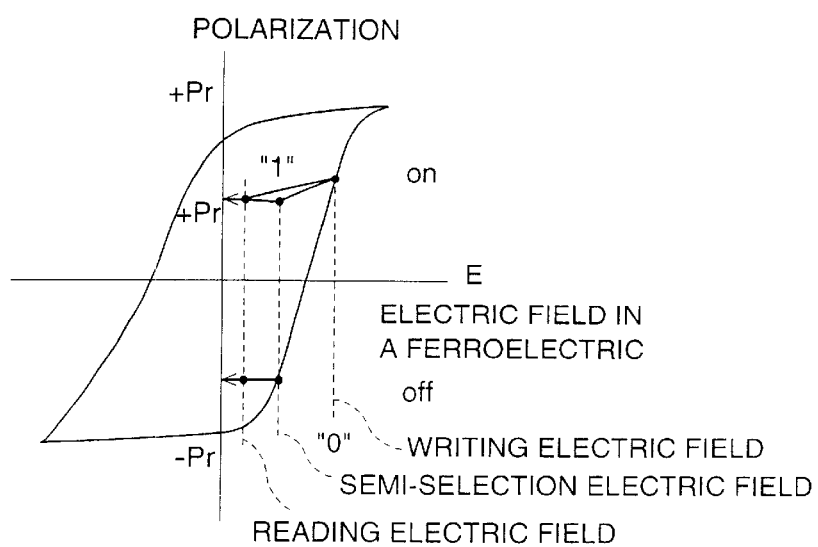
Figure 75A:
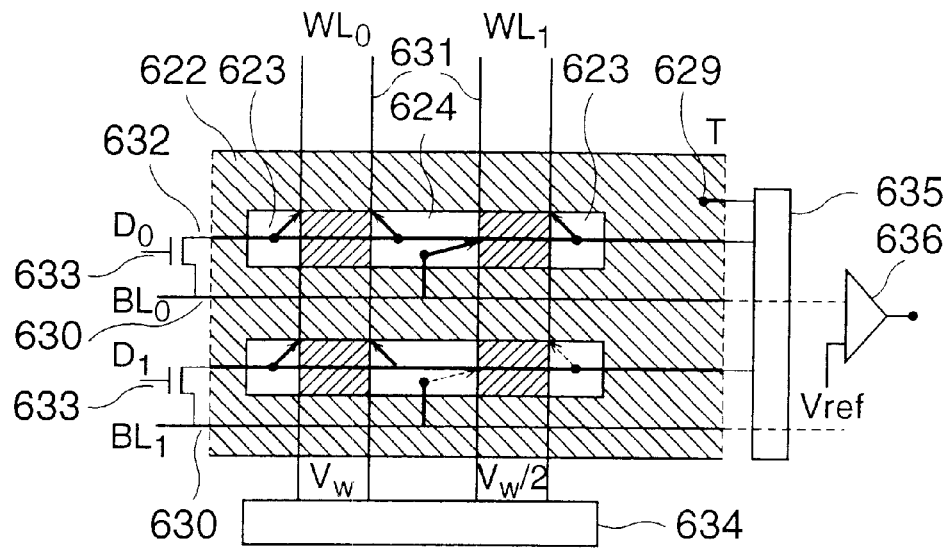
FIG. 75A and FIG. 75B show illustrations for explaining a writing operation in the first embodiment of the ferroelectric memory device shown in FIG. 73A.
Figure 75B:
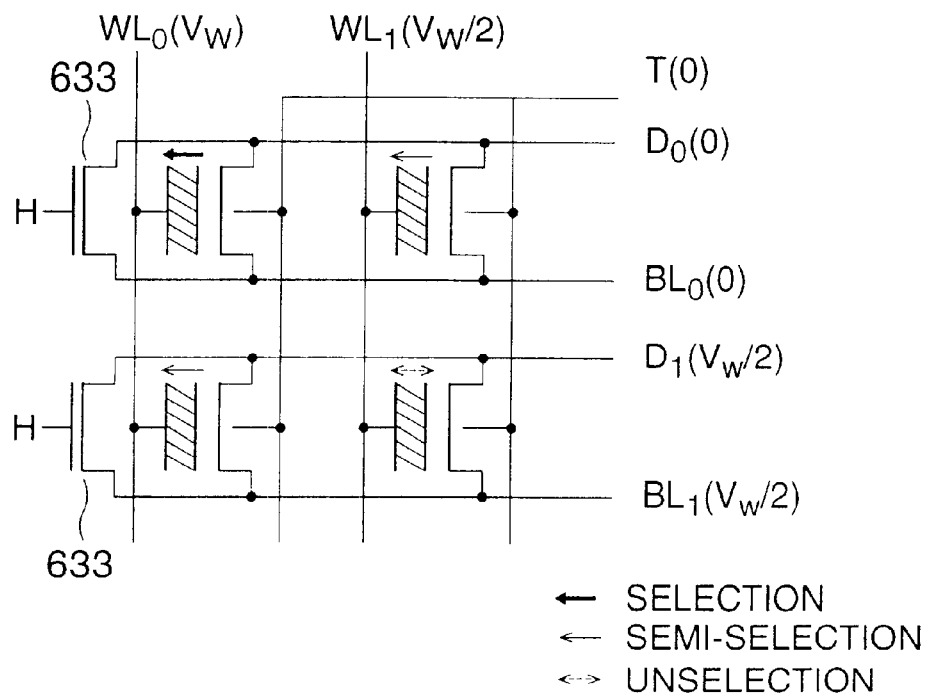
Figure 76A:
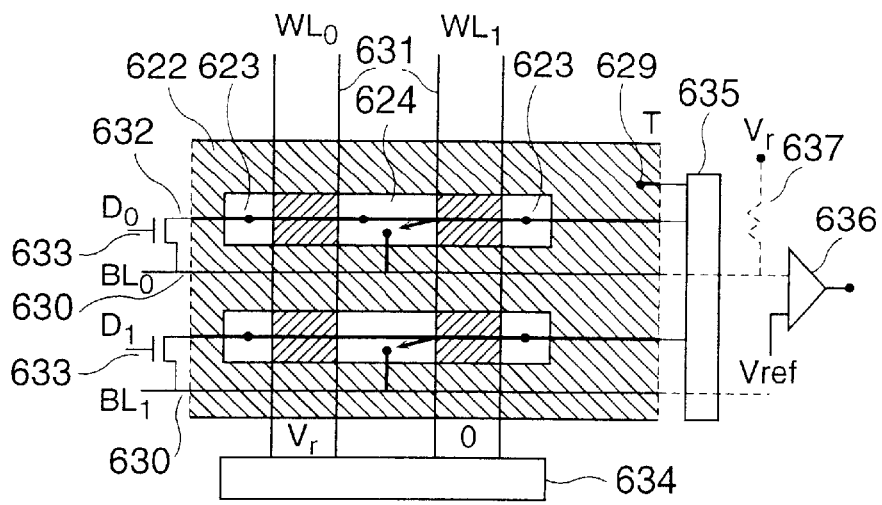
FIG. 76A and FIG. 76B show illustrations for explaining a reading operation in the first embodiment of the ferroelectric memory device shown in FIG. 73A.
Figure 76B:
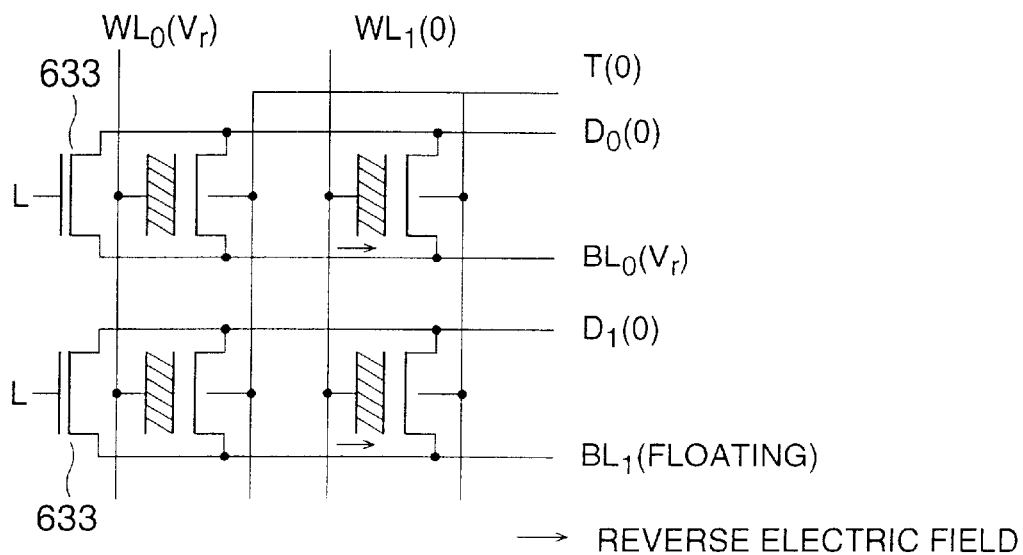

FIG. 73A shows a cross-sectional view of a memory cell structure of the first embodiment of the third optional ferroelectric memory device according to the present invention. FIG. 73B shows a simplified top plan view of a pattern of the ferroelectric memory cell shown in FIG. 73A. FIG. 74A and FIG. 74B show illustrations for explaining operational characteristics of the first embodiment of the ferroelectric memory cell shown in FIG. 73A. FIG. 75A and FIG. 75B show illustrations for explaining a writing operation in the first embodiment of the ferroelectric memory device shown in FIG. 73A. FIG. 76A and FIG. 76B show illustrations for explaining a reading operation in the first embodiment of the ferroelectric memory device shown in FIG. 73A.

In FIG. 73A, first in an n-type semiconductor substrate 621, a common p-type well region 622 is formed. Next, an $SiO_2$ film having a thickness in the range of 1 to 3 μm, preferably, 2.5 μm, a Pt film used for a floating gate having a thickness in the range of 15 to 30 μm, preferably, 20 μm, a PZT thin film used for a ferroelectric film having a thickness in the range of 10 to 70 μm, preferably, 40 μm, and a conductive film such as a Pt film are successively layered to form a layered film.

After that, by patterning the layered film, a gate insulating film comprising an $SiO_2$ film 625, a Pt film 626, and a PZT thin film 627, and a gate electrode 628 are formed, and a plurality of groups of the gate insulating film and the gate electrode 628 are arranged in the direction of a column-selection line. In FIG. 70A, only one group of the gate insulating film and the gate electrode 628 is shown.

Next, by selectively providing an n-type impurity such as As by using the gate electrode 628 as a mask, an n-type drain region 623 and an n-type source region 624 are formed. Subsequently, a plate line (T) 629 is connected to the p-type well region 622, the bit line (BL) 630 is connected to the n-type source region 624, a word line (WL) 631 is connected to the gate electrode 628, and a drive line (D) 632 arranged in parallel to the bit line (BL) 630 is connected to the n-type drain region 623. In this way, the ferroelectric memory cell is formed.

In FIG. 73B, the ferroelectric memory cell is formed in a symmetric mirror formation, and to each of the bit lines ($BL_0$, $BL_1$, . . . ) 630, a sense amplifier 636 is connected through a column multiplexer 635. The column multiplexer 635 and the sense amplifier 636 construct column selection means.

The sense amplifier 636 is formed, by using the p-type well region 622 formed in a fabricating process of the ferroelectric memory cell as a base region, as a lateral-bipolar-transistor in which the n-type drain region 623 and the n-type source region 624 are respectively used for an emitter region and a collector region.

Further, the plate line 629 is connected to means for applying the erasing voltage ($V_E$). The drive lines ($D_0$, $D_1$, . . . ) 632 are respectively connected to the bit lines ($BL_0$, $BL_1$, . . . ) 630 corresponding to the drive lines ($D_0$, $D_1$, . . . ) 632 through transistors 633. According to voltages applied to gate electrodes of the transistors 633, the drive lines ($D_0$, $D_1$, . . . ) 632 and the bit lines ($BL_0$, $BL_1$, . . . ) 630 are set to the same voltage level, or the drive lines and the bit lines are disconnected.

Further, to each of the word lines ($WL_0$, $WL_1$, . . . ) 631, row selection means for applying the earth-ground voltage level, a 1.65-V (Vcc/2) first voltage level (Vr), or a third voltage level ($V_W$), namely, a row multiplexer 634, is respectively connected.

FIG. 74A shows an illustration for explaining the operational characteristics of the ferroelectric memory cell, and FIG. 74B shows an illustration for explaining polarization to an electric field applied to the ferroelectric thin film.

In FIG. 74A and FIG. 74B, the bit lines (BL) and the drive lines (D) are electrically connected to each other by applying a high voltage level to the gates of the transistors 633, and all bit lines (BL) and all drive lines (D) are set to be in a floating state.

Further, the erasing voltage ($V_E$) is applied to the plate line (T), and all word lines (WL) are supplied with the earth-ground voltage level in order to set the ferroelectric memory cell to be non-conductive. At this time, the PZT thin film 627 is inversely polarized in a −Pr direction, and a logic "0" is set. In this way, in the same way as a floating-gate-transistor-type flash memory, information of all ferroelectric memory cells may be simultaneously erased.

In this case, a surface of the p-type well region 622 just under the gate electrode 628 is set to be in a storage state, and the applied voltage is directly applied to the PZT thin film 627. Therefore, using a normal erasing voltage ($V_E$), the information may be erased.

In FIG. 75A and FIG. 75B, when logic "1" data is written in the ferroelectric memory cell, while the plate line (T) is set to the earth-ground voltage level, the bit line (BL) and the drive line (D) are electrically connected each other by applying a high voltage level to the gate electrode of the transistor 633. Further, a selected bit line (BL) and drive line (D) are supplied with 0 V (earth-ground voltage level), and a selected word line (WL) is supplied with a third voltage level ($V_W$). In this way, the logic "1" data is written into the selected ferroelectric memory cell.

In this case, while the word line (WL) is supplied with the voltage, a channel region (not shown) is formed just under the gate electrode. The channel region is set to a voltage level of the source-drain regions, namely, a voltage level of the electrically-connected bit line (BL) and drive line (D). Therefore, in the selected memory cell, the gate electrode is supplied with $V_W$, and the channel region is set to 0 V. By the voltage difference $V_W$, the ferroelectric thin film is polarized, and logic "1" data is written into the ferroelectric memory cell.

At this time, unselected word lines (WL) are previously supplied with the second voltage level ($V_W/2$), and unselected bit lines (BL) and the drive line (D) are also supplied with the second voltage level ($V_W/2$). Therefore, the logic "1" data is inhibited from being written into the unselected or semi-selected memory cell.

The third voltage level ($V_W$) is set to polarize the PZT thin film 627 by +Pr* in a +Pr direction so that an output of the memory cell is the logic "1" when the data is read out. When the PZT thin film 627 is polarized by the +Pr*, a threshold voltage (Vth) decreases so that the memory cell is set to be conductive when a reading-out voltage level is applied. As a result, the memory cell is set to a normally-off state.

In this way, since a biasing operation is carried out, the reverse electric field is prevented from being applied to the semi-selected cell. Therefore, even if the writing operation or the reading operation is repeated many times, degradation of the polarization characteristics is reduced, and, thus, written data is prevented from being destroyed.

Further, when the logic "1" data is written, the electric field applied between the gate electrode 628 and the channel region is used, and an electric field between the gate electrode 628 and the plate line 629 is not used. Therefore, extreme increase of the writing voltage due to an inversion layer may be prevented.

In the ferroelectric memory device, for trimming the third voltage level ($V_W$), third-voltage-level generating means, which has trimming means constructed with a polycrystal silicon fuse, is provided in a chip of the ferroelectric memory device. Therefore, for each chip, the third voltage level may be flexibly adjusted according to characteristics of the memory cell, and, thus, a reading-out margin may be improved.

In FIG. 76A and FIG. 76B, when the information is read out from the ferroelectric memory cell, while the plate line (T) is set to the earth-ground voltage level and the bit line (BL) and the drive line (D) are disconnected from each other by applying a low voltage level to the transistor 633, all drive lines (D) are set to the earth-ground voltage level, a selected bit line (BL) is set to a side of the first voltage level (Vr) through the detecting resistor 637, and a selected word line (WL) is supplied with the first voltage level (Vr).

In this case, unselected bit lines (BL) are set to the floating state, and unselected word lines (WL) are set to 0 V.

When the logic "1" data is previously written in the memory cell, the memory cell is set to be conductive by applying the first voltage level (Vr) as the reading-out voltage. At this time, by voltage-level variation of the bit line (BL), the information is detected through the sense amplifier 636.

When the logic "1" data is not previously written in the memory cell, namely when the data of the memory cell is the logic "0", the memory cell is set to be non-conductive. Therefore, no voltage-level variation occurs in the bit line (BL).

Referring to FIG. 74A and FIG. 74B, in this case, a reverse electric field opposite to Vr/2 or Vr is applied to the unselected cell or the semi-selected cell. However, as shown in FIG. 76A, the reverse electric field is applied to only an overlapped area of the word line (WL) 631 and the n-type source region 624, the overlapped area being the gate electrode. Further, as shown in FIG. 74A, a relationship $Vr \leq V_W/2$ is set. Therefore, even if the reverse electric field is applied as shown in FIG. 74B, there is substantially no influence, and, thus, written data is prevented from being destroyed. Accordingly, the memory cell may positively operate.

In addition, for the first embodiment of the ferroelectric memory device, another reading method is applicable. In the following, a description will be given of the other reading method.

In the reading method, while the plate line (T) is set to the earth-ground voltage level and the bit line (BL) and the drive line (D) are disconnected from each other by applying the low voltage level to the transistor 633, all drive lines (D) are set to the first voltage level (Vr), a selected bit line (BL) is set to a side of the earth-ground voltage level through the detecting resistor 637, and a selected word line (WL) is supplied with the first voltage level (Vr).

In this case, unselected bit lines (BL) are set to be in the floating state, and unselected word lines (WL) are set to 0 V.

When the logic "1" data is previously written in the memory cell, the memory cell is set to be conductive by applying the reading-out voltage (Vr). At this time, by voltage-level variation of the bit line (BL), the information is detected through the sense amplifier.

When the logic "1" data is not previously written in the memory cell, the memory cell is set to be non-conductive. Therefore, no voltage-level variation occurs in the bit line (BL).

The first embodiment of the ferroelectric memory device has features including a high degree of integration and a stable operation because no reverse electric field is applied to the unselected cell or the semi-selected cell at a writing operation. Therefore, the ferroelectric memory device is usable for a high-integration-degree-and-low-speed file memory.

In the above description of the first embodiment of the ferroelectric memory device, the Pt film 626 is provided as the floating gate. By providing the Pt film 626, quality of the PZT thin film 627 formed on the Pt film 626 may be improved, and the memory cell may be positively set to the normally-off state having a low threshold voltage. However, the Pt film 626 is not necessarily required. It is possible to directly provide the PZT thin film 627 on the $SiO_2$ film 625.

Figure 77A:
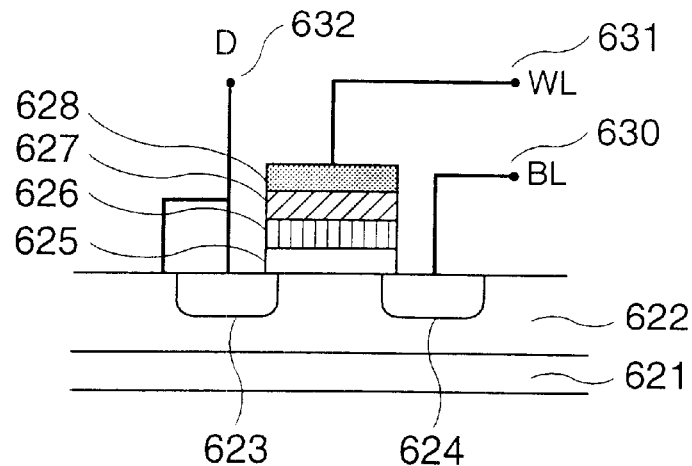
FIG. 77A shows a cross-sectional view of a memory cell structure of a second embodiment of the third optional ferroelectric memory device according to the present invention.
Figure 77B:
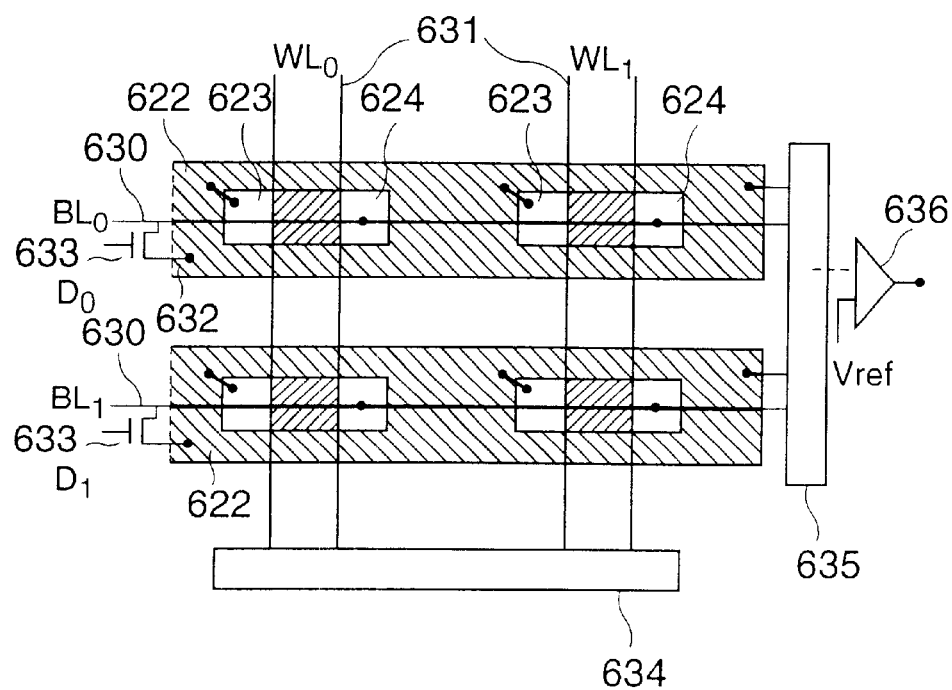
FIG. 77B shows a top plan view of a pattern of the ferroelectric memory cell shown in FIG. 77A.

Next, a description will be given of a second embodiment of the third optional ferroelectric memory device according to the present invention, by referring to FIG. 77A and FIG. 77B. FIG. 77A shows a cross-sectional view of a memory cell structure of the second embodiment of the third optional ferroelectric memory device according to the present invention. FIG. 77B shows a top plan view of a pattern of the ferroelectric memory cell shown in FIG. 77A.

In FIG. 77A, first in the n-type semiconductor substrate 621, like the bit line (BL) 630, a common p-type well region 622 is formed to extend in a direction of the column-selection line. Next, in the same way as the first embodiment, the $SiO_2$ film having a thickness in the range of 1 to 3 $\mu$m, preferably, 2.5 $\mu$m, the Pt film used for the floating gate having a thickness in the range of 15 to 30 $\mu$m, preferably, 20 $\mu$m, the PZT thin film used for the ferroelectric film having a thickness in the range of 10 to 70 $\mu$m, preferably, 40 $\mu$m, and the conductive film such as a Pt film are successively layered to form the layered film.

After that, by patterning the layered film, the gate insulating film comprising the $SiO_2$ film 625, the Pt film 626, and the PZT thin film 627, and the gate electrode 628 are formed in each p-type well region 622.

Next, by selectively providing an n-type impurity such as As by using the gate electrode 628 as a mask, the n-type drain region 623 and the n-type source region 624 are formed. Subsequently, the p-type well region 622 and the n-type drain region 623 are electrically shorted with respect to each other, and, thus, the p-type well region 622 may be the drive line (D) 632. Further, the word line (WL) 631 is connected to the gate electrode 628, and the bit line (BL) 630 is connected to the n-type source region 624. In this way, the ferroelectric memory cell is formed.

As shown in FIG. 77B, in the ferroelectric memory cell, to each of the bit lines ($BL_0$, $BL_1$, . . . ) 630, the sense amplifier 636 is connected through the column multiplexer 635. The sense amplifier 636 and the column multiplexer 635 construct the column selection means.

The sense amplifier 636 is formed, by using the p-type well region 622 formed in the fabricating process of the ferroelectric memory cell as a base region, as the lateral-bipolar-transistor in which the n-type drain region 623 and the n-type source region 624 are respectively used for the emitter region and the collector region.

Further, each of the drive lines ($D_0$, $D_1$, . . . ) 632 is connected to means for applying the erasing voltage ($V_E$) through the p-type well region 622. Also, the drive lines ($D_0$, $D_1$, . . . ) 632 are respectively connected to the bit lines ($BL_0$, $BL_1$, . . . ) 630 corresponding to the drive lines ($D_0$, $D_1$, . . . ) 632 through transistors 633. According to the voltages applied to the gate electrodes of the transistors 633, the drive lines ($D_0$, $D_1$, . . . ) 632 and the bit lines ($BL_0$, $BL_1$, . . . ) 630 are set to the same voltage level, or the drive lines and the bit lines are disconnected from each other.

Further, to each of the word lines ($WL_0$, $WL_1$, . . . ) 631, row selection means for applying the earth-ground voltage level, the first voltage level (Vr), or the third voltage level ($V_W$), namely, the row multiplexer 634, is respectively connected.

In such a memory structure, for the drive line (D) and the plate line (T), the stripe-type p-type well region 622 is used. Therefore, a space for an Al wiring layer prepared in addition to the drive line (D) becomes unnecessary, and, thus, the degree of integration may be improved. Also, since the Al wiring layer is not required, manufacturing process of the ferroelectric memory device may be simplified.

Next, a description will be given of a driving method of the second embodiment of the third optional ferroelectric memory device, by referring to FIG. 77B.

The second embodiment of the ferroelectric memory device has substantially the same operational characteristics as those of the first embodiment of the ferroelectric memory device shown in FIG. 75A and FIG. 76A.

In FIG. 77B, first by applying a high voltage to the gate electrode of the transistor 633, the bit line (BL) is electrically connected to the drive line (D), and all bit lines (BL) are supplied with the erasing voltage ($V_E$). Further, all word lines (WL) are supplied with the earth-ground voltage level in order to set the ferroelectric memory cell to be non-conductive. At this time, the PZT thin film 627 is inversely polarized in a −Pr direction, and a logic "0" is set. In this way, in the same way as the floating-gate-transistor-type flash memory, information of all ferroelectric memory cells may be simultaneously erased.

Also, in this case, the surface of the p-type well region 622 just under the gate electrode 628 is set to be in a storage state, and the applied voltage is directly applied to the PZT thin film 627. Therefore, by the normally-used erasing voltage ($V_E$), the information may be erased.

When logic "1" data is written in the ferroelectric memory cell, while the bit line (BL) is electrically connected to the drive line (D) by applying a high voltage to the gate electrode of the transistor 633, a selected bit line (BL) is supplied with the earth-ground voltage level and a selected word line (WL) is supplied with the third voltage level ($V_W$). In this way, the logic "1" data is written into the selected ferroelectric memory cell.

In this case, unselected bit lines (BL) and unselected word lines (WL) are previously supplied with the 1.65-V second voltage level ($V_W/2$).

The third voltage level is set in substantially the same way as that of the first embodiment of the ferroelectric memory device. Further, also in the second embodiment of the ferroelectric memory device, the third-voltage-level generating means, which has the trimming means constructed with the polycrystal silicon fuse, is provided in a chip of the ferroelectric memory device. Therefore, a reading-out margin may also be improved.

In addition, also in the second embodiment of the ferroelectric memory device, in the same way as the first embodiment, the writing operation may be stabilized, and, also, the written data is prevented from being destroyed.

When the logic "1" data is written, the electric field applied between the gate electrode 628 and the channel region is used, but the electric field applied between the gate electrode 628 and the p-type well region 622 is not used. Therefore, an extreme increase of the writing voltage due to the inversion layer may be prevented.

When the information is read out from the ferroelectric memory cell, while the bit line (BL) and the drive line (D)

are electrically disconnected from each other by applying a low voltage to the transistor 633, all the drive lines (D) are set to the earth-ground voltage level and a selected bit line (BL) is set to a side of the first voltage level (Vr) through the detection resistor 637, and a selected word line (WL) is supplied with the first voltage level (Vr).

In this case, unselected bit lines (BL) are set to the floating state, and unselected word lines (WL) are set to 0 V.

In this way, the second embodiment of the ferroelectric memory device has substantially the same information detecting principle as that of the first embodiment of the ferroelectric memory device.

Further, in the second embodiment of the ferroelectric memory device, when the information is read out, unselected bit lines (BL) are set to the floating state. However, since the p-type well region 622 and the n-type drain region 623 are electrically shorted with respect to each other, the p-n junction of the unselected n-type drain region 623 is not biased in a forward direction, and, thus, the memory cell may positively operate.

The second embodiment of the ferroelectric memory device also has features of a high degree of integration and stable operation, and, thus, in the same way as the first embodiment of the ferroelectric memory device, is usable for the high-integration-degree-and-low-speed file memory.

In the above description of the second embodiment of the ferroelectric memory device, the Pt film 626 is provided as the floating gate. By providing the Pt film 626, quality of the PZT thin film 627 formed on the Pt film 626 may be improved, and the memory cell may be positively set to the normally-off state having a low threshold voltage. However, the Pt film 626 is not necessarily required. It is possible to directly provide the PZT thin film 627 on the $SiO_2$ film 625.

Further, in the above-discussed driving method of the second embodiment of the third optional ferroelectric memory device, a flash-memory-like driving method which erases simultaneously all the information is described. However, the cell structure of the second embodiment may also be operable like a RAM.

In FIG. 77B, as discussed above, when the logic "1" information is written, the memory cell operates in the same way as the flash-memory-like -187driving method. On the other hand, when the logic "0" data is written, by applying the high voltage to the gate electrode of the transistor 633, the bit line (BL) and the drive line (D) are electrically connected to each other. Further, a selected bit line (BL), namely, a selected drive line (D), is supplied with the third voltage level ($V_W$), and a selected word line (WL) is supplied with the earth-ground voltage level.

In this way, by the voltage $V_W$ applied between the p-type well region 622 electrically connected to the drive line (D) and the gate electrode 628, the logic "0" data is written into the selected ferroelectric memory cell.

As discussed above, using a bias operation, to the ferroelectric memory cell in which the logic "1" data has been written, the logic "0" data may be written any time by the normal writing voltage $V_W$. Therefore, the ferroelectric memory cell is also operable like a RAM.

In this case, unselected bit lines (BL) and unselected word line (WL) are previously set to the second voltage level ($V_W/2$).

Further, in this case, since to a semi-selected cell, an inversion voltage is undesirably applied, a counter plan is required, which will be discussed later.

Figure 78A:
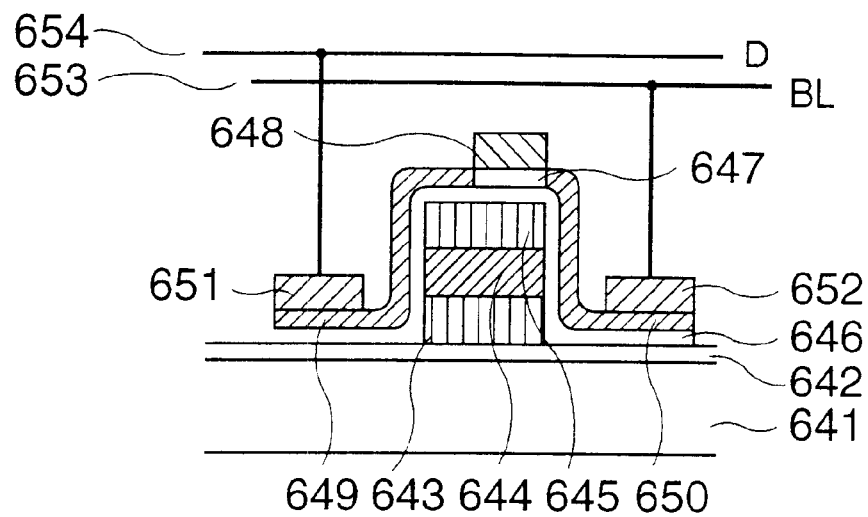
FIG. 78A shows a cross-sectional view of a memory cell structure of a third embodiment of the third optional ferroelectric memory device using the thin-film semiconductor layer according to the present invention.
Figure 78B:
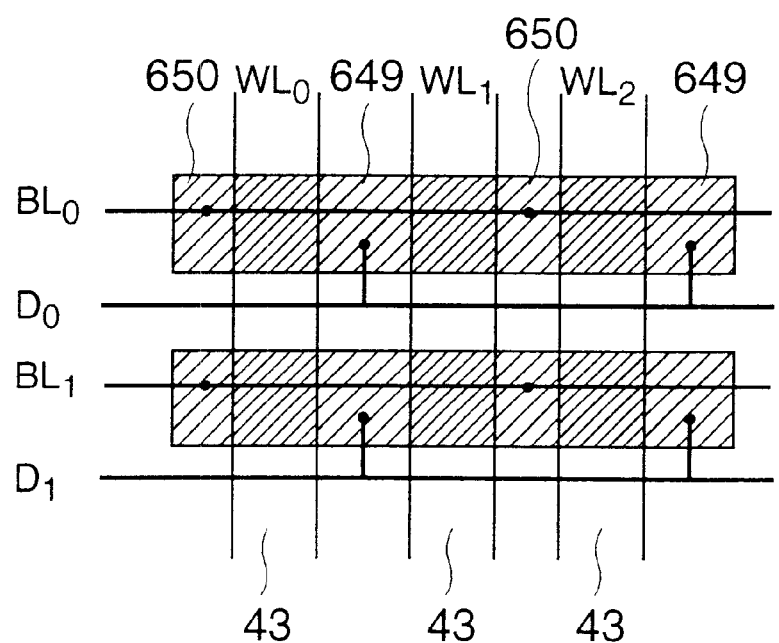
FIG. 78B shows a simplified schematic diagram of the ferroelectric memory device shown in FIG. 78A.

Next, a description will be given of a third embodiment of the third optional ferroelectric memory device using a thin-film semiconductor layer according to the present invention, by referring to FIG. 78A and FIG. 78B. FIG. 78A shows a cross-sectional view of a memory cell structure of the third embodiment of the third optional ferroelectric memory device using the thin-film semiconductor layer according to the present invention. FIG. 78B shows a simplified schematic diagram of the ferroelectric memory device shown in FIG. 78A.

In FIG. 78A, first in a quartz substrate 641, an $SiO_2$ film 642 having a thickness in the range of 10 to 30 $\mu$m, preferably, 20 $\mu$m, is formed by using a sputtering method. Next, through the $SiO_2$ film 642, a Ti film having a thickness in the range of 5 to 15 $\mu$m, preferably, 10 $\mu$m, and a Pt film having a thickness in the range of 15 to 30 $\mu$m, preferably, 20 $\mu$m, are successively layered to form a layered film.

After that, by patterning the layered film, a word line 643 extending in a direction of a row-selection line is formed.

Next, over the above layered film, a PZT thin film as the ferroelectric film having a thickness in the range of 10 to 70 $\mu$m, preferably, 40 $\mu$m, and a Pt film having a thickness in the range of 15 to 30 $\mu$m, preferably, 20 $\mu$m, are successively layered to form a second layered film.

After that, by patterning the second layered film, a PZT film 644 and a floating gate 645 are formed.

Next, over the second layer, an insulating film made of the $SiO_2$ film, etc., having a thickness in the range of 5 to 15 $\mu$m, preferably, 10 $\mu$m, is layered, and an amorphous silicon film having a thickness in the range of 5 to 15 $\mu$m, preferably, 8 $\mu$m, is layered thereon. After that, using a laser anneal, the amorphous silicon film is re-crystallized, and is changed to the polycrystal silicon film.

Next, by patterning the polycrystal silicon film, an island-shaped i-type polycrystal silicon film 647 is formed. The polycrystal silicon film 647 constitutes a pair of memory cells in a symmetric mirror formation.

Then, after a silicon nitride film is layered thereon, a channel protection film 648 is formed by an patterning operation.

Next, by selectively providing an n-type impurity such as As using the channel protection film 648 as a mask, an $n^+$-type source region 649 and an $n^+$-type drain region 650 are formed. After that, an $n^+$-type polycrystal silicon film having a thickness in the range of 5 to 30 $\mu$m, preferably, 10 $\mu$m, is layered thereon to form polycrystal silicon pads 651, 652.

In this case, it is preferred that the channel protection film 648 is formed near the $n^+$-type drain region 650, and an overlapped area of the $n^+$-type source region 649 and the word line 643 used as the gate electrode is set to be larger than an overlapped area of the $n^+$-type drain region 650 and the word line 643 used as the gate electrode. Namely, it is preferred that parasitic capacitance $C_{GS}$ of the $n^+$-type source region 649 is set to be larger than parasitic capacitance $C_{GD}$ of the $n^+$-type drain region 650.

Next, by a PCVD method (plasma CVD method, not shown in the drawing), an $SiO_2$ film is layered overall. After an open part for forming an electrode is formed, a conductive film such as WSi is layered overall. By a patterning process, the polycrystal silicon pads 651 and 652 are respectively connected, and the bit line (BL) 653 and the drive line (D) 654 extending in the same direction are formed.

As shown in FIG. 78B, the ferroelectric memory cell is formed in a symmetric mirror formation, and to each of the bit lines ($BL_0$, $BL_1$, . . . ) 653, a column selection transistor is connected, and also, a sense amplifier is connected through a detection resistor 658 connected to the first voltage level (Vr), the above-discussed structure is not shown in the drawing.

The sense amplifier is constructed using an n-channel thin-film transistor formed in a fabricating process of the ferroelectric memory cell.

In this way, the ferroelectric memory cell is constructed using the thin-film semiconductor layer manufacturing technique established in an active-matrix-type liquid crystal display. Therefore, cost of the ferroelectric memory device may be reduced. Further, since the word line (WL) is provided in a side of the quartz substrate 641, a dedicated wiring space for the word line (WL) is not necessary, and, thus, the degree of integration of the ferroelectric memory device may be improved.

In the following, a description will be given of a driving method of the ferroelectric memory device shown in FIG. 78A, by referring to FIG. 78B.

In FIG. 78B, first by applying a high voltage level to a gate electrode of a transistor (not shown in the drawing), the drive line (D) and the bit line (BL) are electrically connected to each other. In that condition, all bit lines (BL) are supplied with the erasing voltage ($V_E$) and all word lines (WL) are supplied with the earth-ground voltage level, and, thus, the ferroelectric memory cell is set to be non-conductive.

At this time, the PZT thin film 644 is inversely polarized in a −Pr direction, and logic "0" data is set. In this way, in the same way as the floating-gate-transistor-type flash memory, information of all ferroelectric memory cells may be simultaneously erased.

In this case, since an impurity density of the n$^+$-type source region 649 is very high, an inversion layer is not formed in a surface of the n$^+$-type source region 649. Therefore, a voltage applied to the n$^+$-type source region 649 is directly applied to the PZT film 644, and, thus, the information may be erased using the normally-used erasing voltage ($V_E$).

When logic "1" data is written in the ferroelectric memory cell, by applying a high voltage level to the gate of the transistor (not shown in the drawing), the bit line (BL) and the drive line (D) are electrically connected to each other. Further, a selected bit line (BL) is supplied with the earth-ground voltage level, and a selected word line (WL) is supplied with the third voltage level ($V_W$). In this way, the logic "1" data is written into the selected ferroelectric memory cell.

In this case, unselected bit lines (BL) and unselected word lines (WL) are previously supplied with the second voltage level ($V_W/2$).

The third voltage level is set to polarize the PZT thin film 644 by +Pr* in a +Pr direction so that an output of the memory cell is the logic "1" when the data is read out. When the PZT thin film 644 is polarized by the +Pr*, a threshold voltage (Vth) decreases so that the memory cell is set to be conductive when a reading-out voltage level is applied. At this time, the memory cell is set to a normally-off state.

Also in this case, in the ferroelectric memory device, for trimming the third voltage level ($V_W$), third-voltage-level generating means, which has trimming means constructed with the polycrystal silicon fuse, is provided in a chip of the ferroelectric memory device. Therefore, for each chip, the third voltage level may be flexibly adjusted according to characteristics of the memory cell, and, thus, a read-out margin of the ferroelectric memory device may be improved.

When the logic "1" data is written, the electric field applied between the word lint 43 used as the gate electrode and the channel region is used, but the electric field applied between the word line 643 and the i-type polycrystal silicon film 647 is not used. Therefore, an extreme increase in the writing voltage due to the inversion layer may be prevented.

Next, when the information is read out from the ferroelectric memory cell, by applying a low voltage level to the gate of the transistor (not shown in the drawing), the bit line (BL) and the drive line (D) are electrically disconnected from each other. In this condition, all drive lines (D) are set to the earth-ground voltage level, a selected bit line (BL) is set to the first voltage level (Vr) through the detection resistor and a selected word line (WL) is set to the first voltage level (Vr).

In this case, unselected bit lines (BL) are set to the floating state, and unselected word lines (WL) are set to 0 V.

In the above-discussed third embodiment of the ferroelectric memory device, an information detecting principle is substantially the same as that of the first embodiment of the ferroelectric memory device. In this case, since a reverse electric field of Vr/2 applied to the semi-selected cell is so small, a writing error which may occur when the data is read out is prevented.

In addition, for the third embodiment of the ferroelectric memory device, another reading method is applicable. In the following, a description will be given of the reading method.

In the reading method, by applying a low voltage to the gate of the transistor (not shown in the drawing), the bit line (BL) and the drive line (D) are electrically disconnected from each other. In this condition, all drive lines (D) are set to the first voltage level (Vr), a selected bit line (BL) is set to a side of the earth-ground voltage level through the detection resistor, and a selected word line (WL) is supplied with the first voltage level (Vr).

In this case, unselected bit lines (BL) are set to the floating state, and unselected word lines (WL) are set to 0 V.

In the third embodiment of the ferroelectric memory device, when the ferroelectric memory device is designed using a 0.5-$\mu$m rule, memory cell size may be 1.5 $\mu$m×3 $\mu$m. Therefore, a chip area of a 16-Mbit semiconductor storage device for a main memory may be provided in a chip area of 6 mm×12 mm.

In the above description of the third embodiment of the ferroelectric memory device, the Pt film is provided as the floating gate 645. By providing the Pt film, the memory cell may be positively set to the normally-off state having a low threshold voltage. However, after the PZT film 644 is formed, an i-type polycrystal silicon film 647 is formed as an operation region, whereby the PZT film 644 has substantially no influence on a channel boundary of the device. Therefore, the Pt film is not necessarily required. It is possible to directly provide the insulating film 646 on the PZT thin film 644.

Also, in the above-discussed driving method of the third embodiment of the third optional ferroelectric memory device, a flash-memory-like driving method which erases simultaneously all the information is described. However, the cell structure of the third embodiment may also be operable like a RAM.

In FIG. 78B, as discussed above, when the logic "1" information is written, the memory cell operates in the same was as the flash-memory-like driving method. On the other hand, when the logic "0" data is written, by applying a high voltage to the gate electrode of the transistor (not shown in the drawing), the bit line (BL) and the drive line (D) are electrically connected to each other. Further, a selected bit line (BL), namely, a selected drive line (D), is supplied with the third voltage level ($V_W$), and a selected word line (WL) is supplied with the earth-ground voltage level.

In this way, by the voltage $V_W$ applied to an overlapped area of the n$^+$-type source region 649 connected to the drive line (D) and the word line 643 used as the gate electrode, the logic "0" data is written into the selected ferroelectric memory cell.

In this case, since an impurity density of the n$^+$-type source region 649 is very high, an inversion layer is not formed in a surface of the n$^+$-type source region 649. Therefore, a voltage applied to the n$^+$-type source region 649 is directly applied to the PZT film 644, and, thus, to the ferroelectric memory cell in which logic "1" data has been written, logic "0" data may be written any time using the normally-used erasing voltage ($V_E$). Therefore, the ferroelectric memory device is also operable as a RAM.

In this case, unselected bit lines (BL) and unselected word lines (WL) are previously set to the second voltage level ($V_W/2$).

In the above-discussed first to third embodiments of the third optional ferroelectric memory device, when these memory devices operate as RAMs, these memory devices have the same problem as that in the modified ferroelectric memory device shown in FIG. 71A. Namely, when the writing operation for logic "1" and "0" data is repeated many times, the information may be erroneously changed.

Figure 79A:
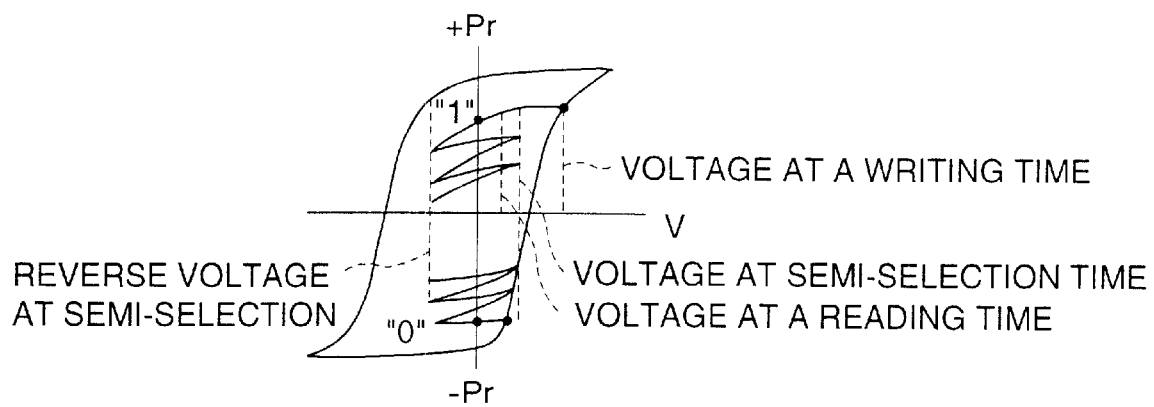
FIG. 79A and FIG. 79B show illustrations for explaining a problem in the first to third embodiments of the third optional ferroelectric memory devices shown in FIG. 73A, FIG. 77A, and FIG. 78A.
Figure 79B:
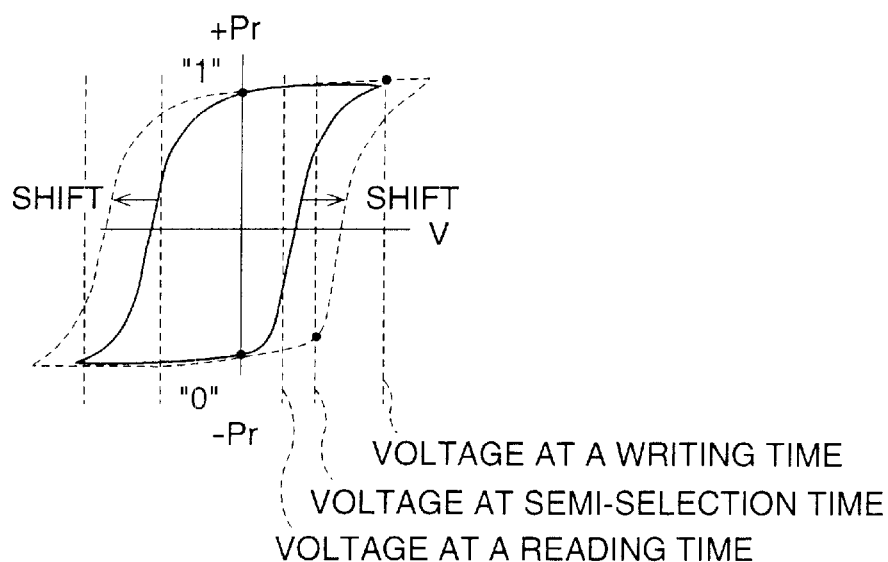

In the following, a description will be given of the above-discussed problem, by referring to FIG. 79A and FIG. 79B. FIG. 79A and FIG. 79B show illustrations for explaining the problem in -the first to third embodiments of the ferroelectric memory devices shown in FIG. 73A, FIG. 77A, and FIG. 78A.

As shown in FIG. 79B, polarization characteristics of the ferroelectric thin film represented by a solid line is different from the ideal polarization characteristics having a good rectangular-shape ratio. Therefore, as shown in FIG. 79A, when information is written, a semi-selection voltage is alternatively applied to a semi-selected memory cell. The polarization point repeatedly moves on a history curve with reduction of the polarization. Finally, the information of the logic "1" written in the memory cell disappears.

Also, in the case where the information of the logic "0" is written in the memory cell, the same operation may be carried out, and the information of the logic "0" written in the memory cell disappears.

If the history curve of the polarization characteristics is set to be the ideal characteristics represented by the dotted line, even if the semi-selection voltage is applied to the semi-selected memory cell, the polarization value may not change. In this case, even when the writing operation is repeated many times, degradation of the polarization characteristics may be reduced, and, thus, occurrence of the writing error may also be reduced.

In order to obtain such ideal polarization characteristics, as shown in FIG. 71A, the two-port switch element may be provided between the ferroelectric thin film and the word line so as to shift the history curve in positive and negative directions. In this case, the reading voltage needs to be a voltage a little lower than a summation of the coercive voltage Vc and the on voltage Von of the two-port switch element. Therefore, for the first to third embodiments of the ferroelectric memory devices, a higher voltage by the on voltage Von of the two-port switch element is required.

Figure 80:
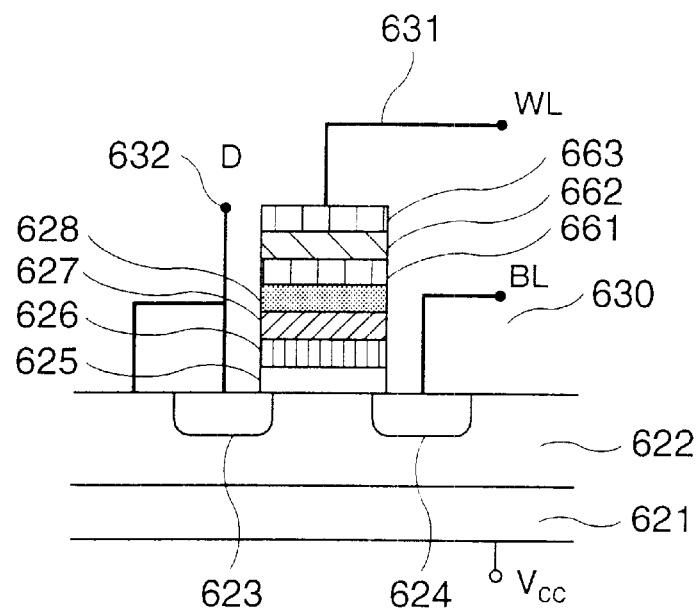
FIG. 80 shows a cross-sectional view of a fourth embodiment of the third optional ferroelectric memory device using an MIM element as a two-port switch element.

Next, a description will be given of a fourth embodiment of the third optional ferroelectric memory device, by referring to FIG. 80. FIG. 80 shows a cross-sectional view of the fourth embodiment of the third optional ferroelectric memory device using an MIM element as the two-port switch element.

In the ferroelectric memory device shown in FIG. 80, as compared to the second embodiment of the ferroelectric memory device shown in FIG. 77A, the MIM element comprising a Ta electrode 661, a $Ta_2O_5$ thin film 661, and a Ta electrode 663 is layered on the gate electrode 628. Other configurations are the same as that of the second embodiment of the ferroelectric memory device shown in FIG. 77A.

In this case, the on voltage Von of the MIM element depends on a thickness of the $Ta_2O_5$ thin film 662. It is preferred that the on voltage Von is set to approximately 1.5 to 5.0 V, at least about the coercive voltage (Vc). In this case, although the writing voltage or the reading voltage increases by the on voltage Von, the polarization is substantially not changed by a semi-selection voltage ($V_W/2$, or $Vr/2$) applied to the semi-selected cell. Therefore, even when the writing operation is repeated many times, degradation of the polarization may be reduced, and, thus, occurrence probability of the writing error may also be reduced.

In the case where the MIM element is provided, when the writing or reading operation is carried out, charges are stored in the Ta electrode between the $Ta_2O_5$ thin film 662 operating as an I layer of the MIM element and the PZT thin film 627. Therefore, it is required to reset the voltage level to 0 V by applying a voltage $V_{Re}$ for pulling out the stored charge just after the writing or reading operation.

In the above-discussed fourth embodiment, the MIM element is provided between the PZT thin film 627 and the gate electrode 628. However, by removing the gate electrode 628, the Ta film 661, the $Ta_2O_5$ thin film 662, and the Ta film 663 may successively be layered directly on the PZT thin film 627. In this case, interactive diffusion between the PZT thin film 627 and the Ta film 661 needs to be considered.

Figure 81:
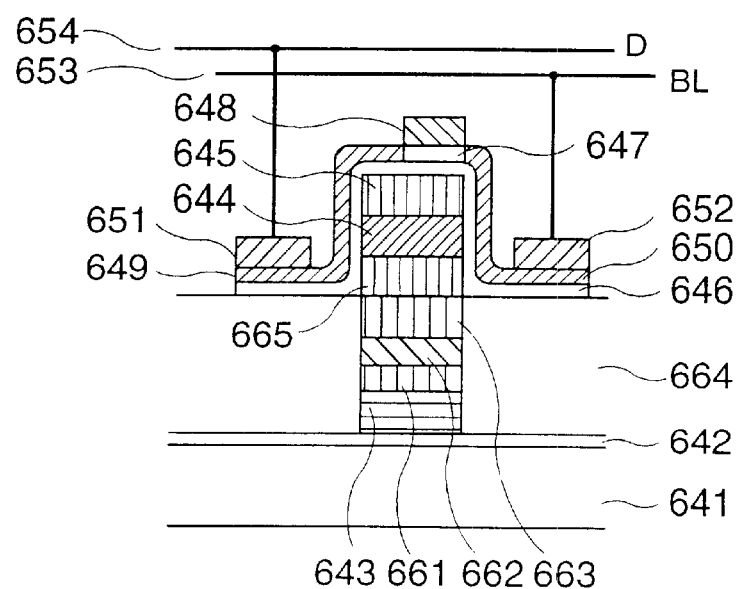
FIG. 81 shows a cross-sectional view of a cell structure of a fifth embodiment of the third optional ferroelectric memory device according to the present invention.

Next, a description will be given of a fifth embodiment of the third optional ferroelectric memory device according to the present invention, by referring to FIG. 81. FIG. 81 shows a cross-sectional view of a cell structure of the fifth embodiment of the third optional ferroelectric memory device according to the present invention. The fifth embodiment shows a thin-film semiconductor-layer-type ferroelectric memory device formed by providing the MIM element to the third embodiment of the ferroelectric memory device shown in FIG. 78A.

As shown in FIG. 81, in the fifth embodiment of the ferroelectric memory device, an MIM element comprising the Ta electrode 661, the $Ta_2O_5$ thin film 662, and the Ta electrode 663 is provided under a Pt film 665 corresponding to the word line in the third embodiment shown in FIG. 78A. Further, under the MIM element, the word line 643 is provided.

The driving method of the fifth embodiment is substantially the same as that of the third embodiment. In this case, although the writing voltage or the reading voltage increases by the on voltage Von of the MIM element, the polarization is substantially not changed by a semi-selection voltage ($V_W/2$, or $Vr/2$) applied to the semi-selected cell. Therefore, even when the writing operation is repeated many times, degradation of the polarization may be reduced, and, thus, occurrence probability of the writing error may also be reduced.

In the above descriptions of the first to fifth embodiments of the third optional ferroelectric memory device, the n-channel-type memory cell is used. However, in these ferroelectric memory devices, a p-channel-type memory cell is also usable. In these cases, according to changing of the channel-conduction type, with respect to a voltage level applied to each line, the third voltage level ($V_W$) needs to be changed to the first voltage level (Vr), and the earth-ground voltage level needs to be changed to the third voltage level ($V_W$) or the first voltage level (Vr).

In the above-discussed fourth and fifth embodiments, the word line is provided on the quartz substrate 641. However, also in another method, the gate insulating film and the gate electrode may be formed. For example, after forming a re-crystallized polycrystal silicon film on the quartz substrate 641, the insulating film 646, the floating gate 645, the PZT film 644, and the conductive film are successively layered. Subsequently, by patterning these layers, the gate insulating film and the word line used as the gate electrode are formed. The above-discussed manufacturing process is complex, but the degree of integration may be improved.

In the above descriptions of the fourth and fifth embodiments of the ferroelectric memory device, the quartz substrate 641 is used for a substrate, and the $SiO_2$ film 642 is formed on the quartz substrate 641 by the CVD method. However, the $SiO_2$ film 642 is not necessarily required. Further, the substrate is not limited to the quartz substrate, but other insulating substrates such as sapphire are also usable. Also, an insulating substrate, on which an oxide film is provided by thermally oxidizing a silicon substrate, is usable. In the present specification, the term "insulating substrate" includes a variety of substrates.

In each of the above-discussed embodiments, for the ferroelectric thin film, PZT is used. However, the ferroelectric thin film is not limited to PZT, but other ferroelectric thin film such as PLZT, $BaTiO_3$, $PbTiO_3$, and $Bi_4Ti_3O_{12}$, are also applicable.

Further, in each of the above-discussed embodiments, Pt is used for the floating gate. However, polycrystal silicon is usable for the floating gate.

When polycrystal silicon is used for the floating gate, since it is difficult to directly layer PZT on polycrystal silicon film, it is preferred that PZT is layered on polycrystal silicon through an $IrO_2$ film. In this case, by using polycrystal silicon for the floating gate, a boundary face condition of the gate $SiO_2$ is improved, and, thus, an increased manufacturing yield and an improvement in operational stability are provided ("Electronic Material" in Japanese, August, 1994, p.27–32).

Further, the above descriptions of the fourth and fifth embodiments have shown the two-port switch element is the MIM element comprising the Ta electrode 661, the $Ta_2O_5$ thin film 662, and the Ta electrode 663. However, the two-port switch element is not limited to such substances, but a variety of substances, which are well known as substances constituting the MIM element, are usable. In addition, the two-port switch element is not limited to the MIM element, but it is possible to use other switch elements having characteristics obtained when the diodes are connected in series in a reverse direction.

In addition, in each of the above-discussed embodiments, for the semiconductor, a silicon substrate or polycrystal silicon film is used. However, the semiconductor is not limited to silicon, but other IV-group semiconductor such as SiGe combination crystal and a III–V-group compound semiconductor such as GaAs are also usable.

As described above, the present inventions have the following features.

According to the present invention, the memory cell is constructed with a single MISFET having a ferroelectric gate insulating film, and the driving method of the memory device is provided so that an imbalance between the erasing voltage in the information erasing process and the writing voltage in the information writing process decreases.

Therefore, the degree of integration of the ferroelectric memory device may be improved. Further, the 1Tr-type ferroelectric memory device and its driving method for carrying out a stable driving operation and a positive memory operation may be utilized.

Furthermore, by adding the MIM element to the ferroelectric memory device, a stable RAM operation may be provided.

Further, the present invention is not limited to these embodiments, but other variations and modifications may be made without departing from the scope of the present invention.

What is claimed is:

1. A method of reading data from a ferroelectric memory having a memory cell which uses a ferroelectric capacitor as a storage medium, said method comprising the steps of:

(a) successively applying first and second electric fields having opposite directions to said ferroelectric capacitor, wherein polarization of the ferroelectric capacitor is changed according to a variation of said first and second electric fields; and (b) reading out said data stored in said memory cell by detecting a variation of said polarization of the ferroelectric capacitor.

2. A method of reading data from a ferroelectric memory having a memory cell, said memory cell including a transmission gate having a first charge input-and-output port connected to a data line and a second charge input-and-output port, and a ferroelectric capacitor having a first electrode connected to said second charge input-and-output port and a second electrode connected to a driving voltage line, said method comprising the steps of:

(a) controlling said transmission gate to be non-conductive;

(b) precharging said data line;

(c) controlling said transmission gate to be conductive;

(d) applying a driving voltage to said second electrode of the ferroelectric capacitor through said driving voltage line to successively apply first and second electric fields having opposite directions to said ferroelectric capacitor, wherein polarization of the ferroelectric capacitor is changed according to a variation of said first and second electric fields; and (e) reading out the data stored in said memory cell to said data line.

3. A method of reading data from a ferroelectric memory, said memory comprising:

an i-th memory cell, where i=1, 3, . . . , 2n−1, said memory cell including:
        an i-th transmission gate controlled to be conductive and non-conductive by an i-th word line, said i-th transmission gate having a first charge input-and-output port connected to a first data line and a second charge input-and-output port; and
        an i-th ferroelectric capacitor having a first electrode connected to the second charge input-and-output port of said i-th transmission gate and a second electrode connected to an i-th driving voltage line;

an (i+1)-th memory cell including:
   an (i+1)-th transmission gate controlled to be conductive and non-conductive by an (i+1)-th word line, said (i+1)-th transmission gate having a first charge input-and-output port connected to a second data line and a second charge input-and-output port; and
   an (i+1)-th ferroelectric capacitor having a first electrode connected to the second charge input-and-output port of said (i+1)-th transmission gate and a second electrode connected to an (i+1)-th driving voltage line;
a sense amplifier amplifying a voltage difference between said first and second data lines; and
a column selection gate selecting said first and second data lines;
said method comprising the steps of:
   (a) controlling said 1st, 2nd, . . . , 2n transmission gates to be non-conductive;
   (b) precharging said first and second data lines;
   (c) controlling the transmission gate of a selected memory cell to be conductive;
   (d) applying a driving voltage to said second electrode of the ferroelectric capacitor of said selected memory cell through a selected driving voltage line to successively apply first and second electric fields having opposite directions to the ferroelectric capacitor of said selected memory cell, wherein polarization of the ferroelectric capacitor of said selected memory cell is changed according to a variation of said first and second electric fields;
   (e) reading out the data stored in said selected memory cell to a corresponding one of said first and second data lines; and
   (f) amplifying the voltage difference between said first and second data lines.

4. The method as claimed in claim 1, wherein a strength of said first electric field is smaller than that of an electric field applied to said ferroelectric capacitor when the data is written, and strength of said second electric field is smaller than that of said first electric field.

5. The method as claimed in claim 1, further comprising the step of successively applying third and fourth electric fields having opposite directions, a strength of said third and fourth electric fields being respectively larger than that of said first and second electric fields applied to said ferroelectric capacitor, and polarization of the ferroelectric capacitor being changed according to a variation of said third and fourth electric fields.

6. The method as claimed in claim 1, wherein a strength of said first and second electric fields is set so that a reading-out margin when a logic "1" is written in said ferroelectric capacitor is substantially equal to a reading-out margin when a logic "0" is written in said ferroelectric capacitor.

7. The method as claimed in claim 2, wherein said step (b) comprises a step of precharging said data line to a precharge voltage which is substantially half of a power source voltage.

8. A ferroelectric memory comprising a memory cell which uses a ferroelectric capacitor as a storage medium, said memory cell comprising:
   applying means for applying first and second electric fields having opposite directions to said ferroelectric capacitor, wherein polarization of the ferroelectric capacitor is changed according to a variation of said first and second electric fields; and reading means for reading out data stored in said memory cell by detecting a variation of said polarization of the ferroelectric capacitor.

9. A ferroelectric memory comprising:
a memory cell including:
   a transmission gate having a first charge input-and-output port connected to a data line and a second charge input-and-output port; and
   a ferroelectric capacitor having a first electrode connected to said second charge input-and-output port and a second electrode connected to a driving voltage line;
precharging means for precharging said data line; and
driving-voltage applying means for applying a driving voltage to said second electrode of the ferroelectric capacitor through said driving voltage line to successively apply first and second electric fields having opposite directions to said ferroelectric capacitor, wherein polarization of the ferroelectric capacitor is changed according to a variation of said first and second electric fields, and a driving-voltage applying operation of said driving-voltage applying means is carried out after processes in which said transmission gate is controlled to be non-conductive, said data line is precharged by said precharging means, and said transmission gate is controlled to be conductive;
   wherein data stored in said memory cell is read out to said data line by successively applying said first and second electric fields to said ferroelectric capacitor after said processes in which said transmission gate is controlled to be non-conductive, said data line is precharged, and said transmission gate is controlled to be conductive.

10. A ferroelectric memory comprising:
an i-th memory cell, where i=1, 3, . . . , 2n−1, said memory cell including:
   an i-th transmission gate controlled to be conductive and non-conductive by an i-th word line, said i-th transmission gate having a first charge input-and-output port connected to a first data line and a second charge input-and-output port; and
   an i-th ferroelectric capacitor having a first electrode connected to the second charge input-and-output port of said i-th transmission gate and a second electrode connected to an i-th driving voltage line;
an (i+1)-th memory cell including:
   an (i+1)-th transmission gate controlled to be conductive and non-conductive by an (i+1)-th word line, said (i+1)-th transmission gate having a first charge input-and-output port connected to a second data line and a second charge input-and-output port; and
   an (i+1)-th ferroelectric capacitor having a first electrode connected to the second charge input-and-output port of said (i+1)-th transmission gate and a second electrode connected to an (i+1)-th driving voltage line;
a sense amplifier amplifying a voltage difference between said first and second data lines;
a column selection gate selecting said first and second data lines;
precharging means for precharging said first and second data lines; and
driving-voltage applying means for applying a driving voltage to said second electrode of the ferroelectric capacitor of a selected memory cell through a selected driving voltage line to successively apply first and second electric fields having opposite directions to the ferroelectric capacitor of said selected memory cell, wherein polarization of the ferroelectric capacitor of said selected memory cell is changed according to a variation of said first and second electric fields, and a driving-voltage applying operation of said driving-voltage applying means is carried out after processes in which said 1st, 2nd, . . . 2n transmission gates are controlled to be non-conductive, said first and second data lines are precharged by said precharging means, and said transmission gate of said selected memory cell is controlled to be conductive;

wherein by successively applying said first and second electric fields to said ferroelectric capacitor of said selected memory cell after said processes in which said 1st, 2nd, . . . 2n transmission gates are controlled to be non-conductive, said first and second data lines are precharged, and said transmission gate of said selected memory cell is controlled to be conductive, the data stored in said selected memory cell is read out to a corresponding data line, and said voltage difference between said first and second data lines is amplified.

11. The memory as claimed in claim 9, wherein said driving voltage is set so that a strength of said first electric field is smaller than that of an electric field applied to said ferroelectric capacitor when the data is written, and a strength of said second electric field is smaller than that of said first electric field.

12. The memory as claimed in claim 9, wherein said driving-voltage applying means further comprises means for providing a driving voltage for successively applying third and fourth electric fields having opposite directions, strength of said third and fourth electric fields being respectively larger than that of said first and second electric fields applied to said ferroelectric capacitor, and polarization of the ferroelectric capacitor being changed according to a variation of said third and fourth electric fields.

13. The memory as claimed in claim 9, wherein said driving-voltage applying means further comprises means for providing a driving voltage which is set so that a reading-out margin when a logic "1" is written in said ferroelectric capacitor is substantially equal to a reading-out margin when a logic "0" is written in said ferroelectric capacitor.

14. The memory as claimed in claim 9, wherein said precharging means precharges said data line to a voltage which is substantially half of a power source voltage.

15. The method as claimed in claim 1, wherein said data line has parasitic capacitance $C_{BL}$, the parasitic capacitance $C_{BL}$ being set to be equal to or less than a value $C_{BL}$ in which a voltage difference generated in said data line when a logic "1" and a logic "0" are read out is substantially maximized.

16. The method as claimed in claim 3, wherein said first data line has parasitic capacitance $C_{BL}$, the parasitic capacitance $C_{BL}$ being set to be equal to or less than a value $C_{BL}$ in which a voltage difference generated in said data line when a logic "1" and a logic "0" are read out is substantially maximized.

17. The method as claimed in claim 15, wherein one of said first and second electric fields is larger than an internal power-supply voltage, and when the data is read out, a voltage generated in said data line increases as compared with a case where said one is substantially the same as the internal power-supply voltage.

18. The method as claimed in claim 17, wherein said ferroelectric capacitor includes Pb (Zr, Ti) $O_3$, and a ratio of said parasitic capacitance $C_{BL}$ in the data line to capacitance Prs of said ferroelectric capacitor substantially satisfies the following condition:

$$0.5[V^{-1}]<(C_{BL}[F]/PrS[C])<2.$$

19. The memory as claimed in claim 8, wherein said data line has parasitic capacitance $C_{BL}$, the parasitic capacitance $C_{BL}$ being set to be equal to or less than a value $C_{BL}$ in which a voltage difference generated in said data line when a logic "1" and a logic "0" are read out is substantially maximized.

20. The memory as claimed in claim 10, wherein said first data line has parasitic capacitance $C_{BL}$, the parasitic capacitance $C_{BL}$ being set to be equal to or less than a value $C_{BL}$ in which a voltage difference generated in said data line when a logic "1" and a logic "0" are read out is substantially maximized.

21. The memory as claimed in claim 19, wherein one of said first and second electric fields is larger than an internal power-supply voltage, and when the data is read out, a voltage generated in said data line increases as compared with a case where said one is substantially the same as the internal power-supply voltage.

22. The method as claimed in claim 21, wherein said ferroelectric capacitor includes Pb (Zr, Ti) $O_3$, and a ratio of said parasitic capacitance $C_{BL}$ in the data line to capacitance Prs of said ferroelectric capacitor substantially satisfies the following condition:

$$0.5[V^{-1}]<(C_{BL}[F]/PrS[C])<2.$$

23. A method of reading data from a ferroelectric memory having a memory cell which uses a ferroelectric capacitor as a storage medium and a dummy cell which uses a ferroelectric capacitor, wherein said data is written in said ferroelectric memory by means of a direction of the ferroelectric capacitor in said memory cell, said method comprising the steps of:

(a) precharging data lines at ground level;

(b) applying a first driving voltage to the ferroelectric capacitor in said memory cell;

(c) generating one of first and second voltages to a data line according to the data stored in said memory cell;

(d) applying a second driving voltage less than said first driving voltage to the ferroelectric capacitor in said dummy cell to generate a reference voltage; and (e) discriminating said first and second voltages generated in the step (c) based on said reference voltage to read out the data.

24. The method as claimed in claim 23, wherein said step (d) further includes a step (d-1) of adjusting said second driving voltage in said dummy cell so as to generate said reference voltage between said first and second voltages.

25. The method as claimed in claim 23, wherein said step (d) further includes a step (d-2) of adjusting said second driving voltage in said dummy cell to a minimum requirement value.

26. The method as claimed in claim 23, wherein said step (d) further includes a step (d-3) of applying said second driving voltage to the ferroelectric capacitor in said dummy cell, and successively pulling down the driving voltage to the ground level, and said step (e) is carried out after the step (d).

27. The method as claimed in claim 23, wherein said memory cell and said dummy cell are arranged in parallel, and are driven by the same power supply.

28. The method as claimed in claim 27, wherein a capacitor is connected to the ferroelectric capacitor in said dummy cell in series, and said second driving voltage applied to said ferroelectric capacitor is properly adjusted by said capacitor.

29. The method as claimed in claim 28, wherein said capacitor connected to the ferroelectric capacitor in the dummy cell in series is constructed with a ferroelectric capacitor.

30. The method as claimed in claim 27, wherein a resistor is connected to the ferroelectric capacitor in said dummy cell in series, and said second driving voltage applied to said ferroelectric capacitor is properly adjusted.

31. A ferroelectric memory having a memory cell which uses a ferroelectric capacitor as a storage medium and a dummy cell which uses a ferroelectric capacitor, wherein said data is written in said ferroelectric memory by means of a direction of the ferroelectric capacitor in said memory cell, and when said data is read out, one of first and second voltages is provided to a data line according to said data, said ferroelectric memory comprising:

first means for applying a first driving voltage to the ferroelectric capacitor in said memory cell;

second means for applying a second driving voltage less than said first driving voltage to the ferroelectric capacitor in said dummy cell to generate a reference voltage; and third means for discriminating said first and second voltages provided when the data is read out, based on said reference voltage to read out the data.

32. The ferroelectric memory as claimed in claim 31, wherein said second driving voltage in said dummy cell is adjusted so as to generate said reference voltage between said first and second voltages.

33. The ferroelectric memory as claimed in claim 31, wherein said second driving voltage in said dummy cell is adjusted to a minimum required value.

34. The ferroelectric memory as claimed in claim 31, wherein said second driving voltage is applied to the ferroelectric capacitor in said dummy cell, and successively the driving voltage is pulled down to the ground level, and after the above operations, a data reading-out operation including discrimination is carried out.

35. The ferroelectric memory as claimed in claim 31, wherein said memory cell and said dummy cell are arranged in parallel, and are driven by the same power supply.

36. The ferroelectric memory as claimed in claim 35, further comprising a capacitor connected to the ferroelectric capacitor in said dummy cell in series, said second driving voltage applied to said ferroelectric capacitor in the dummy cell is properly adjusted by said capacitor.

37. The ferroelectric memory as claimed in claim 36, wherein said capacitor connected to the ferroelectric capacitor in the dummy cell in series is constructed with a ferroelectric capacitor.

38. The method as claimed in claim 35, further comprising a resistor connected to the ferroelectric capacitor in said dummy cell in series, and said second driving voltage applied to said ferroelectric capacitor in the dummy cell is properly adjusted by said resistor.

39. A method of reading data from a non-volatile ferroelectric memory having a ferroelectric capacitor, said non-volatile ferroelectric memory is substantially operative in a DRAM mode at a normal operation time and holds data by remanent polarization of said ferroelectric capacitor at a power-off state, said method comprising the steps of:

(a) setting voltage levels of a plate electrode and a bit line to be substantially half of a power source voltage Vcc when a power source is supplied; and (b) successively applying to said voltage level of the plate electrode $Vcc/2 \rightarrow (Vcc/2+V\alpha) \rightarrow (Vcc-V\beta) \rightarrow Vcc/2$, where $V\alpha$ and $V\beta$ are respectively first and second given voltage;

wherein when the power source is supplied, a storage state of the data in all memory cells is changed from said remanent polarization to a storage charge holding information in the DRAM mode.

40. A non-volatile ferroelectric memory having a ferroelectric capacitor, said non-volatile ferroelectric memory is substantially operative in a DRAM mode at a normal operation time and holds data by remanent polarization of said ferroelectric capacitor at a power-off state, said memory comprising:

first voltage setting means for setting voltage levels of a plate electrode and a bit line to be substantially half of a power source voltage (Vcc) when a power source is supplied; and second voltage setting means for successively applying to said voltage level of the plate electrode $Vcc/2 \rightarrow (Vcc/2+V\alpha) \rightarrow (Vcc-V\beta) \rightarrow Vcc/2$, where $V\alpha$ and $V\beta$ are respectively first and second given voltage;

wherein when the power source is supplied, a storage state of the data in all memory cells is changed from said remanent polarization to a storage charge holding information in the DRAM mode.

41. A ferroelectric memory device comprising:

memory cells respectively having a ferroelectric capacitor, each of the memory cells being connected to a word line, a charge input/output line and one of a pair of bit lines;

a bit line precharge circuit connected to the pair of bit lines; and a sense amplifier connected to the pair of the bit lines, the charge input/output line carrying a driving voltage which changes in a given sequence which causes first and second electric fields having opposite directions to be successively applied to the ferroelectric capacitors.

42. The ferroelectric memory device as claimed in claim 41, wherein the sense amplifier comprises a circuit configuration which detects a variation in a polarization of the ferroelectric capacitor of a selected one of the ferroelectric memory cells.

43. The ferroelectric memory device as claimed in claim 41, further comprising a driving voltage applying circuit which applies the driving voltage to the charge input/output line.

44. The ferroelectric memory device as claimed in claim 41, further comprising a driving voltage applying circuit which applies the driving voltage to the charge input/output line after the bit line precharge circuit precharges the bit lines to a given voltage in a state in which the ferroelectric capacitors are disconnected from the bit lines and the ferroelectric capacitors are then connected to the bit lines.

45. The ferroelectric memory device as claimed in claim 41, further comprising a driving voltage applying circuit which applies the driving voltage to the charge input/output line so that fist and second electric fields which change a polarization of the ferroelectric capacitors and have different directions are sequentially applied thereto.

46. The ferroelectric memory device as claimed in claim 41, wherein two adjacent memory cells are arranged so that the ferroelectric capacitor of one of the two adjacent memory cells is connected to one of the pair of bit lines and the other one of the two adjacent memory cells is connected to the other one of the pair of bit lines.

47. The ferroelectric memory device as claimed in claim 41, wherein the driving voltage is set so that a strength of the first electric field is less than that of an electric field applied to the ferroelectric capacitor when data is written into one of the memory cells, and a strength of the second electric field is less than that of the first electric field.

48. The ferroelectric memory device as claimed in claim 41, wherein the driving voltage applying circuit further comprises a circuit portion which provides another driving voltage for successively applying third and fourth electric fields having opposite directions, strength of the third and fourth electric fields being respectively greater than that of said first and second electric fields applied to the ferroelectric capacitor, and polarization of the ferroelectric capacitor being changed according to a variation of the third and fourth electric fields.

49. The ferroelectric memory device as claimed in claim 41, wherein the driving voltage applying circuit further comprises a circuit portion which provides another driving voltage which is set so that a read-out margin when a logic "1" is written into the ferroelectric capacitor is substantially equal to a read-out margin when a logic "0" is written into the ferroelectric capacitor.

50. The ferroelectric memory device as claimed in claim 41, wherein the bit line precharge circuit precharges the pair of bit lines to a voltage which is approximately half of a power source voltage.

51. The ferroelectric memory device as claimed in claim 41, wherein each of the pair of bit lines has a parasitic capacitance $C_{BL}$, which is set equal to or less than a value in which a voltage difference produced between the pair of bit lines when a logic "1" and a logic "0" are read is substantially maximized.

52. The ferroelectric memory device as claimed in claim 51, wherein one of the first and second electric fields is greater than an internal power supply voltage, and when the data is read, a voltage produced between the pair of bit lines increases as compared with a case where said one of the first and second electric fields is substantially the same as the internal power supply voltage.

53. A ferroelectric memory having a memory cell which uses a ferroelectric capacitor and a dummy cell which uses a ferroelectric capacitor, wherein said data is written in said ferroelectric memory by means of a direction of the ferroelectric capacitor in said memory cell, and when said data is read out, one of first and second voltages is provided to a data line according to said data, said ferroelectric memory comprising:
a first circuit which applies a first driving voltage to the ferroelectric capacitor in said memory cell;
a second circuit which applies a second driving voltage less than said first driving voltage to the ferroelectric capacitor in said dummy cell to generate a reference voltage; and
a third circuit which discriminates said first and second voltages provided when the data is read out, based on said reference voltage to read out the data.

54. The ferroelectric memory as claimed in claim 53, wherein said second driving voltage in said dummy cell is adjusted so as to generate said reference voltage between said first and second voltages.

55. The ferroelectric memory as claimed in claim 53, wherein said second driving voltage in said dummy cell is adjusted to a minimum required value.

56. The ferroelectric memory as claimed in claim 53, wherein said second driving voltage is applied to the ferroelectric capacitor in said dummy cell, and successively the driving voltage is pulled down to the ground level, and after the above operations, a data reading-out operation including discrimination is carried out.

57. The ferroelectric memory as claimed in claim 53, wherein said memory cell and said dummy cell are arranged in parallel, and are driven by the same power supply.

58. The ferroelectric memory as claimed in claim 57, further comprising a capacitor connected to the ferroelectric capacitor in said dummy cell in series, said second driving voltage applied to said ferroelectric capacitor in the dummy cell is properly adjusted by said capacitor.

59. The ferroelectric memory as claimed in claim 58, wherein said capacitor connected to the ferroelectric capacitor in the dummy cell in series is constructed with a ferroelectric capacitor.

60. A non-volatile ferroelectric memory having a ferroelectric capacitor, said non-volatile ferroelectric memory is substantially operative in a DRAM mode at a normal operation time and holds data by remanent polarization of said ferroelectric capacitor at a power-off state, said memory comprising:
a first voltage setting circuit which sets voltage levels of a plate electrode and a bit line to be substantially half of a power source voltage (Vcc) when a power source is supplied; and
a second voltage setting circuit which successively applies to said voltage level of the plate electrode Vcc/2→(Vcc/2+Vα)→(Vcc−Vβ)→Vcc/2, where Vα and Vβ are respectively first and second given voltage;
wherein when the power source is supplied, a storage state of the data in all memory cells is changed from said remanent polarization to a storage charge holding information in the DRAM mode.

* * * * *